(12) United States Patent
Min et al.

(10) Patent No.: US 11,844,266 B2
(45) Date of Patent: Dec. 12, 2023

(54) ORGANOMETALLIC COMPOUND AND ORGANIC LIGHT-EMITTING DEVICE INCLUDING THE SAME

(71) Applicants: Samsung Electronics Co., Ltd., Suwon-si (KR); SAMSUNG SDI CO., LTD., Yongin-si (KR)

(72) Inventors: Minsik Min, Suwon-si (KR); Sangmo Kim, Hwaseong-si (KR); Hosuk Kang, Suwon-si (KR); Wook Kim, Suwon-si (KR); Sungho Nam, Daegu (KR); Hyejin Bae, Suwon-si (KR); Jhunmo Son, Yongin-si (KR); Yongsik Jung, Seoul (KR); Jun Chwae, Suwon-si (KR)

(73) Assignees: SAMSUNG ELECTRONICS CO., LTD., Gyeonggi-Do (KR); SAMSUNG SDI CO., LTD, Gyeonggi-Do (KR)

( * ) Notice: Subject to any disclaimer, the term of this patent is extended or adjusted under 35 U.S.C. 154(b) by 774 days.

(21) Appl. No.: 16/750,214

(22) Filed: Jan. 23, 2020

(65) Prior Publication Data
US 2020/0280003 A1    Sep. 3, 2020

(30) Foreign Application Priority Data

Jan. 31, 2019 (KR) .......................... 10-2019-0012817
Jan. 22, 2020 (KR) .......................... 10-2020-0008761

(51) Int. Cl.
| | | |
|---|---|---|
| H01L 51/54 | (2006.01) | |
| H10K 85/30 | (2023.01) | |
| C07F 15/00 | (2006.01) | |
| C09K 11/06 | (2006.01) | |
| H10K 50/11 | (2023.01) | |
| H10K 101/10 | (2023.01) | |

(52) U.S. Cl.
CPC ....... H10K 85/346 (2023.02); C07F 15/0086 (2013.01); C09K 11/06 (2013.01); C09K 2211/1029 (2013.01); C09K 2211/1044 (2013.01); C09K 2211/185 (2013.01); H10K 50/11 (2023.02); H10K 2101/10 (2023.02)

(58) Field of Classification Search
CPC ... H01L 51/0087; H01L 51/0077–0089; H01L 51/0091–0092; H01L 51/5016; H01L 51/0032; H01L 51/0085; H01L 51/50; C09K 11/06; C09K 2211/182–188; C07F 5/00; C07F 5/003; C07F 5/06–069; C07F 7/00; C07F 7/003; C07F 7/22–28; C07F 9/00; C07F 9/005
See application file for complete search history.

(56) References Cited

U.S. PATENT DOCUMENTS

| | | |
|---|---|---|
| 7,279,704 B2 | 10/2007 | Walters et al. |
| 7,553,560 B2 | 6/2009 | Lamansky et al. |
| 9,385,329 B2 | 7/2016 | Li et al. |
| 9,406,891 B2 | 8/2016 | Yong Sik et al. |
| 9,493,698 B2 | 11/2016 | Beers et al. |
| 9,812,653 B2 | 11/2017 | Jung et al. |
| 9,923,151 B2 | 3/2018 | Numata |
| 9,947,881 B2 | 4/2018 | Li et al. |
| 10,084,143 B2 | 9/2018 | Alleyne et al. |
| 2006/0258043 A1 | 11/2006 | Bold et al. |
| 2012/0012821 A1 | 1/2012 | Langer et al. |
| 2014/0364605 A1 | 12/2014 | Li et al. |
| 2015/0008419 A1 | 1/2015 | Li |

(Continued)

FOREIGN PATENT DOCUMENTS

| | | |
|---|---|---|
| CN | 109748938 A | 5/2019 |
| EP | 3431482 A1 | 1/2019 |

(Continued)

OTHER PUBLICATIONS

Extended European search report issued by the European Patent Office dated May 29, 2020 in the examination of the European Patent Application No. 20153874.1, which corresponds to the U.S. Application above.

(Continued)

Primary Examiner — Andrew K Bohaty
(74) Attorney, Agent, or Firm — CANTOR COLBURN LLP

(57) ABSTRACT

Provided are the organometallic compound represented by Formula 1 and an organic light-emitting device including the same:

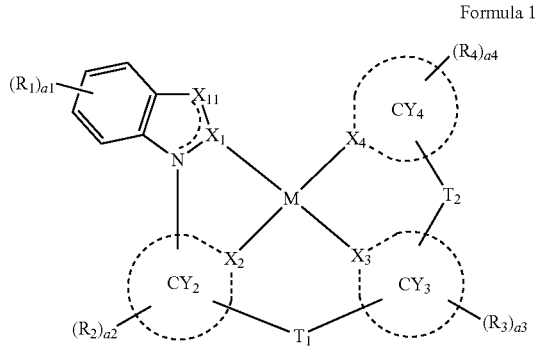

Formula 1

M, $X_1$ to $X_4$, $X_{11}$, ring $CY_2$ to ring $CY_4$, $T_1$, $T_2$, $R_1$ to $R_4$, and a1 to a4 in Formula 1 are the same as described in the present specification.

20 Claims, 1 Drawing Sheet

(56) References Cited

U.S. PATENT DOCUMENTS

| | | |
|---|---|---|
| 2015/0105556 A1 | 4/2015 | Li et al. |
| 2015/0194616 A1 | 7/2015 | Li et al. |
| 2015/0228914 A1 | 8/2015 | Li et al. |
| 2015/0349279 A1 | 12/2015 | Huh et al. |
| 2016/0013423 A1 | 1/2016 | Huh et al. |
| 2016/0028208 A1 | 1/2016 | Cable et al. |
| 2016/0233441 A1 | 8/2016 | Kim et al. |
| 2016/0359125 A1 | 12/2016 | Li et al. |
| 2018/0053904 A1 | 2/2018 | Li et al. |
| 2018/0182981 A1 | 6/2018 | Chen et al. |
| 2018/0261780 A1 | 9/2018 | Park et al. |
| 2018/0375036 A1* | 12/2018 | Chen ............ H01L 51/0087 |
| 2019/0225636 A1 | 7/2019 | Bae et al. |
| 2020/0140471 A1* | 5/2020 | Chen ............ H01L 51/0087 |
| 2020/0144517 A1 | 5/2020 | Chung et al. |

FOREIGN PATENT DOCUMENTS

| | | |
|---|---|---|
| JP | 5650932 B2 | 1/2015 |
| KR | 1020110074538 A | 6/2011 |
| KR | 1020140076253 A | 6/2014 |
| KR | 1020150061975 A | 6/2015 |
| KR | 1020160006629 A | 1/2016 |
| KR | 1020170019968 A | 2/2017 |
| KR | 1020190089626 A | 7/2019 |
| WO | 2002015645 A1 | 2/2002 |
| WO | 2005019373 A2 | 3/2005 |
| WO | 2005123873 A1 | 12/2005 |
| WO | 2010079051 A1 | 7/2010 |
| WO | 2012090967 A1 | 7/2012 |

OTHER PUBLICATIONS

Tyler Fleetham, et al., Efficient "Pure" Blue OLEDs Employing Tetradentate Pt Complexes with a Narrow Spectral Bandwidth, Adv. Mater. 2014, 26, 7116-7121.

Wiberg, K. B., & Slaugh, L. H. (1958), The Deuterium Isotope Effect in the Side Chain Halogenation of Toluene, Journal of the American Chemical Society, 80(12), 3033-3039.

\* cited by examiner

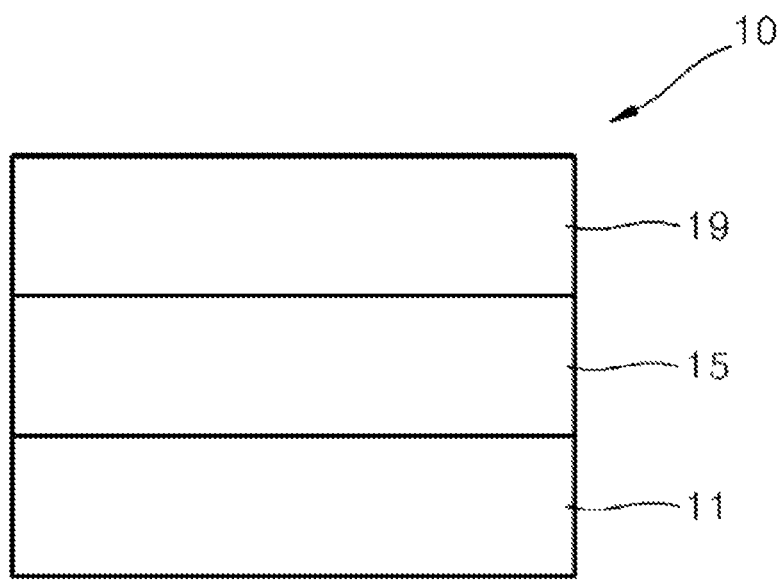

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2019-0012817, filed on Jan. 31, 2019, and Korean Patent Application No. 10-2020-0008761, filed on Jan. 22, 2020, in the Korean Intellectual Property Office, the contents of which is incorporated herein in its entirety by reference.

BACKGROUND

1. Field

The present disclosure relates to an organometallic compound and an organic light-emitting device including the same.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Provided are novel organometallic compounds, and organic light-emitting devices using the same.

Additional aspects will be set forth in part in the description which follows and, in part, will be apparent from the description, or may be learned by practice of the presented embodiments of the disclosure.

According to an aspect of an embodiment, an organometallic compound represented by Formula 1 is provided:

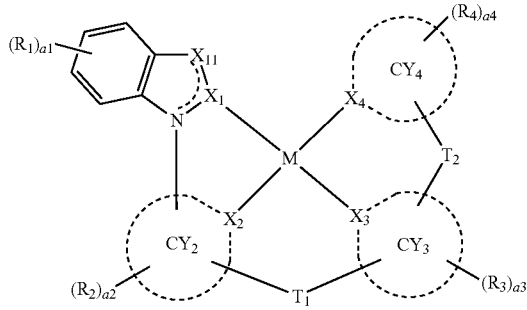

Formula 1 wherein, in Formula 1,
M is a transition metal,
$X_1$ may be C, and $X_2$ to $X_4$ may each independently be C or N,
a bond between $X_1$ and M may be a coordinate bond,
one of a bond between $X_2$ and M, a bond between $X_3$ and M, and a bond between $X_4$ and M may be a coordinate bond, and the other two bonds may be covalent bonds,
$X_{11}$ may be O, S, or $N(R_{1a})$,
ring $CY_2$ to ring $CY_4$ may each independently be a $C_5$-$C_{30}$ carbocyclic group or a $C_1$-$C_{30}$ heterocyclic group,
$T_1$ may be a single bond, a double bond, *—$N(R_5)$—*', *—$B(R_5)$—*', *—$P(R_5)$—*', *—$C(R_5)$ $(R_6)$—*', *—$Si(R_5)$ $(R_6)$—*', *—$Ge(R_5)$ $(R_6)$—*', *—S—*', *—Se—*', *—O—*', *—C(=O)—*', *—S(=O)—*', *—S(=O)_2$—*', *—$C(R_5)$=*', *=$C(R_5)$—*', *—$C(R_5)$=$C(R_6)$—*', *—C(=S)—*', or *—C≡C—*',
$T_2$ may be a single bond, a double bond, *—$N(R_7)$—*', *—$B(R_7)$—*', *—$P(R_7)$—*', *—$C(R_7)$ $(R_8)$—*', *—$Si(R_7)$ $(R_8)$—*', *—$Ge(R_7)$ $(R_8)$—*', *—S—*', *—Se—*', *—O—*', *—C(=O)—*', *—S(=O)—*', *—S(=O)_2$—*', *—$C(R_7)$=*', *=$C(R_7)$—*', *—$C(R_7)$=$C(R_8)$—*', *—C(=S)—*', or *—C≡C—*',
$R_{1a}$ and $R_1$ to $R_8$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$N(Q_1)$ $(Q_2)$, —$Si(Q_3)$ $(Q_4)$ $(Q_5)$, —$Ge(Q_3)$ $(Q_4)$ $(Q_5)$, —$B(Q_6)$ $(Q_7)$, —P(=O) $(Q_8)$ $(Q_9)$, or —$P(Q_8)$ $(Q_9)$,
a1 may be an integer from 1 to 4,
a2 to a4 may each independently be an integer from 0 to 20,
at least one of $R_1$ in the number of a1 may each independently be an unsubstituted or substituted $C_1$-$C_{60}$ alkyl group or an unsubstituted or substituted $C_3$-$C_{10}$ cycloalkyl group,
two or more of a plurality of $R_1$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$,
two or more of a plurality of $R_2$(S) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $R_3$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $R_4$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{1a}$ and $R_1$ to $R_8$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as explained in connection with $R_2$,

* and *' each indicate a binding site to a neighboring atom, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})$ $(Q_{12})$, —$Si(Q_{13})$ $(Q_{14})$ $(Q_{15})$, —$Ge(Q_{13})$ $(Q_{14})$ $(Q_{15})$, —$B(Q_{16})$ $(Q_{17})$, —$P(=O)$ $(Q_{18})$ $(Q_{19})$, —$P(Q_{18})$ $(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})$ $(Q_{22})$, —$Si(Q_{23})$ $(Q_{24})$ $(Q_{25})$, —$Ge(Q_{23})$ $(Q_{24})$ $(Q_{25})$, —$B(Q_{26})$ $(Q_{27})$, —$P(=O)$ $(Q_{28})$ $(Q_{29})$, —$P(Q_{28})$ $(Q_{29})$, or any combination thereof;

—$N(Q_{31})$ $(Q_{32})$, —$Si(Q_{33})$ $(Q_{34})$ $(Q_{35})$, —$Ge(Q_{33})$ $(Q_{34})$ $(Q_{35})$, —$B(Q_{36})$ $(Q_{37})$, —$P(=O)$ $(Q_{38})$ $(Q_{39})$, or —$P(Q_{38})$ $(Q_{39})$; or any combination thereof, wherein $Q_1$ to $Q_9$, $Q_{11}$ to $Q_{19}$, $Q_{21}$ to $Q_{29}$ and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group that is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group that is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect provides an organic light-emitting device: including a first electrode; a second electrode; and an organic layer disposed between the first electrode and the second electrode and including an emission layer, wherein the organic layer includes at least one of the organometallic compound.

The organometallic compound in the emission layer of the organic layer may function as a dopant.

BRIEF DESCRIPTION OF THE DRAWINGS

The above and other aspects, features, and advantages of certain embodiments of the disclosure will be more apparent from the following description taken in conjunction with the accompanying drawings, in which:

FIGURE shows a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organometallic compound according to an embodiment of the present disclosure may be represented by Formula 1 below:

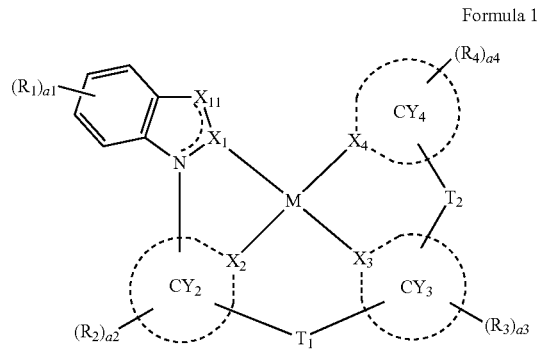

Formula 1

M in Formula 1 may be a transition metal.

For example, M may be a first-row transition metal of the Periodic Table of Elements, a second-row transition metal of the Periodic Table of Elements, or a third-row transition metal of the Periodic Table of Elements.

In one or more embodiments, M may be Pt, Pd, Au, or Cu.

In Formula 1, $X_1$ may be C, and $X_2$ to $X_4$ may each independently be C or N.

In one or more embodiments, in Formula 1, $X_2$ and $X_3$ may each be C, and $X_4$ may be N.

A bond between $X_1$ and M in Formula 1 may be a coordinate bond.

In Formula 1, one of a bond between $X_2$ and M, a bond between $X_3$ and M, and a bond between $X_4$ and M may be a coordinate bond, and the other two bonds may be covalent bonds. Thus, the organometallic compound represented by Formula 1 may be electrically neutral.

In one or more embodiments, in Formula 1, a bond between $X_2$ and M and a bond between $X_3$ and M may be a covalent bond, and a bond between $X_4$ and M may be a coordinate bond.

$X_{11}$ in Formula 1 may be O, S, or $N(R_{1a})$.

In one or more embodiments, $X_{11}$ may be $N(R_{1a})$.

Ring $CY_2$ to ring $CY_4$ in Formula 1 may each independently be a $C_5$-$C_{30}$ carbocyclic group or a $C_1$-$C_{30}$ heterocyclic group.

For example, ring $CY_2$ to ring $CY_4$ may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring is a cyclopentane group, a cyclopentadiene group, a furan group, a thiophene group, a pyrrole group, a silole group, an indene group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

In one or more embodiments, ring $CY_2$ to ring $CY_4$ in Formula 1 may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, phenoxazine group, a phenothiazine group, a dihydrophenazine group, a dihydroacridine group, an azaphenoxazine group, an azaphenothiazine group, an azadihydrophenazine group, or an azadihydroacridine group.

In one or more embodiments, ring $CY_2$ may be a benzene group or a pyridine group, ring $CY_3$ may be a carbazole group, and ring $CY_4$ may be a pyridine group, a pyrimidine group, a pyrazine group, a pyridazine group, or a triazine group.

In Formula 1, $T_1$ may be a single bond, a double bond, *—$N(R_5)$—*', *—$B(R_5)$—*', *—$P(R_5)$—*', *—$C(R_5)(R_6)$—*', *—$Si(R_5)(R_6)$—*', *—$Ge(R_5)(R_6)$—*', *—S—*', *—Se—*', *—O—*', *—C(=O)—*', *—S(=O)—*', *—$S(=O)_2$—*', *—$C(R_5)$=*', *=$C(R_5)$—*', *—$C(R_5)$=$C(R_6)$—*', *—C(=S)—*', or *—C≡C—*', and $T_2$ may be a single bond, a double bond, *—$N(R_7)$—*', *—$B(R_7)$—*', *—$P(R_7)$—*', *—$C(R_7)(R_8)$—*', *—$Si(R_7)(R_8)$—*', *—$Ge(R_7)(R_8)$—*', *—S—*', *—Se—*', *—O—*', *—C(=O)—*', *—S(=O)—*', *—$S(=O)_2$—*', *—$C(R_7)$=*', *=$C(R_7)$—*', *—$C(R_7)$=$C(R_8)$—*', *—C(=S)—*', or *—C≡C—*'. $R_5$ to $R_8$ are the same as described in the present specification.

In one or more embodiments, $T_1$ may be *—$N(R_5)$—*', *—$C(R_5)(R_6)$—*', *—S—*, *—O—*' or *—$S(=O)_2$—*', and $T_2$ may be a single bond, *—$N(R_7)$—*', *—$C(R_7)(R_8)$—*', *—S—*', or *—O—*'.

$R_{1a}$ and $R_1$ to $R_8$ in Formula 1 may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. In this regard, $Q_1$ to $Q_9$ are the same as described in the present specification.

For example, $R_{1a}$ and $R_1$ to $R_8$ in Formula 1 may each independently be:

hydrogen, deuterium, —F, —Cl, —Br, —I, a hydroxyl group, a cyano group, a nitro group, an amino group, an amidino group, hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_2$-$C_{20}$ alkenyl group, a $C_1$-$C_{20}$ alkoxy group, or a $C_1$-$C_{20}$ alkylthio group;

a C$_1$-C$_{20}$ alkyl group, a C$_2$-C$_{20}$ alkenyl group, a C$_1$-C$_{20}$ alkoxy group, or a C$_1$-C$_{20}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a deuterated C$_2$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$) (Q$_2$), —Si(Q$_3$) (Q$_4$) (Q$_5$), —Ge(Q$_3$) (Q$_4$) (Q$_5$), —B(Q$_6$) (Q$_7$), —P(=O) (Q$_8$) (Q$_9$), or —P(Q$_8$) (Q$_9$);

Q$_1$ to Q$_9$ may each independently be:

deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, —F, a C$_1$-C$_{10}$ alkyl group, a phenyl group, or any combination thereof.

a1 in Formula 1 indicates the number of R$_1$(s), and may be an integer from 1 to 4. For example, a1 may be 1 or 2. When a1 is two or more, two or more of R$_1$(s) may be identical to or different from each other.

a2 to a4 in Formula 1 indicate the numbers of R$_2$ to R$_4$, respectively, and may each independently an integer from 0 to 20. When a2 is 2 or more, two or more R$_2$(s) may be identical to or different from each other, when a3 is 2 or more, two or more R$_3$(s) may be identical to or different from each other, and when a4 is 2 or more, two or more $R_4$(s) may be identical to or different from each other.

At least one of $R_1$ in the number of a1 in Formula 1 may each independently be an unsubstituted or substituted $C_1$-$C_{60}$ alkyl group or an unsubstituted or substituted $C_3$-$C_{10}$ cycloalkyl group.

In one or more embodiments, at least one of $R_1$(s) in the number of a1 in Formula 1 may each independently be a $C_1$-$C_{20}$ alkyl group or a $C_3$-$C_{10}$ cycloalkyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, or any combination thereof.

In one or more embodiments, at least one of $R_1$(s) in the number of a1 in Formula 1 may each independently a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, or a ($C_1$-$C_{20}$ alkyl)bicyclo[2.2.2]octyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2] octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, or any combination thereof.

In one or more embodiments, $R_{1a}$ and $R_1$ to $R_8$ in Formula 1 may each independently be hydrogen, deuterium, —F, —CH$_3$, —CD$_3$, —CD$_2$H, —CDH$_2$, —CF$_3$, —CF$_2$H, —CFH$_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-201 to 9-237, a group represented by one of Formulae 9-201 to 9-237 in which at least one hydrogen is substituted with deuterium, a group represented by one of Formulae 10-1 to 10-129, a group represented by one of Formulae 10-1 to 10-129 in which at least one hydrogen is substituted with deuterium, a group represented by one of Formulae 10-201 to 10-350, a group represented by one of Formulae 10-201 to 10-350 in which at least one hydrogen is substituted with deuterium, —N($Q_1$) ($Q_2$), —Si($Q_3$) ($Q_4$) ($Q_5$), or —Ge($Q_3$) ($Q_4$) ($Q_5$) ($Q_3$ to $Q_5$ are the same as described in the present specification).

In one or more embodiments, at least one of $R_1$(s) in the number of a1 may each independently be —CH$_3$, —CD$_3$, —CD$_2$H, —CDH$_2$, —CF$_3$, —CF$_2$H, —CFH$_2$, a group represented by one of Formulae 9-1 to 9-39, a group represented by one of Formulae 9-1 to 9-39 in which at least one hydrogen is substituted with deuterium, a group represented by one of Formulae 9-201 to 9-227, a group represented by one of Formulae 9-201 to 9-227 in which at least one hydrogen is substituted with deuterium, a group represented by one of Formulae 10-1 to 10-9, or a group represented by one of Formulae 10-1 to 10-9 in which at least one hydrogen is substituted with deuterium:

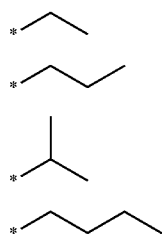

9-1

9-2

9-3

9-4

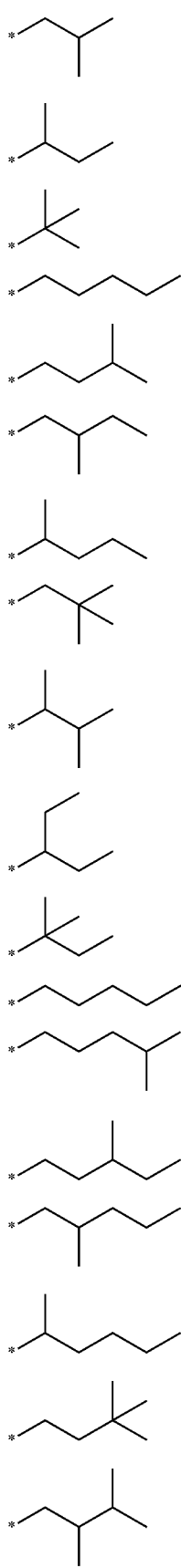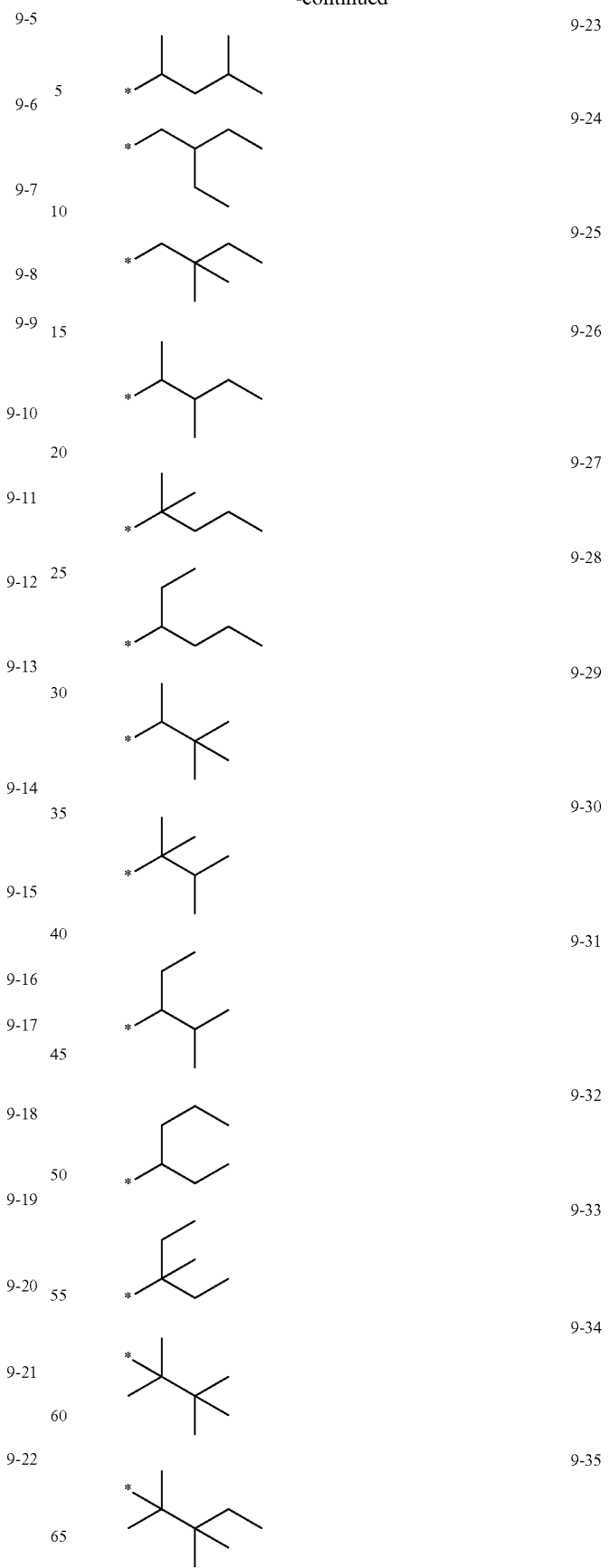

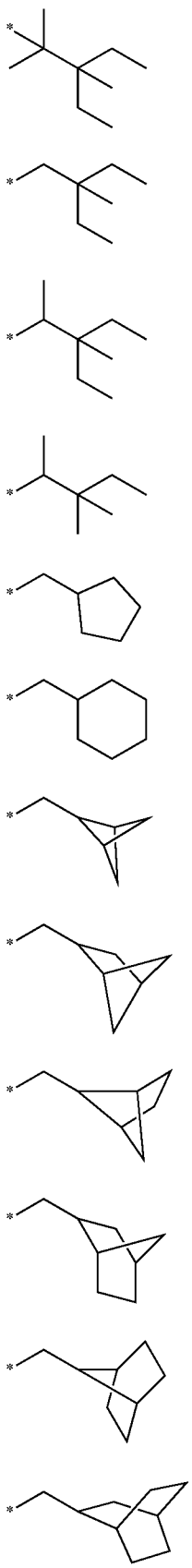
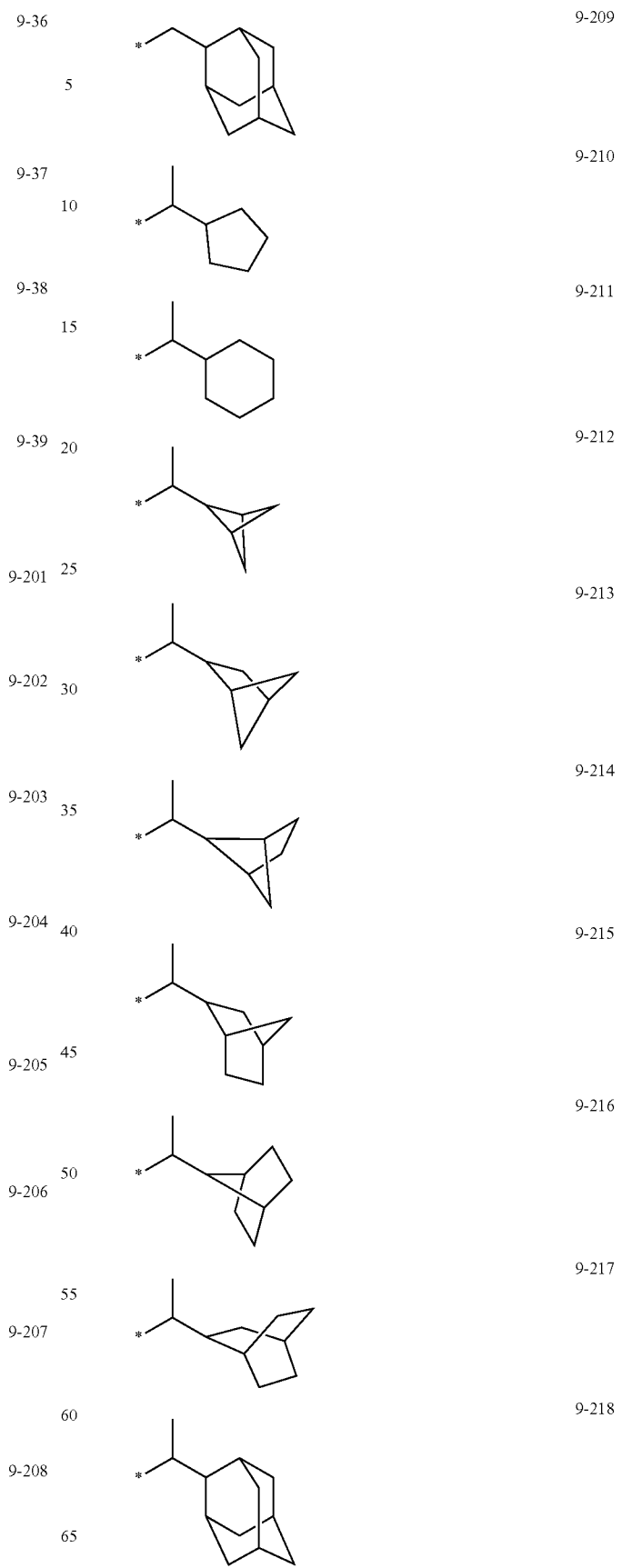

-continued
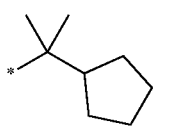 9-219
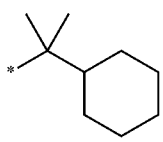 9-220
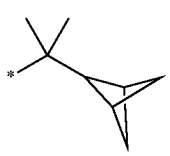 9-221
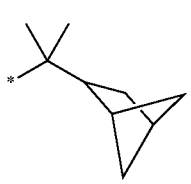 9-222
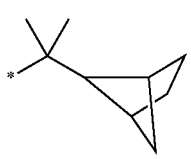 9-223
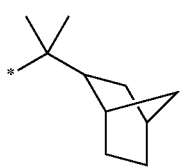 9-224
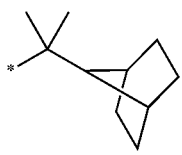 9-225
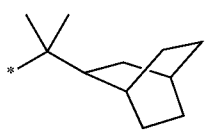 9-226
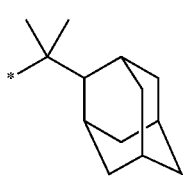 9-227
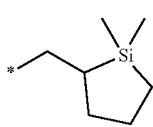 9-228
-continued
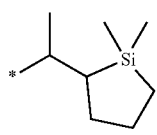 9-229
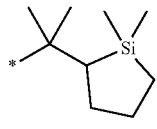 9-230
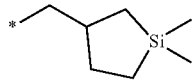 9-231
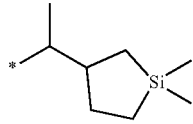 9-232
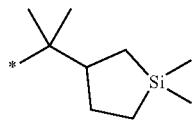 9-233
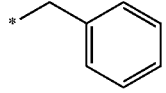 9-234
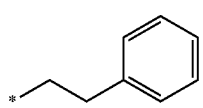 9-235
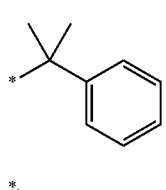 9-236
9-237
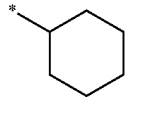 10-1
10-2
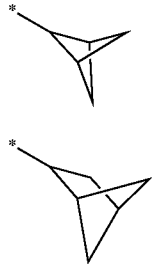 10-3
10-4

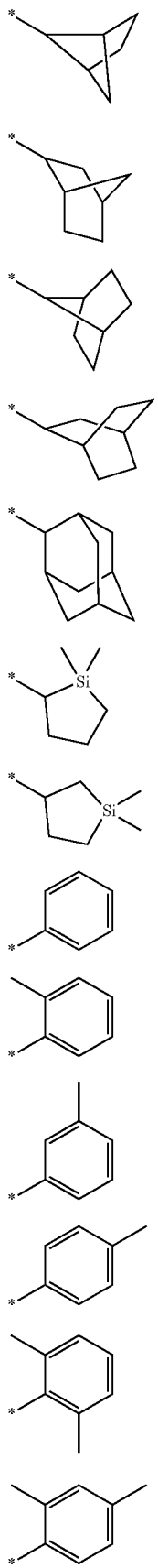
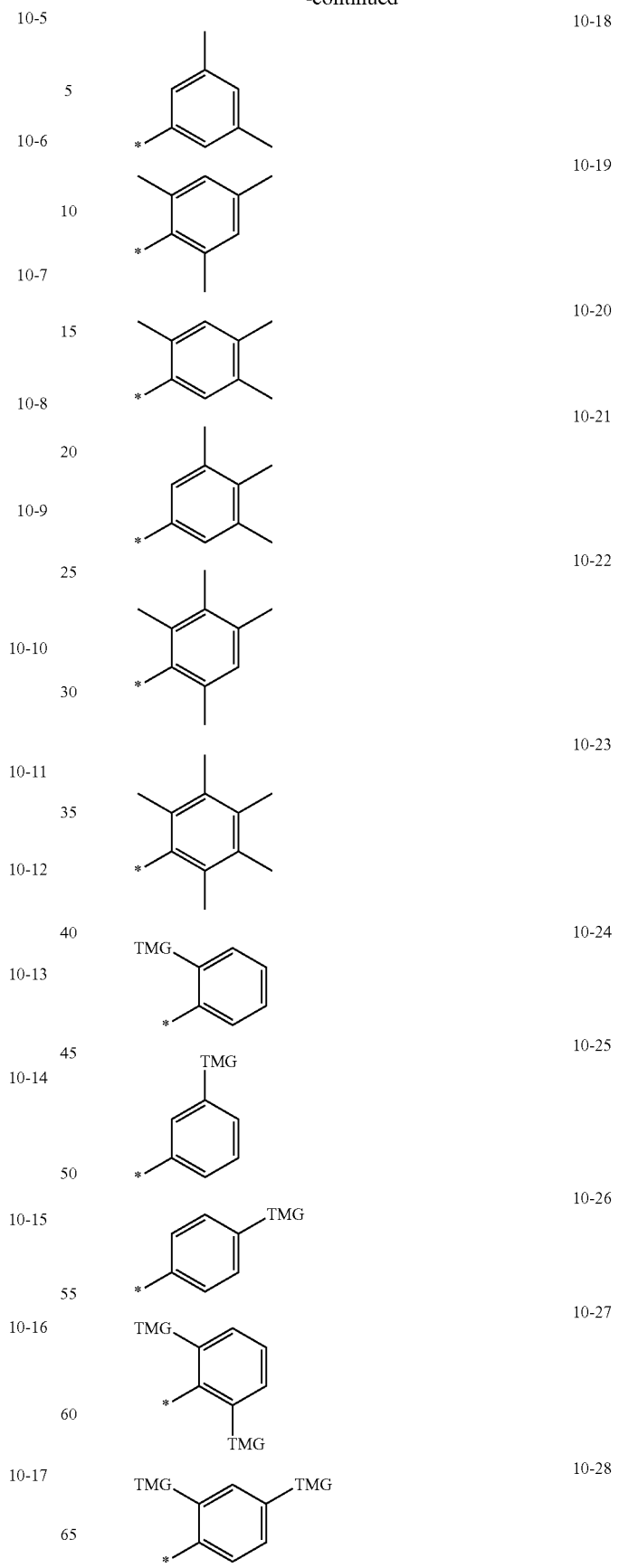

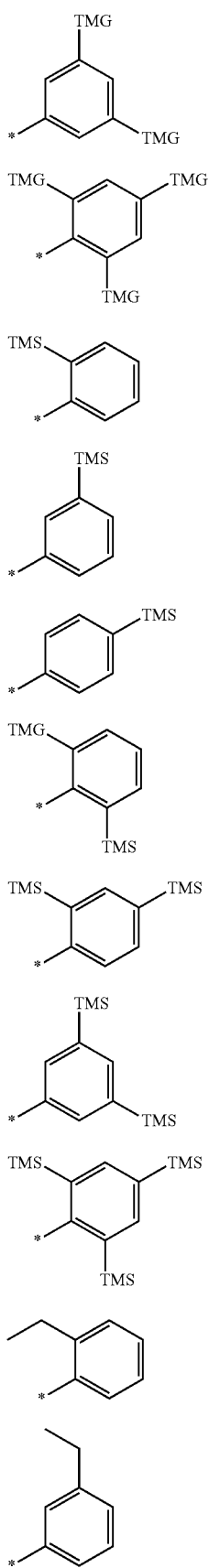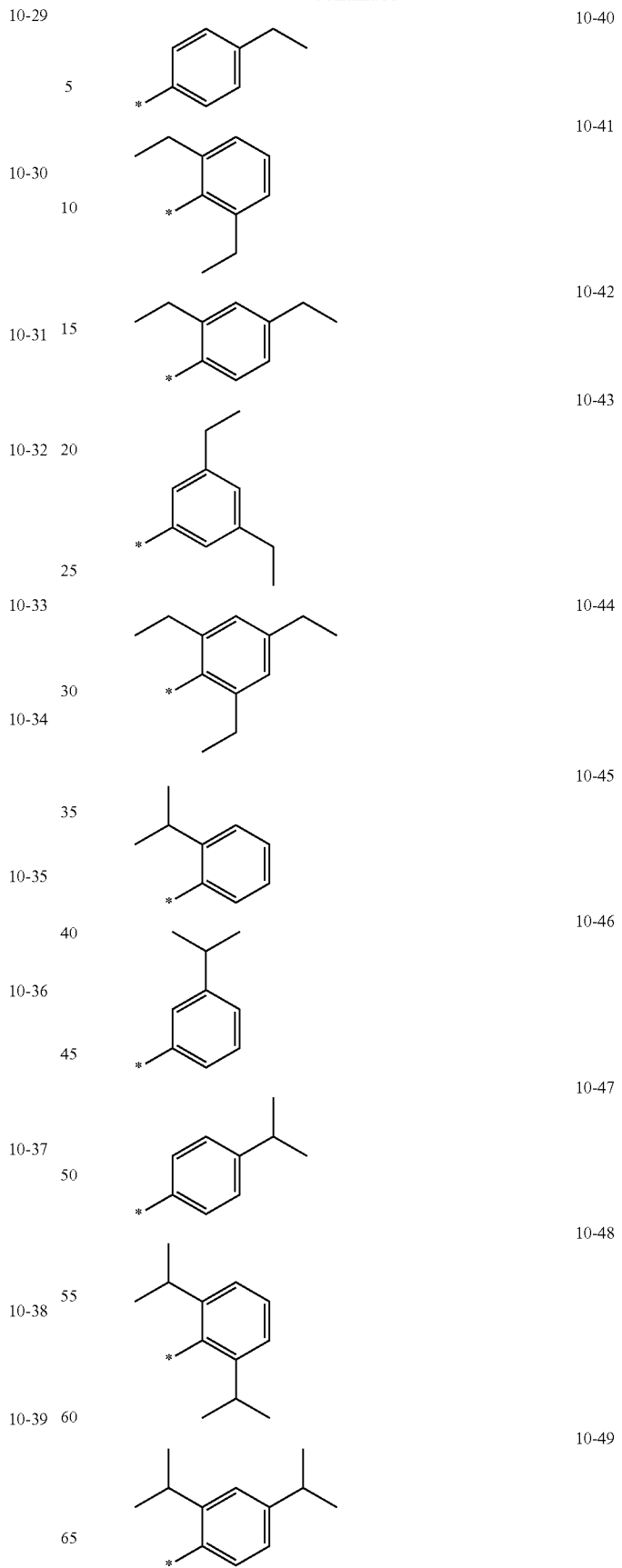

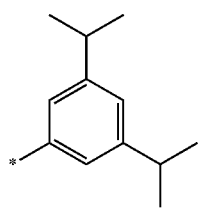
10-43
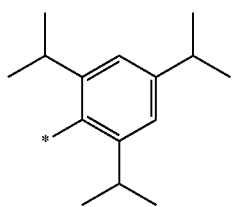
10-44
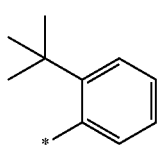
10-45
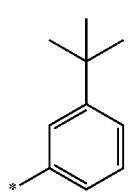
10-46
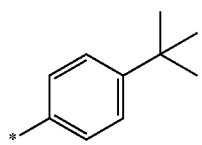
10-47
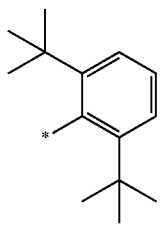
10-48
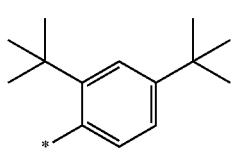
10-49
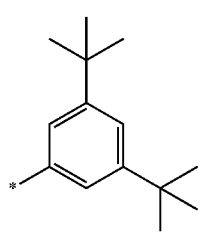
10-50
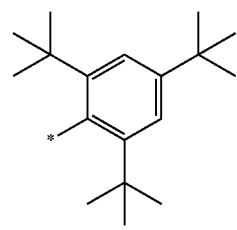
10-51
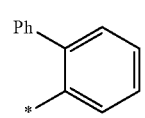
10-52
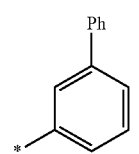
10-53
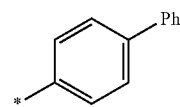
10-54
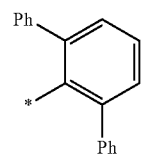
10-55
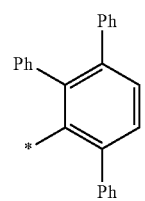
10-56
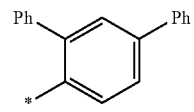
10-57
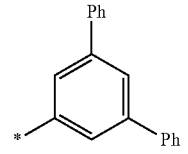
10-58
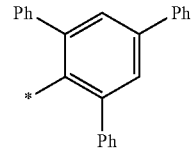
10-59
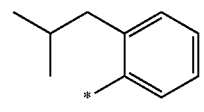
10-60

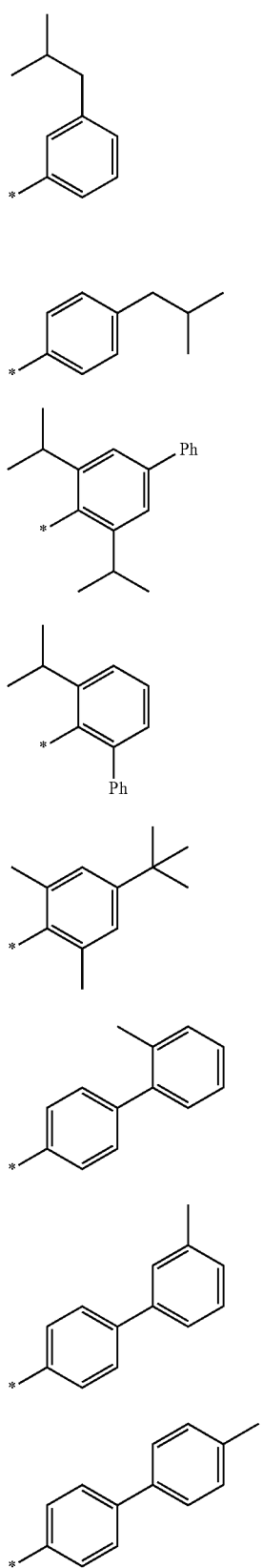
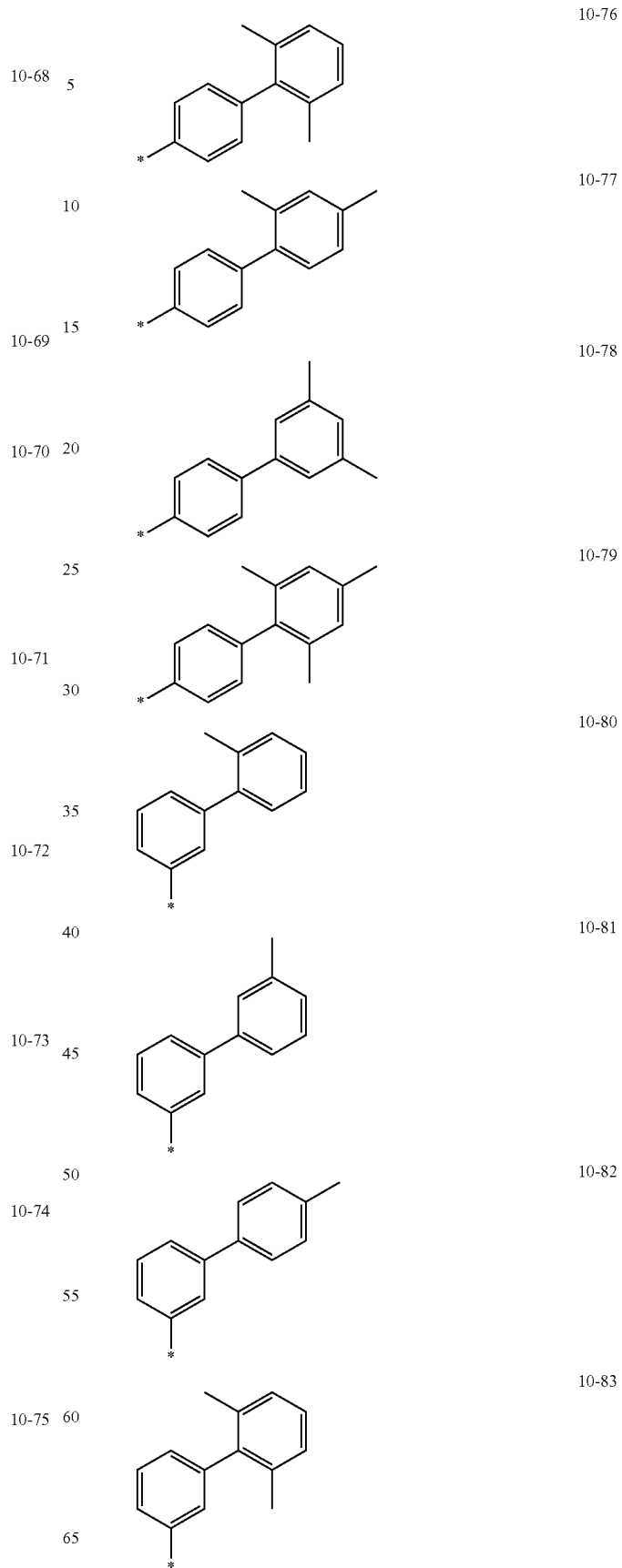

-continued
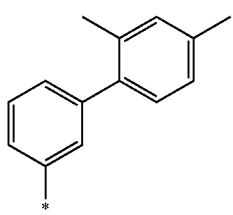
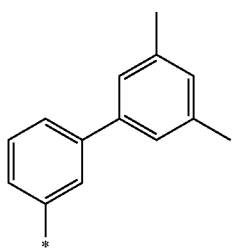
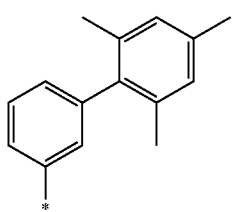
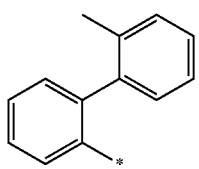
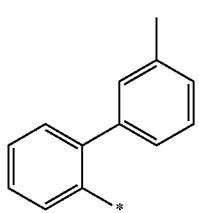
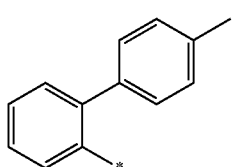
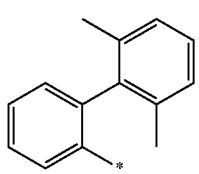
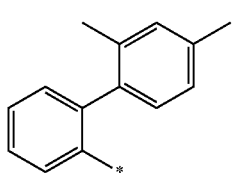
-continued
10-84
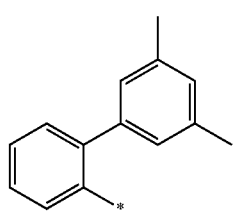
10-85
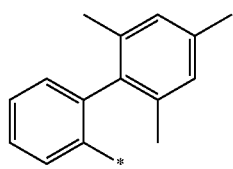
10-86
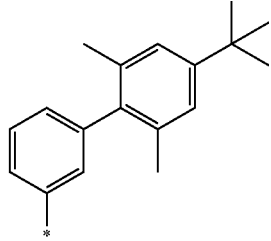
10-87
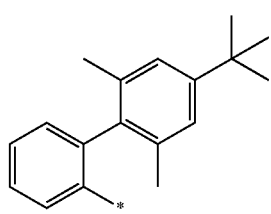
10-88
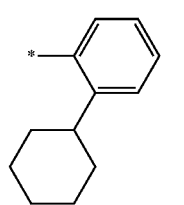
10-89
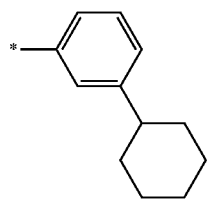
10-90
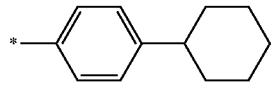
10-91
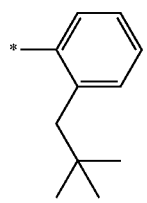
10-92
10-93
10-94
10-95
10-96
10-97
10-98
10-99

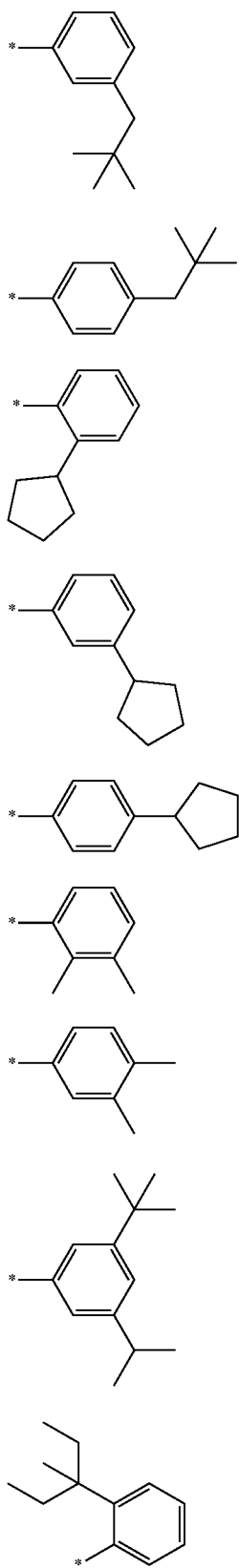
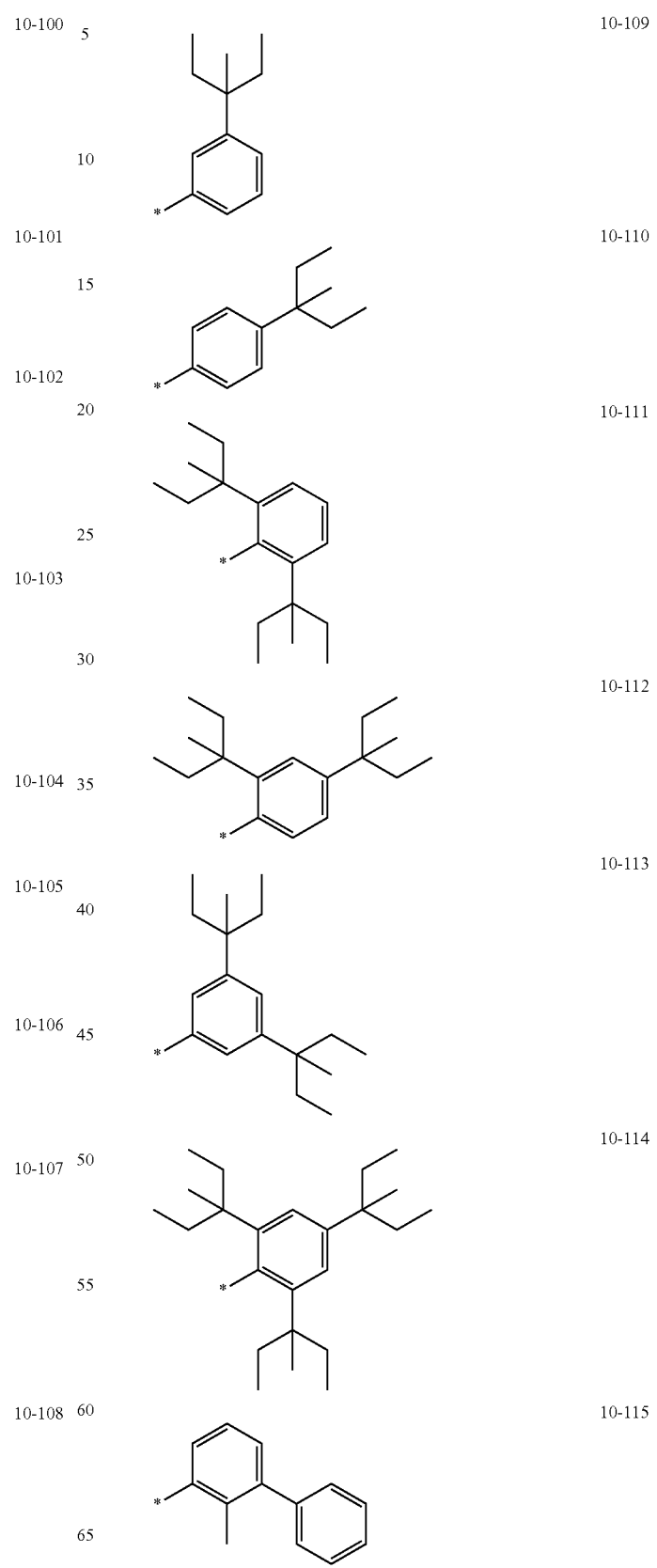

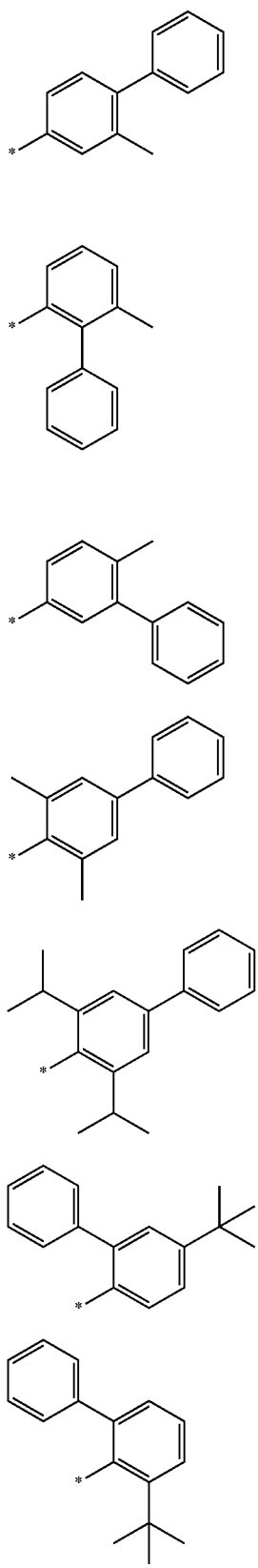
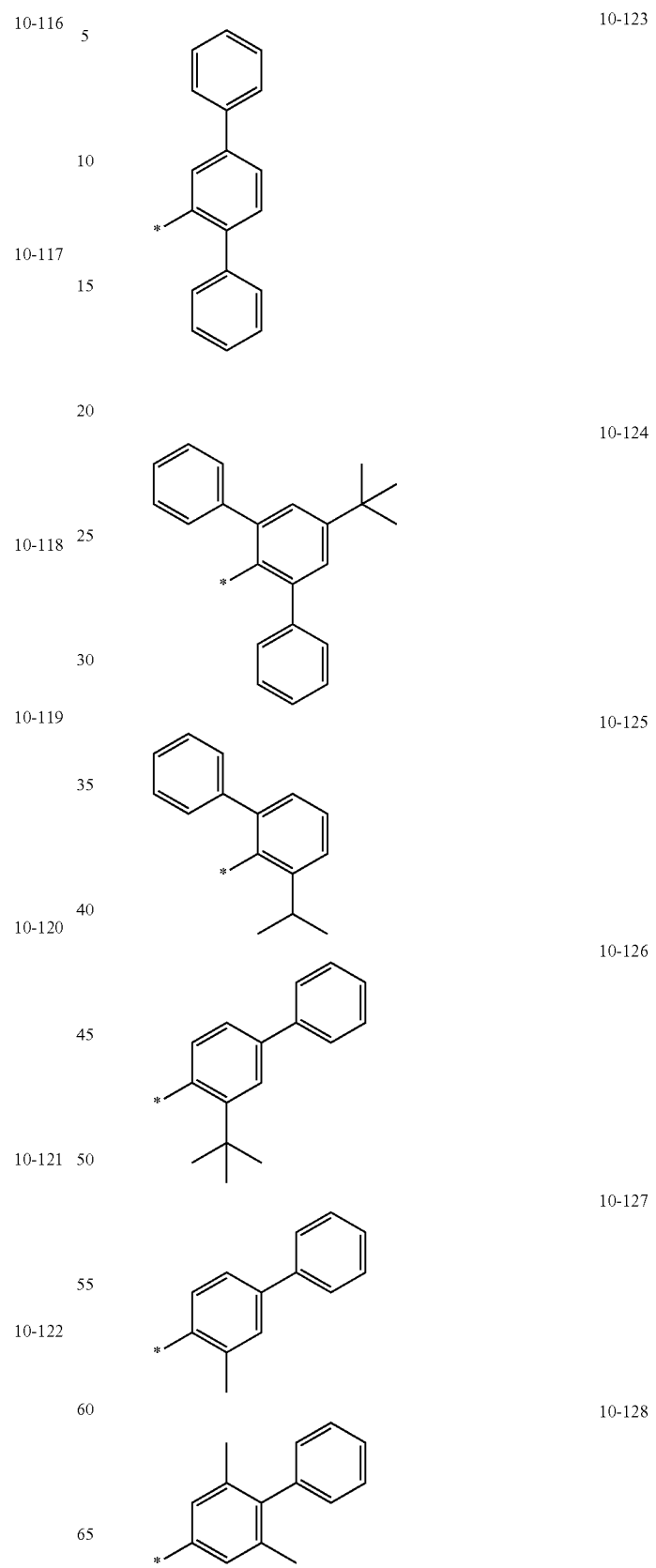

10-129 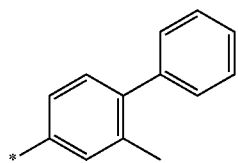
10-201 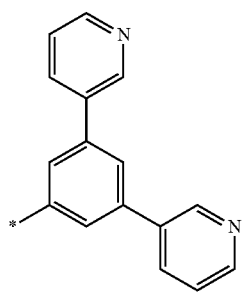
10-202 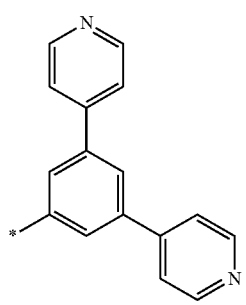
10-203 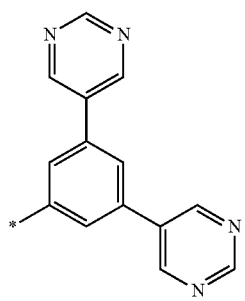
10-204 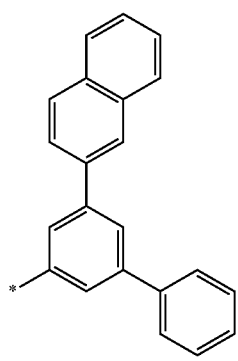
10-205 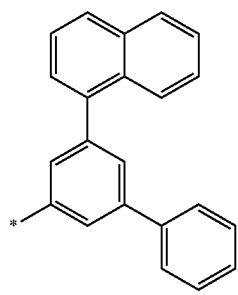
10-206 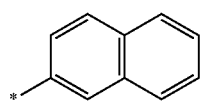
10-207 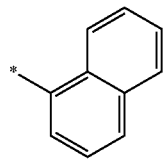
10-208 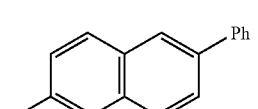
10-209 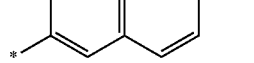
10-210 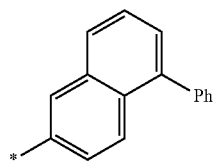
10-211 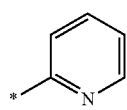
10-212 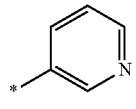
10-213 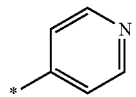
10-214 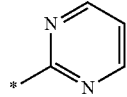
10-215 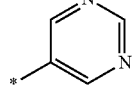

-continued
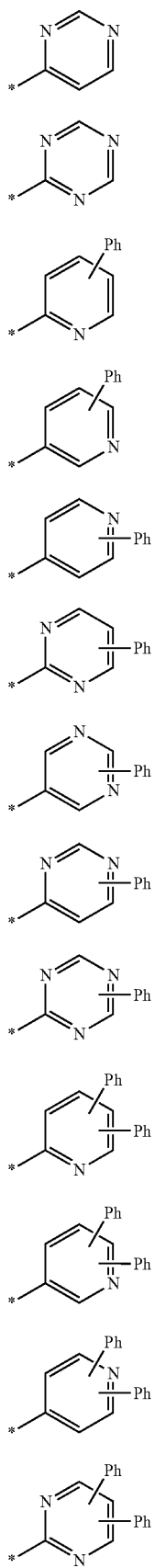
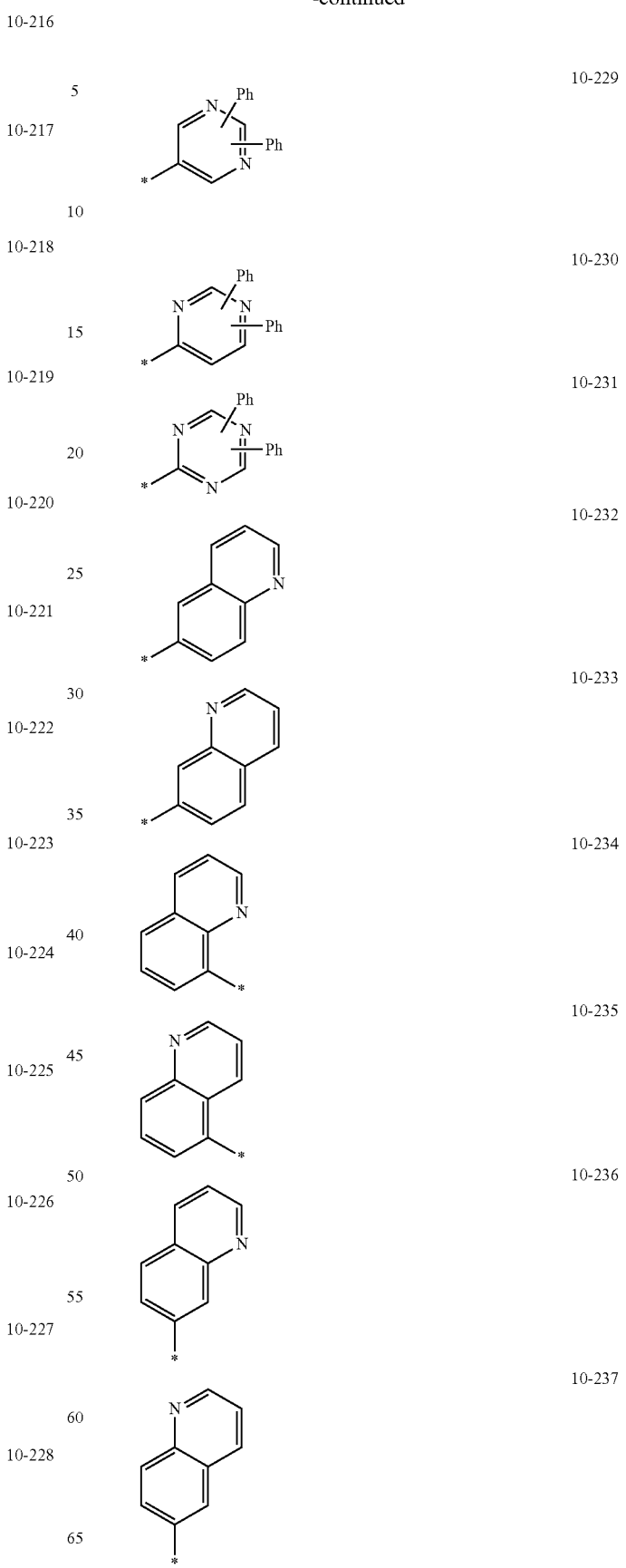

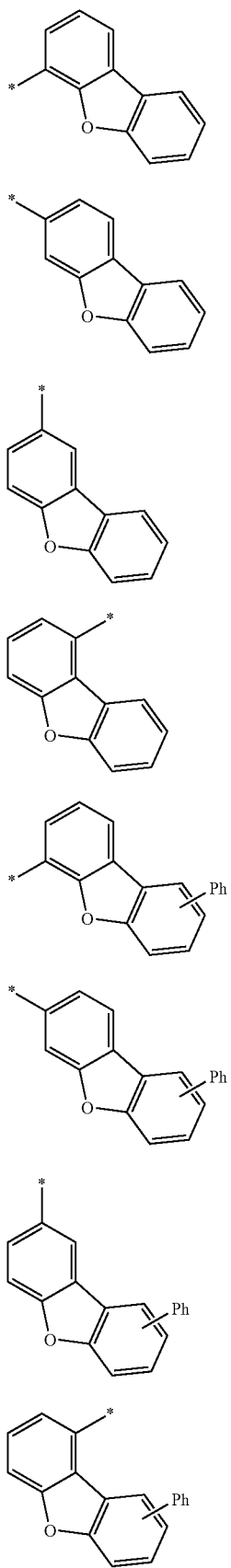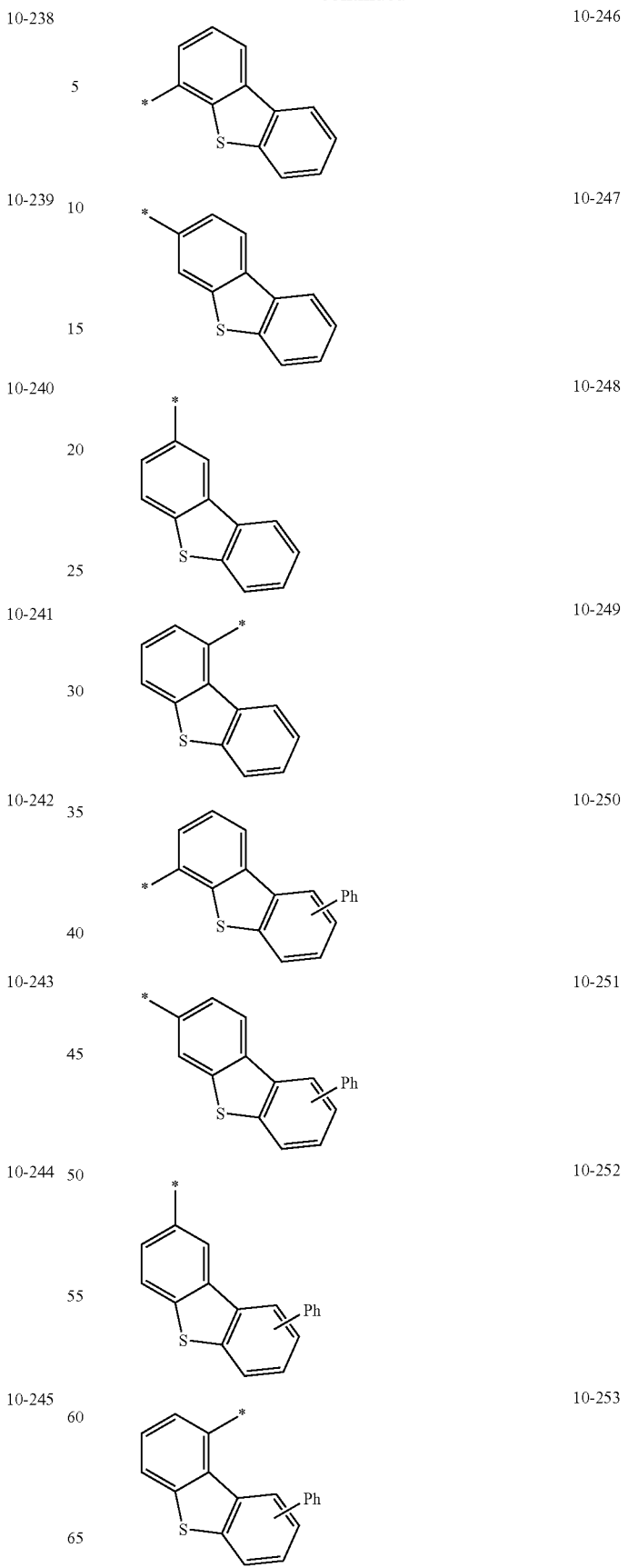

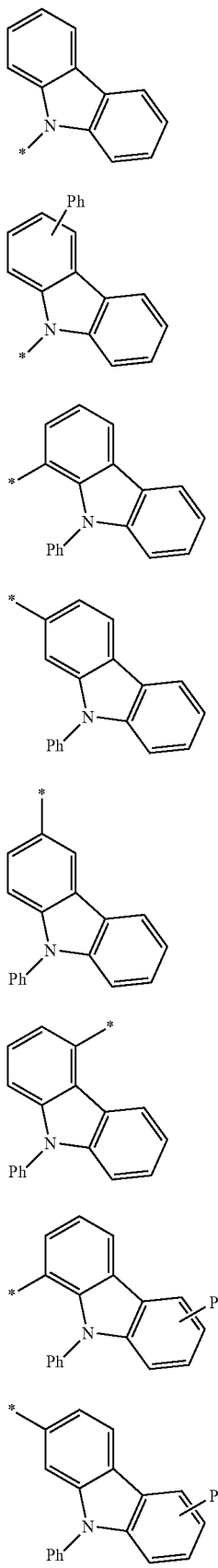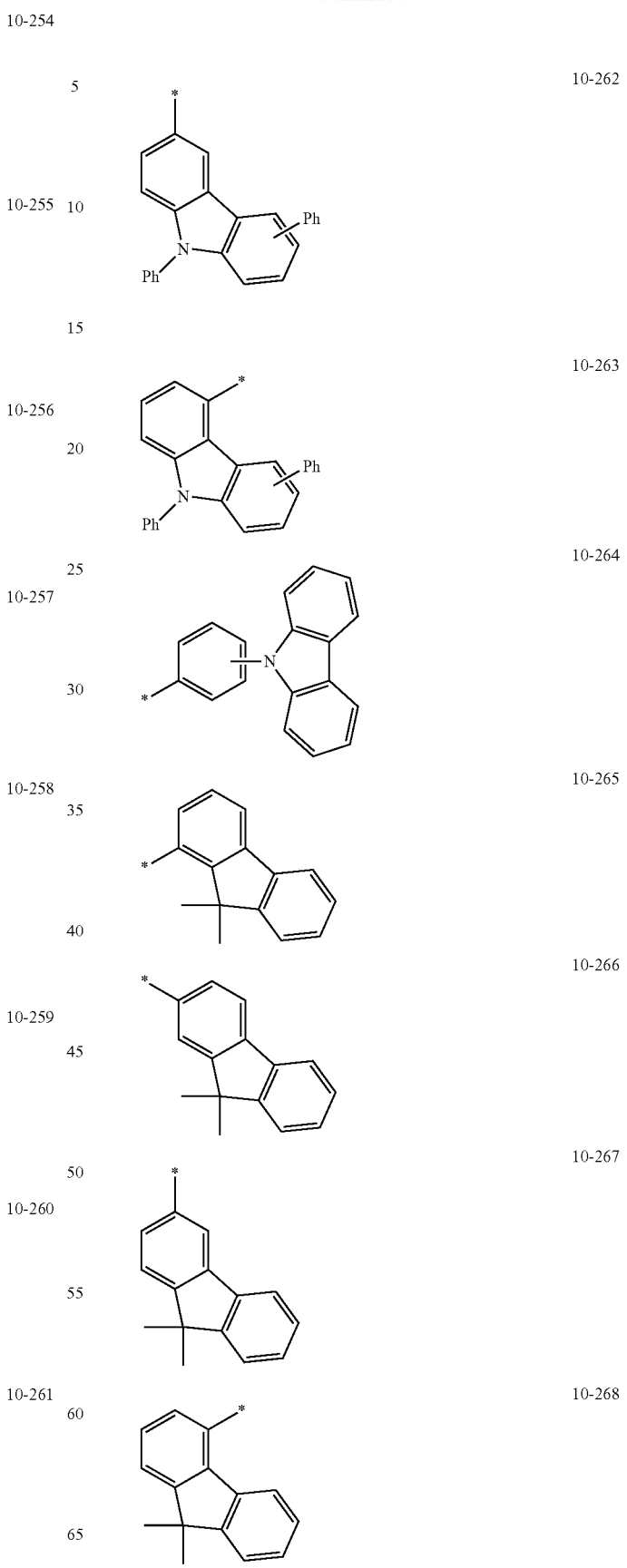

-continued
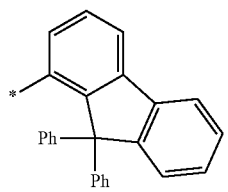 
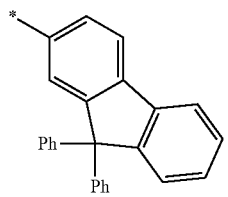
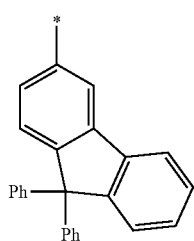
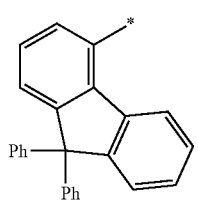
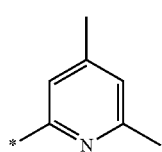
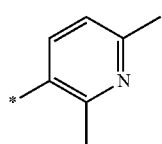
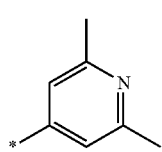
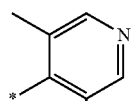
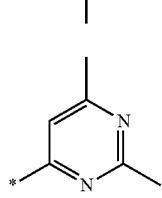
-continued
10-269 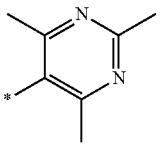 10-278
10-270 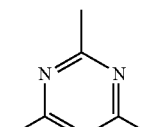 10-279
10-271 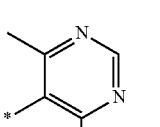 10-280
 10-281
10-272 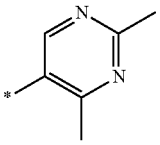 10-282
10-273 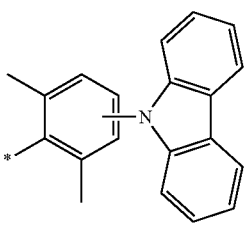 10-283
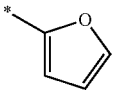 
10-274 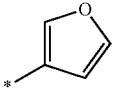 10-284
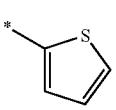 10-285
10-275 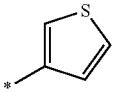 10-286
10-276 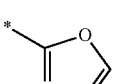 10-287
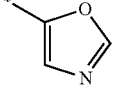 10-288
10-277 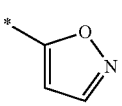 10-289

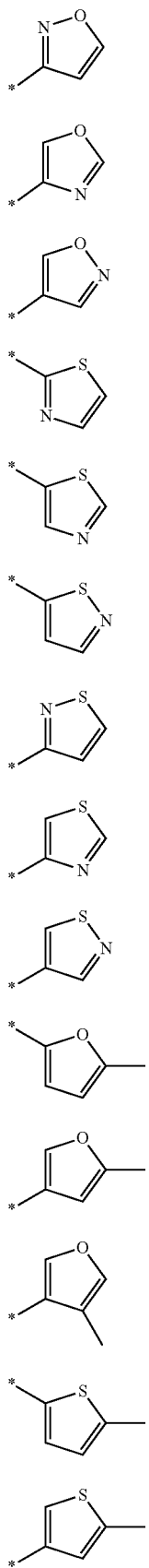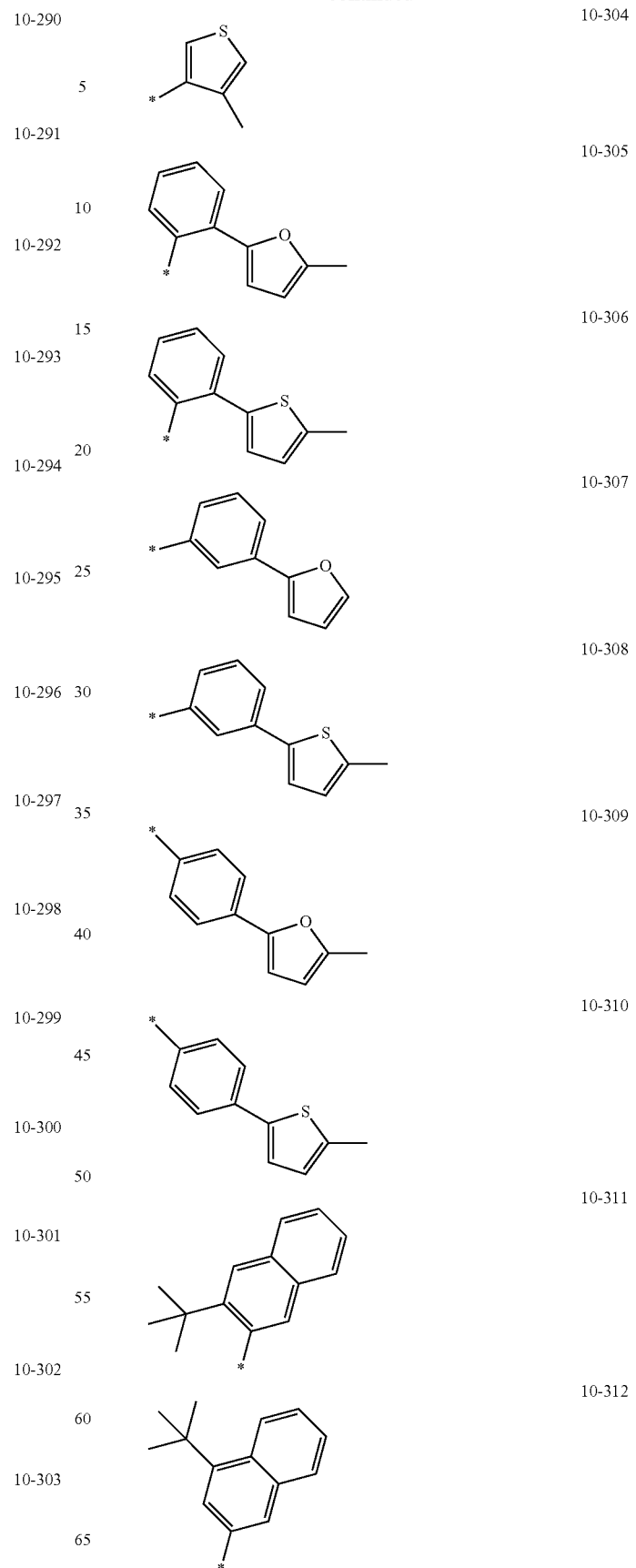

-continued
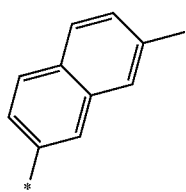
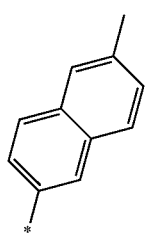
10-313
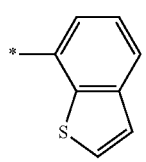
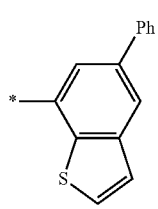
10-314
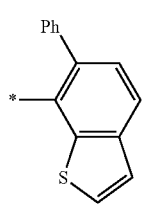
10-315
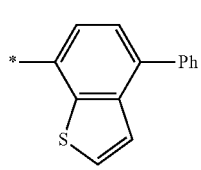
10-316
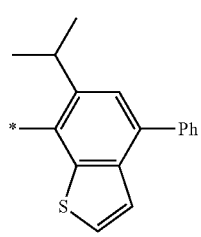
10-317
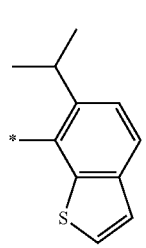
10-318
-continued
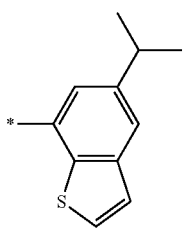
10-321
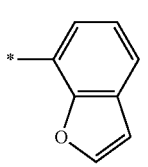
10-322
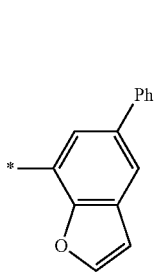
10-323
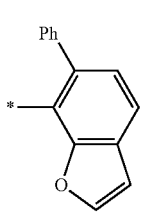
10-324
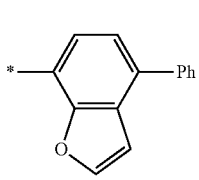
10-325
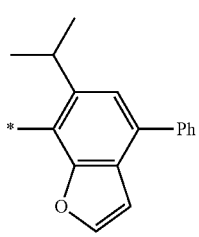
10-326
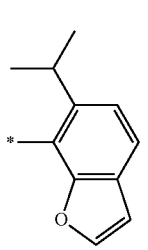
10-327
10-319
10-320

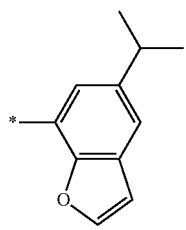
10-328
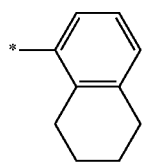
10-329
10-330
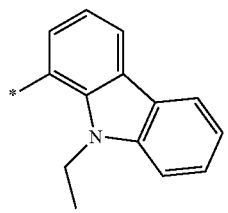
10-331
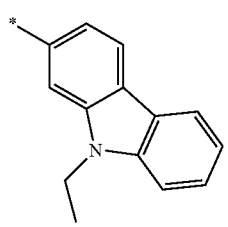
10-332
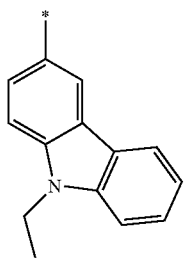
10-333
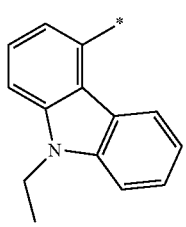
10-334
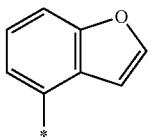
10-335
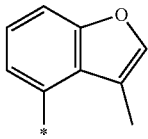
10-336
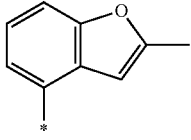
10-337
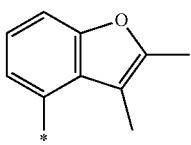
10-338
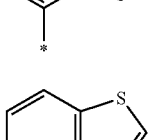
10-339
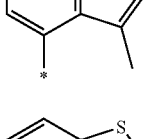
10-340
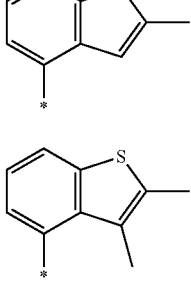
10-341
10-342
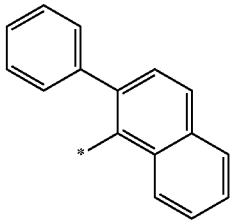
10-343
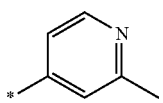
10-344

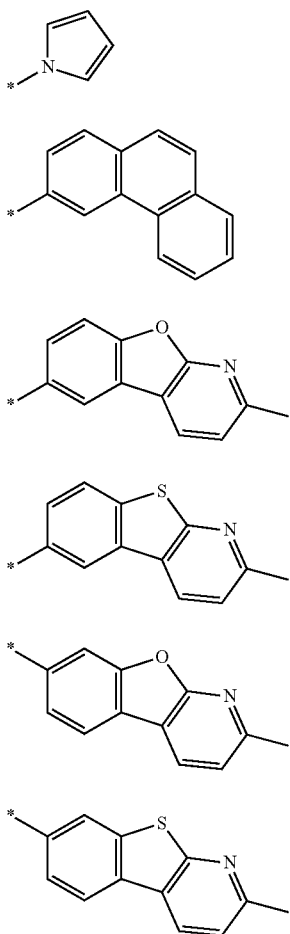

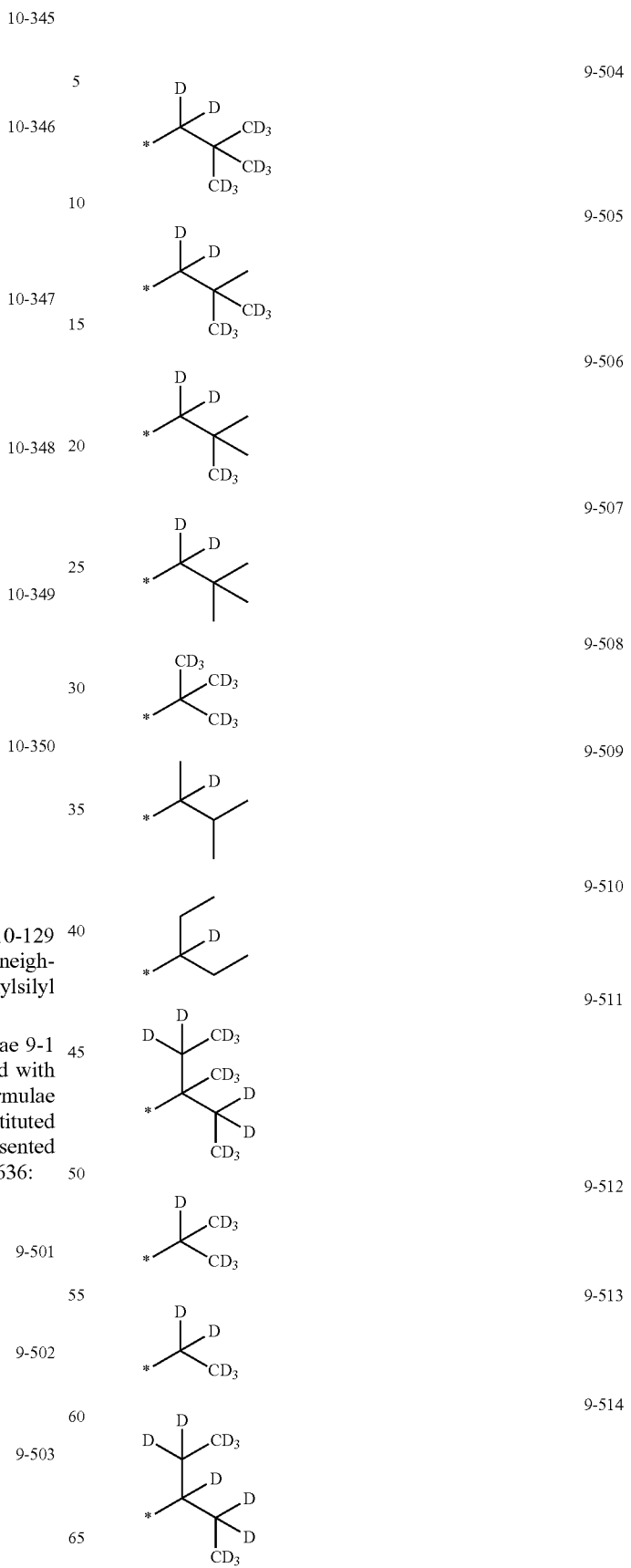

* in Formulae 9-1 to 9-39, 9-201 to 9-237, 10-1 to 10-129 and 10-201 to 10-350 indicates a binding site to a neighboring atom, Ph is a phenyl group, TMS is a trimethylsilyl group, and TMG is a trimethylgermyl group.

The terms "a group represented by one of Formulae 9-1 to 9-39 in which at least one hydrogen is substituted with deuterium" and "a group represented by one of Formulae 9-201 to 9-237 in which at least one hydrogen is substituted with deuterium" may be, for example, a group represented by one of Formulae 9-501 to 9-514 and 9-601 to 9-636:

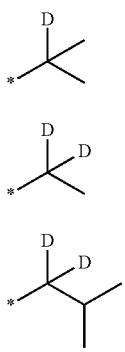

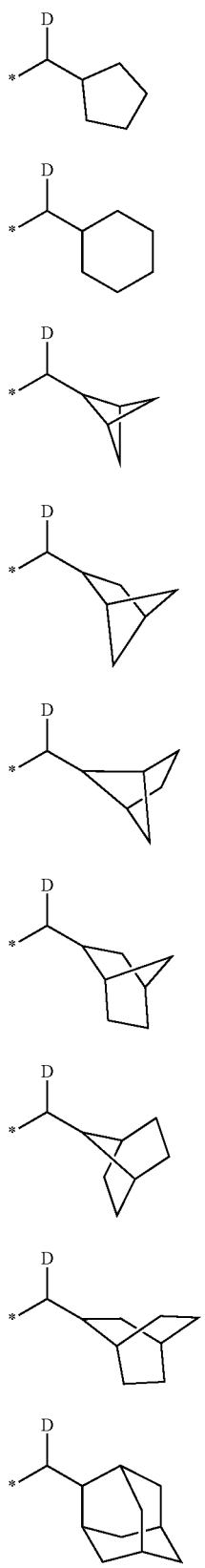
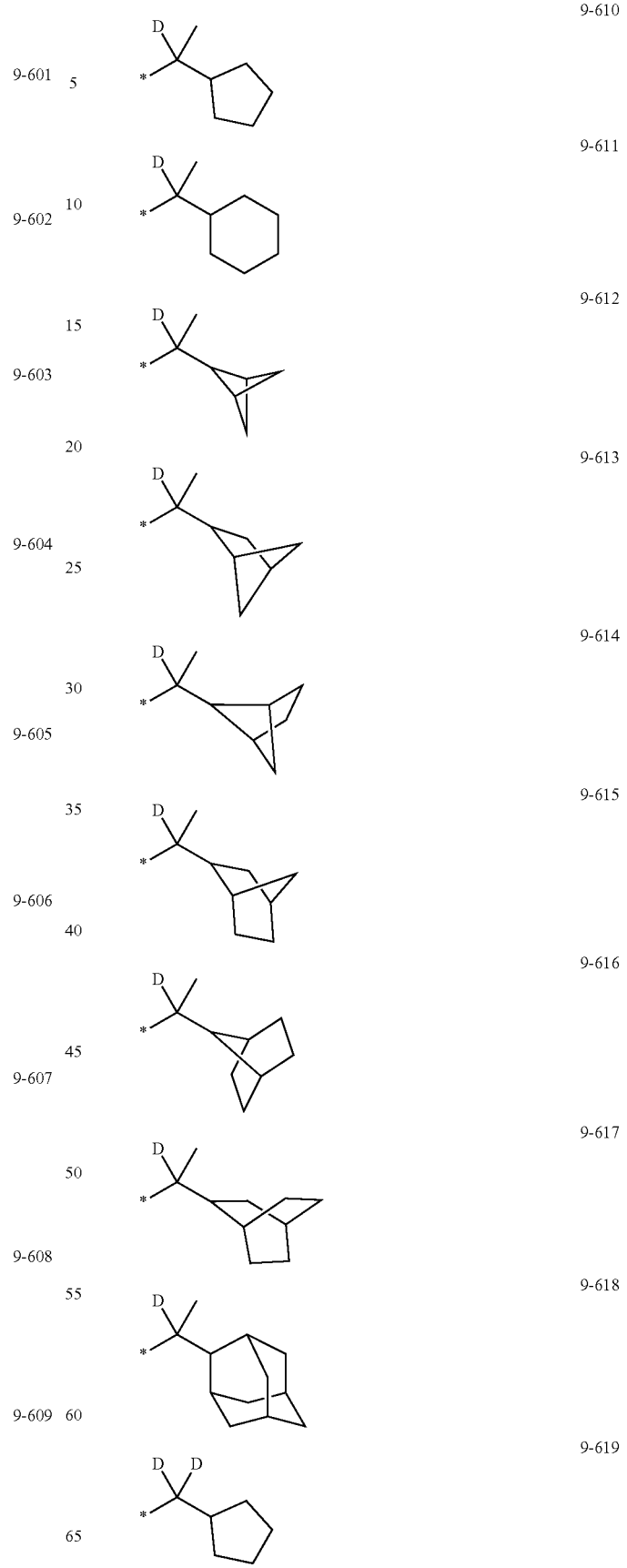

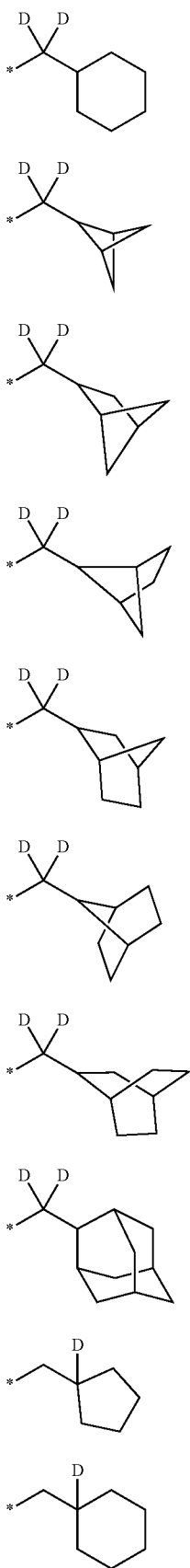
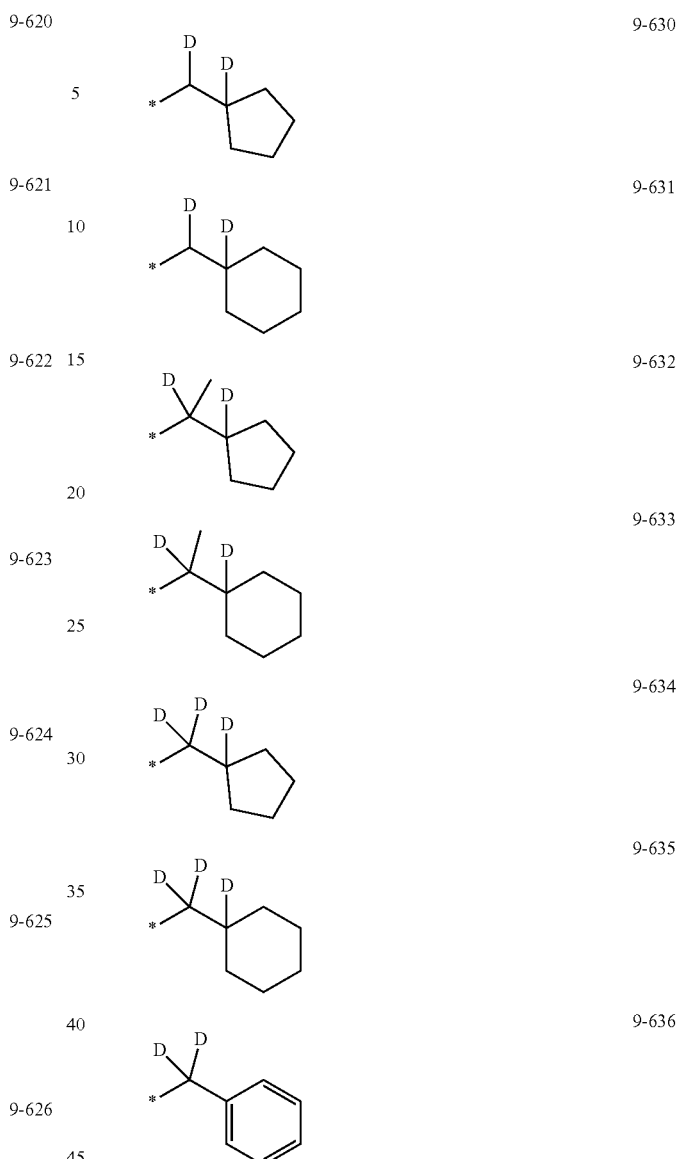
The terms "a group represented by one of Formulae 10-1 to 10-129 in which at least one hydrogen is substituted with deuterium" and "a group represented by one of Formulae 10-201 to 10-350 in which at least one hydrogen is substituted with deuterium" may be, for example, a group represented by one of Formulae 10-501 to 10-553:
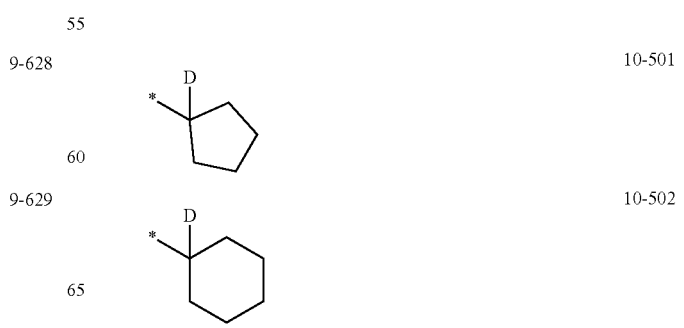

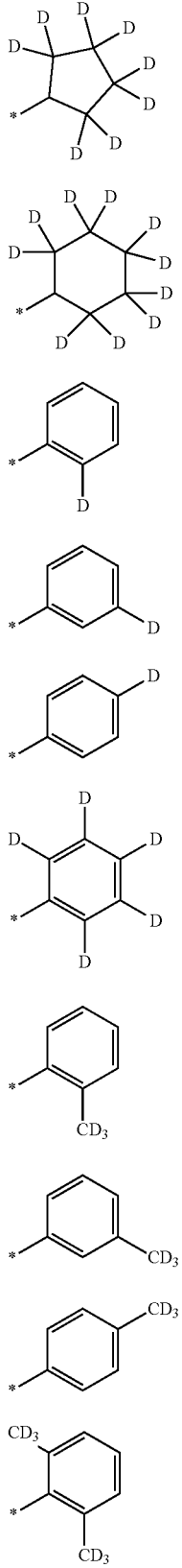
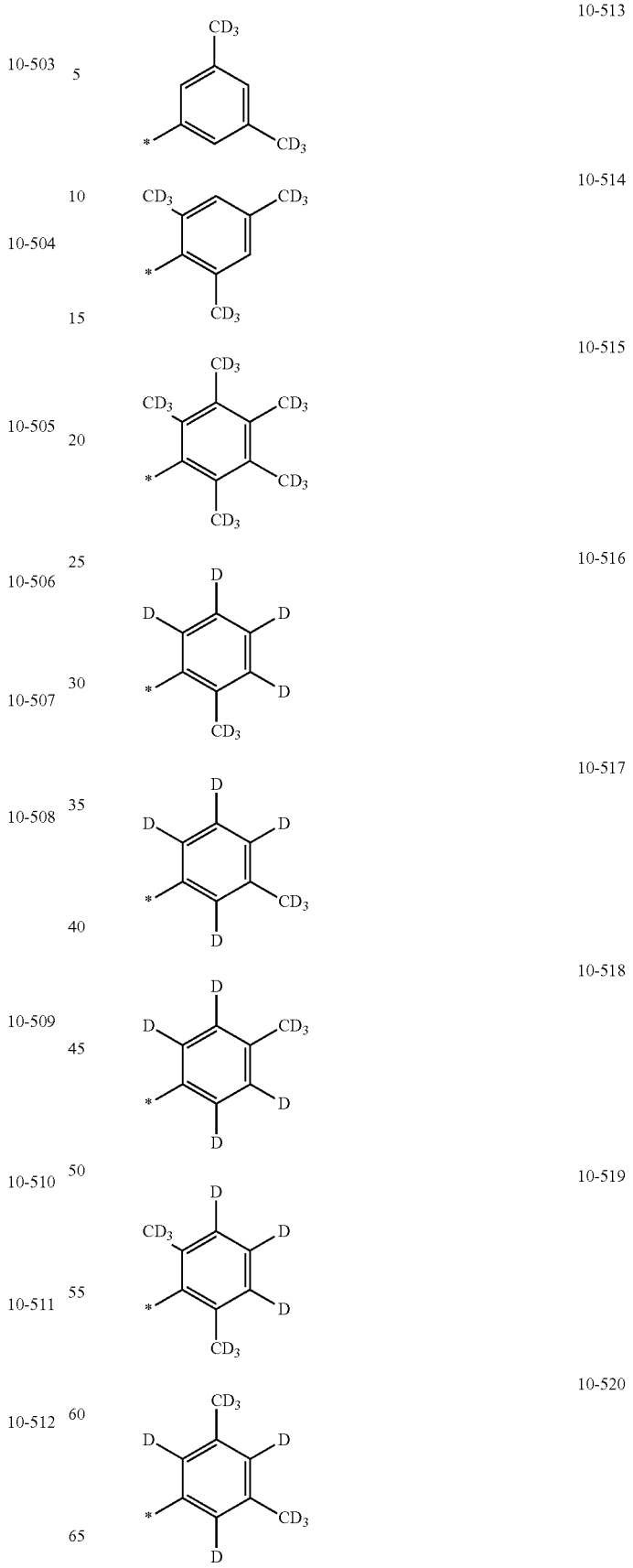

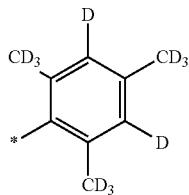 10-521
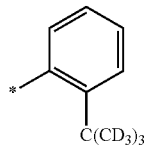 10-522
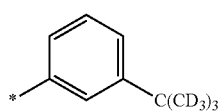 10-523
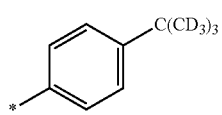 10-524
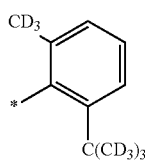 10-525
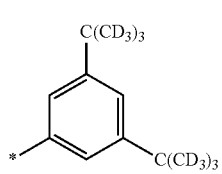 10-526
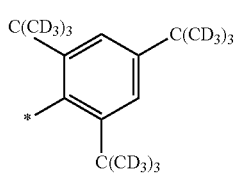 10-527
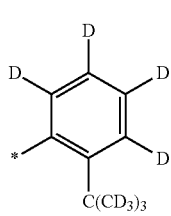 10-528
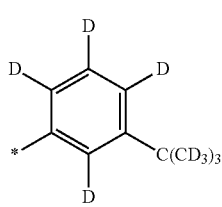 10-529
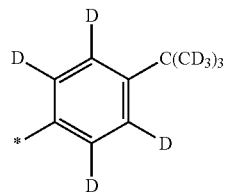 10-530
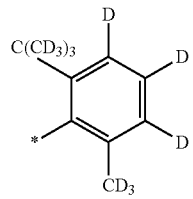 10-531
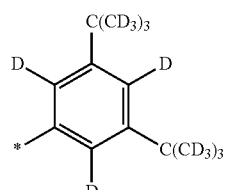 10-532
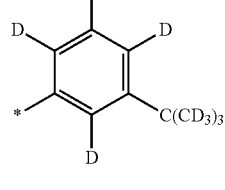 10-533
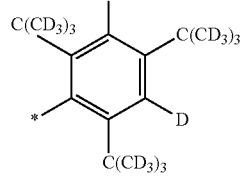 10-534
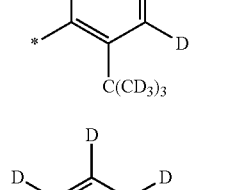 10-535
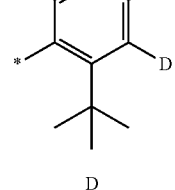 
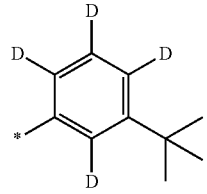 
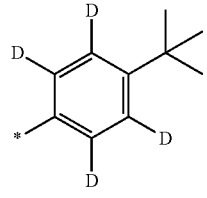 10-536

10-537 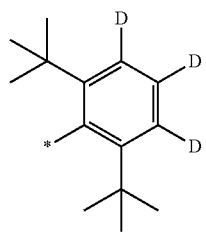
10-538 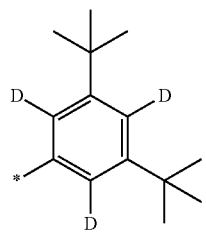
10-540 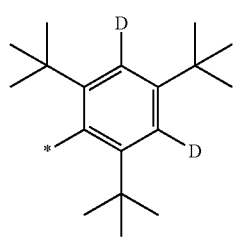
10-541 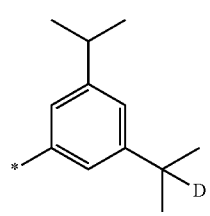
10-542 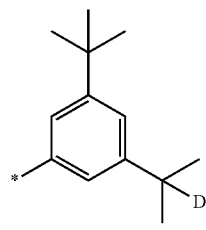
10-543 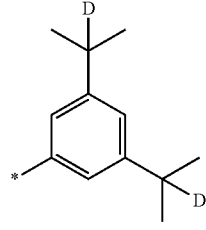
10-544 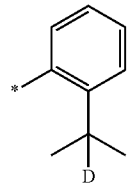
10-545 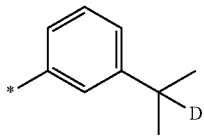
10-546 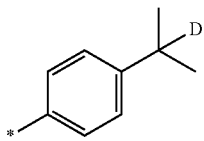
10-547 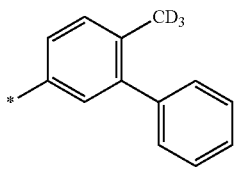
10-548 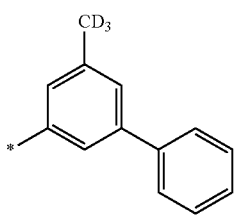
10-549 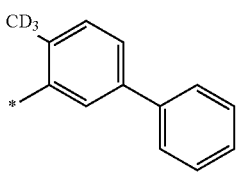
10-550 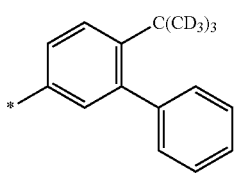
10-551 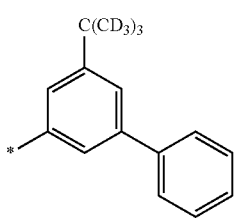
10-552 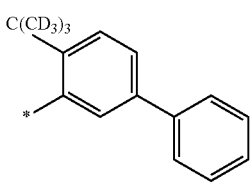

-continued 10-553

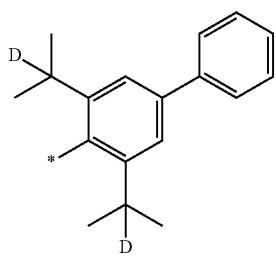

In one or more embodiments, in Formula 1, at least one of $R_2$(s) in the number of a2, at least one of $R_4$(s) in the number of a4, or any combination thereof may each independently be an unsubstituted or substituted $C_1$-$C_{60}$ alkyl group or an unsubstituted or substituted $C_3$-$C_{10}$ cycloalkyl group.

In one or more embodiments, in Formula 1, at least one of $R_2$(s) in the number of a2 may each independently be an unsubstituted or substituted $C_1$-$C_{60}$ alkyl group or an unsubstituted or substituted $C_3$-$C_{10}$ cycloalkyl group.

In one or more embodiments, in Formula 1, at least one of $R_4$(s) in the number of a4 may each independently be an unsubstituted or substituted $C_1$-$C_{60}$ alkyl group or an unsubstituted or substituted $C_3$-$C_{10}$ cycloalkyl group.

In one or more embodiments, in Formula 1, at least one of $R_2$(s) in the number of a2 and at least one of $R_4$(s) in the number of a4 may each independently be an unsubstituted or substituted $C_1$-$C_{60}$ alkyl group or an unsubstituted or substituted $C_3$-$C_{10}$ cycloalkyl group.

The organometallic compound represented by Formula 1 may satisfy one of Condition 1 to Condition 3 and/or, one of Condition 4 to Condition 6:

Condition 1

$T_1$ may be neither a single bond nor a double bond, a group represented by

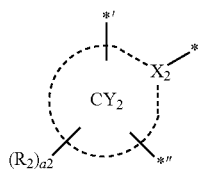

may be a group represented by Formula A2-1, and a group represented by

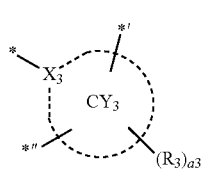

may be a group represented by Formula A3-1 or A3-2.

Condition 2

$T_1$ may be a single bond or a double bond, a group represented by

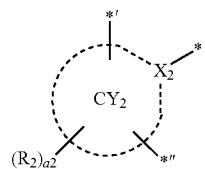

may be a group represented by Formula A2-2, and a group represented by

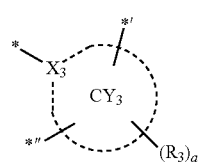

may be a group represented by one of Formulae A3-1 or A3-2.

Condition 3

$T_1$ may be a single bond or a double bond, a group represented by

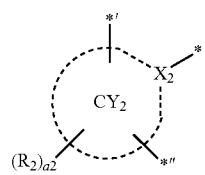

may be a group represented by Formula A2-1, and a group represented by

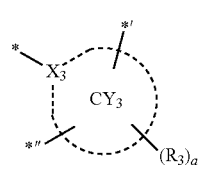

may be a group represented by Formula A3-3.

Condition 4

$T_2$ may be a single bond or a double bond, a group represented by

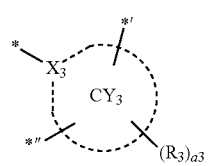

may be a group represented by Formula A3-2, and a group represented by

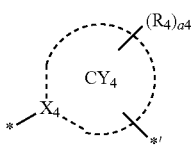

may be a group represented by Formula A4-1.

Condition 5

$T_2$ may be a single bond or a double bond, a group represented by

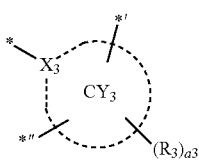

may be a group represented by Formulae A3-1 or A3-3, and a group represented by

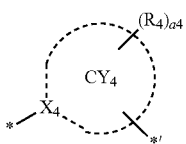

may be a group represented by Formula A4-2.

Condition 6

$T_2$ may be neither a single bond nor a double bond, a group represented by

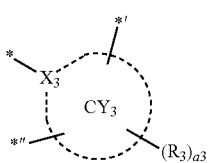

may be a group represented by Formulae A3-1 or A3-3, and a group represented by

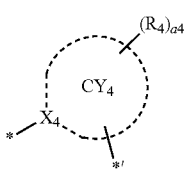

may be a group represented by Formula A4-1.

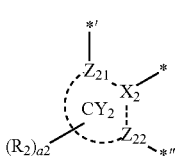
A2-1

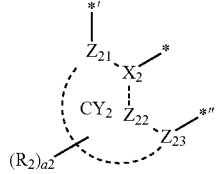
A2-2

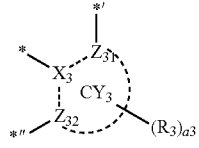
A3-1

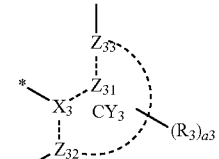
A3-2

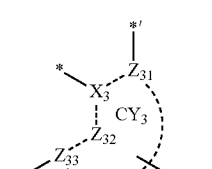
A3-3

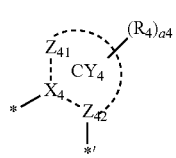
A4-1

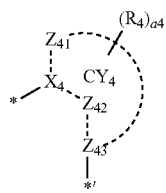
A4-2

In Formulae A2-1, A2-2, A3-1, A3-2, A3-3, A4-1, and A4-2, $X_2$ to $X_4$, $R_2$ to $R_4$ and a2 to a4 are the same as described in the present specification, $Z_{21}$ to $Z_{23}$, $Z_{31}$ to $Z_{33}$, and $Z_{41}$ to $Z_{43}$ may each independently be C or N, a bond between $Z_{21}$ and $X_2$, a bond between $X_2$ and $Z_{22}$, a bond between $Z_{22}$ and $Z_{23}$, a bond between $Z_{31}$ and $X_3$, a bond between $X_3$ and $Z_{32}$, a bond between $Z_{31}$ and $Z_{33}$, a bond between $Z_{32}$ and $Z_{33}$, a bond between $Z_{41}$ and $X_4$, a bond between $X_4$ and $Z_{42}$, and a bond between $Z_{42}$ and $Z_{23}$ are each a chemical bond, in Formulae A2-1 and A2-2, * indicates a binding site to M in Formula 1, *' indicates a binding site to a neighboring nitrogen atom in Formula 1, and *''' indicates a binding site to $T_1$ in Formula 1, in Formulae A3-1 to A3-3, * indicates a binding site to M in Formula 1, *''' indicates a binding site to $T_1$ in Formula 1, and *' indicates a binding site to $T_2$ in Formula 1, and in Formulae A4-1 and A4-2, * indicates a binding site to M in Formula 1, and *' indicates a binding site to T₂ in Formula 1.
In one or more embodiments, a group represented by
in Formula 1 may be a group represented by one of Formulae A2-1(1) to A2-1(17):
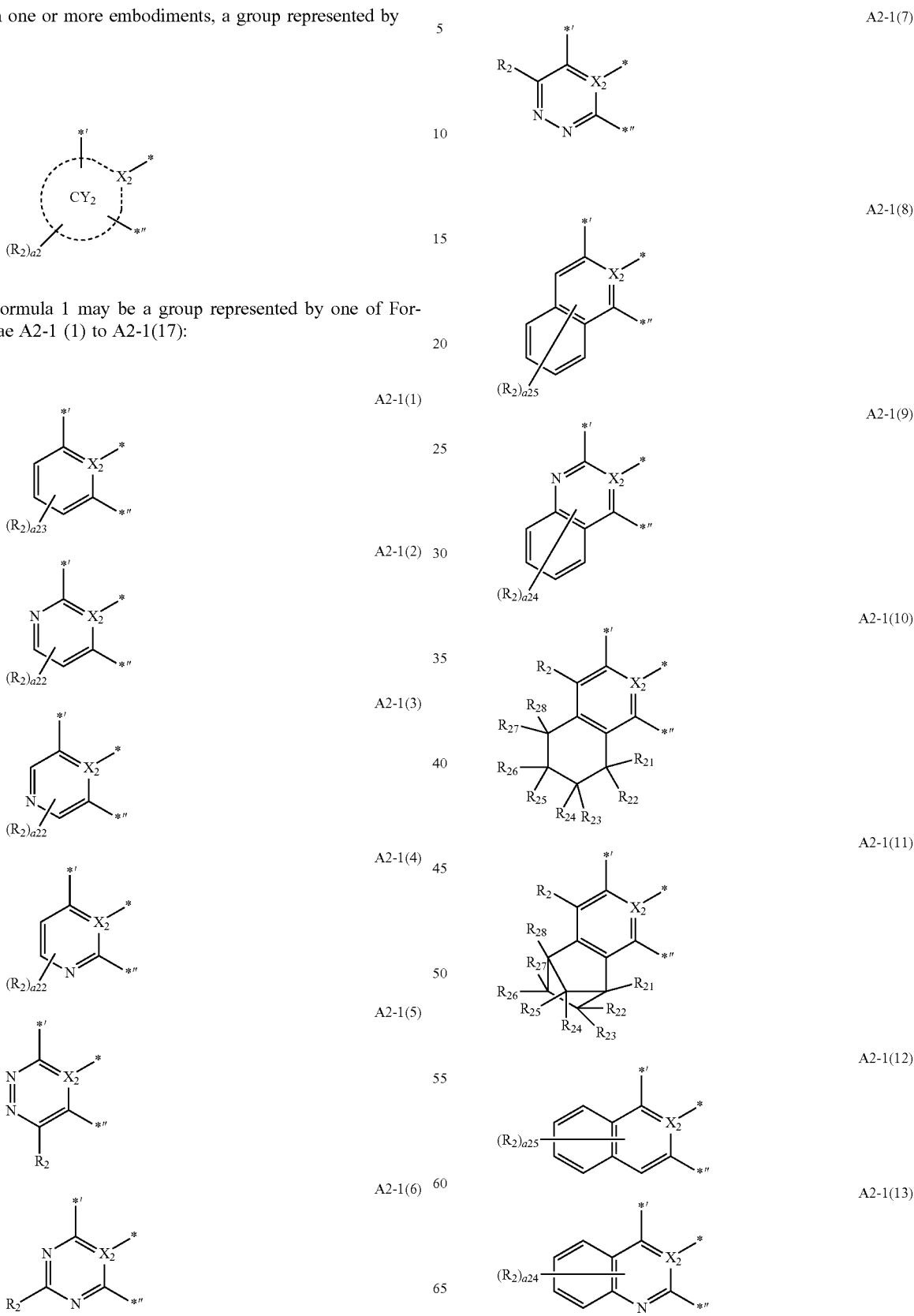

-continued

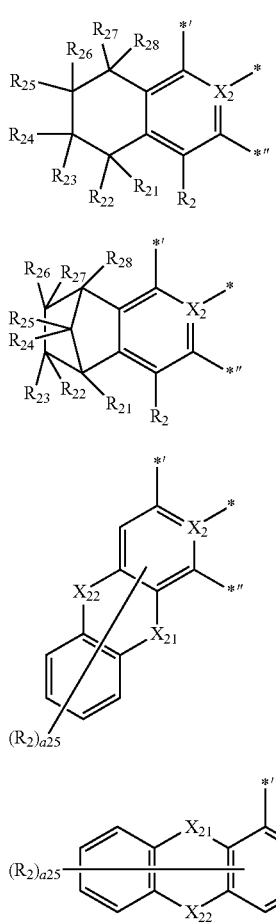

A2-1(14)

A2-1(15)

A2-1(16)

A2-1(17)

wherein, in Formulae A2-1 (1) to A2-1(17),
$X_2$ and $R_2$ are the same as described above,
$X_{21}$ is a single bond, O, S, $N(R_{21})$, $C(R_{21})(R_{22})$, or $Si(R_{21})(R_{22})$, and $X_{22}$ is a single bond, O, S, $N(R_{23})$, $C(R_{23})(R_{24})$, or $Si(R_{23})(R_{24})$, wherein at least one of $X_{21}$ and $X_{22}$ is not a single bond,
$R_{21}$ to $R_{28}$ are the same as described in connection with $R_2$,
a25 may be an integer from 0 to 5,
a24 may be an integer from 0 to 4,
a23 may be an integer from 0 to 3,
a22 may be an integer from 0 to 2,
\* indicates a binding site to M in Formula 1,
\*' indicates a binding site to a neighboring nitrogen atom in Formula 1, and
\*" indicates a binding site to $T_1$ in Formula 1.

In one or more embodiments, a group represented by

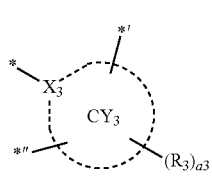

in Formula 1 may be a group represented by one of Formulae A3-1(1) to A3-1(17) and A3-2(1) to A3-2(7):

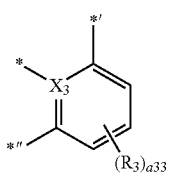

A3-1(1)

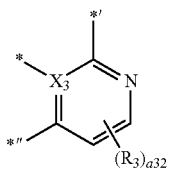

A3-1(2)

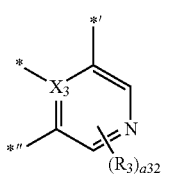

A3-1(3)

A3-1(4)

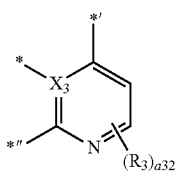

A3-1(5)

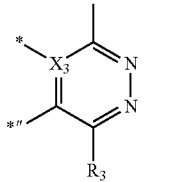

A3-1(6)

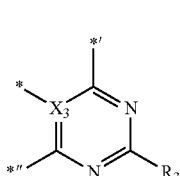

A3-1(7)

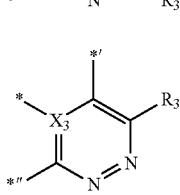

A3-1(8)

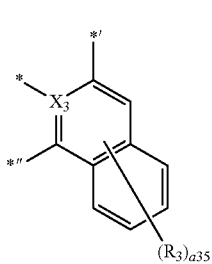

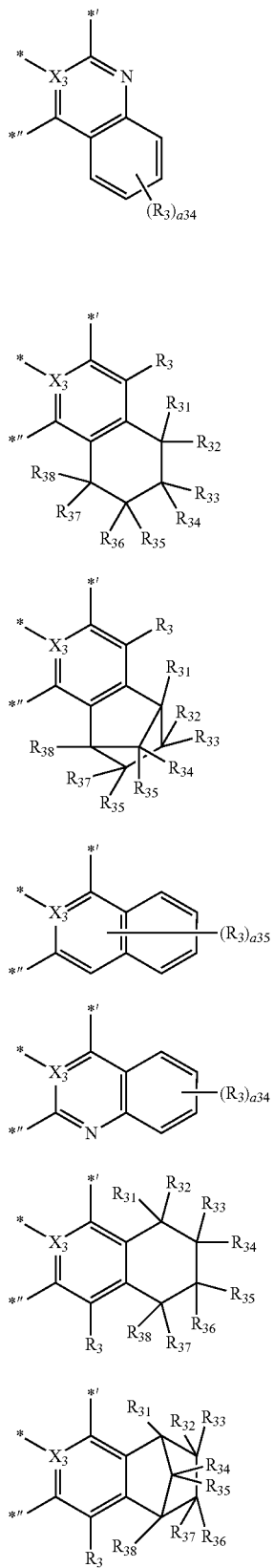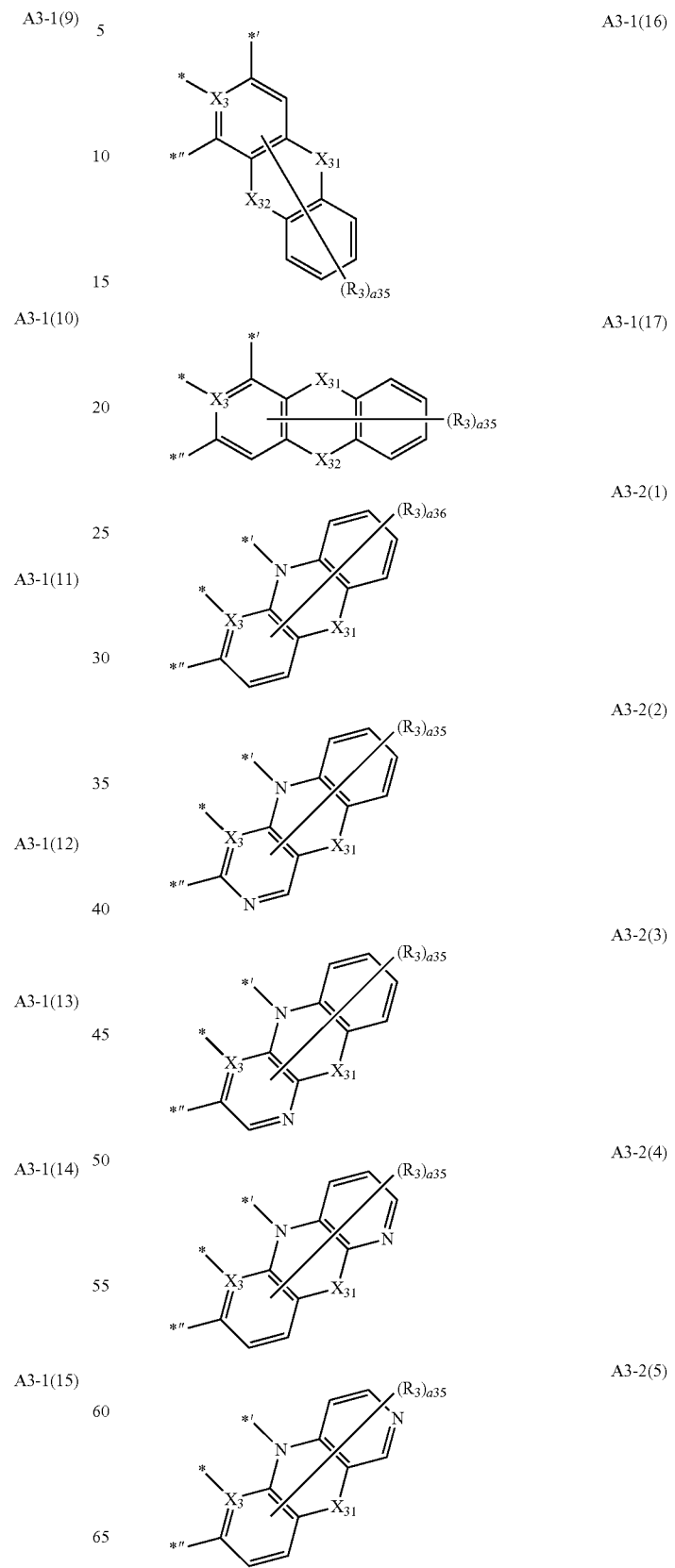

-continued

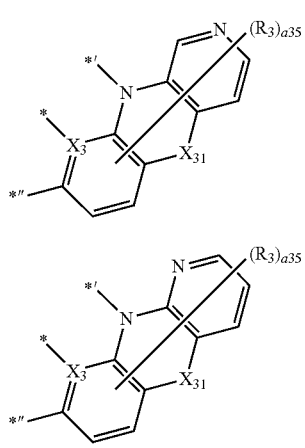

A3-2(6)

A3-2(7)

wherein, in Formulae A3-1(1) to A3-1(17) and A3-2(1) to A3-2(7), $X_3$ and $R_3$ are the same as described above, $X_{31}$ may be single bond, O, S, $N(R_{31})$, $C(R_{31})(R_{32})$, r $Si(R_{31})(R_{32})$, and $X_{32}$ may be a single bond, O, S, $N(R_{33})$, $C(R_{33})(R_{34})$, or $Si(R_{33})(R_{34})$, and at least one of $X_{31}$ and $X_{32}$ of Formula A3-1(16) and A3-1(17) may not be a single bond, $R_{31}$ to $R_{38}$ are the same as described in connection with $R_3$, a36 may be an integer from 0 to 6,
a35 may be an integer from 0 to 5,
a34 may be an integer from 0 to 4,
a33 may be an integer from 0 to 3,
a32 may be an integer from 0 to 2, \* indicates a binding site to M in Formula 1,
\*' indicates a binding site to $T_2$ in Formula 1,
\*'' indicates a binding site to $T_1$ in Formula 1.

In one or more embodiments, a group represented by

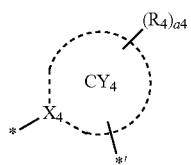

in Formula 1 may be a group represented by one of Formulae A4-1(1) to A4-1(26) and A4-2(1) to A4-2(8):

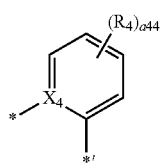

A4-1(1)

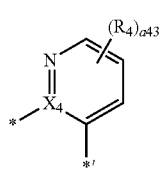

A4-1(2)

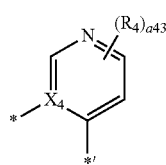

A4-1(3)

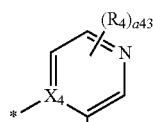

A4-1(4)

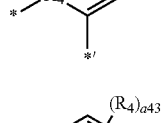

A4-1(5)

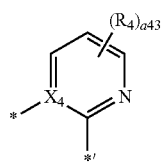

A4-1(6)

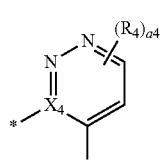

A4-1(7)

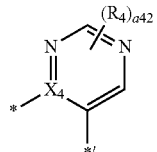

A4-1(8)

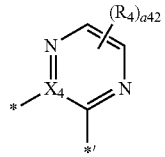

A4-1(9)

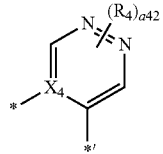

A4-1(10)

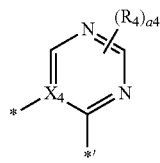

A4-1(11)

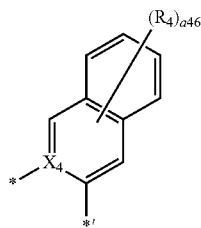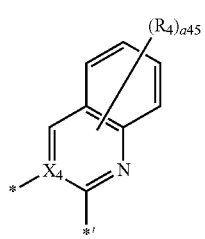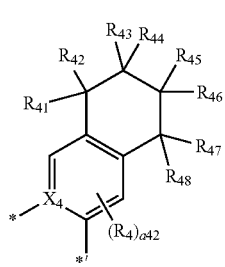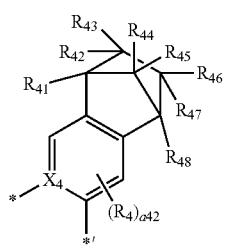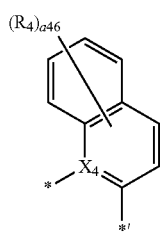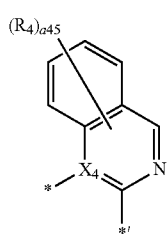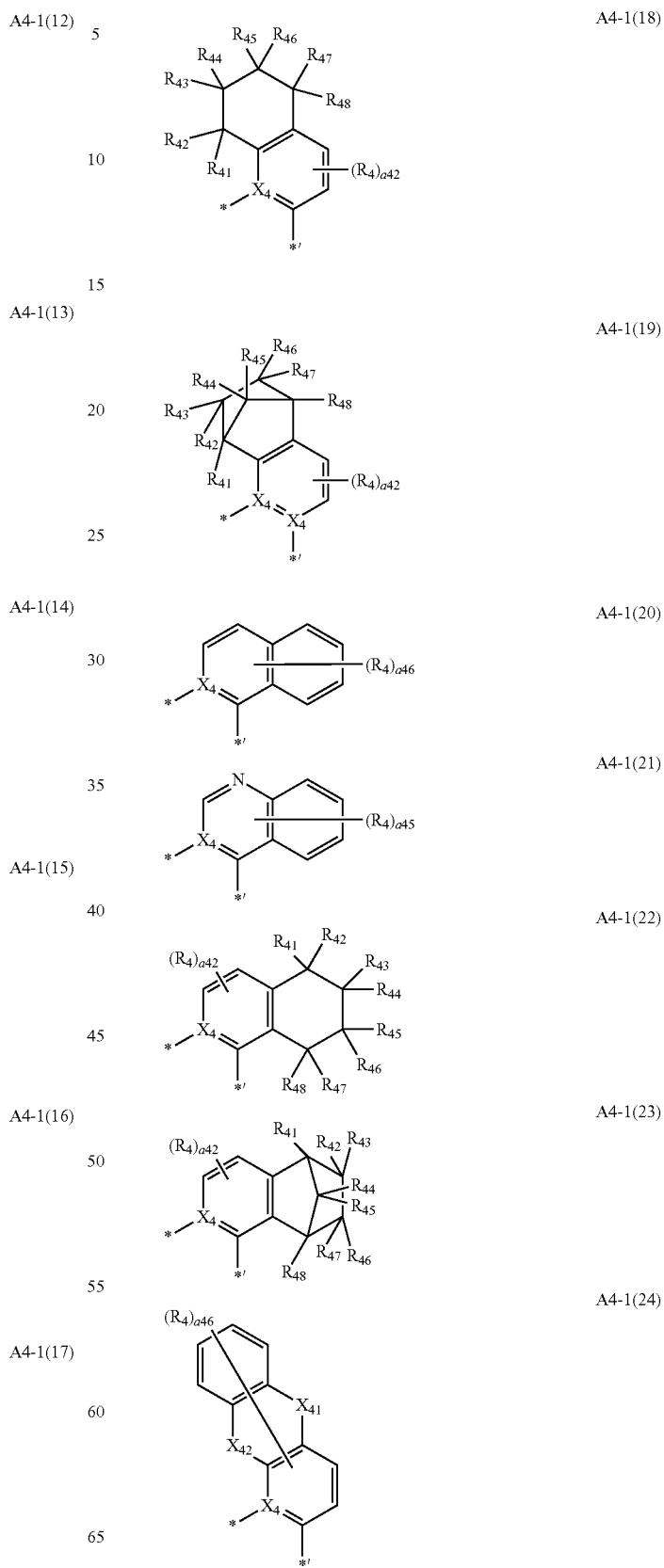

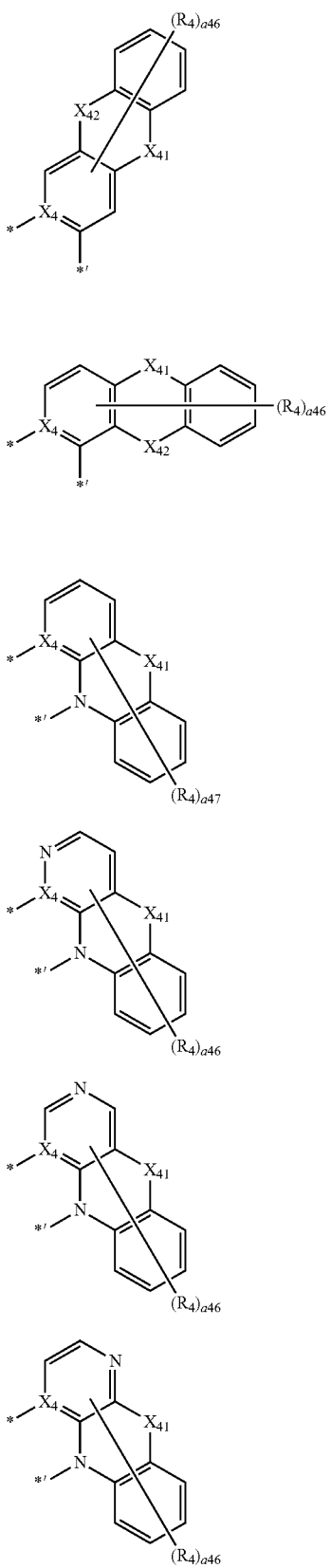
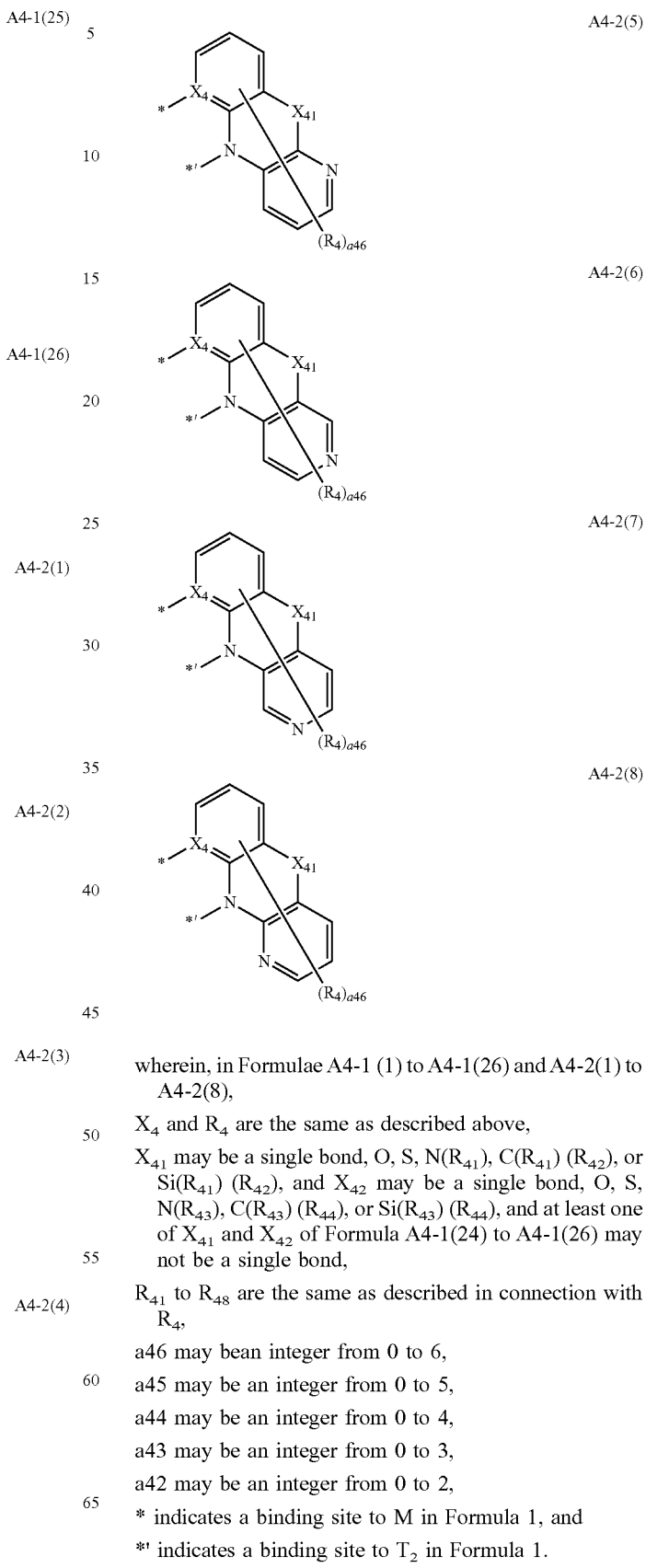

wherein, in Formulae A4-1 (1) to A4-1(26) and A4-2(1) to A4-2(8), $X_4$ and $R_4$ are the same as described above, $X_{41}$ may be a single bond, O, S, N($R_{41}$), C($R_{41}$) ($R_{42}$), or Si($R_{41}$) ($R_{42}$), and $X_{42}$ may be a single bond, O, S, N($R_{43}$), C($R_{43}$) ($R_{44}$), or Si($R_{43}$) ($R_{44}$), and at least one of $X_{41}$ and $X_{42}$ of Formula A4-1(24) to A4-1(26) may not be a single bond, $R_{41}$ to $R_{48}$ are the same as described in connection with $R_4$, a46 may be an integer from 0 to 6, a45 may be an integer from 0 to 5, a44 may be an integer from 0 to 4, a43 may be an integer from 0 to 3, a42 may be an integer from 0 to 2,

* indicates a binding site to M in Formula 1, and

*' indicates a binding site to $T_2$ in Formula 1.

In one or more embodiments, in Formula 1,
a group represented by

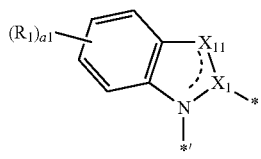

may be a group represented by one of Formulae CY1-1 to CY1-15, and/or
a group represented by

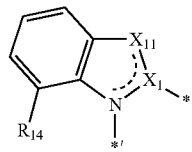

may be a group represented by one of Formulae CY2-1 to CY2-8, and/or
a group represented by

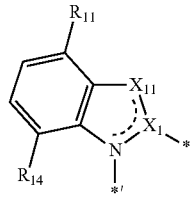

may be a group represented by one of Formulae CY3-1 to CY3-16, and/or
a group represented by

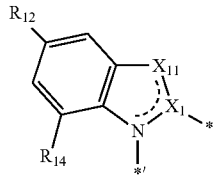

may be a group represented by one of Formulae CY4-1 to CY4-24:

CY1-1

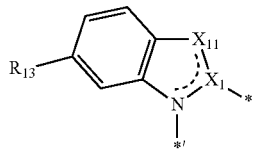

CY1-2

CY1-3

CY1-4

CY1-5

CY1-6

CY1-7

CY1-8

CY1-9

CY1-10

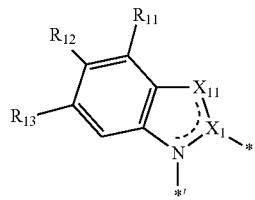 CY1-11
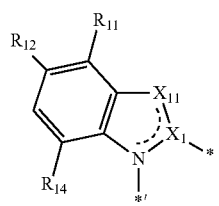 CY1-12
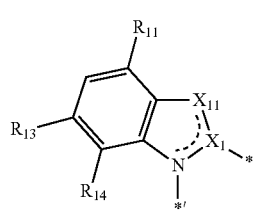 CY1-13
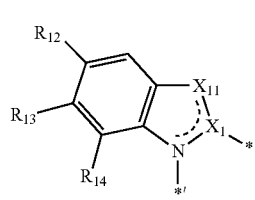 CY1-14
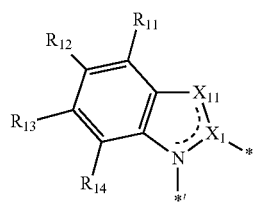 CY1-15
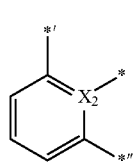 CY2-1
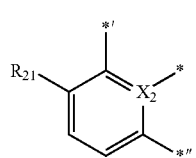 CY2-2
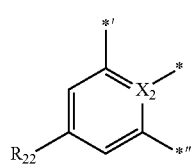 CY2-3
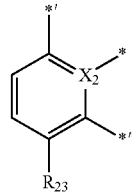 CY2-4
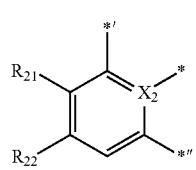 CY2-5
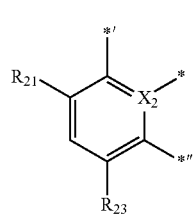 CY2-6
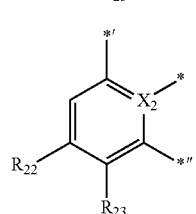 CY2-7
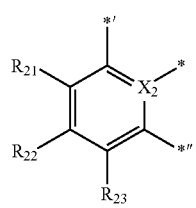 CY2-8
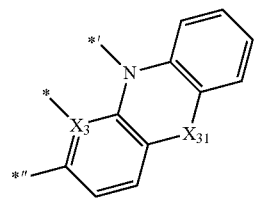 CY3-1
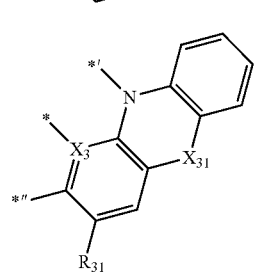 CY3-2

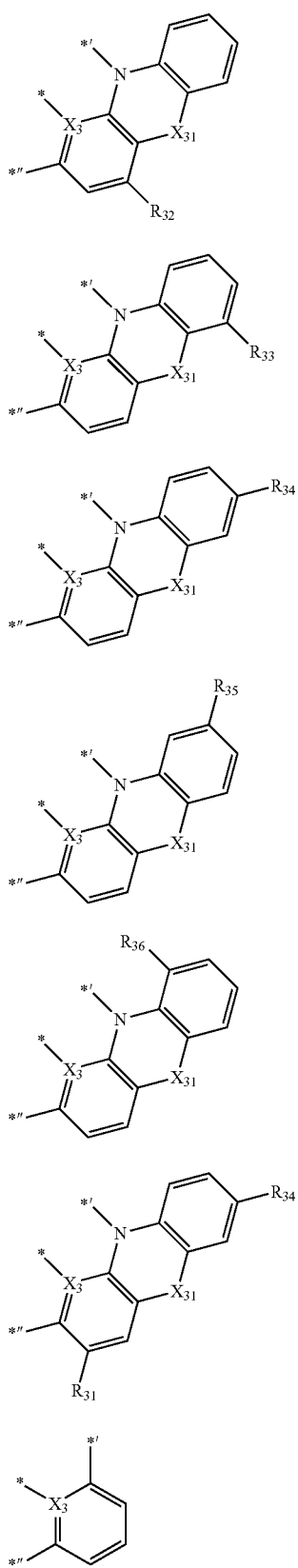
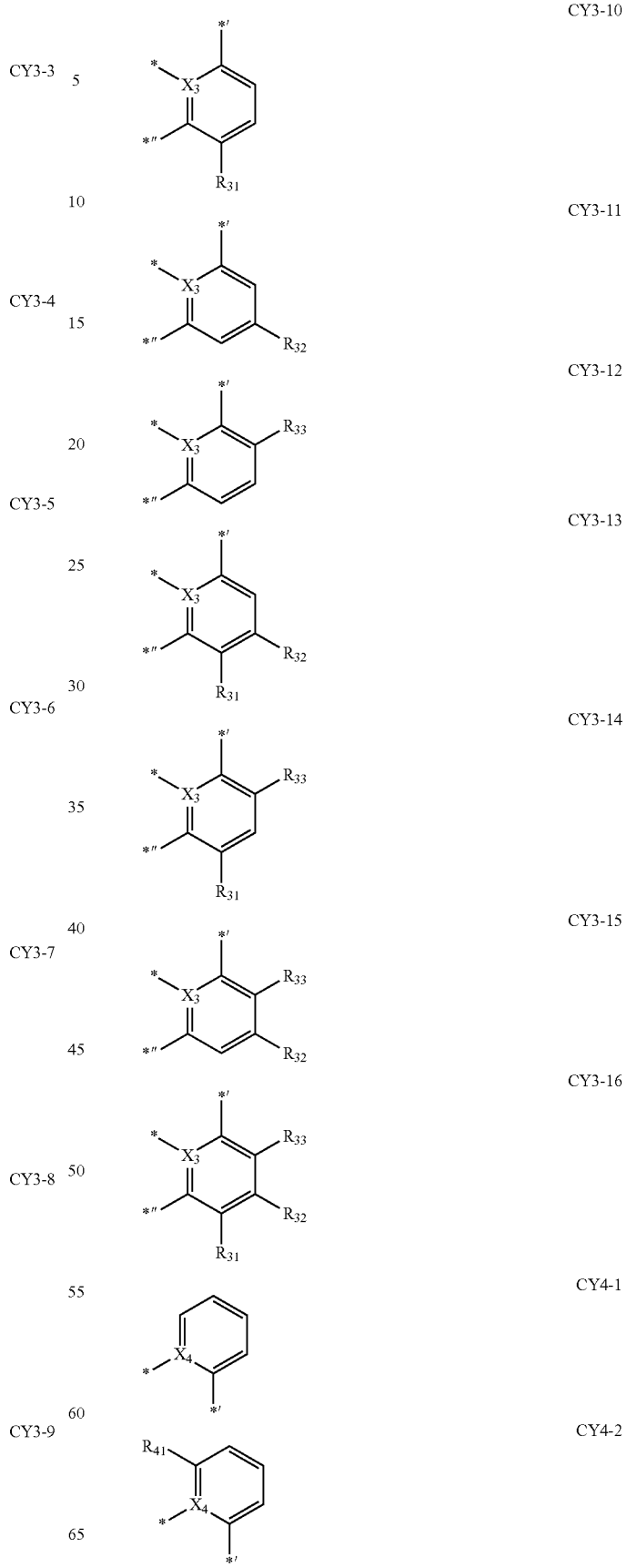

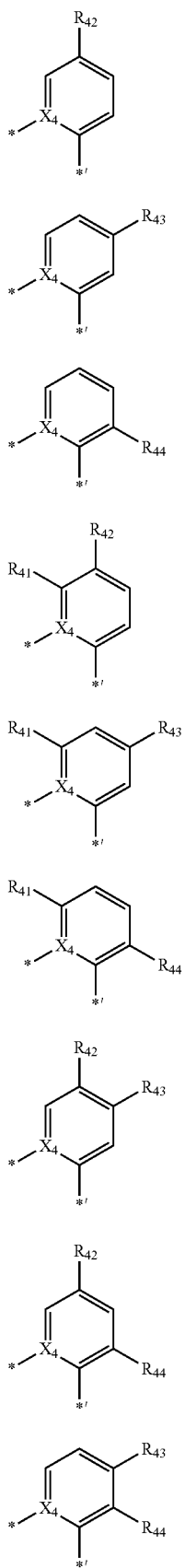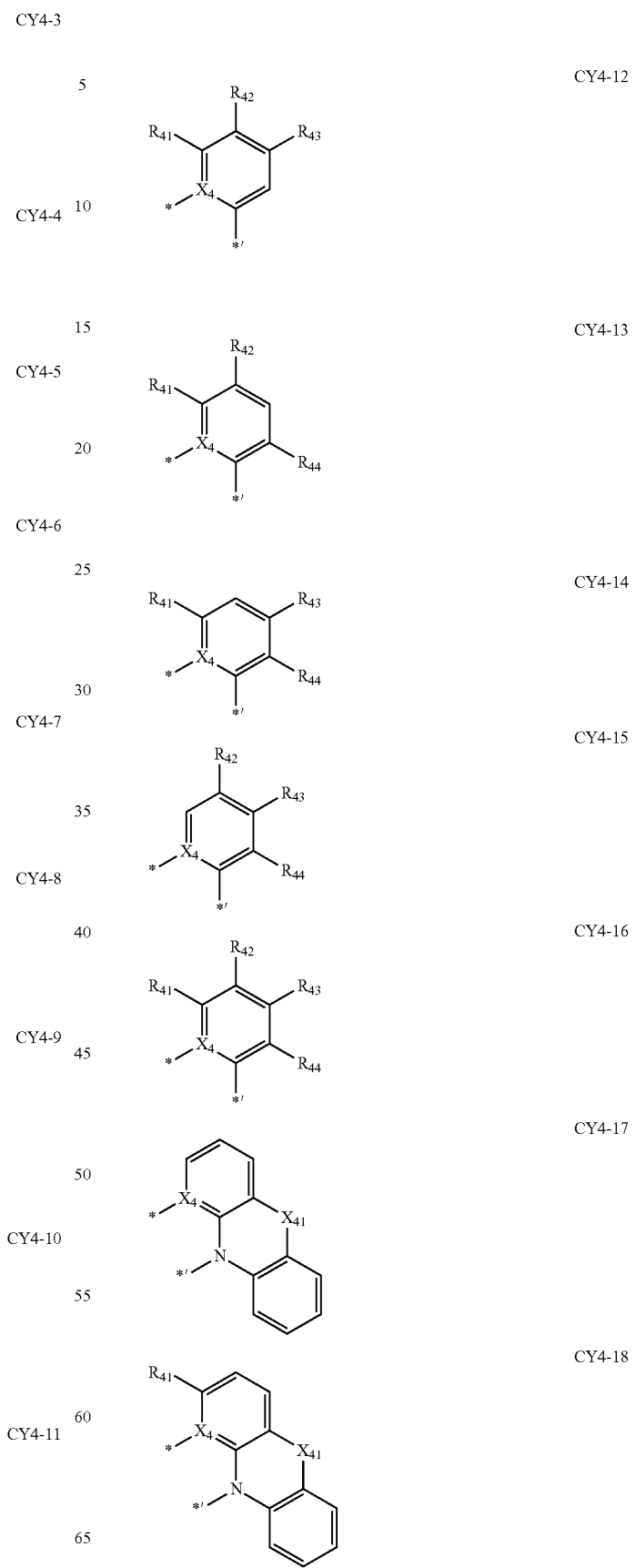

CY4-19
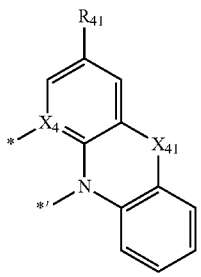

CY4-20
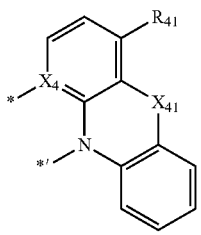

CY4-21
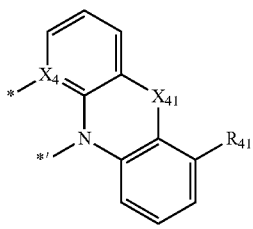

CY4-22
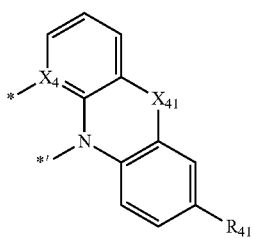

CY4-23
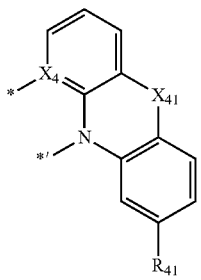

CY4-24
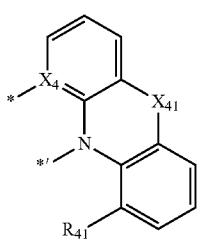

wherein, in Formulae CY1-1 to CY1-15, CY2-1 to CY2-8, CY3-1 to CY3-16, and CY4-1 to CY4-24, $X_1$ to $X_4$, $X_{11}$ and $R_1$ to $R_4$ are each the same as described above, $X_{31}$ may be a single bond, O, S, $N(R_{31})$, $C(R_{31})(R_{32})$, or $Si(R_{31})(R_{32})$, $X_{41}$ may be a single bond, O, S, $N(R_{41})$, $C(R_{41})(R_{42})$, or $Si(R_{41})(R_{42})$, $R_{11}$ to $R_{14}$ may each independently be a substituted or unsubstituted $C_1$-$C_{60}$ alkyl group, or a substituted or unsubstituted $C_3$-$C_{10}$ cycloalkyl group, $R_{21}$ to $R_{23}$ are the same as described in connection with $R_2$, $R_{31}$ to $R_{36}$ are the same as described in connection with $R_3$, $R_{41}$ to $R_{44}$ are the same as described in connection with $R_4$, and each of $R_{21}$ to $R_{23}$, $R_{31}$ to $R_{36}$, and $R_{41}$ to $R_{44}$ is not hydrogen, In Formulae CY1-1 to CY1-15, * indicates a binding site to M in Formula 1, and *' indicates a binding site to ring $CY_2$ in Formula 1, in Formulae CY2-1 to CY2-8, * indicates a binding site to M in Formula 1, *' indicates a binding site to a neighboring nitrogen atom in Formula 1, and *'' indicates a binding site to $T_1$ in Formula 1, in Formulae CY3-1 to CY3-16, * indicates a binding site to M in Formula 1, *'' indicates a binding site to $T_1$ in Formula 1, and *' indicates a binding site to $T_2$ in Formula 1, and in Formulae CY4-1 to CY4-24, * indicates a binding site to M in Formula 1, and *' indicates a binding site to $T_2$ in Formula 1.

In one or more embodiments, in Formula 1,
a group represented by

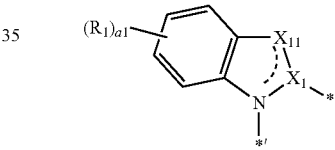

may be a group represented by one of Formulae CY1-3 and CY1-8, and/or
a group represented by

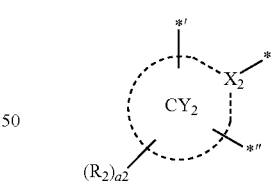

may be a group represented by one of Formulae CY2-1 and CY2-3, and/or
a group represented by

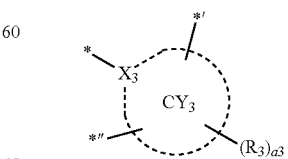

may be a group represented by Formula CY3-1, and/or a group represented by

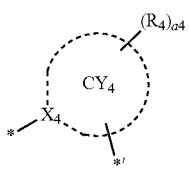

may be a group represented by one of Formulae CY4-1 and CY4-4.

In one or more embodiments, the organometallic compound may be represented by one of Formulae 1A to 1C:

Formula 1A

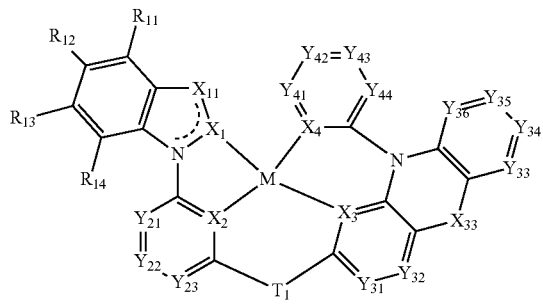

Formula 1B

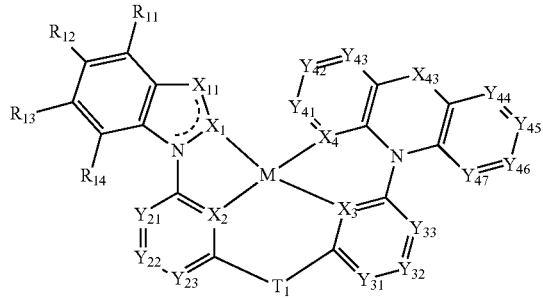

Formula 1C

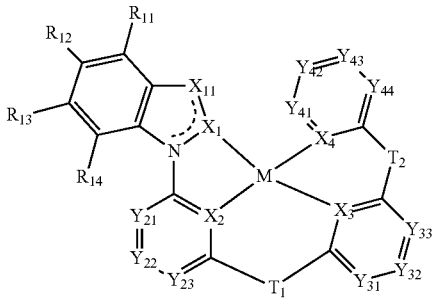

wherein, in Formulae 1A to 1C,

M, $X_1$ to $X_4$, $X_{11}$, $T_1$ and $T_2$ are the same as described above, and $T_2$ in Formula 1C may not be a single bond, $Y_{21}$ may be $C(R_{21})$ or N, $Y_{22}$ may be $C(R_{22})$ or N, $Y_{23}$ may be $C(R_{23})$ or N, $Y_{31}$ may be $C(R_{31})$ or N, $Y_{32}$ may be $C(R_{32})$ or N, $Y_{33}$ may be $C(R_{33})$ or N, $Y_{34}$ may be $C(R_{34})$ or N, $Y_{35}$ may be $C(R_{35})$ or N, $Y_{36}$ may be $C(R_{36})$ or N, $Y_{41}$ may be $C(R_{41})$ or N, $Y_{42}$ may be $C(R_{42})$ or N, $Y_{43}$ may be $C(R_{43})$ or N, $Y_{44}$ may be $C(R_{44})$ or N, $Y_{45}$ may be $C(R_{45})$ or N, $Y_{46}$ may be $C(R_{46})$ or N, $Y_{47}$ may be $C(R_{47})$ or N, $X_{33}$ may be a single bond, O, S, $N(R_{3a})$, $C(R_{3a})(R_{3b})$, or $Si(R_{3a})(R_{3b})$, $X_{43}$ may be a single bond, O, S, $N(R_{4a})$, $C(R_{4a})(R_{4b})$, or $Si(R_{4a})(R_{4b})$, $R_{11}$ to $R_{14}$ are the same as described in connection with $R_1$, and at least one of $R_{11}$ to $R_{14}$ may each independently be an unsubstituted or substituted $C_1$-$C_{60}$ alkyl group or an unsubstituted or substituted $C_3$-$C_{10}$ cycloalkyl group, $R_{21}$ to $R_{23}$ may be the same as described in connection with $R_2$, and two or more of $R_{21}$ to $R_{23}$ may optionally be linked to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{31}$ to $R_{36}$, $R_{3a}$, and $R_{3b}$ may be the same as described in connection with $R_3$, and two or more of $R_{31}$ to $R_{36}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{41}$ to $R_{47}$, $R_{4a}$, and $R_{4b}$ may be the same as described in connection with $R_4$, and two or more of $R_{41}$ to $R_{47}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and $R_{10a}$ is the same as described in connection with $R_2$.

In one or more embodiments, $R_{11}$ to $R_{14}$ of Formula CY1-1 to CY1-15 and at least one of $R_{11}$ to $R_{14}$ of Formulae 1A to 1C may each independently be a $C_1$-$C_{20}$ alkyl group or a $C_3$-$C_{10}$ cycloalkyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, or any combination thereof.

In one or more embodiments, $R_{11}$ to $R_{14}$ of Formula CY1-1 to CY1-15 and at least one of $R_{11}$ to $R_{14}$ of Formulae 1A to 1C may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, or a ($C_1$-$C_{20}$ alkyl)bicyclo[2.2.2]octyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, or any combination thereof.

In one or more embodiments, $R_{11}$ to $R_{14}$ of Formulae CY1-1 to CY1-15 and at least one of $R_{11}$ to $R_{14}$ of Formulae 1A to 1C may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-201 to 9-227, a group represented by one of Formulae 9-201 to 9-227 in which at least one hydrogen is substituted with deuterium, a group represented by one of Formulae 10-1 to 10-9, or a group represented by one of Formulae 10-1 to 10-9 in which at least one hydrogen is substituted with deuterium.

In one or more embodiments, in Formulae 1A and 1C, $Y_{21}$ may be $C(R_{21})$, $Y_{22}$ may be $C(R_{22})$, $Y_{23}$ may be $C(R_{23})$, $Y_{41}$ may be $C(R_{41})$, $Y_{42}$ may be $C(R_{42})$, $Y_{43}$ may be $C(R_{43})$, $Y_{44}$ may be $C(R_{44})$, and at least one of $R_{21}$ to $R_{23}$, at least one of $R_{41}$ to $R_{44}$, or any combination thereof may each be an unsubstituted or substituted $C_1$-$C_{60}$ alkyl group or an unsubstituted or substituted $C_3$-$C_{10}$ cycloalkyl group.

In one or more embodiments, in Formulae 1A to 1C, $Y_{21}$ may be $C(R_{21})$, $Y_{22}$ may be $C(R_{22})$, $Y_{23}$ may be $C(R_{23})$, and at least one of $R_{21}$ to $R_{23}$ may each independently be an unsubstituted or substituted $C_1$-$C_{60}$ alkyl group or an unsubstituted or substituted $C_3$-$C_{10}$ cycloalkyl group.

In one or more embodiments, in Formulae 1A and 1C, $Y_{41}$ may be $C(R_{41})$, $Y_{42}$ may be $C(R_{42})$, $Y_{43}$ may be $C(R_{43})$, $Y_{44}$ may be $C(R_{44})$, at least one of $R_{41}$ to $R_{44}$ may each independently be an unsubstituted or substituted $C_1$-$C_{60}$ alkyl group, or an unsubstituted or substituted $C_3$-$C_{10}$ cycloalkyl group.

In one or more embodiments, in Formulae 1A and 1C, $Y_{21}$ may be $C(R_{21})$, $Y_{22}$ may be $C(R_{22})$, $Y_{23}$ may be $C(R_{23})$, $Y_{41}$ may be $C(R_{41})$, $Y_{42}$ may be $C(R_{42})$, $Y_{43}$ may be $C(R_{43})$, $Y_{44}$ may be $C(R_{44})$, and at least one of $R_{21}$ to $R_{23}$ and at least one of $R_{41}$ to $R_{44}$ may each be an unsubstituted or substituted $C_1$-$C_{60}$ alkyl group or an unsubstituted or substituted $C_3$-$C_{10}$ cycloalkyl group.

In one or more embodiments, in Formula 1B, $Y_{21}$ may be $C(R_{21})$, $Y_{22}$ may be $C(R_{22})$, $Y_{23}$ may be $C(R_{23})$, $Y_{41}$ may be $C(R_{41})$, $Y_{42}$ may be $C(R_{42})$, $Y_{43}$ may be $C(R_{43})$, $Y_{44}$ may be $C(R_{44})$, $Y_{45}$ may be $C(R_{45})$, $Y_{46}$ may be $C(R_{46})$, $Y_{47}$ may be $C(R_{47})$, and at least one of $R_{21}$ to $R_{23}$, at least one of $R_{41}$ to $R_{47}$, or any combination thereof may each independently be an unsubstituted or substituted $C_1$-$C_{60}$ alkyl group or an unsubstituted or substituted $C_3$-$C_{10}$ cycloalkyl group.

In one or more embodiments, in Formula 1B, $Y_{41}$ may be $C(R_{41})$, $Y_{42}$ may be $C(R_{42})$, $Y_{43}$ may be $C(R_{43})$, $Y_{44}$ may be $C(R_{44})$, $Y_{45}$ may be $C(R_{45})$, $Y_{46}$ may be $C(R_{46})$, $Y_{47}$ may be $C(R_{47})$, and at least one of $R_{41}$ to $R_{47}$ may each independently be an unsubstituted or substituted $C_1$-$C_{60}$ alkyl group or an unsubstituted or substituted $C_3$-$C_{10}$ cycloalkyl group.

In one or more embodiments, in Formula 1B, $Y_{21}$ may be $C(R_{21})$, $Y_{22}$ may be $C(R_{22})$, $Y_{23}$ may be $C(R_{23})$, $Y_{41}$ may be $C(R_{41})$, $Y_{42}$ may be $C(R_{42})$, $Y_{43}$ may be $C(R_{43})$, $Y_{44}$ may be $C(R_{44})$, $Y_{45}$ may be $C(R_{45})$, $Y_{46}$ may be $C(R_{46})$, $Y_{47}$ may be $C(R_{47})$, and at least one of $R_{21}$ to $R_{23}$ and at least one of $R_{41}$ to $R_{47}$ may each independently be an unsubstituted or substituted $C_1$-$C_{60}$ alkyl group or an unsubstituted or substituted $C_3$-$C_{10}$ cycloalkyl group.

In Formula 1, i) two or more of a plurality of $R_1$(s) may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) two or more of a plurality of $R_2$(S) may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) two or more of a plurality of $R_3$(s) may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) two or more of a plurality of $R_4$(s) may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, v) two or more of $R_{1a}$ and $R_1$ to $R_8$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, wherein "$C_5$-$C_{30}$ carbocyclic group" and "$C_1$-$C_{30}$ heterocyclic group" are the same as described in connection with ring $CY_2$, and $R_{10a}$ is the same as described in connection with $R_2$.

The expressions * and *' used herein each indicate a binding site to a neighboring atom, unless otherwise stated.

For example, the organometallic compound may be one of Compounds 1 to 120:
1
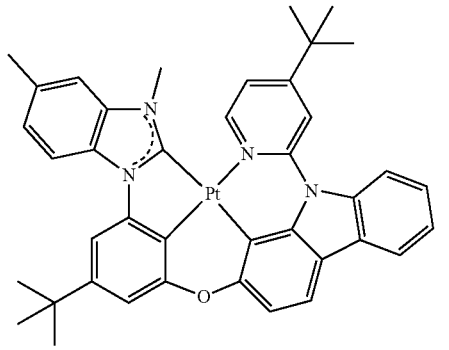
2
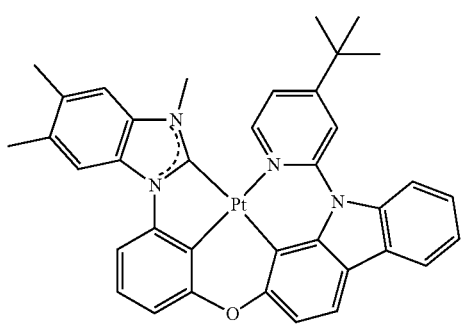
3
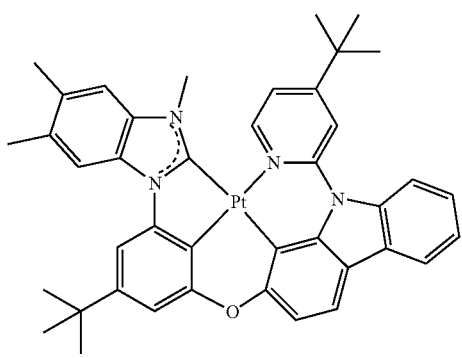
4
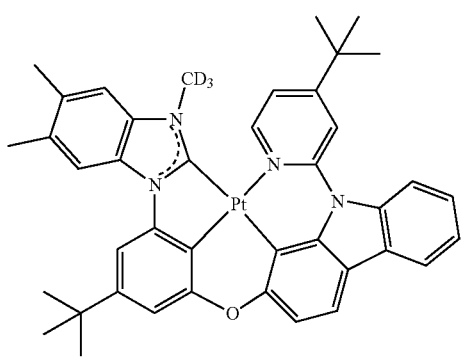
5
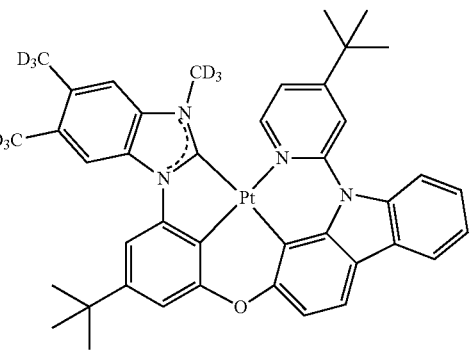
6
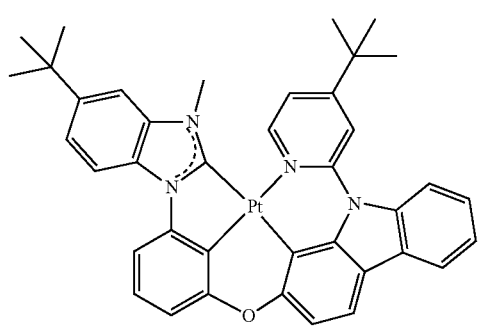
7
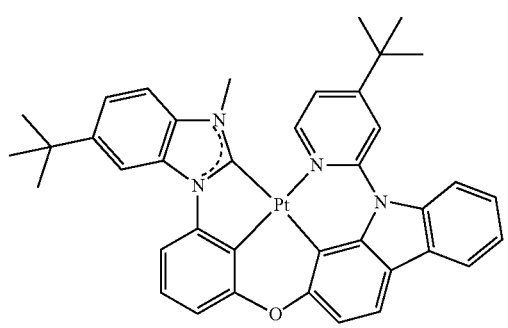
8
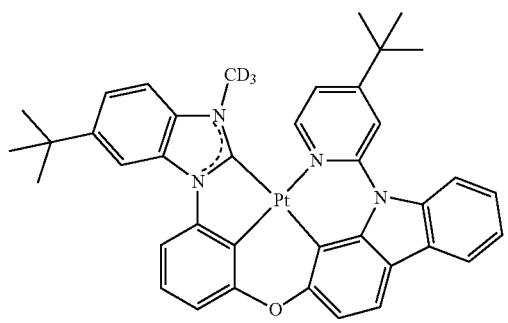

93
-continued
9
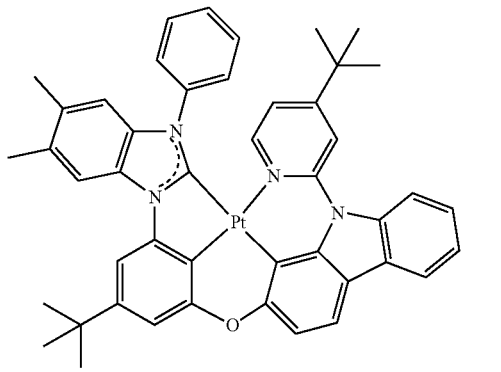
10
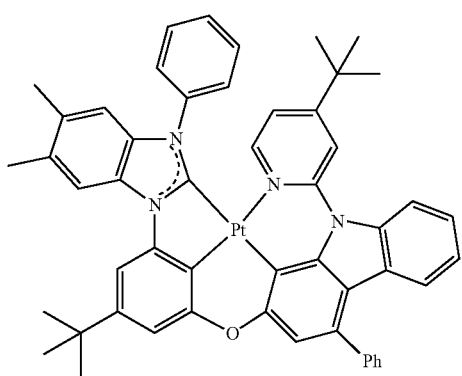
11
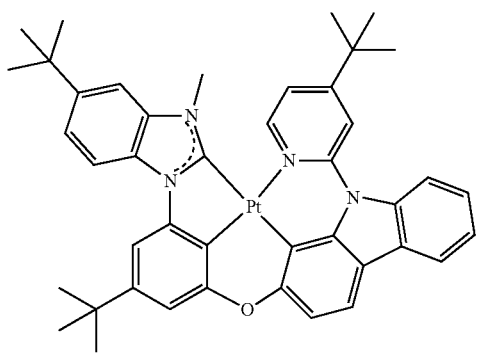
12
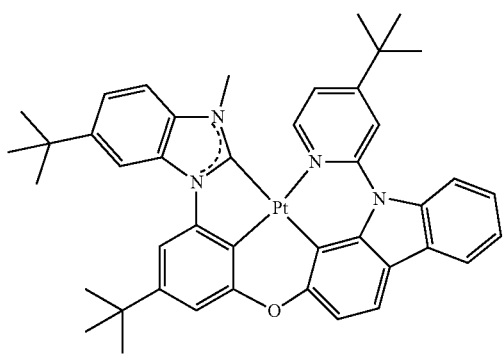
94
-continued
13
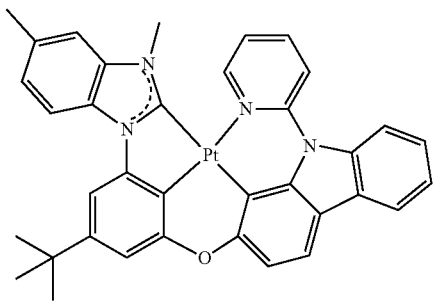
14
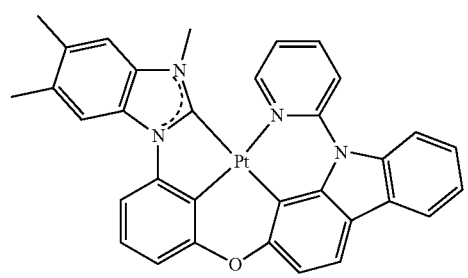
15
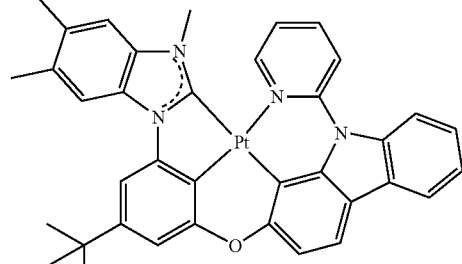
16
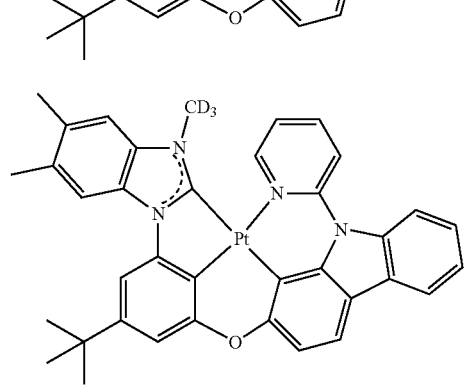
17
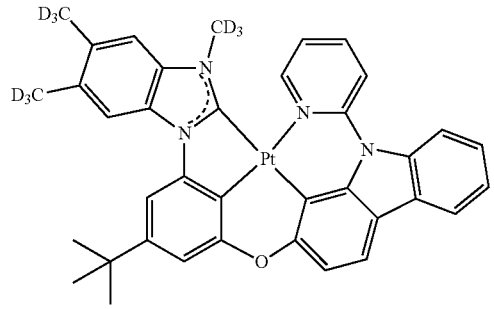

95
-continued
18
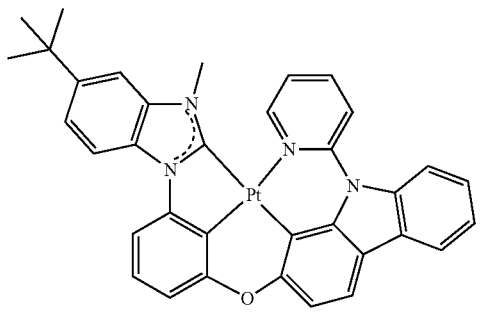
19
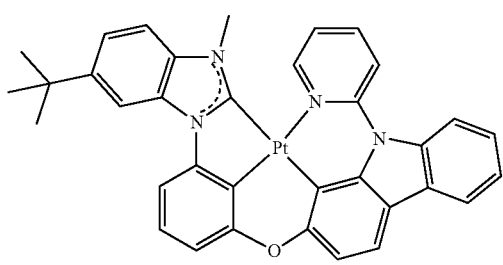
20
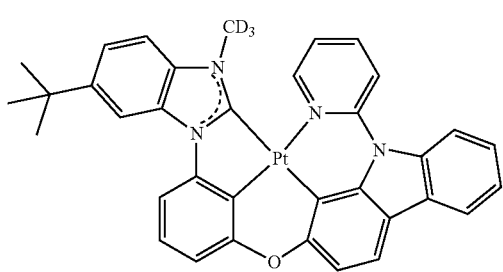
21
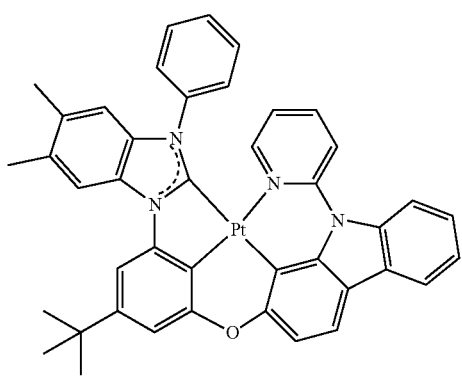
22
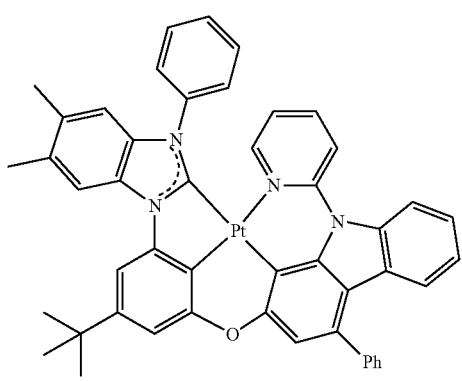
96
-continued
23
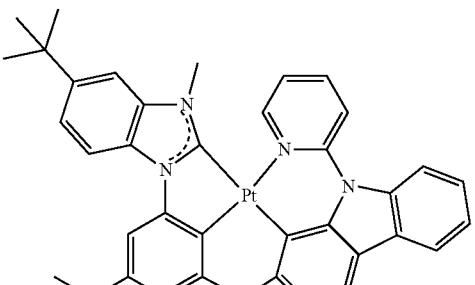
24
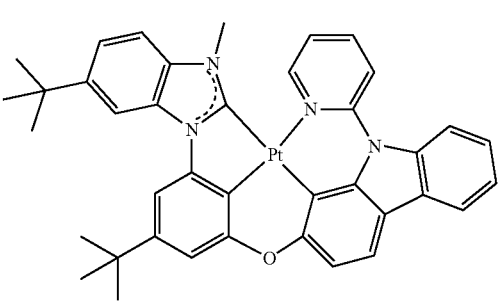
25
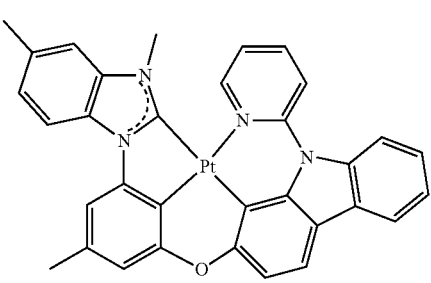
26
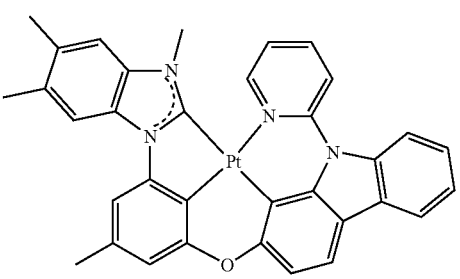
27
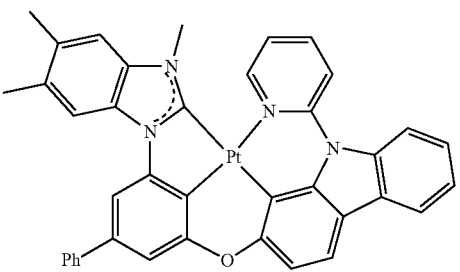

28
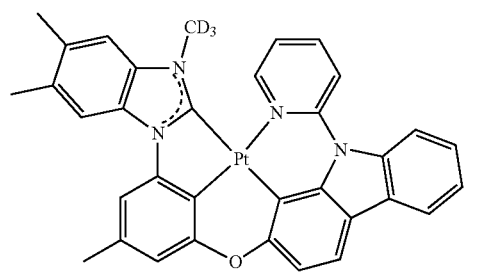
29
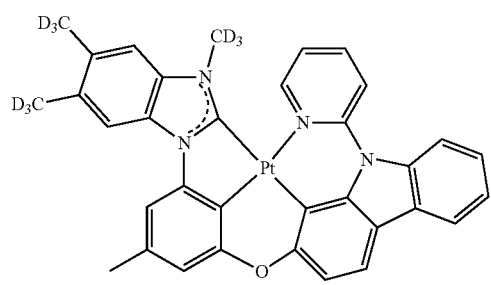
30
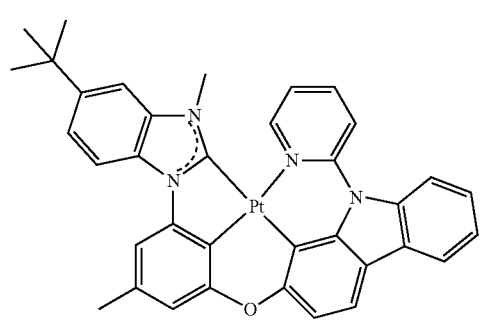
31
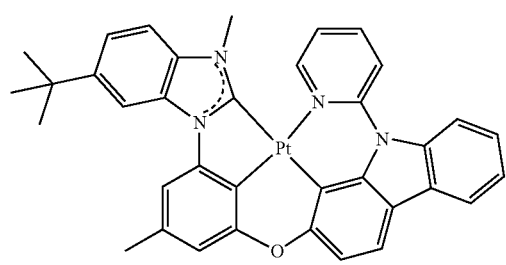
32
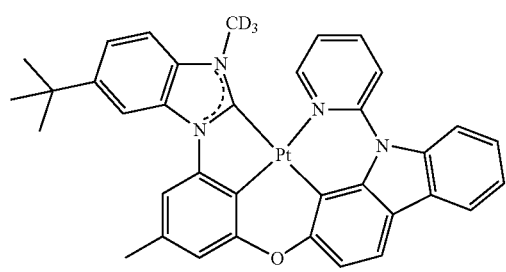
33
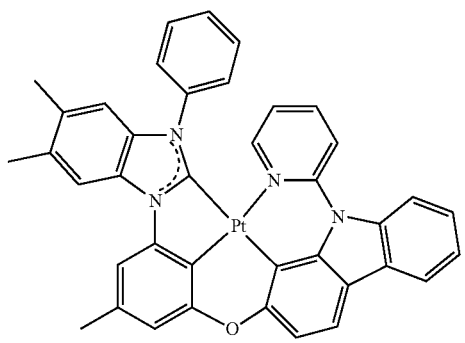
34
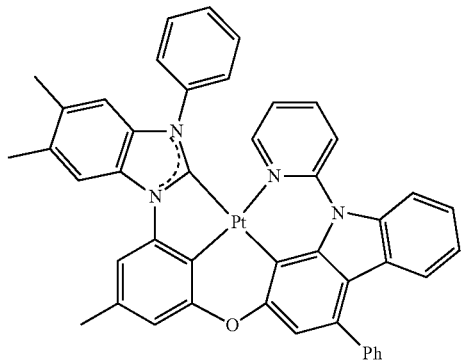
35
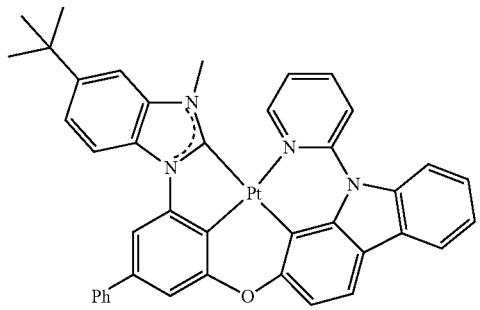
36
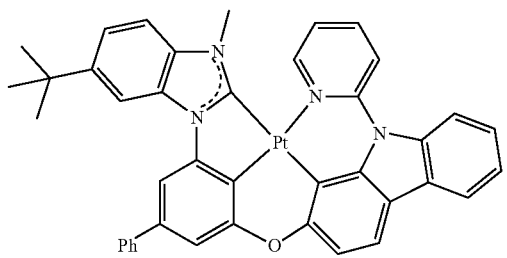
37
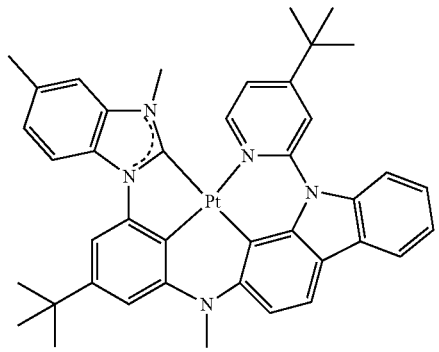

38
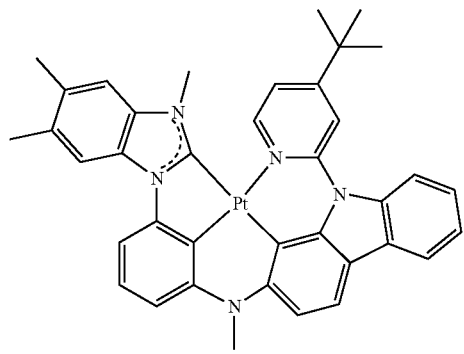
42
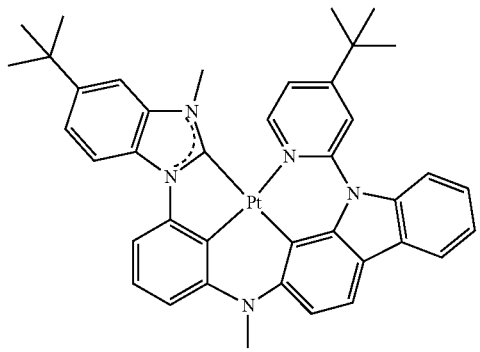
39
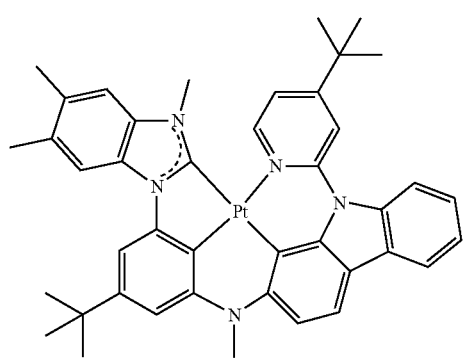
43
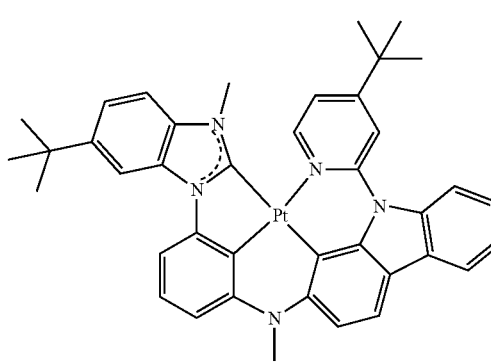
40
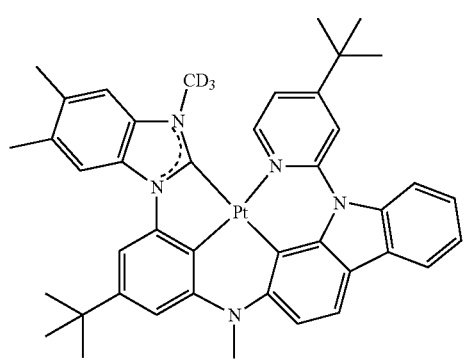
44
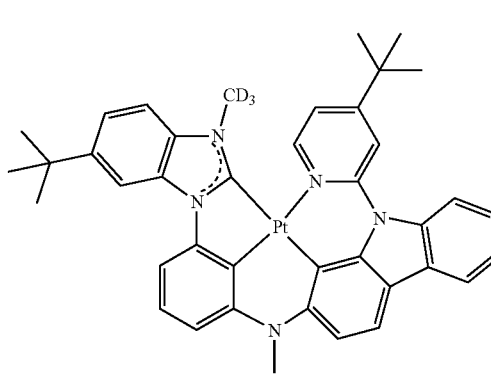
41
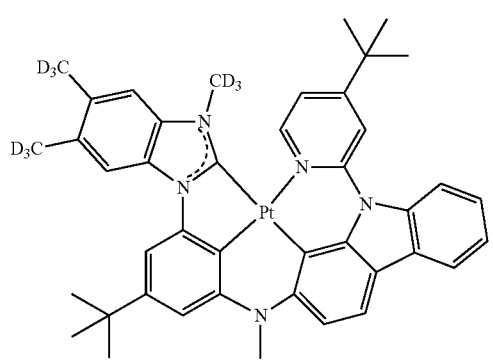
45
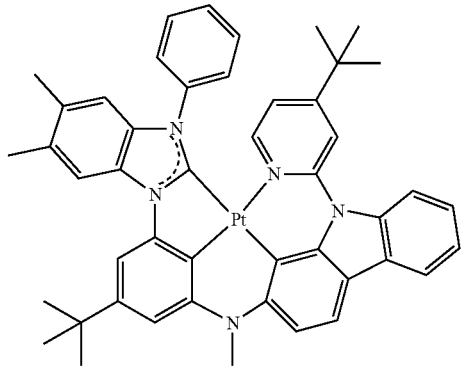

46
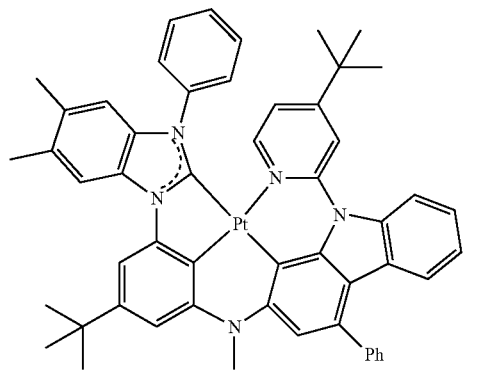
47
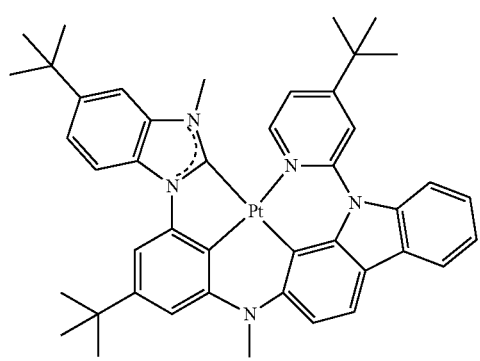
48
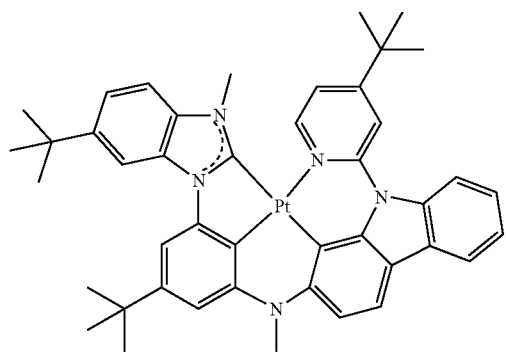
49
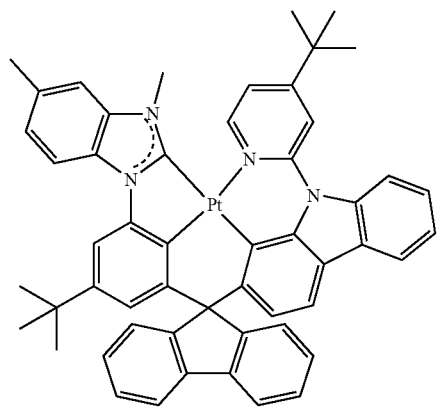
50
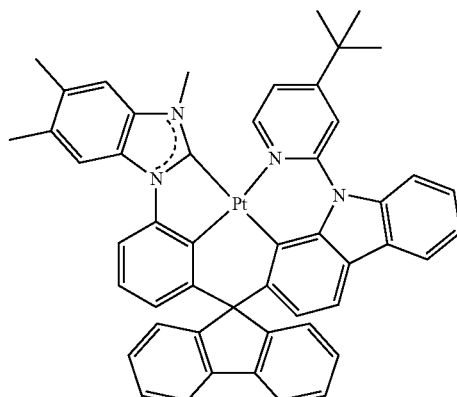
51
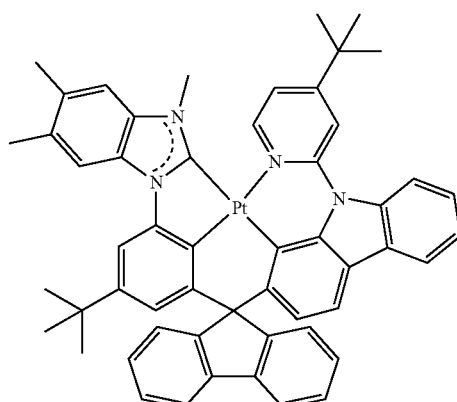
52
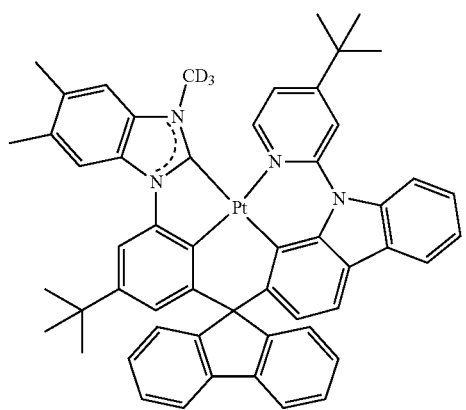
53
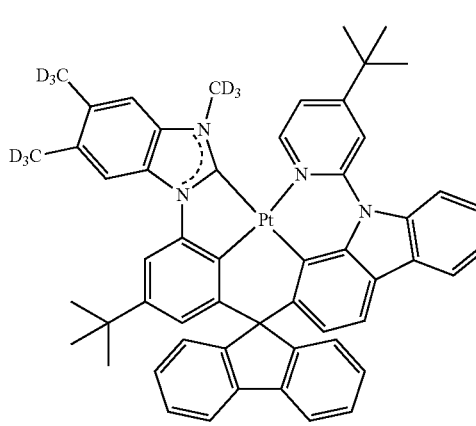

103
-continued
54
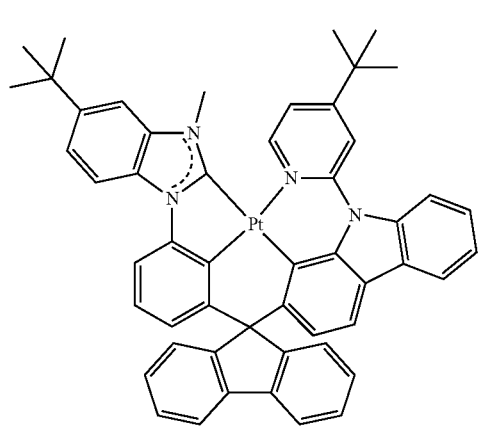
55
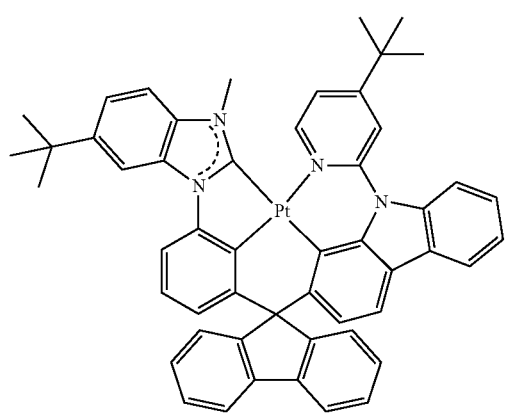
56
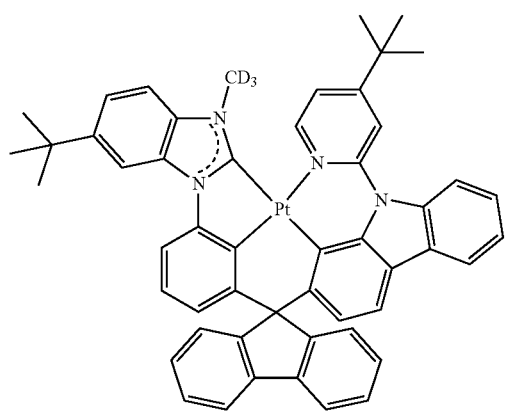
104
-continued
57
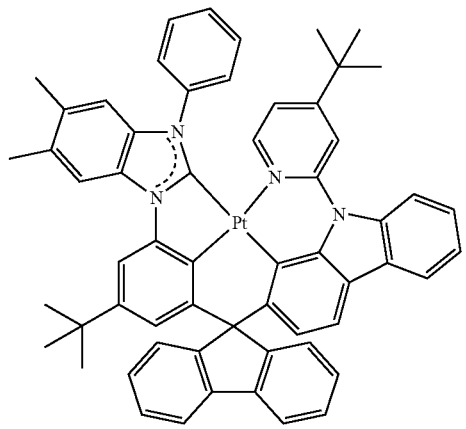
58
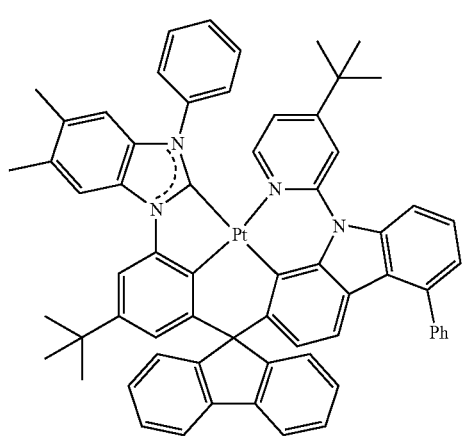
59
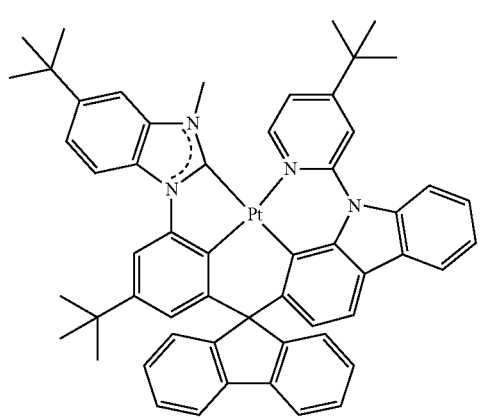

60
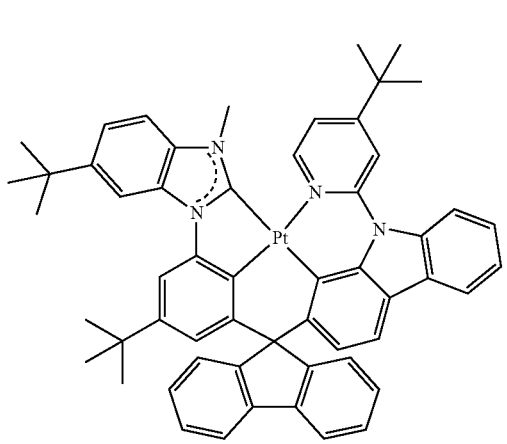
61
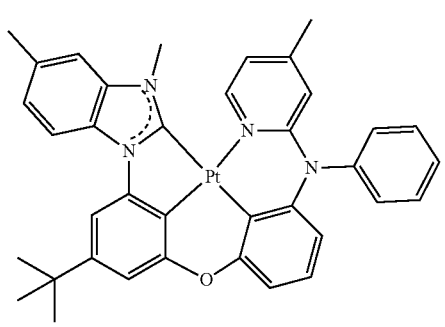
62
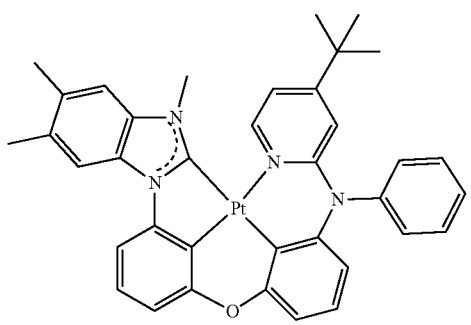
63
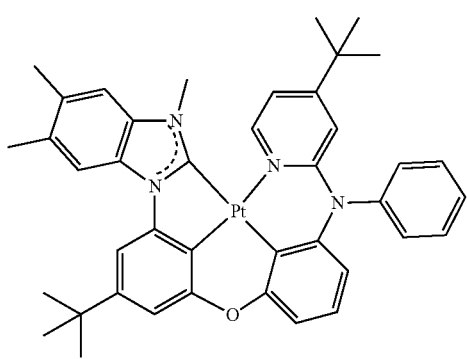
64
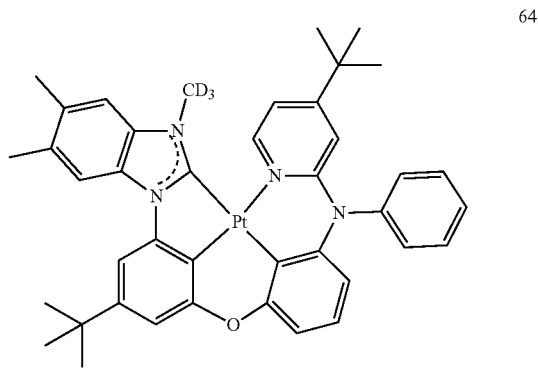
65
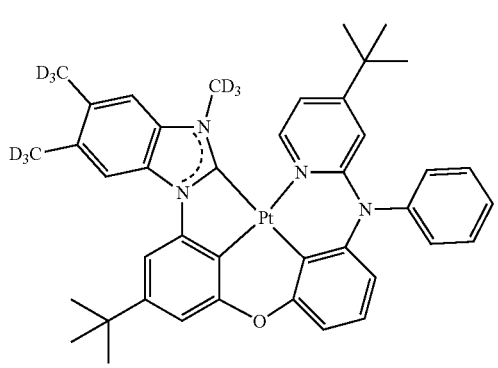
66
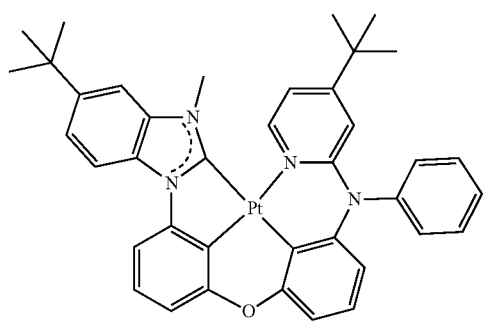
67
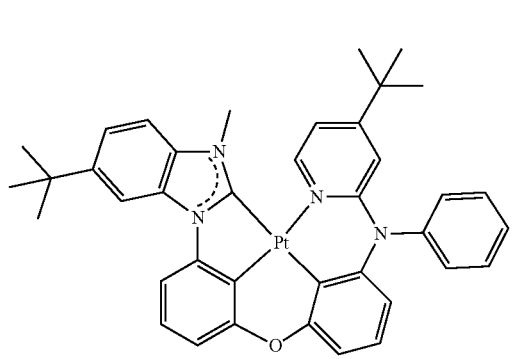

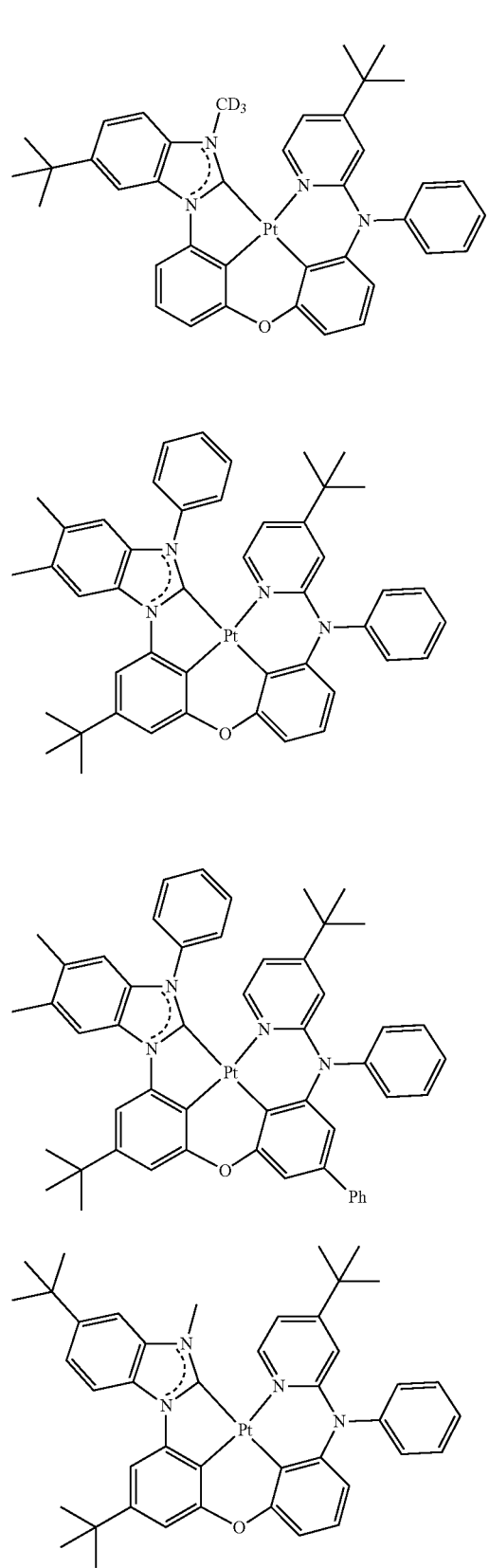
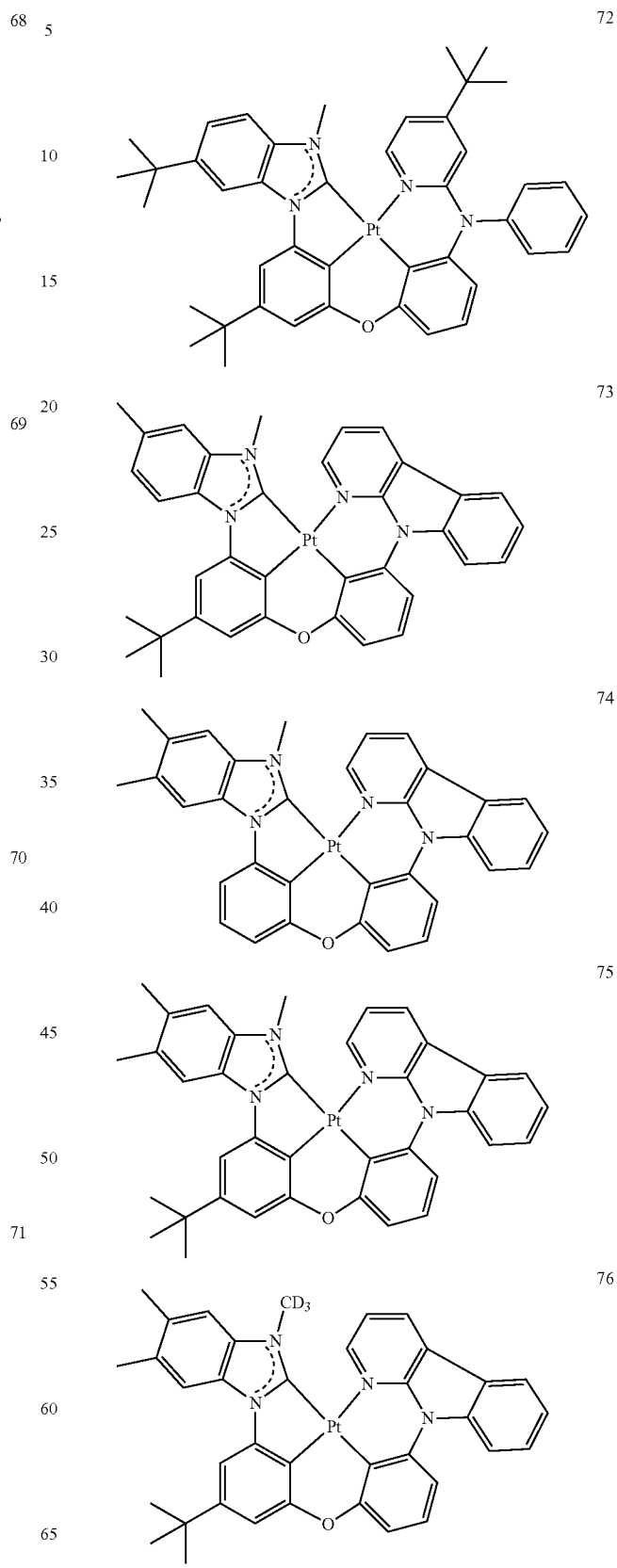

77
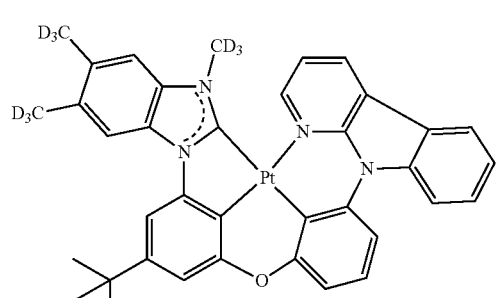
78
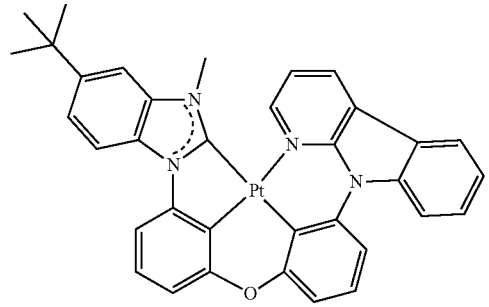
79
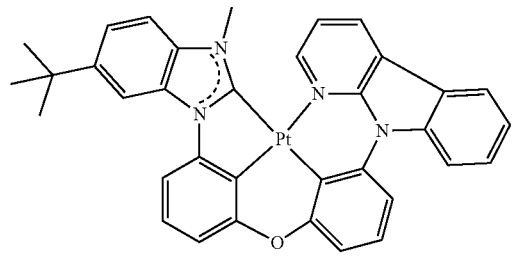
89
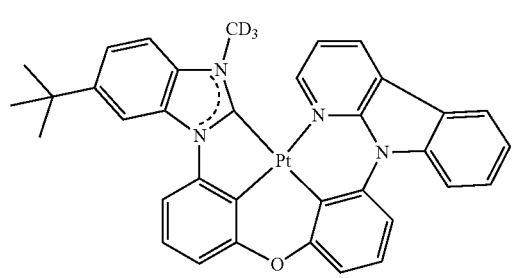
81
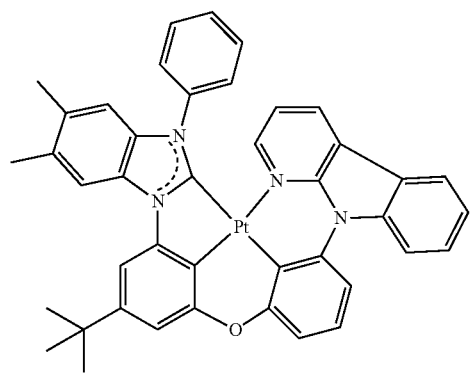
82
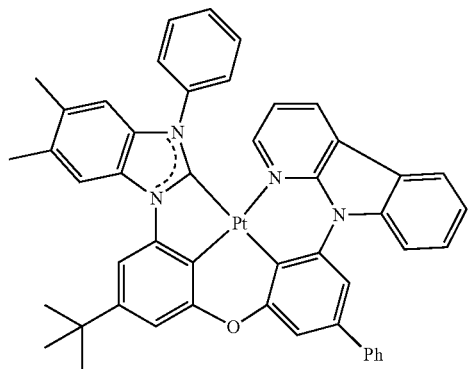
83
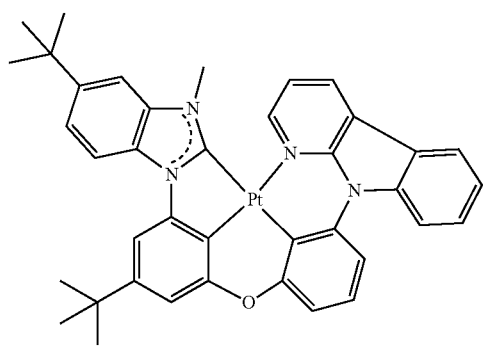
84
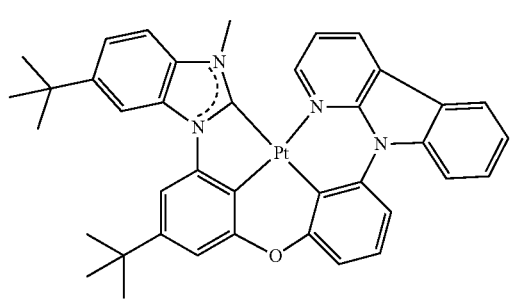
85
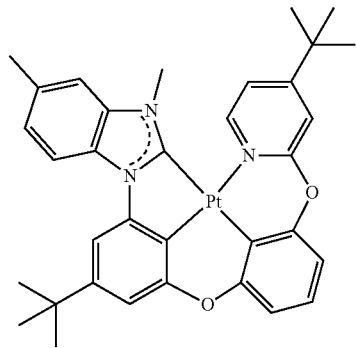

86
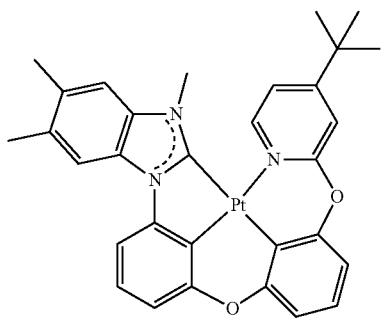
87
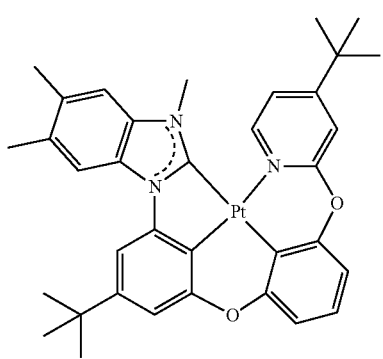
88
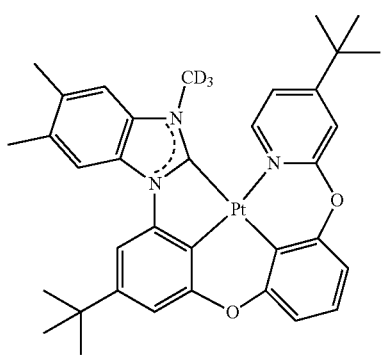
89
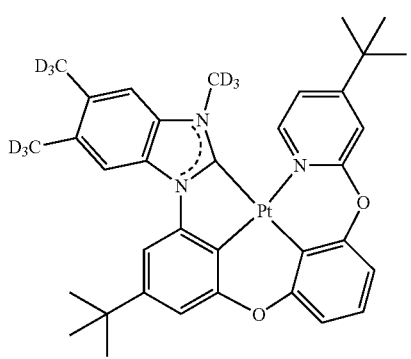
90
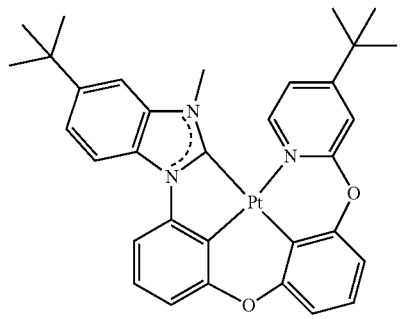
91
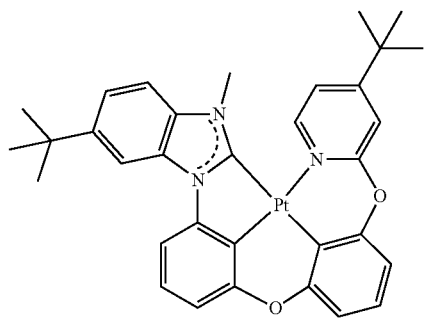
92
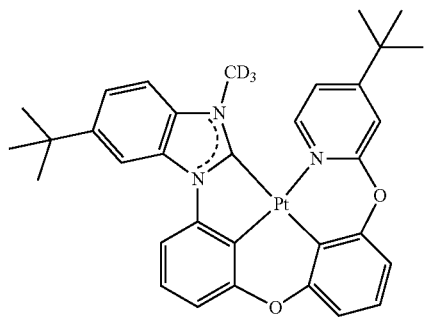
93
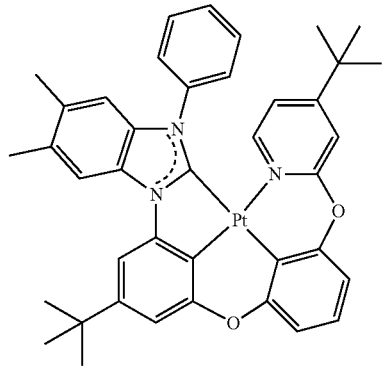

94
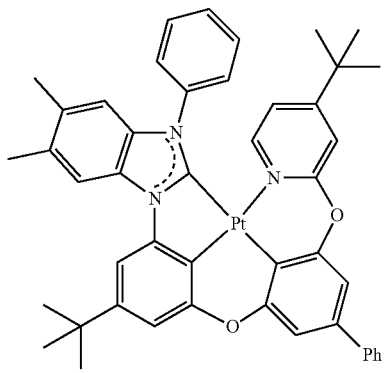
95
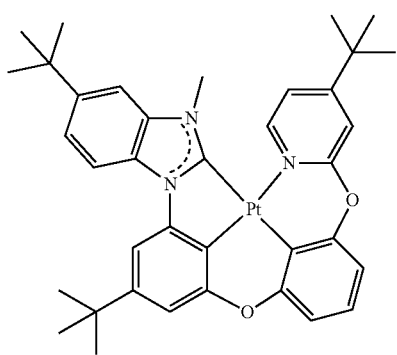
96
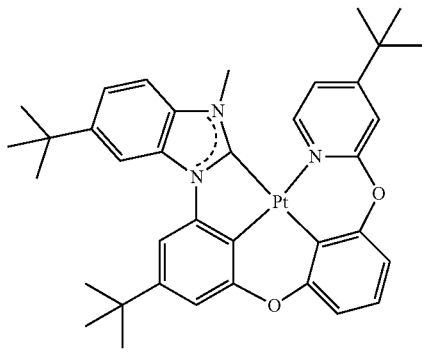
97
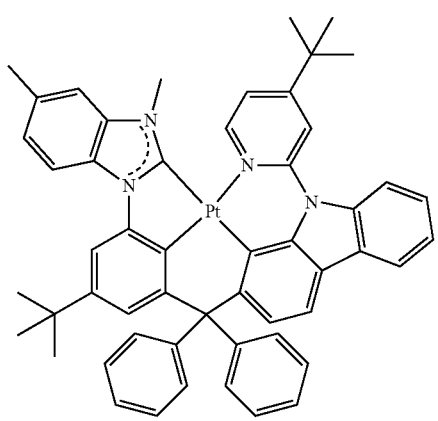
98
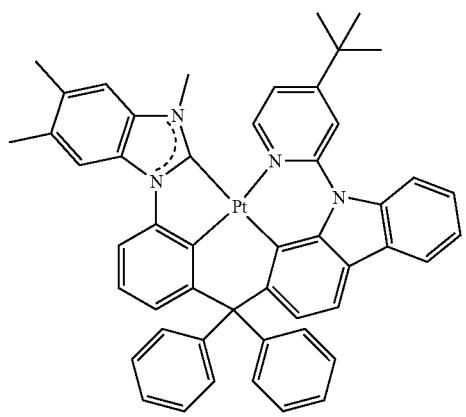
99
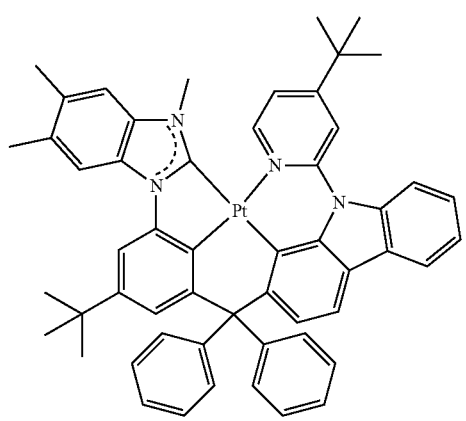
100
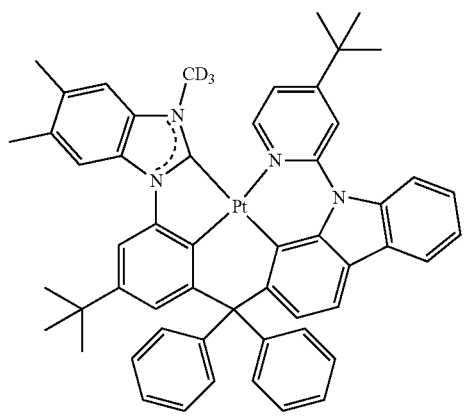
101
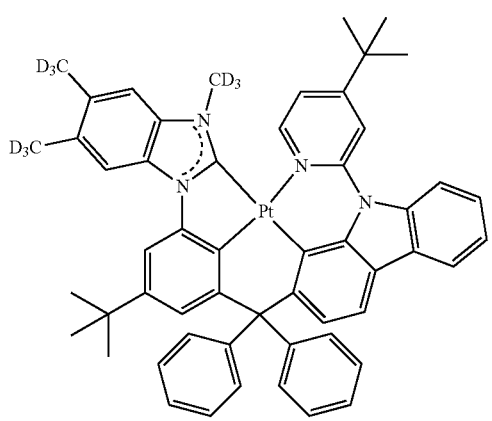

115
-continued
116
-continued
102
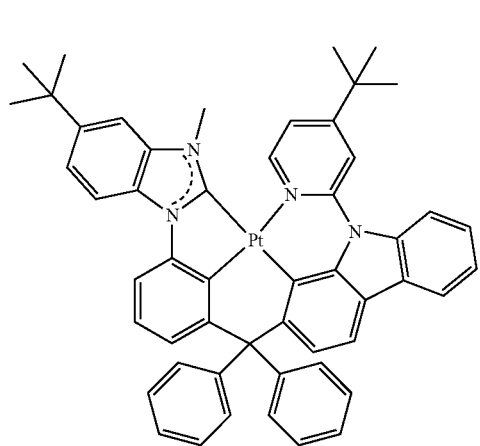
103
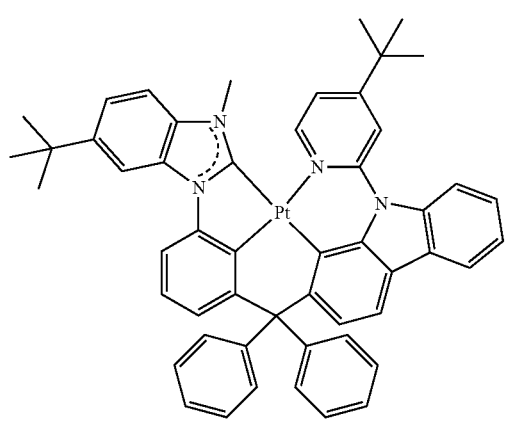
104
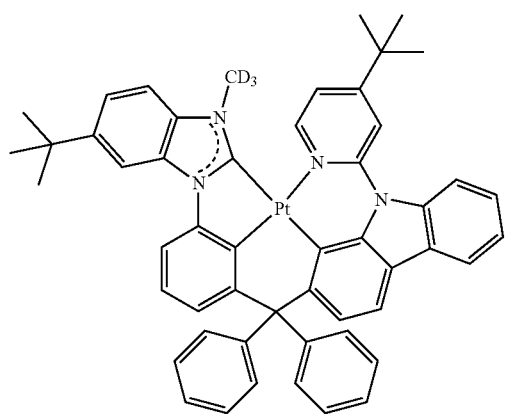
105
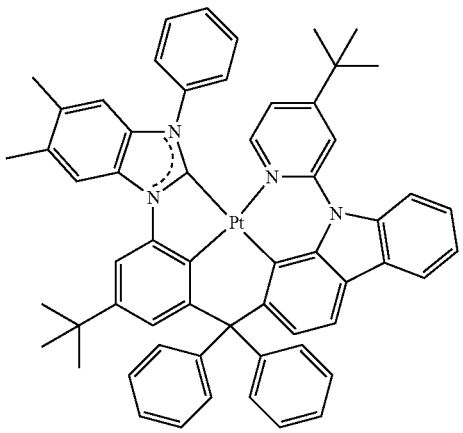
106
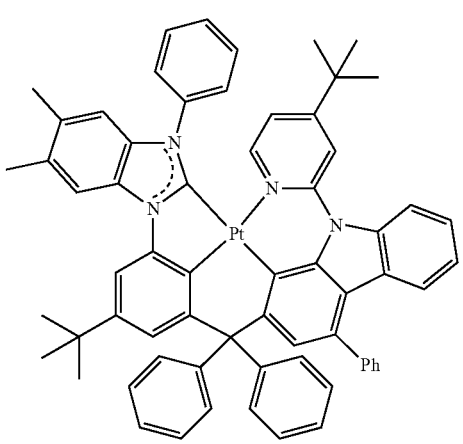
107
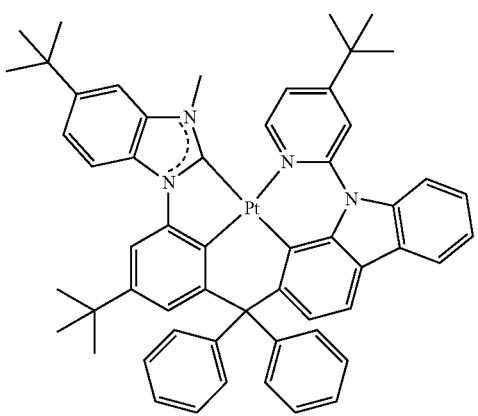

108
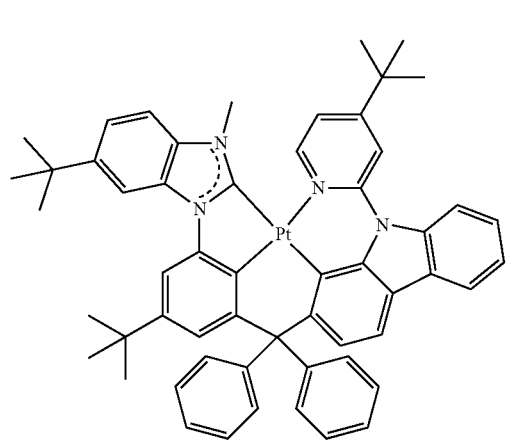
109
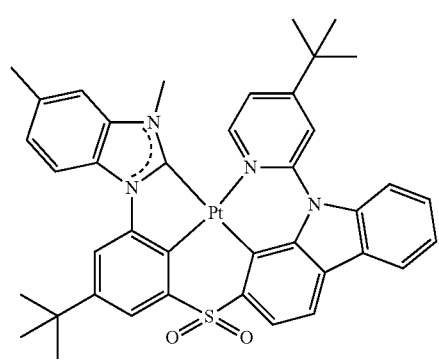
110
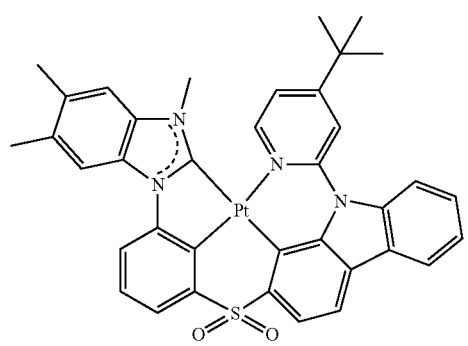
111
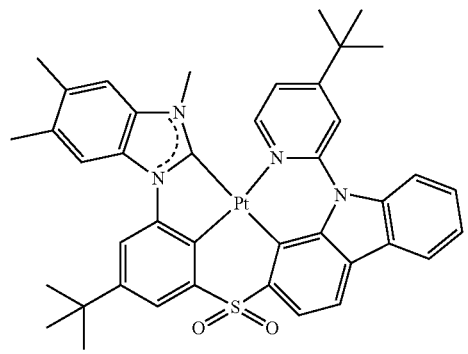
112
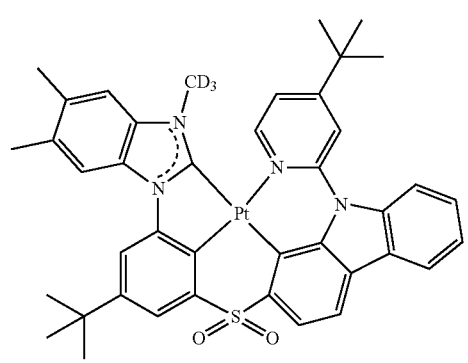
113
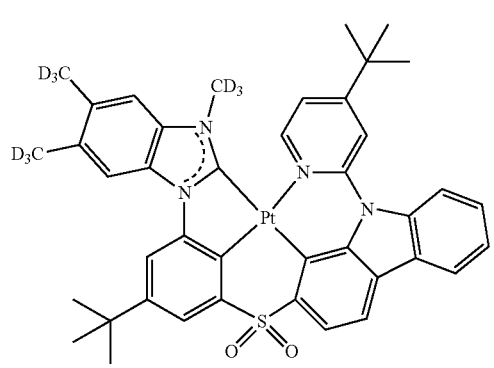
114
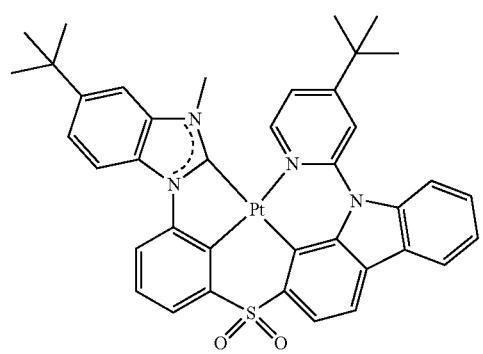
115
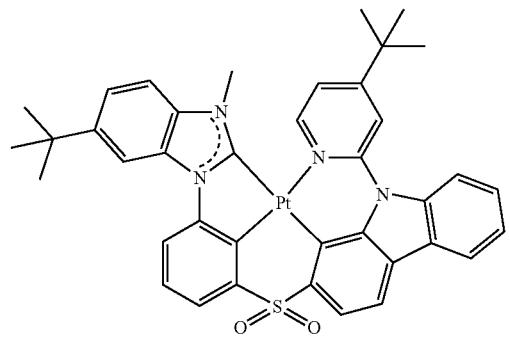

116

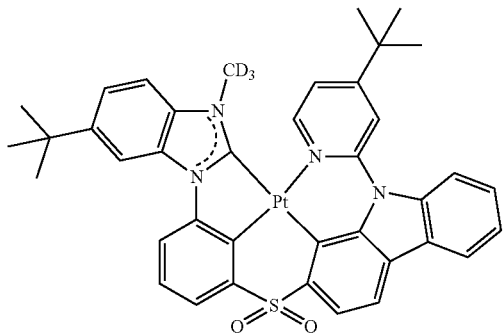

117

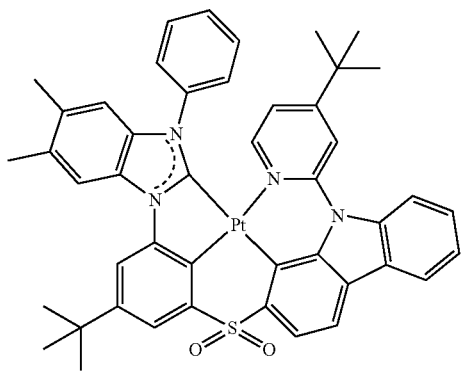

118

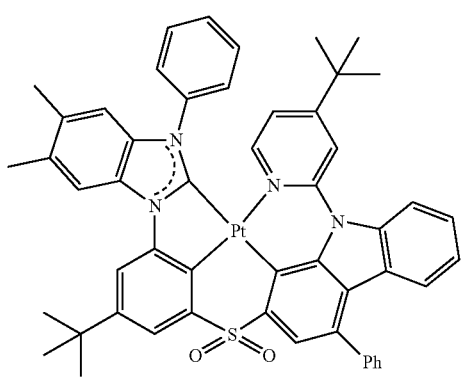

119

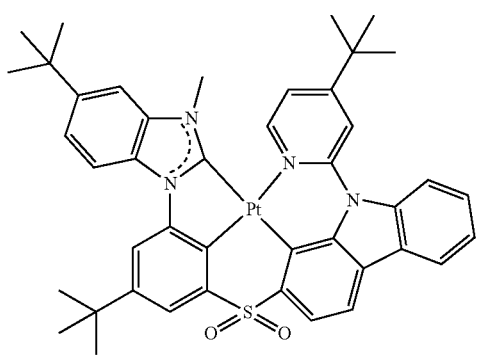

5

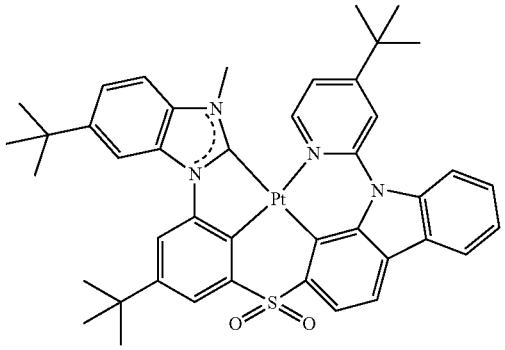

$X_1$ in Formula 1 may be C, and a bond between $X_1$ and M may be a coordinate bond. That is, $X_1$ in Formula 1 may be carbon of a carbene moiety. Since the metal-ligand bonding force in Formula 1 is enhanced due to the carbene moiety, which is a strong sigma-donating group, even when the organometallic compound represented by Formula 1 is in an excited state, the decomposition of the metal-ligand bond may be suppressed and thus, the organometallic compound represented by Formula 1 may have excellent durability.

Ring $CY_1$ in Formula 1 may be a condensed cyclic group (see Formula 1') in which a benzene ring is condensed with a $X_1$-containing 5-membered ring. Accordingly, the organometallic compound represented by Formula 1 may have a relatively high triplet energy level, and thus, an electronic device including the organometallic compound represented by Formula 1, for example, an organic light-emitting device including the organometallic compound represented by Formula 1 may emit blue light and, at the same time, may have high luminescent efficiency and/or a long lifespan.

Formula 1'

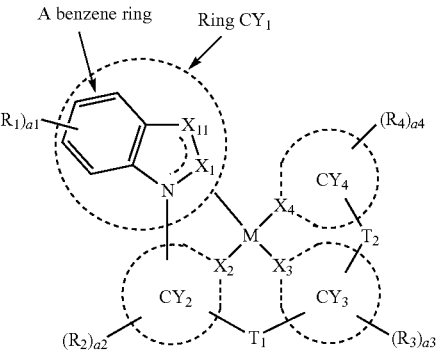

Furthermore, a1 in Formula 1 may be an integer from 1 to 4, and at least one of $R_1$(s) in the number of a1 may each independently be an unsubstituted or substituted $C_1$-$C_{60}$ alkyl group or an unsubstituted or substituted $C_3$-$C_{10}$ cycloalkyl group. Accordingly, the organometallic compound represented by Formula 1 may have a high optical orientation, and thus, for example, may emit blue light and at the same time, may have high luminescent efficiency.

For example, the HOMO, LUMO, and $T_1$ energy level of some of the compounds are structure-optimized at the (B3LYP, 6-31G(d,p)) level by using the DFT method of the Gaussian program and evaluated. Results thereof are shown in Table 1 below.

TABLE 1

| Compound No. | HOMO (eV) | LUMO (eV) | $T_1$ (eV) |
| --- | --- | --- | --- |
| 1 | −4.62 | −1.27 | 2.63 |
| 2 | −4.64 | −1.27 | 2.66 |
| 3 | −4.60 | −1.25 | 2.64 |
| 4 | −4.60 | −1.25 | 2.64 |
| 5 | −4.60 | −1.25 | 2.64 |
| 6 | −4.66 | −1.29 | 2.65 |
| 7 | −4.66 | −1.29 | 2.66 |
| 8 | −4.66 | −1.29 | 2.66 |
| 9 | −4.58 | −1.16 | 2.62 |
| 10 | −4.60 | −1.19 | 2.57 |
| 11 | −4.62 | −1.27 | 2.64 |
| 12 | −4.62 | −1.27 | 2.64 |

From Table 1, it is confirmed that the organometallic compound represented by Formula 1 has such electric characteristics that are suitable for use as a dopant for an electronic device, for example, an organic light-emitting device.

For example, the organometallic compound represented by Formula 1 may emit blue light.

In one or more embodiments, the organometallic compound represented by Formula 1 may emit blue light having a maximum emission range of about 450 nm to about 470 nm, for example, about 457 nm to about 465 nm. Above maximum emission range may be confirmed by a photoluminescent (PL) spectrum and/or an electroluminescent (EL) spectrum for the organometallic compound represented by Formula 1.

In one or more embodiments, the triplet ($T_1$) energy level of the organometallic compound represented by Formula 1 may be 2.6 eV or more, or may have the range of about 2.6 eV to about 3.5 eV. The $T_1$ energy level is a result obtained by using a DFT method of Gaussian program (structure-optimized at the level of B3LYP, 6-31G(d,p)).

In one or more embodiments, the full width at half maximum (FWHM) of a main peak having a maximum intensity in the photoluminescent (PL) spectrum and/or an electroluminescent (EL) spectrum for the organometallic compound represented by Formula 1 may be 50 nm or less, in the range of about 10 nm to about 50 nm, in the range of about 15 nm to about 30 nm, or in the range of about 20 nm to about 30 nm.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer disposed between the first electrode and the second electrode and including an emission layer, wherein the organic layer includes at least one organometallic compound represented by Formula 1.

Due to the inclusion of the organic layer having the organometallic compound represented by Formula 1, the organic light-emitting device may have improved driving voltage and improved external quantum efficiency.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light, green light, or blue light. For example, the organometallic compound may emit blue light.

For example, the emission layer may have a structure according to a first embodiment or a second embodiment:

First Embodiment

The emission layer may include the organometallic compound represented by Formula 1, and the organometallic compound may act as an emitter, for example, a phosphorescent emitter. For example, the ratio of the luminescent component emitted from the organometallic compound with respect to all luminescent components of the emission layer may be 80% or more, 85% or more, 90% or more, or 95% or more. Light emitted from the organometallic compound may be blue light.

Second Embodiment

The emission layer may further include, in addition to the organometallic compound represented by Formula 1, a phosphorescent dopant, a fluorescent dopant, or any combination thereof, each of which is different from the organometallic compound. In this regard, the organometallic compound may act as, not a phosphorescent emitter, a sensitizer or an auxiliary dopant. For example, the emission layer further includes a fluorescent dopant, the fluorescent dopant is different from the organometallic compound, and the ratio of the luminescent component emitted from the fluorescent dopant with respect to all luminescent components of the emission layer may be 80% or more, 85% or more, 90% or more, or 95% or more.

The amount of fluorescent dopant in the second embodiment may be, based on 100 parts by weight of the organometallic compound represented by Formula 1, in the range of about 1 part by weight to about 100 parts by weight, about 5 parts by weight to about 50 parts by weight, or about 10 parts by weight to about 20 parts by weight.

The total amount of the organometallic compound represented by Formula 1 and the fluorescent dopant in the second embodiment may be, based on 100 parts by weight of the emission layer, about 1 part by weight to about 30 parts by weight, about 3 parts by weight to about 20 parts by weight, or about 5 parts by weight to about 15 parts by weight.

The fluorescent dopant used in the second embodiment may not include a transition metal.

For example, the fluorescent dopant used in the second embodiment may be a fluorescence emission material that does not include a cyano group (—CN) and a fluoro group (—F).

In one or more embodiments, the fluorescent dopant used in the second embodiment may be a condensed cyclic group-containing compound, an amino group-containing compound, a styryl-containing compound, or a boron-containing compound.

For example, the fluorescent dopant used in the second embodiment may include an amino group-containing compound.

In one or more embodiments, the fluorescent dopant used in the second embodiment may include a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a group represented by one of Formulae 501-1 to 501-21, or any combination thereof:
501-1
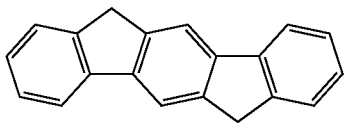
501-2
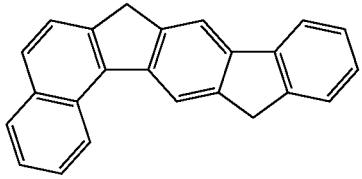
501-3
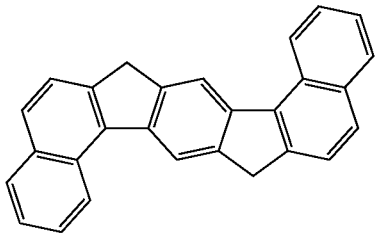
501-4
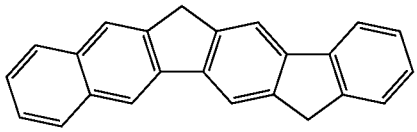
501-5
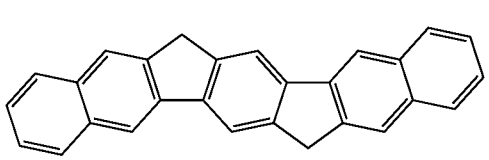
501-6
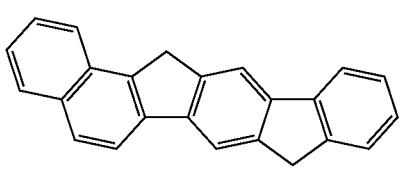
501-7
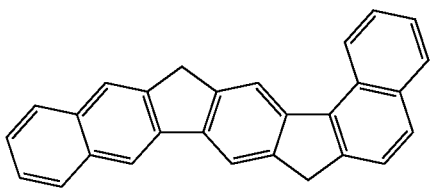
501-8
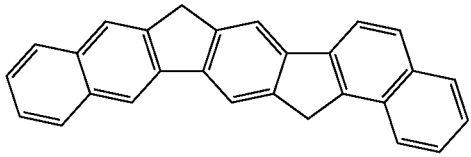
-continued
501-9
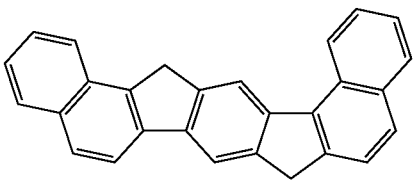
501-10
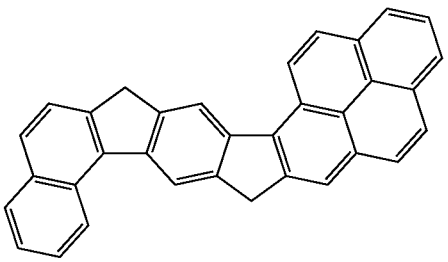
501-11
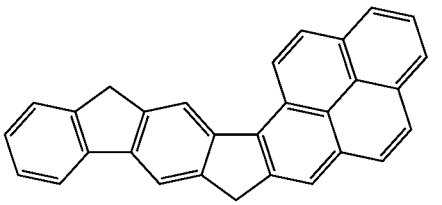
501-12
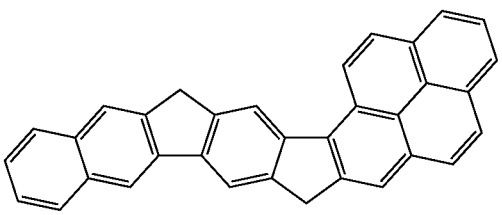
501-13
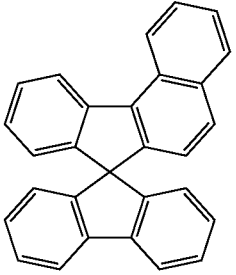
501-14
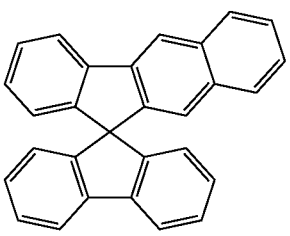

-continued 501-15
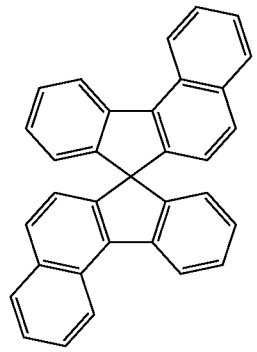

501-16
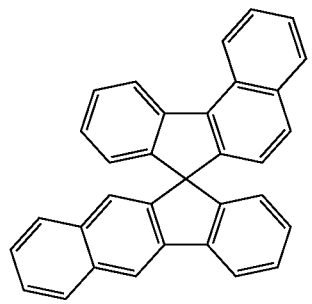

501-17
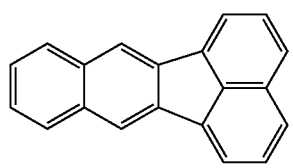

501-18
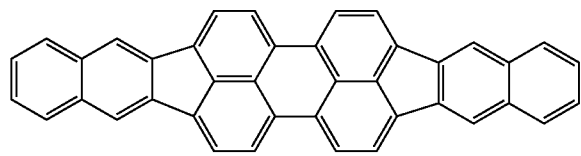

501-19
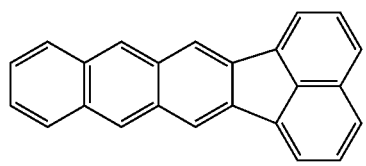

501-20
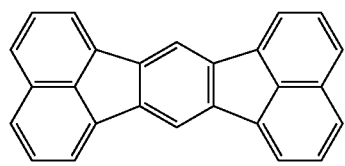

501-21
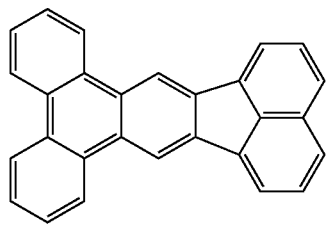

In one or more embodiments, a fluorescent dopant used in the second embodiment may include a compound represented by Formula 501A or 501B:

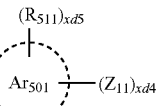

501A

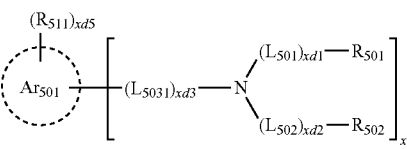

501B wherein, in Formulae 501A and 501B, $Ar_{501}$ may be a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group (a tetracene group), a picene group, a perylene group, a pentaphene group, an indenoanthracene group, a bisanthracene group, or a group represented by one of Formulae 501-1 to 501-21, $R_{511}$ may be hydrogen, deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or —Si($Q_{501}$)($Q_{502}$)($Q_{503}$), xd5 may be an integer from 0 to 10, $L_{501}$ to $L_{503}$ may each independently be:

a single bond; or a $C_3$-$C_{10}$ cycloalkylene group, a $C_1$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, a $C_1$-$C_{60}$ heteroarylene group, a divalent non-aromatic condensed polycyclic group, or a divalent non-aromatic condensed heteropolycyclic group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof;

xd1 to xd3 may each independently be 1, 2, or 3, $R_{501}$ and $R_{502}$ may each independently be a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, a dibenzothiophenyl group, or a dibenzosilolyl group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, $Z_{11}$ may be a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$) ($Q_{502}$) ($Q_{503}$), or any combination thereof, xd4 may be 1, 2, 3, 4, 5, or 6, and $Q_{501}$ to $Q_{503}$ may each independently be hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

In one or more embodiments, the fluorescent dopant may include a compound represented by Formula 501A or 501B, and xd4 in Formula 501A may be 1, 2, 3, 4, 5, or 6, and xd4 in Formula 501B may be 2, 3, or 4.

In one or more embodiments, the fluorescent dopant may include one of Compounds FD(1) to FD(16), one of FD1 to FD15, or any combination thereof:

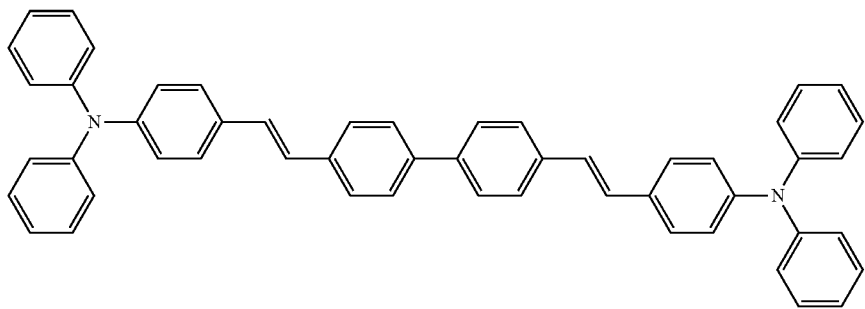

FD(1)

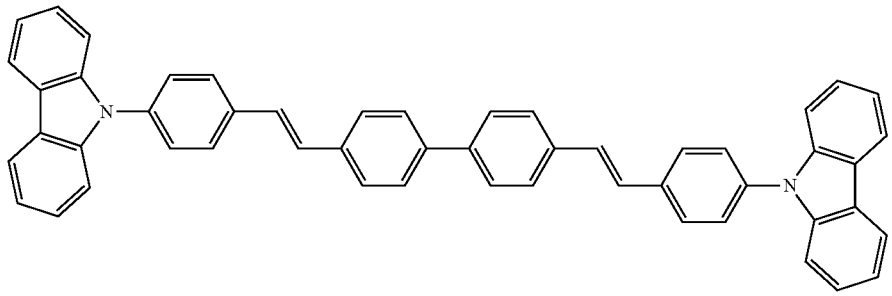

FD(2)

FD(3) 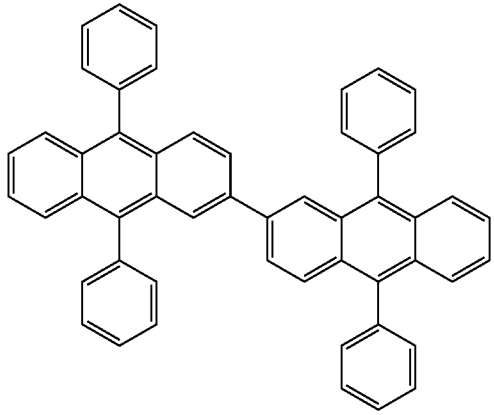
FD(4) 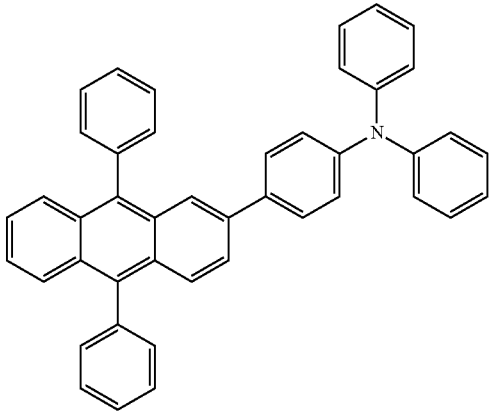
FD(5) 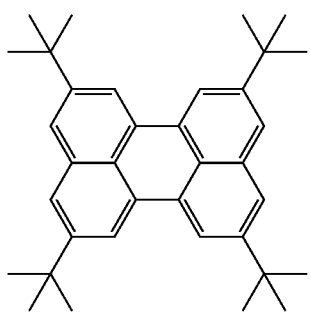
FD(6) 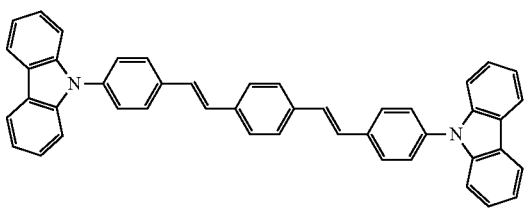
FD(7) 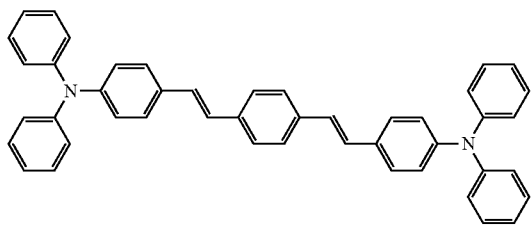
FD(8) 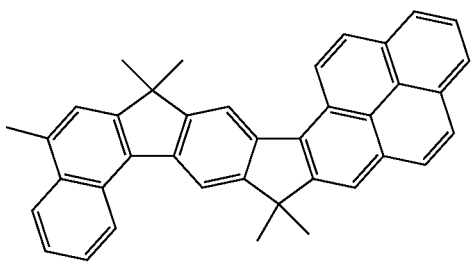
FD(9) 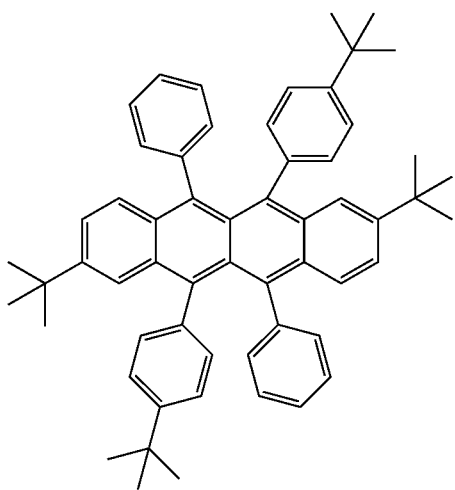
FD(10) 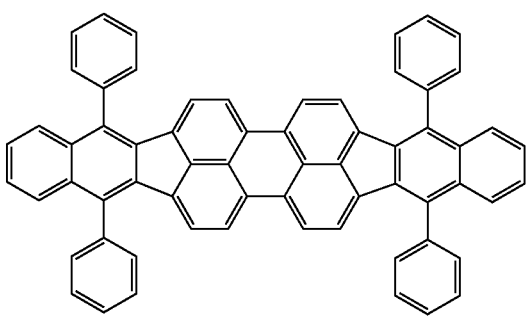

-continued
FD(11)
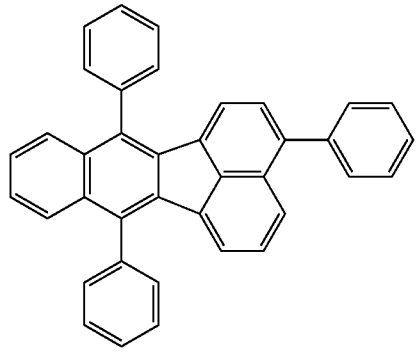
FD(12)
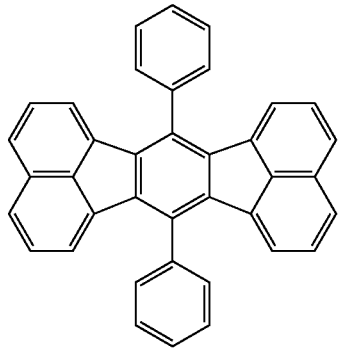
FD(13)
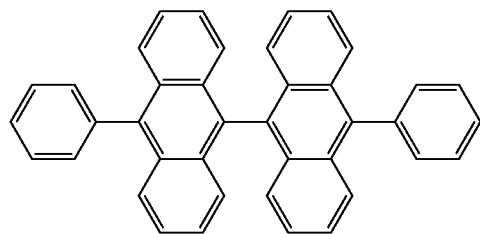
FD(14)
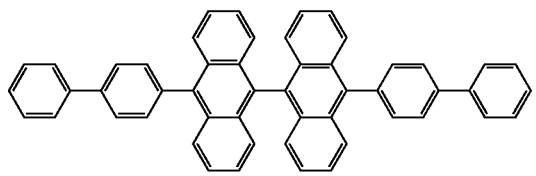
FD(15)
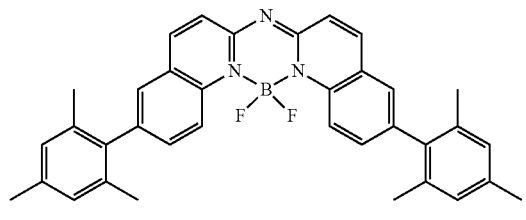
FD(16)
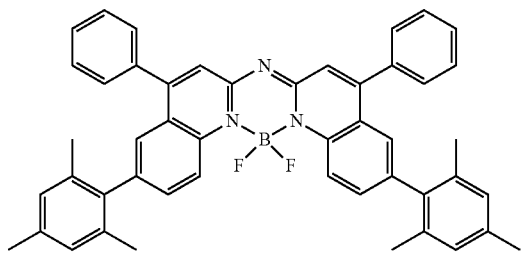
FD1
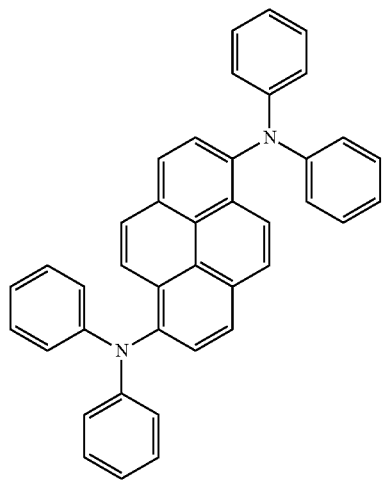
FD2
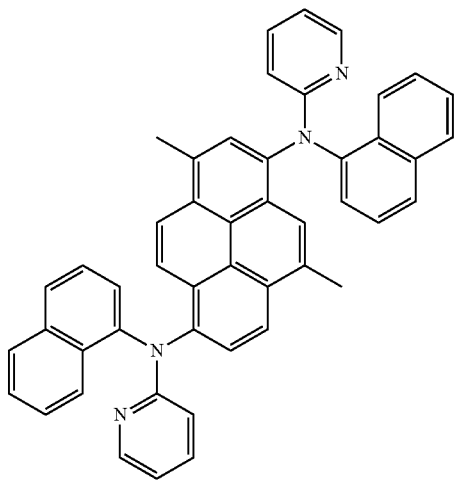

-continued
FD3
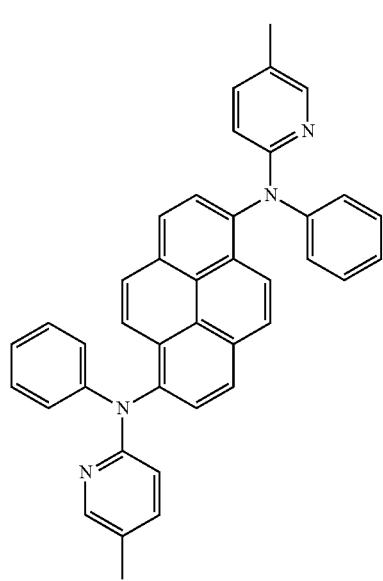
FD4
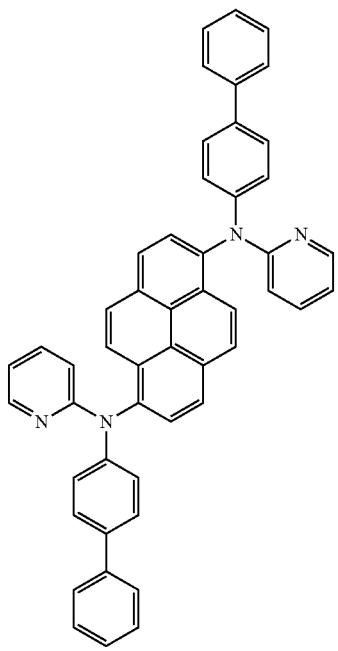
FD5
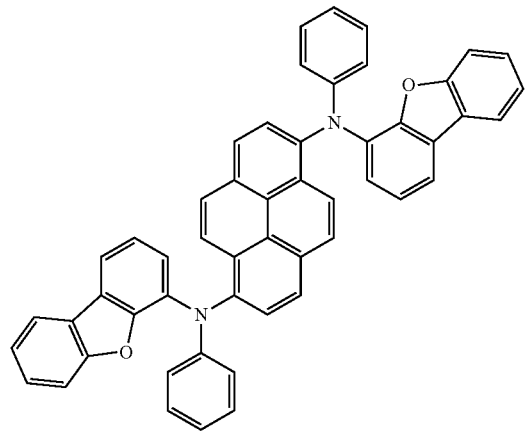
FD6
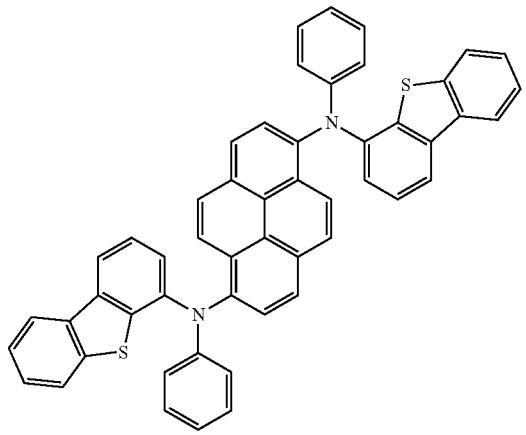
FD7
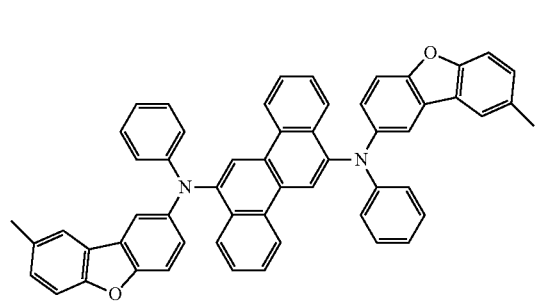
FD8
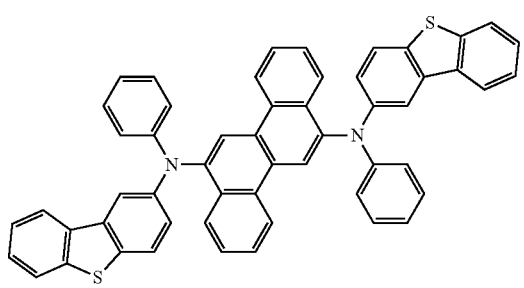

-continued

FD9
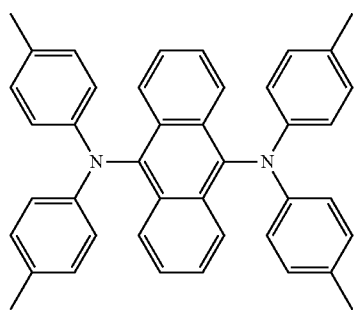

FD10
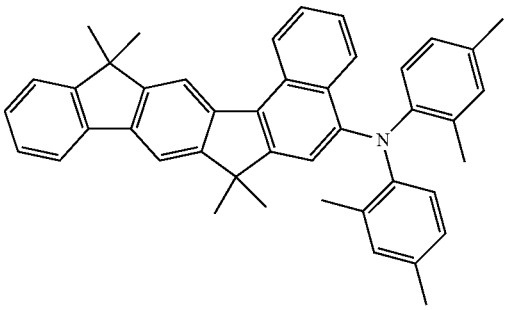

FD11
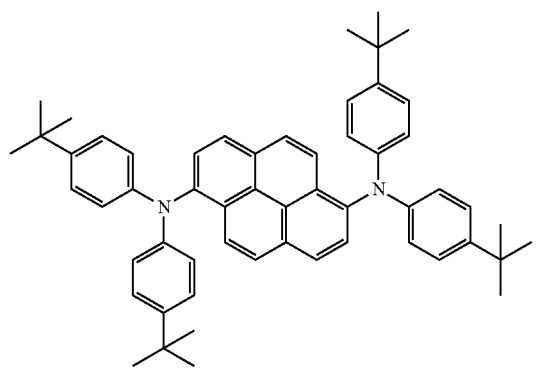

FD12
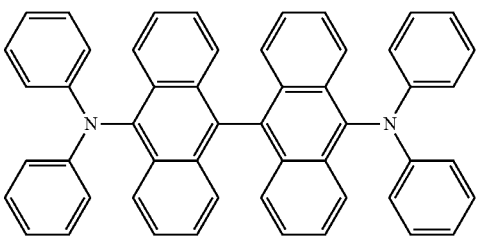

FD13
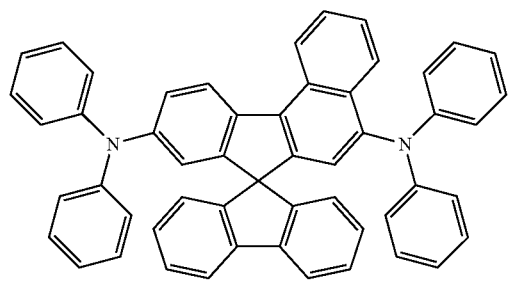

FD14
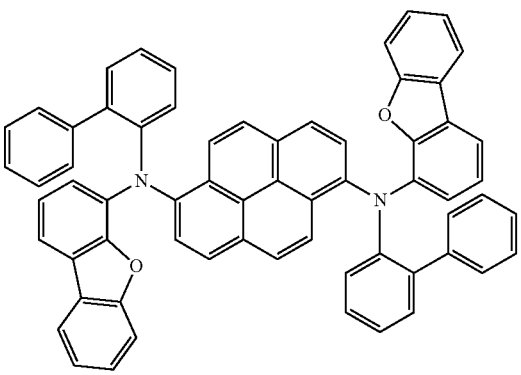

FD15
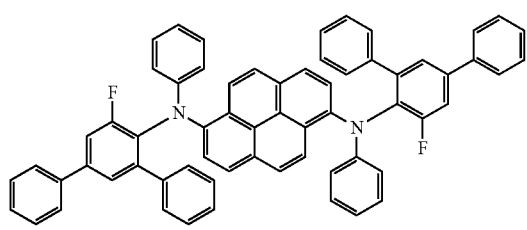

FD16
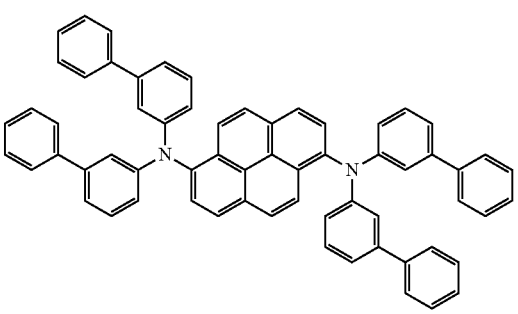

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. Here, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer further includes a hole transport region disposed between the first electrode and the emission layer and an electron transport region disposed between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure, a hole injection layer/hole transport layer/electron blocking layer structure, or a first hole injection layer/second hole injection layer/electron blocking layer structure, which, for each structure, are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202, or any combination thereof:

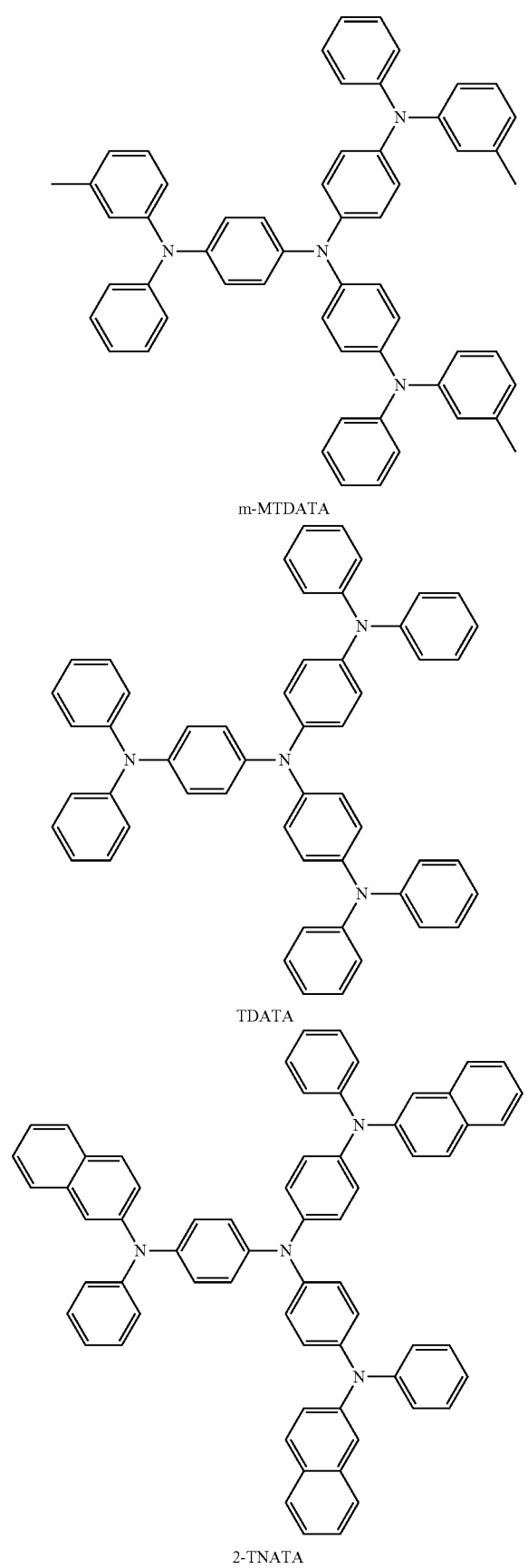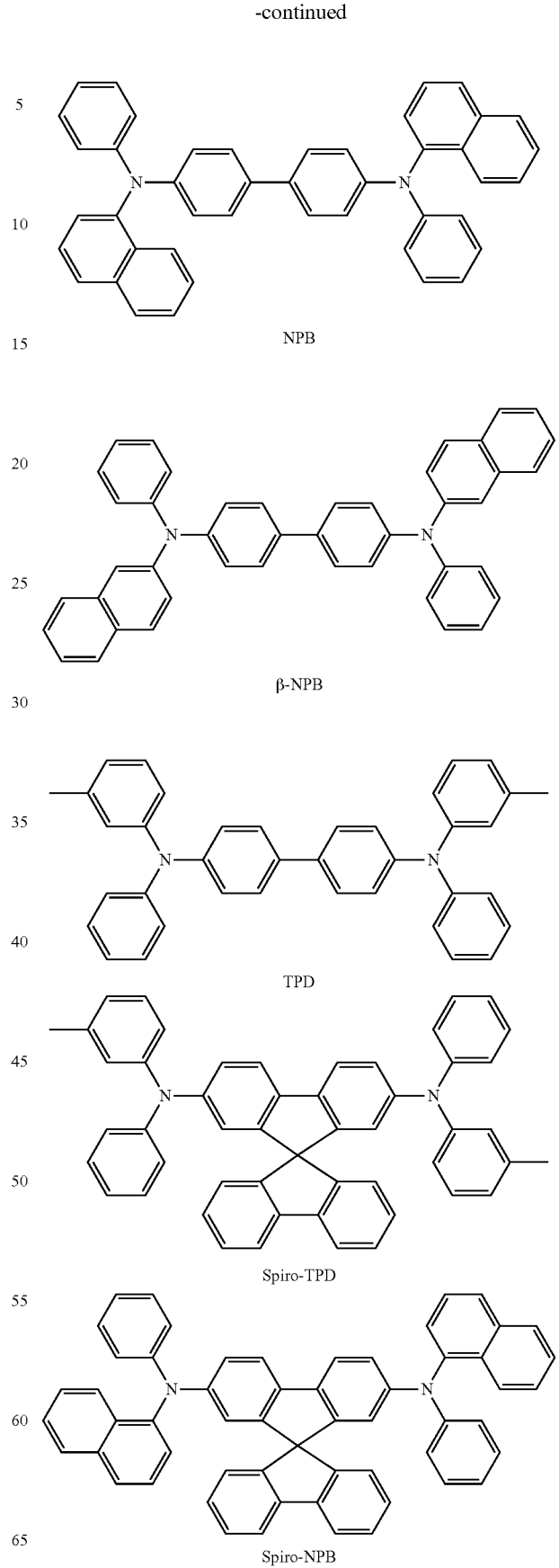

-continued

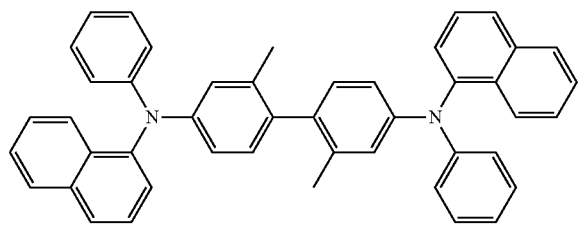

methylated NPB

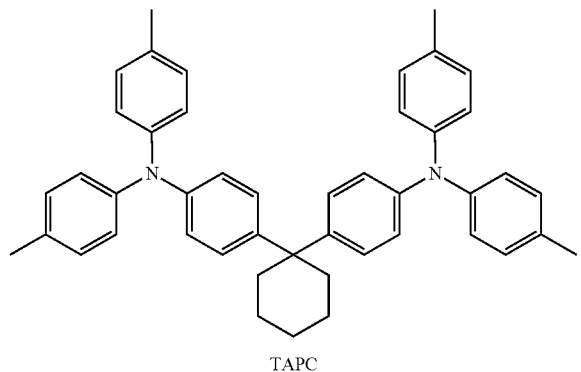

TAPC

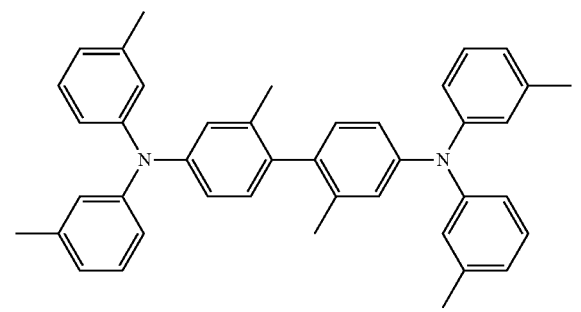

HMTPD

Formula 201

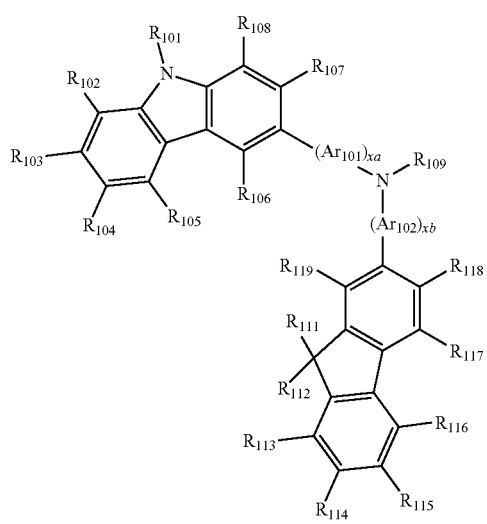

-continued

Formula 202

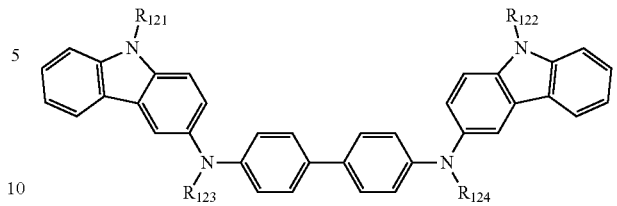

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1 or 2. For example, xa may be 1, and xb may be 0.

R$_{101}$ to R$_{108}$, R$_{111}$ to R$_{119}$ and R$_{121}$ to R$_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, or so on);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, a compound represented by Formula 201 may be represented by Formula 201A:

Formula 201A

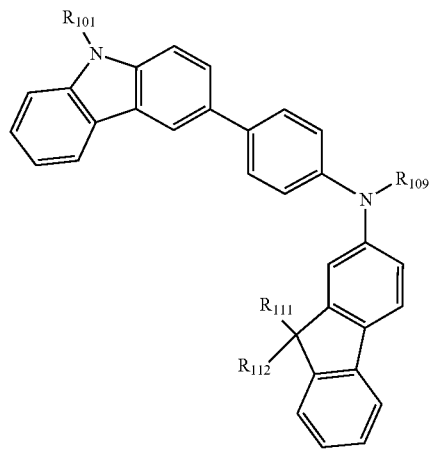

$R_{101}$, $R_{111}$, $R_{112}$, and $R_{109}$ in Formula 201A may be understood by referring to the description provided herein.

For example, the hole transport region may include one of compounds HT1 to HT20 or any combination thereof:

HT1

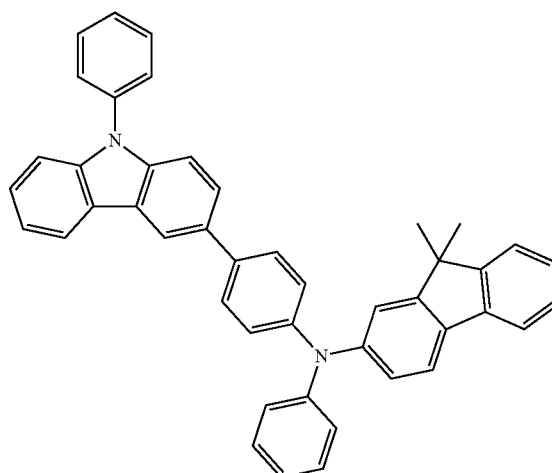

HT2

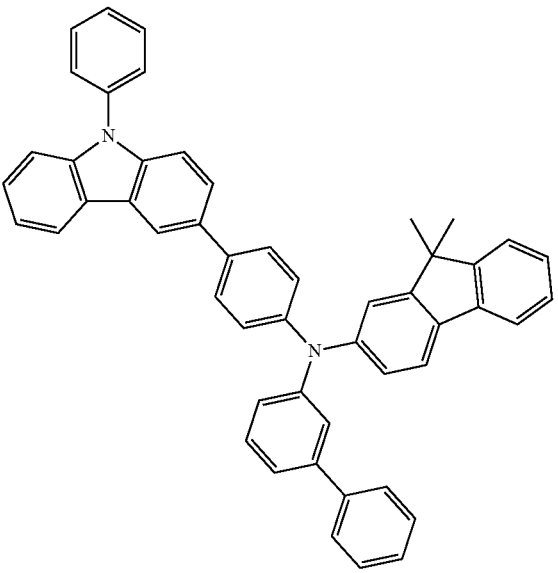

HT3

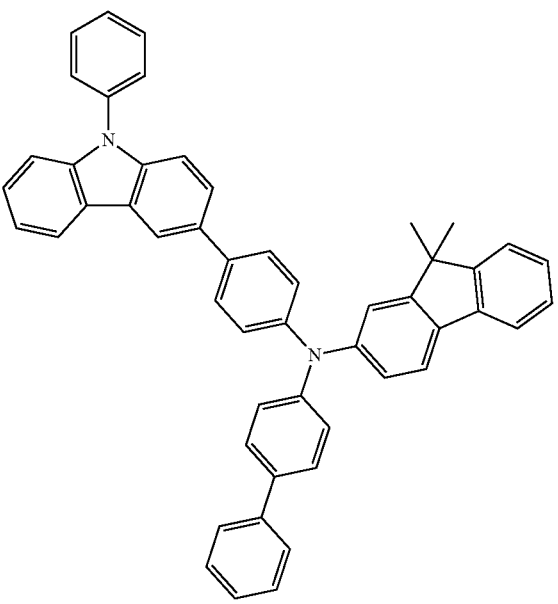

145
-continued
146
-continued
HT4
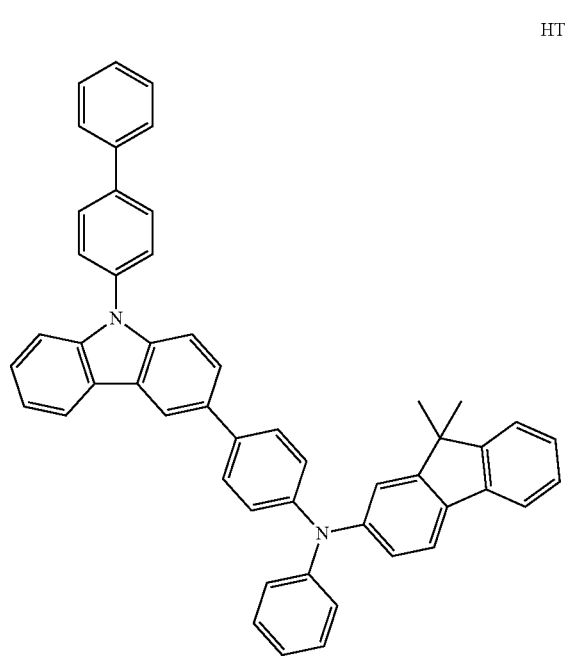
HT6
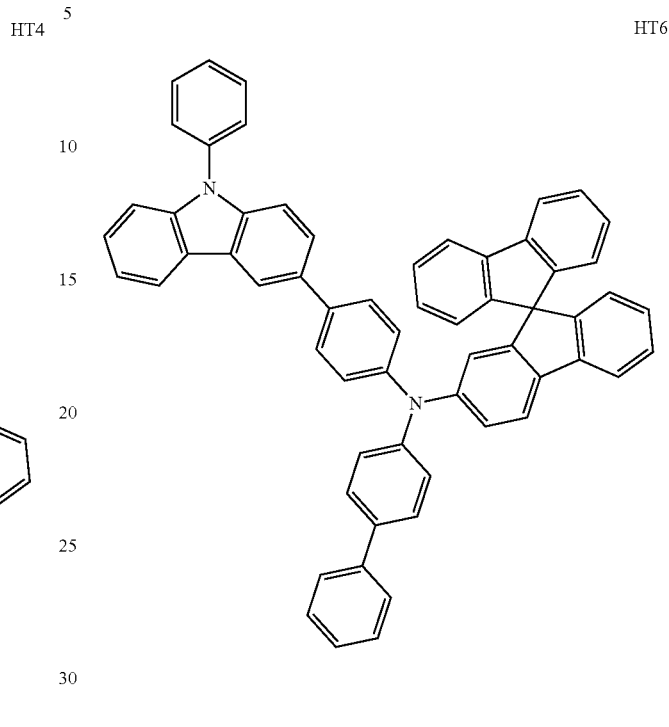
HT5
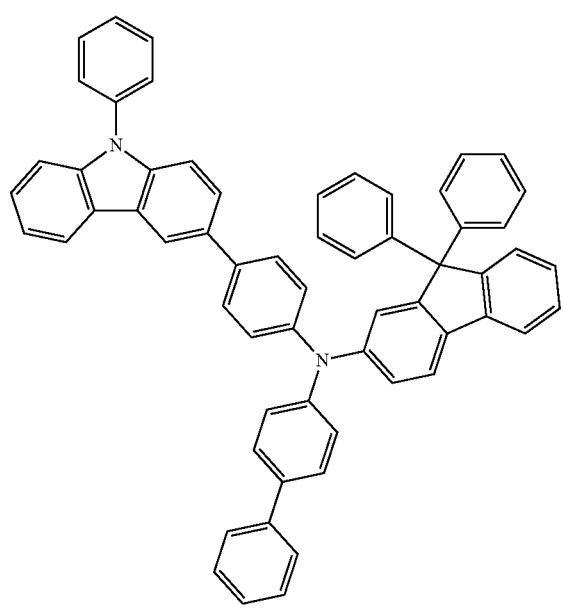
HT7

HT8
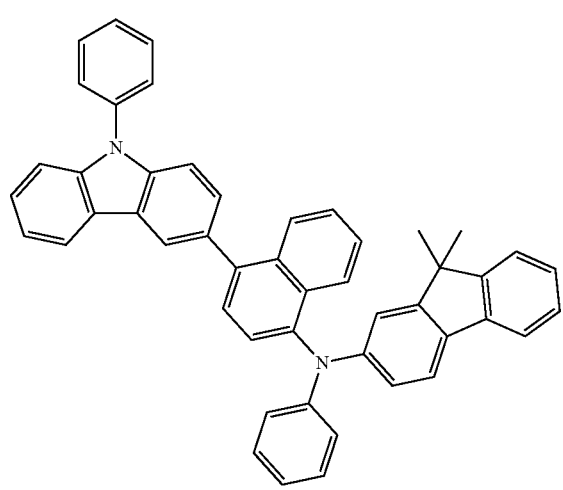
HT9
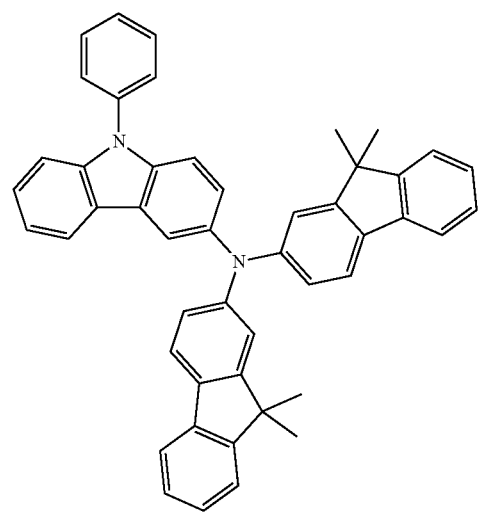
HT10
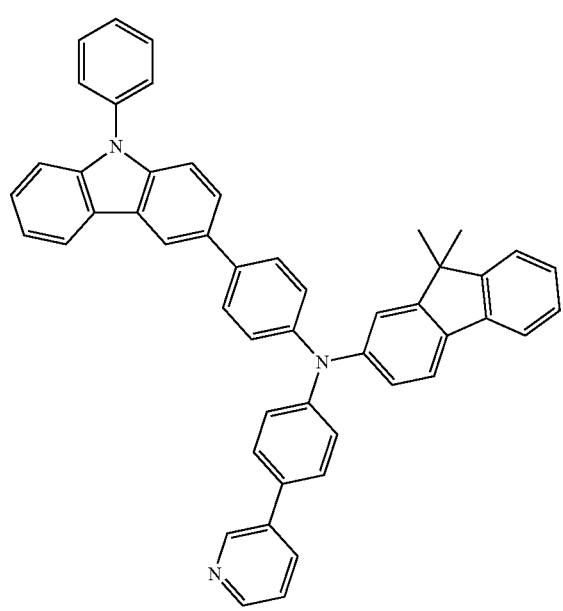
HT11
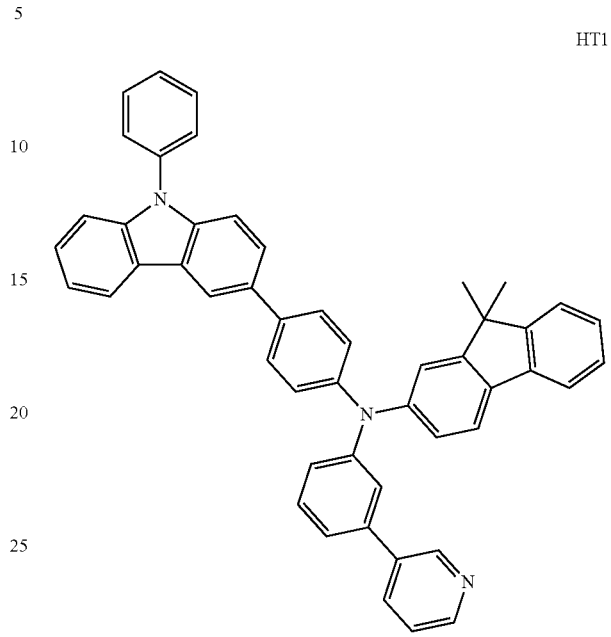
HT12
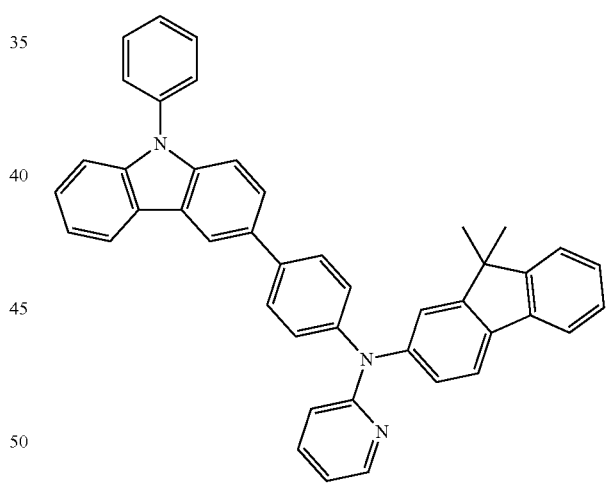
HT13
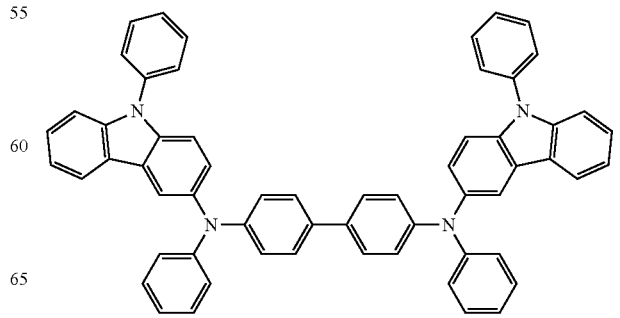

HT14
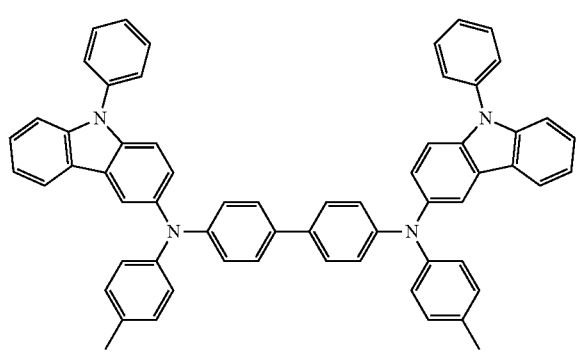

HT15
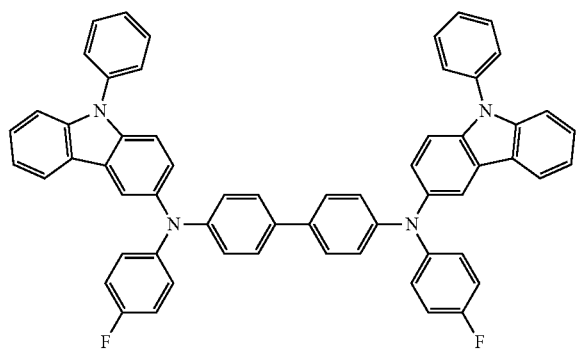

HT16
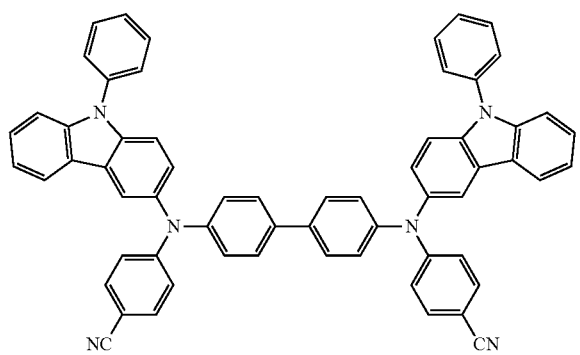

HT17
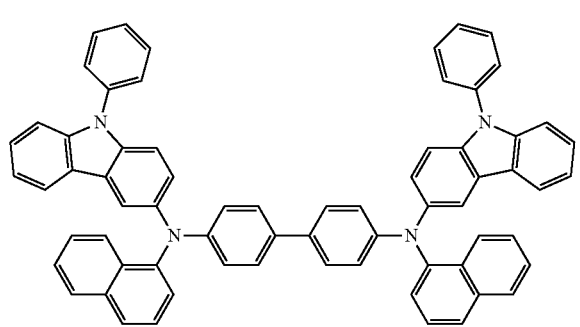

HT18
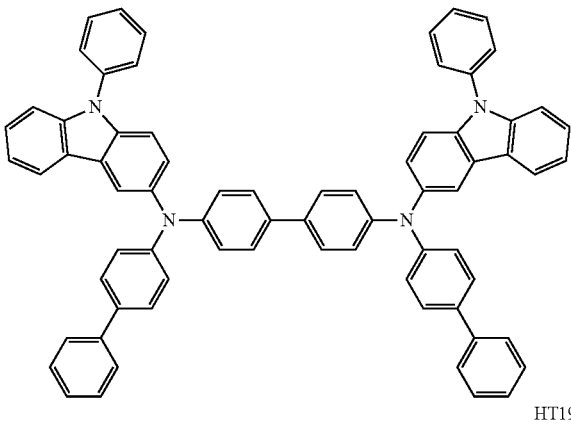

HT19
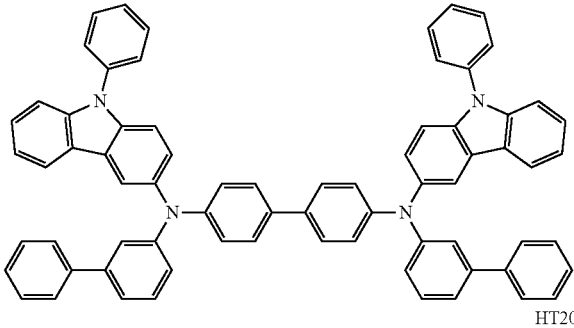

HT20
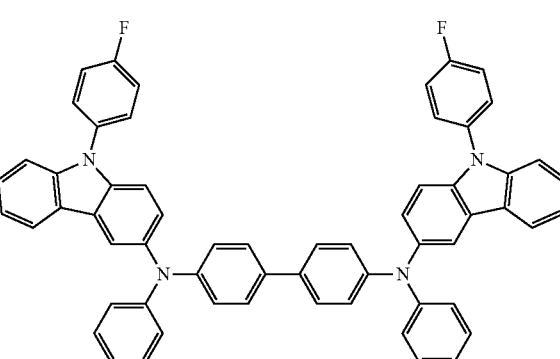

A thickness of the hole transport region may be from about 100 Å to about 10,000 Å, for example, about 100 Å to about 3,000 Å. When the hole transport region includes a hole injection layer, a hole transport layer, an electron blocking layer, or any combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. For example, the p-dopant may be a quinone derivative, such as tetracyanoquinonedimethane (TCNQ) or 2,3,5,6-tetrafluoro-tetracyano-1,4-benzoquinonedimethane (F4-TCNQ), or F6-TCNNQ; a metal oxide, such as a tungsten oxide or a molybdenum oxide; a cyano group-containing compound, such as Compound HT-D1 below, or any combination thereof.

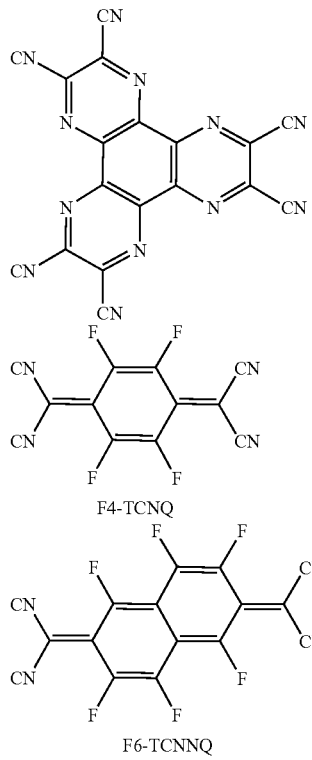

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 described in the present specification.

The host may include TPBi, TBADN, ADN (also referred to as "DNA"), CBP, CDBP, TCP, mCP, Compound H50, Compound H51, Compound H52, or any combination thereof:

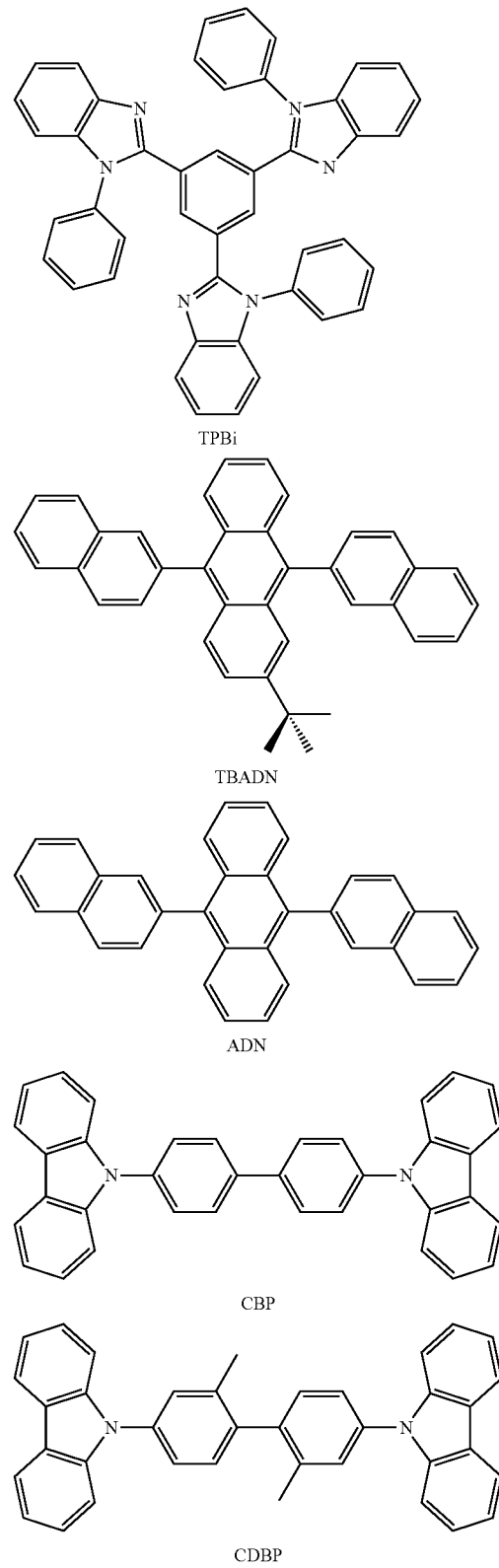

TCP mCP

H50

H51

H52 by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

BCP

Bphen

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts In one or more embodiment, the hole blocking layer may include the host, a material for an electron transport layer, a material for an electron injection layer, or any combination thereof, which will be described in detail.

A thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, Alq$_3$, BAlq, TAZ, NTAZ, or any combination thereof:
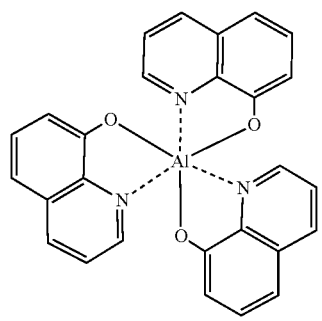
Alq$_3$
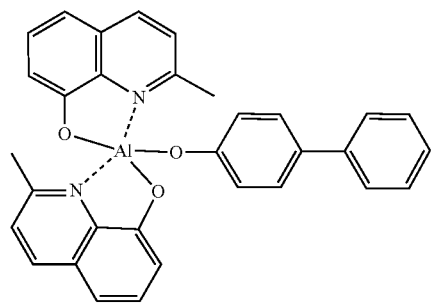
BAlq
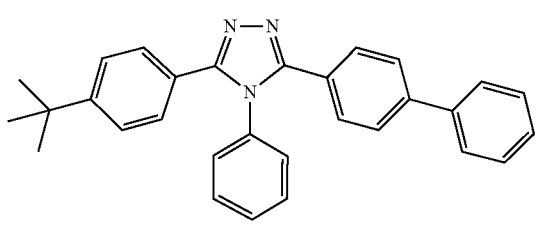
TAZ
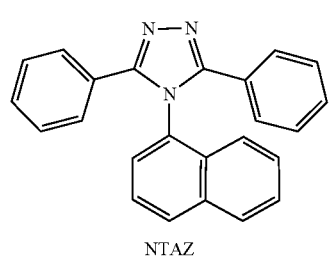
NTAZ
In one or more embodiments, the electron transport layer may include at least one of ET1 to ET25:
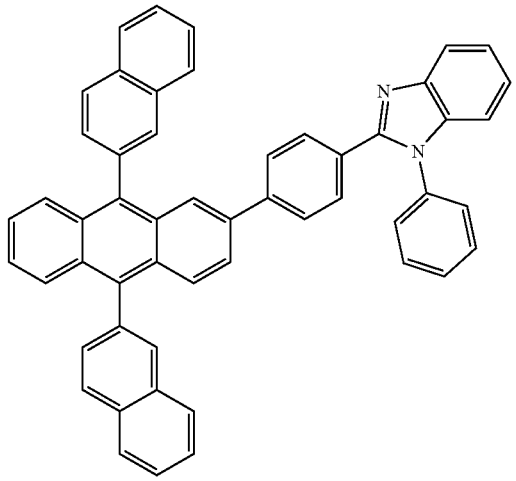
ET1
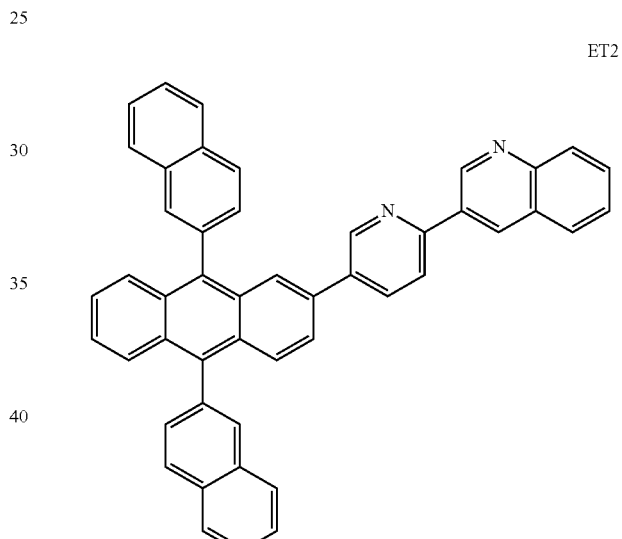
ET2
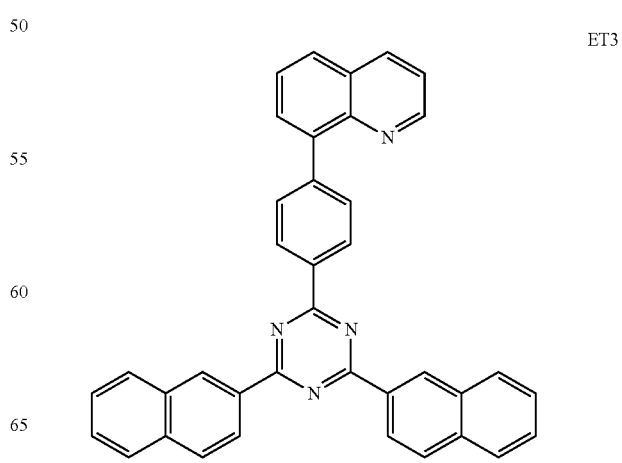
ET3

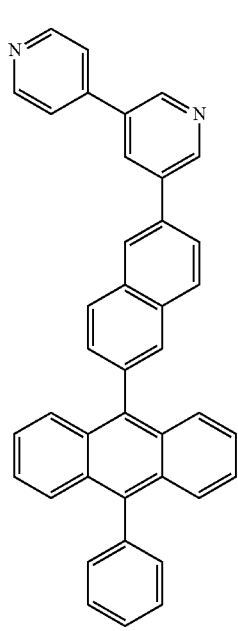
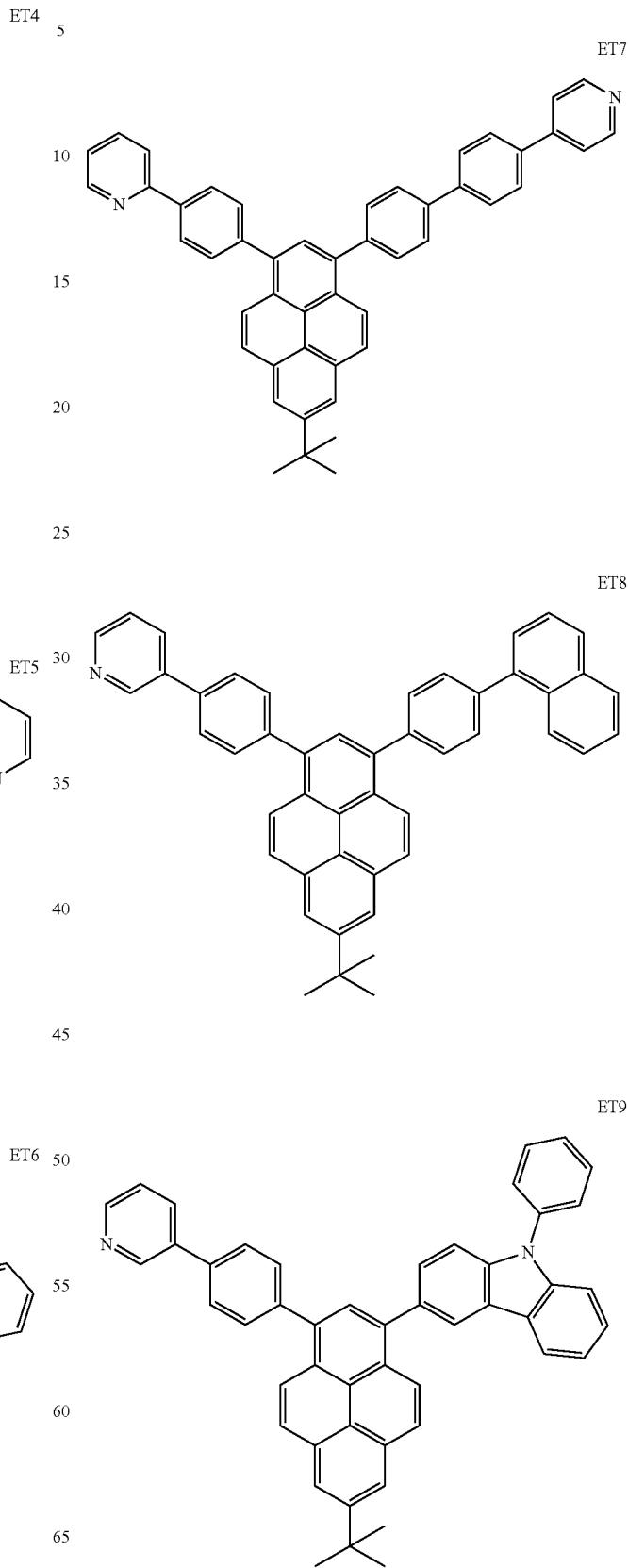

ET10
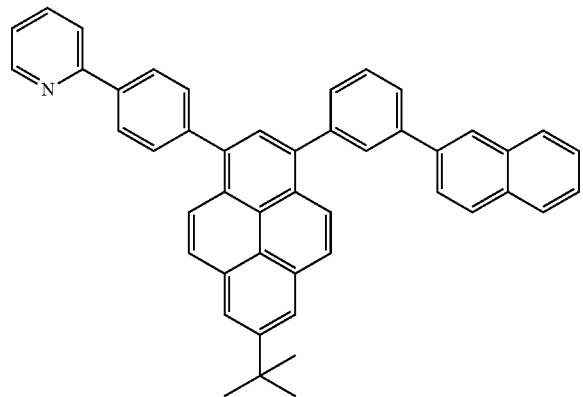
ET11
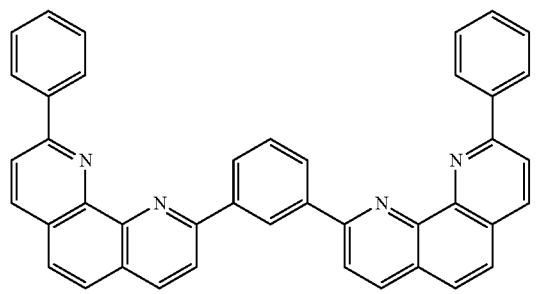
ET12
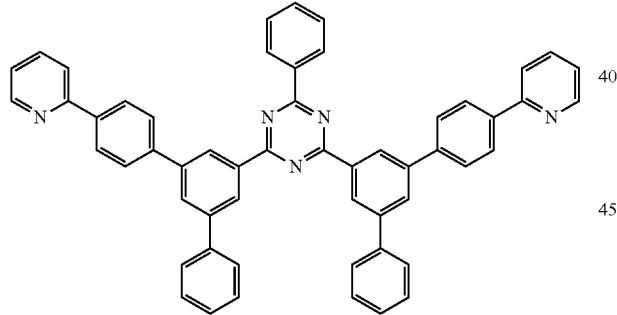
ET13
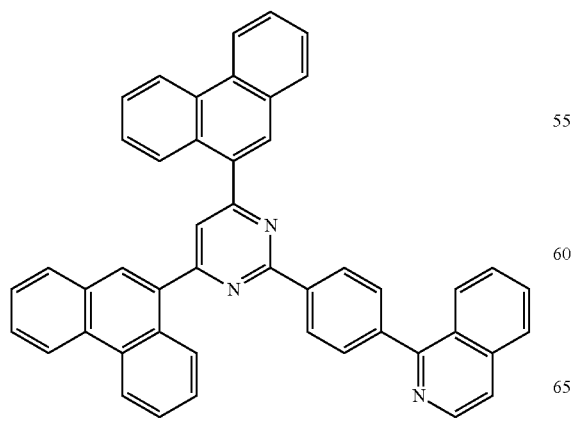
ET14
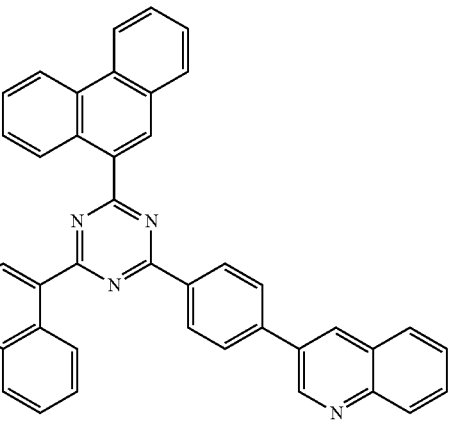
ET15
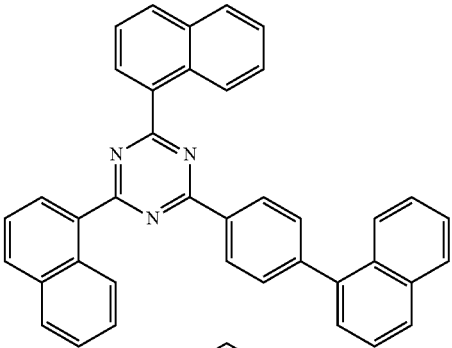
ET16
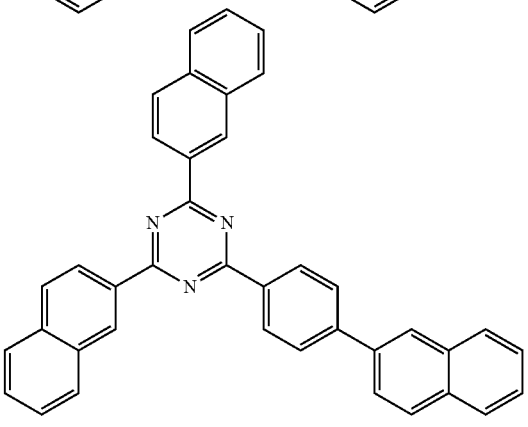
ET17
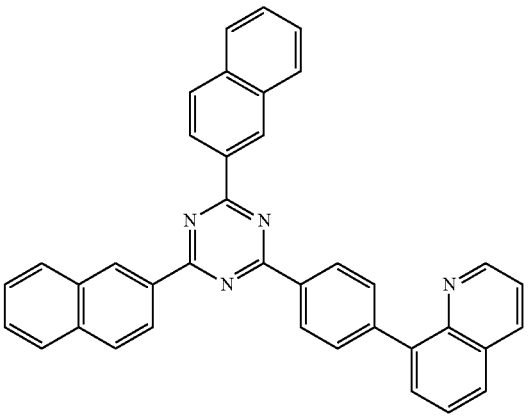

ET18
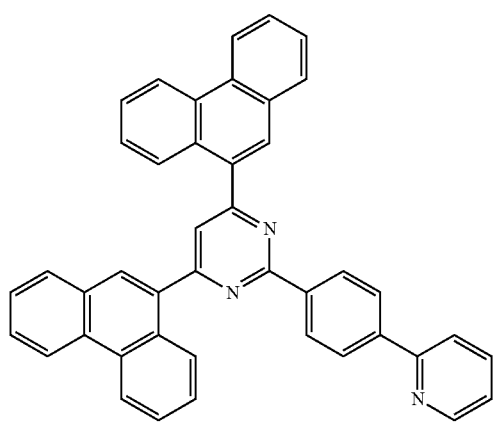
ET21
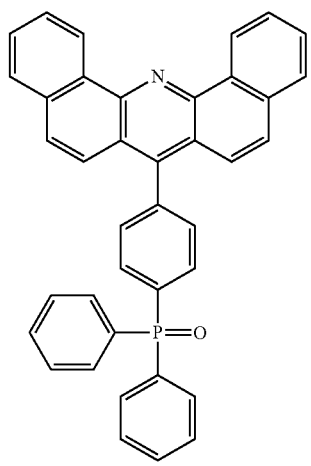
ET19
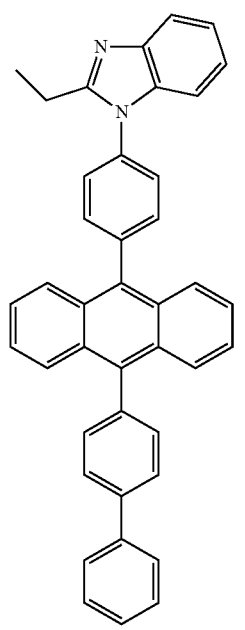
ET22
ET20
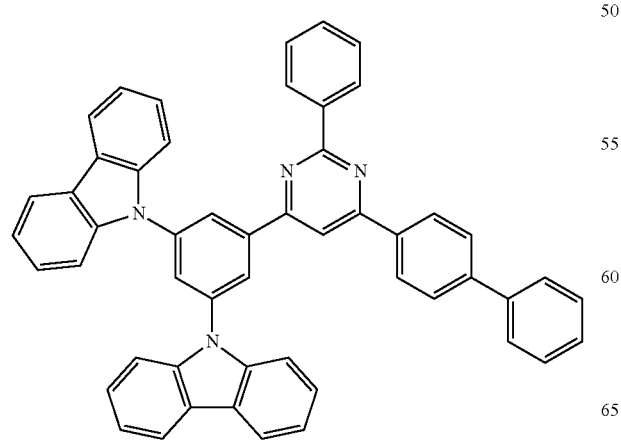
ET23
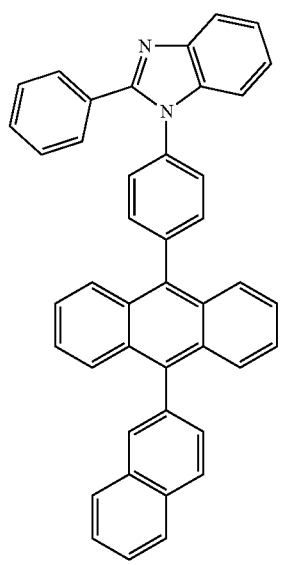

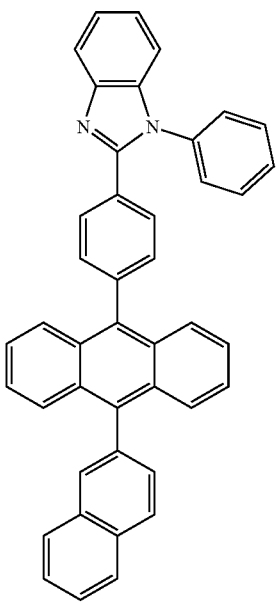
ET24

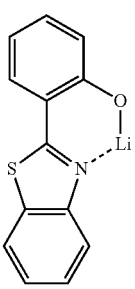
ET-D2

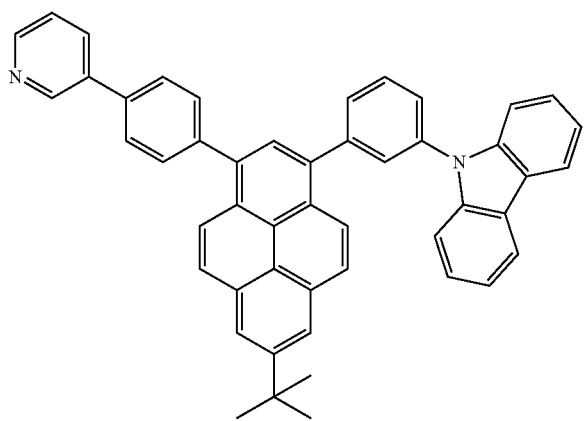
ET25

A thickness of the electron transport layer may be from about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or ET-D2:

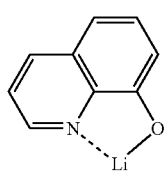
ET-D1

The electron transport region may include an electron injection layer (EIL) that promotes flow of electrons from the second electrode 19 thereinto.

The electron injection layer may include LiF, a NaCl, CsF, $Li_2O$, BaO, or any combination thereof.

A thickness of the electron injection layer may be in a range of about 1 Å to about 100 Å, and, for example, about 3 Å to about 90 Å. When a thickness of the electron injection layer is within these ranges, satisfactory electron injection characteristics may be obtained without substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, and may be a tert-butyl group substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

Examples of "a $C_1$-$C_{60}$ alkoxy group, a $C_1$-$C_{20}$ alkoxy group, or a $C_1$-$C_{10}$ alkoxy group" are a methoxy group, an ethoxy group, a propoxy group, a butoxy group, and a pentoxy group.

The term "$C_1$-$C_{60}$ alkylthio group" used herein refers to a monovalent group represented by —$SA_{101}$ (wherein $A_{101}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group(bicyclo[1.1.1]pentyl), a bicyclo[2.1.1]hexyl group(bicyclo[2.1.1]hexyl), a bicyclo[2.2.1]heptyl group (bicyclo[2.2.1]heptyl) (norbornanyl group), a bicyclo[2.2.2]octyl group, etc.

The term "$C_1$-$C_{10}$ heterocycloalkyl group" as used herein refers to a monovalent saturated monocyclic group having at least one N, O, P, Si, Se, Ge, B, S, or any combination thereof as a ring-forming atom and 1 to 10 carbon atoms, and examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

Examples of the term "$C_1$-$C_{10}$ heterocycloalkyl group" as used herein are a silolanyl group, a silinanyl group, a tetrahydrofuranyl group group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, Se, Ge, B, S, or any combination thereof as a ring-forming atom, 2 to 10 carbon atoms, and at least one double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{59}$ aryl group substituted with at least one $C_1$-$C_{54}$ alkyl group.

The term "$C_1$-$C_{60}$ heteroaryl group" as used herein refers to a monovalent group having a cyclic aromatic system that has at least one heteroatom selected from N, O, P, Si, Se, Ge, B, S, or any combination thereof as a ring-forming atom, and 1 to 60 carbon atoms. The term "$C_1$-$C_{60}$ heteroarylene group" as used herein refers to a divalent group having a cyclic aromatic system that has at least one heteroatom selected from N, O, P, Si, Se, Ge, B, S, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The $C_2$-$C_{60}$ alkylheteroaryl group used herein refers to a $C_1$-$C_{59}$ heteroaryl group substituted with at least one $C_1$-$C_{59}$ alkyl group.

The term "$C_6$-$C_{60}$ aryloxy group" as used herein refers to —$OA_{102}$ (herein, $A_{102}$ is the $C_6$-$C_{60}$ aryl group), the term "$C_6$-$C_{60}$ arylthio group as used herein refers to —$SA_{103}$ (herein, $A_{103}$ is the $C_6$-$C_{60}$ aryl group), and the term "$C_1$-$C_{60}$ alkylthio group" as used herein refers to —$SA_{104}$ (herein, $A_{104}$ is the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as that of the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, Se, Ge, B, S, or any combination thereof other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as that of the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The term "$C_5$-$C_{30}$ carbocyclic group (unsubstituted or substituted with at least one $R_{10a}$)" used herein may include, for example, an adamantane group, a norbornene group, a bicyclo[1.1.1]pentane group, a bicyclo[2.1.1] hexane group, a bicyclo[2.2.1]heptane group(norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, and a fluorene group. each (unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, Si, P, Se, Ge, B, S, or any combination thereof other than 1 to 30 carbon atoms. The $C_1$-$C_{30}$ heterocyclic group may be a monocyclic group or a polycyclic group. The term "$C_1$-$C_{30}$ heterocyclic group that is unsubstituted or substituted with at least one $R_{10a}$" may include, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each unsubstituted or substituted with at least one $R_{10a}$.

The "deuterated $C_2$-$C_{20}$ alkyl group" may respectively be a $C_2$-$C_{20}$ alkyl group substituted with at least one deuterium. For example, the "deuterated $C_2$ alkyl group (that is, the deuterated ethyl group)" may include —$CH_2CD_3$, —$CH_2CD_2H$, —$CH_2CDH_2$, —$CHDCD_3$, —$CHDCD_2H$, —$CHDCDH_2$, —$CD_2CD_3$, —$CD_2CD_2H$, and —$CD_2CDH_2$. The "deuterated $C_2$-$C_{20}$ alkyl group" may be i) the case in which all hydrogen included in each group is substituted with deuterium, including a fully deuterated $C_2$-$C_{20}$ alkyl group, or ii) the case in which all hydrogen included in each group is substituted with deuterium, including a partially deuterated $C_2$-$C_{20}$ alkyl group.

The term "($C_1$-$C_{20}$ alkyl) 'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" refers to a $C_3$-$C_{10}$ cycloalkyl group substituted with at least one $C_1$-$C_{20}$ alkyl group, and the term "($C_1$-$C_{20}$ alkyl)phenyl group" refers to a phenyl group substituted with at least one $C_1$-$C_{20}$ alkyl group. An example of the ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" each refers to a hetero ring obtained by substituting, with nitrogen, at least one carbon that forms the ring, and having the same backbone of a corresponding group selected from "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group."

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof; —N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof;

wherein $Q_1$ to $Q_9$, $Q_{11}$ to $Q_{19}$, $Q_{21}$ to $Q_{29}$ and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group that is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group that is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 2)

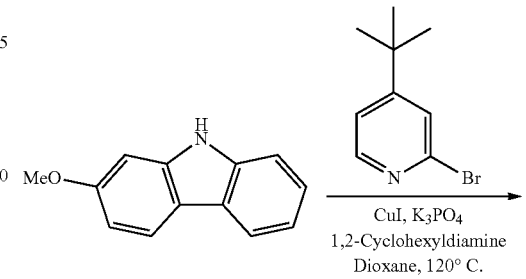

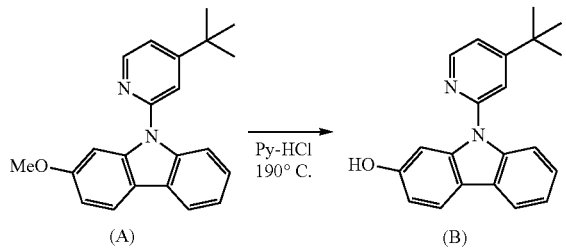

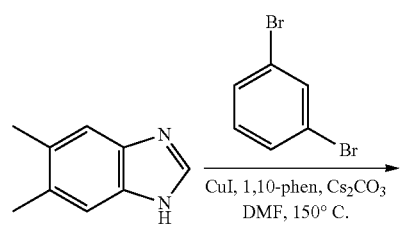

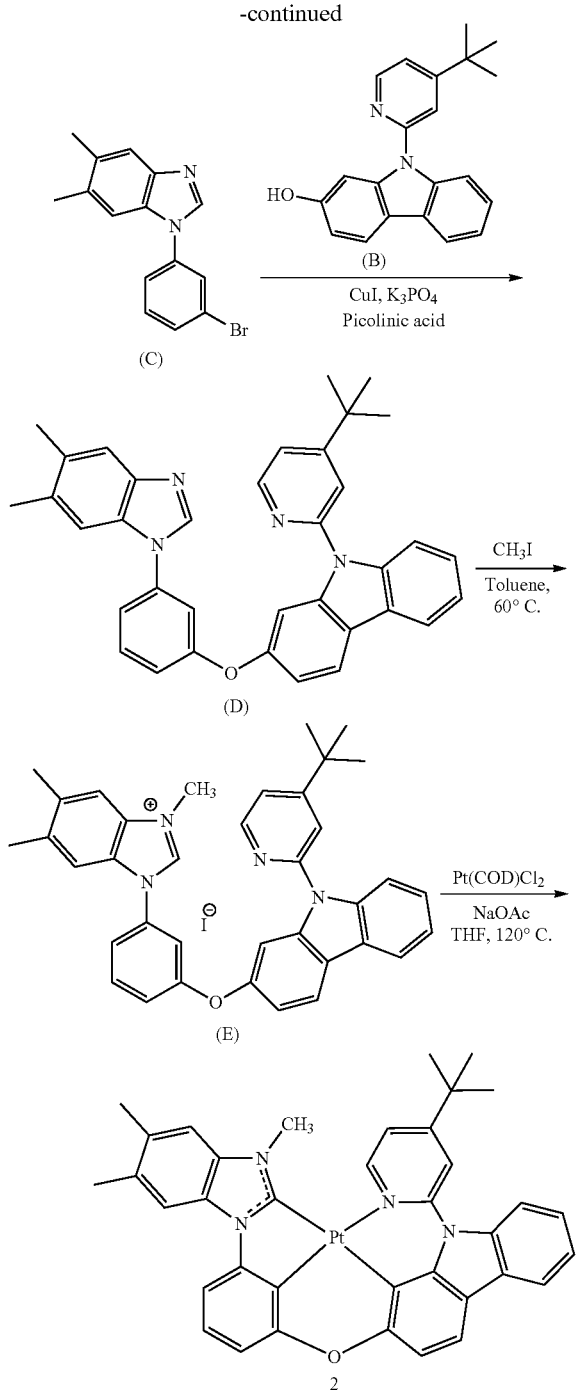

(1) Synthesis of Intermediate (A)

2-methoxy-9H-carbazole (15.0 g, 76.06 mmol), 2-bromo-4-(tert-butyl)pyridine (19.52 g, 91.27 mmol), copper (I) iodide (2.90 g, 15.21 mmol), 1,2-cyclohexyldiamine (3.47 g, 30.42 mmol), and $K_3PO_4$ (potassium phosphate tribasic) (32.31 g, 152.12 mmol) were mixed with 150 ml of 1,4-dioxane, and then, the mixture was stirred at a temperature of 120° C. for 18 hours. After the reaction was terminated, the mixture was cooled to room temperature, and an organic layer extracted by using saturated ammonium chloride ($NH_4Cl$) and dichloromethane (DCM). The DCM was dried using anhydrous magnesium sulfate ($MgSO_4$), followed by filtering, and condensing under reduced pressure. Silica gel column chromatography was performed on the crude product to produce Intermediate (A) (20.11 g, 60.85 mmol, and yield=80%).

LC-Mass (calculated: 330.17 g/mol, found: $M^{+1}$=331 g/mol).

(2) Synthesis of Intermediate (B)

Intermediate (A) (20.11 g, 60.85 mmol) and pyridine hydrochloride (70.3 g, 600.9 mmol) were stirred at a temperature of 190° C. for 18 hours. After the reaction was terminated, the mixture was cooled to room temperature, and an organic layer extracted by using saturated ammonium chloride ($NH_4Cl$) and dichloromethane (DCM). The DCM was dried using anhydrous magnesium sulfate ($MgSO_4$), followed by filtering, and condensing under reduced pressure. Silica gel column chromatography was performed on the crude product to produce Intermediate (B) (20.11 g, 60.85 mmol, and yield=80%).

LC-Mass (calculated: 316.16 g/mol, found: $M^{+1}$=317 g/mol).

(3) Synthesis of Intermediate (C)

5,6-dimethyl-1H-benzo[d]imidazole (15.0 g, 102.60 mmol), 1,3-dibromobenzene (24.20 g, 102.60 mmol), copper (I) iodide (3.91 g, 20.52 mmol), 1,10-phenanthroline (5.55 g, 30.78 mmol), and cesium carbonate (66.86 g, 205.20 mmol) were mixed with 250 ml of dimethylformamide (DMF), and then, the mixture was stirred at a temperature of 150° C. for 18 hours. After the reaction was terminated, the mixture was cooled to room temperature, and an organic layer extracted by using saturated ammonium chloride ($NH_4Cl$) and dichloromethane (DCM). The organic layer was dried using anhydrous magnesium sulfate ($MgSO_4$), followed by filtering, and condensing under reduced pressure. Silica gel column chromatography was performed on the crude product to produce Intermediate (C) (14.52 g, 48.22 mmol, yield=47%).

LC-Mass (calculated: 300.02 g/mol, found: $M^{+1}$=301 g/mol).

(4) Synthesis of Intermediate (D)

Intermediate (C) (5.0 g, 16.60 mmol), Intermediate (B) (5.25 g, 16.60 mmol), copper (I) iodide (0.63 g, 3.32 mmol), picolinic acid (0.82 g, 6.64 mmol), and potassium phosphate tribasic (7.05 g, 33.20 mmol) were mixed with 80 ml of dimethylsulfoxide (DMSO), and then, the mixture was stirred at a temperature of 120° C. for 18 hours. After the reaction was terminated, the mixture was cooled to room temperature, and an organic layer extracted by using saturated ammonium chloride ($NH_4Cl$) and ethyl acetate (EA). The organic layer was dried using anhydrous magnesium sulfate ($MgSO_4$), followed by filtering, and condensing under reduced pressure. Silica gel column chromatography was performed on the crude product to produce Intermediate (D) (5.35 g, 9.96 mmol, yield=60%).

LC-Mass (calculated: 536.26 g/mol, found: $M^{+1}$=537 g/mol).

(5) Synthesis of Intermediate (E)

Intermediate (D) (5.35 g, 9.96 mmol) and methyl iodide (4.24 g, 29.88 mmol) were mixed with 50 ml of toluene, and then, the mixture was stirred at a temperature of 60° C. for 12 hours. After the reaction was terminated, the mixture was cooled to room temperature, and then, silica gel column chromatography was performed on the crude product obtained by condensation under reduced pressure to produce Intermediate (E) (5.41 g, 7.97 mmol, yield=80%).

(6) Synthesis of Compound 2

Intermediate (E) (5.41 g, 7.97 mmol), $Pt(COD)Cl_2$ (3.28 g, 8.77 mmol), and sodium acetate (1.96 g, 23.91 mmol) were mixed with 80 ml of tetrahydrofuran (THF), and then, the mixture was stirred at a temperature of 120° C. for 48 hours. After the reaction was terminated, the mixture was cooled to room temperature, and an organic layer extracted by using saturated ammonium chloride (NH₄Cl) and EA. The organic layer was dried using anhydrous magnesium sulfate (MgSO₄), followed by filtering, and condensing under reduced pressure. Silica gel column chromatography was performed on the obtained result to produce Compound 2 (1.78 g, 2.39 mmol, yield=30%).

LC-Mass (calculated: 743.22 g/mol, found: $M^{+1}$=744 g/mol).

Synthesis Example 2 (Compound 3)

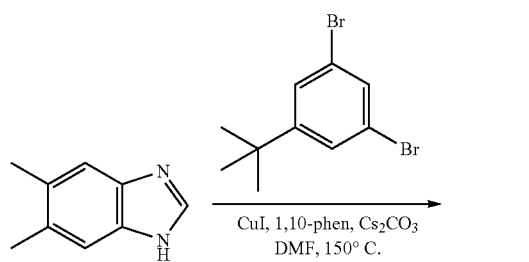

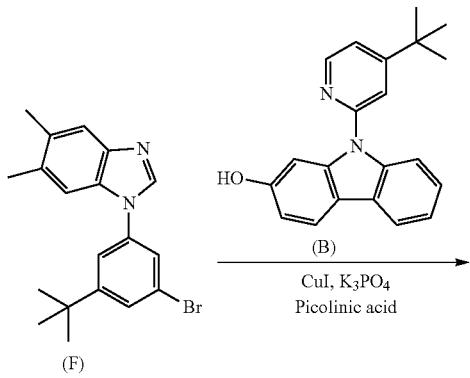

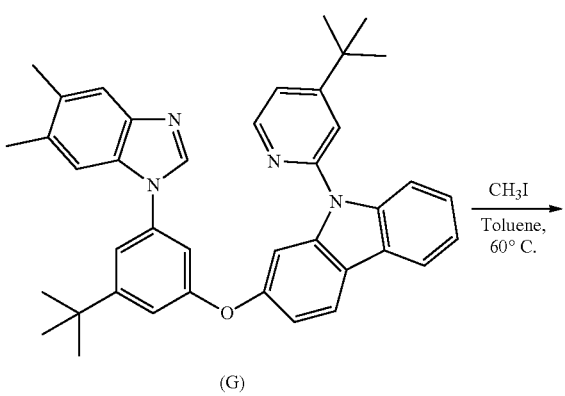

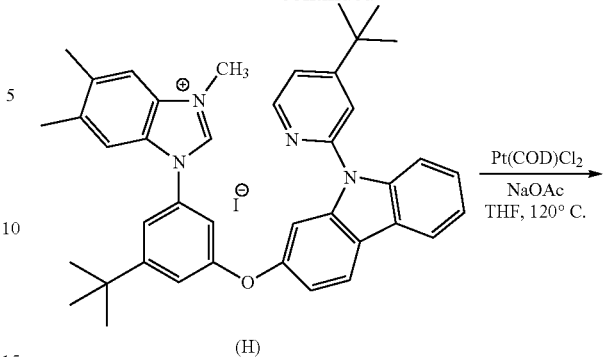

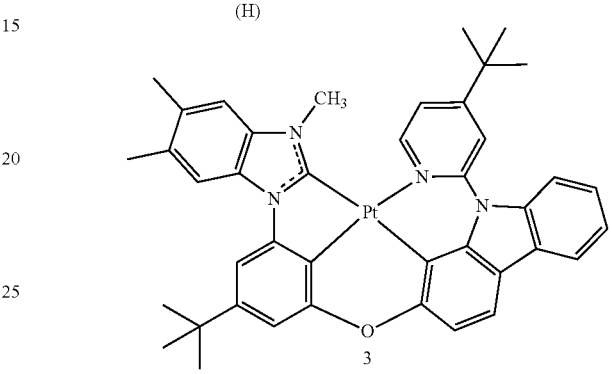

(1) Synthesis of Intermediate (F)

5,6-dimethyl-1H-benzo[d]imidazole (15.0 g, 102.60 mmol), 1,3-dibromo-5-(tert-butyl)benzene (30.0 g, 102.60 mmol), copper (I) iodide (3.91 g, 20.52 mmol), 1,10-phenanthroline (5.55 g, 30.78 mmol), and cesium carbonate (66.86 g, 205.20 mmol) were mixed with 250 ml of DMF, and then, the mixture was stirred at a temperature of 150° C. for 18 hours. After the reaction was terminated, the mixture was cooled to room temperature, and an organic layer extracted by using saturated ammonium chloride (NH₄Cl) and DCM. The organic layer was dried using anhydrous magnesium sulfate (MgSO₄), followed by filtering, and condensing under reduced pressure. Silica gel column chromatography was performed on the crude product to produce Intermediate (F) (17.60 g, 49.25 mmol, yield=48%).

LC-Mass (calculated: 356.09 g/mol, found: $M^{+1}$=357 g/mol).

(2) Synthesis of Intermediate (G)

Intermediate (F) (5.0 g, 14.0 mmol), Intermediate (B) (4.43 g, 14.0 mmol), copper (I) iodide (0.53 g, 2.80 mmol), picolinic acid (0.69 g, 5.60 mmol), and potassium phosphate tribasic (5.94 g, 28.0 mmol) were mixed with 70 ml of DMSO, and then, the mixture was stirred at a temperature of 120° C. for 18 hours. After the reaction was terminated, the mixture was cooled to room temperature, and an organic layer extracted by using saturated ammonium chloride (NH₄Cl) and ethyl acetate (EA). The organic layer was dried using anhydrous magnesium sulfate (MgSO₄), followed by filtering, and condensing under reduced pressure. Silica gel column chromatography was performed on the crude product to produce Intermediate (G) (5.23 g, 8.82 mmol, yield=63%).

LC-Mass (calculated: 592.32 g/mol, found: $M^{+1}$=593 g/mol).

(3) Synthesis of Intermediate (H)

Intermediate (G) (5.23 g, 8.82 mmol) and methyl iodide (3.76 g, 26.46 mmol) were mixed with 50 ml of toluene, and then, the mixture was stirred at a temperature of 60° C. for 12 hours. After the reaction was terminated, the mixture was cooled to room temperature, and then, silica gel column chromatography was performed on the crude product obtained by condensation under reduced pressure to produce Intermediate (E) (5.31 g, 7.23 mmol, yield=82%).

(4) Synthesis of Compound 3

Intermediate (H) (5.31 g, 7.23 mmol), Pt(COD)Cl$_2$ (2.98 g, 7.95 mmol), and sodium acetate (1.78 g, 21.69 mmol) were mixed with 75 ml of THF, and then, the mixture was stirred at a temperature of 120° C. for 48 hours. After the reaction was terminated, the mixture was cooled to room temperature, and an organic layer extracted by using saturated ammonium chloride (NH$_4$Cl) and EA. The organic layer was dried using anhydrous magnesium sulfate (MgSO$_4$), followed by filtering, and condensing under reduced pressure. Silica gel column chromatography was performed on the crude product to produce Compound 3 (2.02 g, 2.53 mmol, yield=35%).

LC-Mass (calculated: 743.22 g/mol, found: M$^{+1}$=744 g/mol).

Synthesis Example 3 (Compound 4)

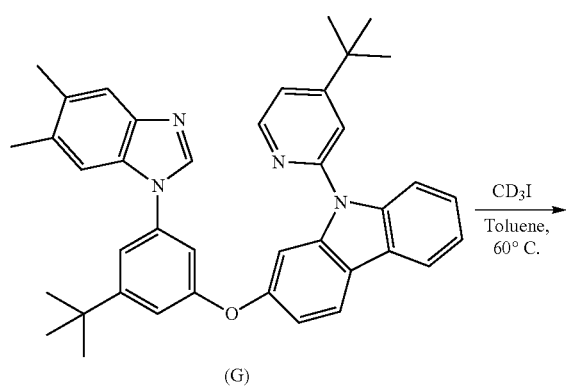

(G)

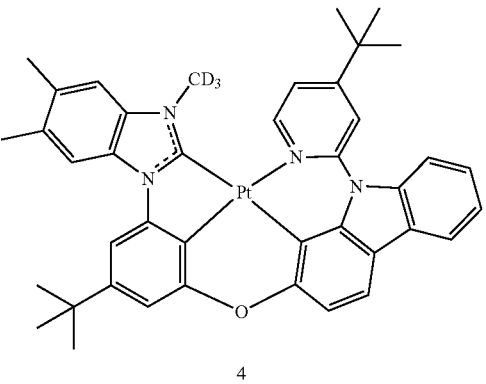

4

(1) Synthesis of Intermediate (I)

Intermediate (G) (5.23 g, 8.82 mmol) and methyl iodide-d3 (3.84 g, 26.46 mmol) were mixed with 40 ml of toluene, and the mixture was stirred at a temperature of 60° C. for 12 hours. After the reaction was terminated, the mixture was cooled to room temperature, and then, silica gel column chromatography was performed on the result obtained by condensation under reduced pressure to produce Intermediate (I) (5.21 g, 7.06 mmol, yield=80%).

(2) Synthesis of Compound 4

Intermediate (I) (5.21 g, 7.06 mmol), Pt(COD)Cl$_2$ (2.91 g, 7.77 mmol), and sodium acetate (1.74 g, 21.18 mmol) were mixed with 70 ml of THF, and then, the mixture was stirred at a temperature of 120° C. for 48 hours. After the reaction was terminated, the mixture was cooled to room temperature, and an organic layer extracted by using saturated ammonium chloride (NH$_4$Cl) and EA. The organic layer was dried using anhydrous magnesium sulfate (MgSO$_4$), followed by filtering, and condensing under reduced pressure. Silica gel column chromatography was performed on the crude product to produce Compound 4 (2.10 g, 2.61 mmol, yield=37%).

Synthesis Example 4 (Compound 5)

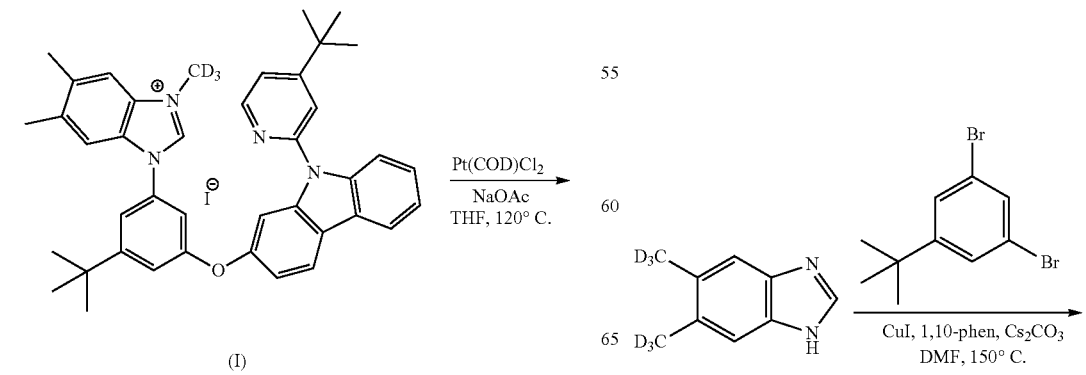

(I)

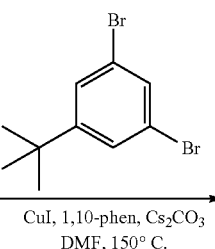

-continued

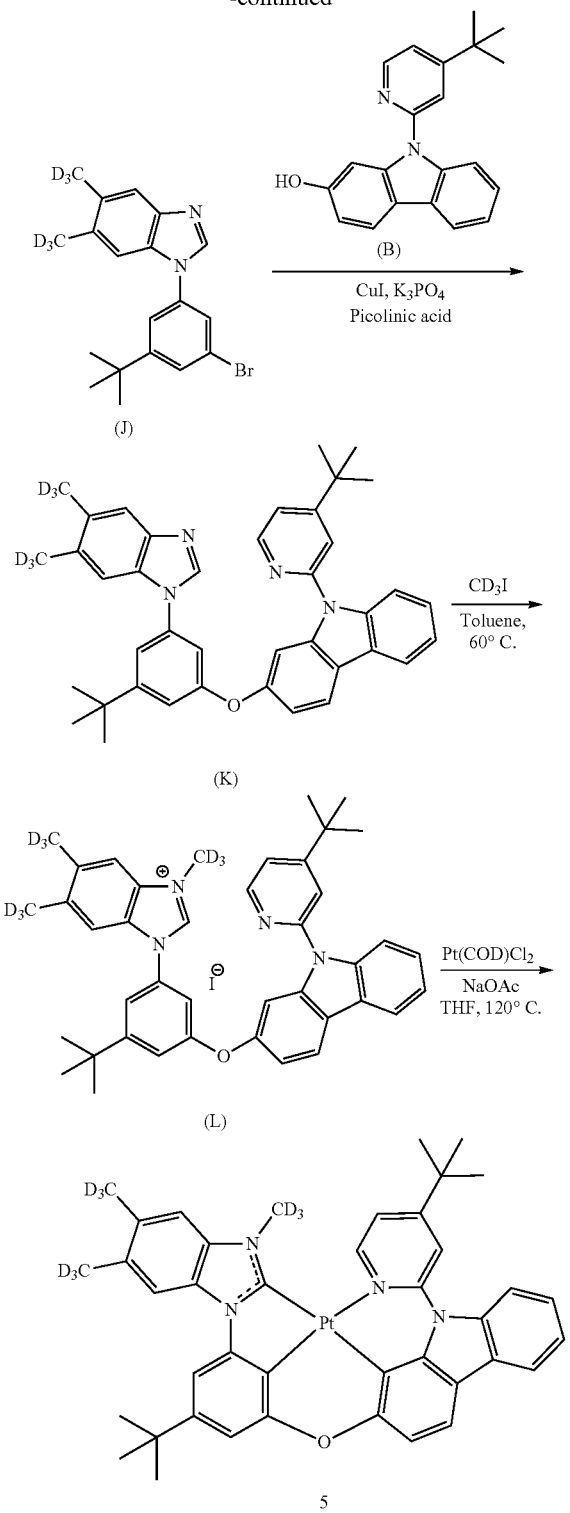

(1) Synthesis of Intermediate (J)

5,6-dimethyl-1H-benzo[d]imidazole-d6 (15.6 g, 102.60 mmol), 1,3-dibromo-5-(tert-butyl)benzene (30.0 g, 102.60 mmol), copper (I) iodide (3.91 g, 20.52 mmol), 1,10-phenanthroline (5.55 g, 30.78 mmol), and cesium carbonate (66.86 g, 205.20 mmol) were mixed with 250 ml of DMF, and then, the mixture was stirred at a temperature of 150° C. for 18 hours. After the reaction was terminated, the mixture was cooled to room temperature, and an organic layer extracted by using saturated ammonium chloride (NH$_4$Cl) and DCM. The organic layer was dried using anhydrous magnesium sulfate (MgSO$_4$), followed by filtering, and condensing under reduced pressure. Silica gel column chromatography was performed on the crude product to produce Intermediate (J) (17.46 g, 48.22 mmol, yield=47%).

LC-Mass (calculated: 362.13 g/mol, found: M$^{+1}$=363 g/mol).

(2) Synthesis of Intermediate (K)

Intermediate (K) (5.02 g, 8.39 mmol, yield=61%) was obtained in the same manner as used to synthesize Intermediate (D) of Synthesis Example 1, except that Intermediate (J) (5.0 g, 13.76 mmol) was used instead of Intermediate (C).

LC-Mass (calculated: 598.81 g/mol, found: M$^{+1}$=599 g/mol).

(3) Synthesis of Intermediate (L)

Intermediate (L) (5.05 g, 6.79 mmol, yield=81%) was obtained in the same manner as used to synthesize Intermediate (I) of Synthesis Example 3, except that Intermediate (K) (5.02 g, 8.39 mmol) was used instead of Intermediate (G).

(4) Synthesis of Compound 5

Compound 5 (2.09 g, 2.58 mmol, yield=38%) was obtained in the same manner as used to synthesize Compound 2 of Synthesis Example 1, except that Intermediate (L) (5.05 g, 6.79 mmol) was used instead of Intermediate (E).

LC-Mass (calculated: 808.34 g/mol, found: M$^{+1}$=809 g/mol).

Synthesis Example 5 (Compound 9)

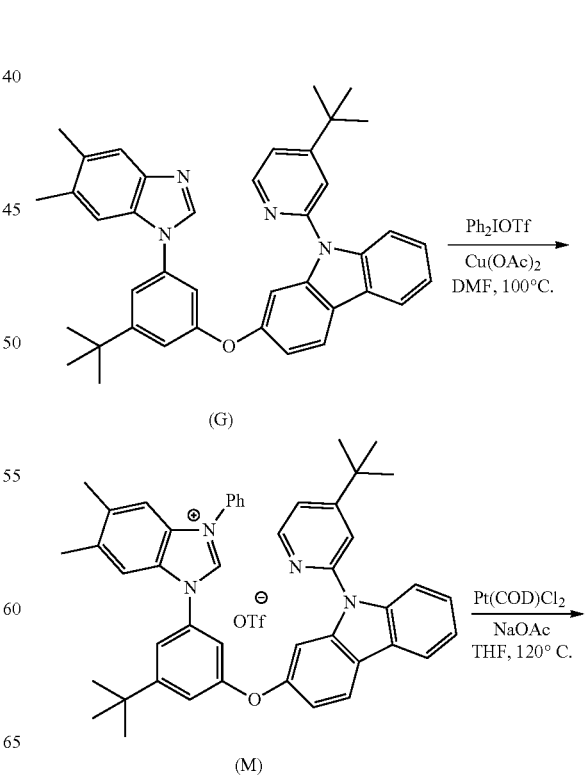

-continued

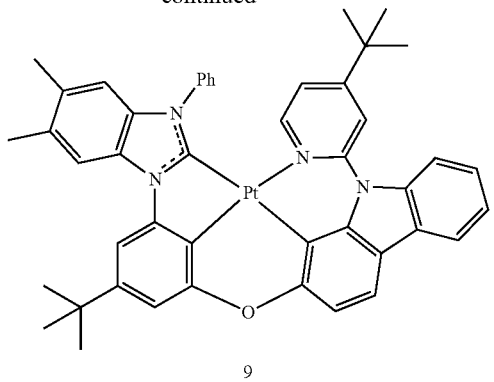

9

(1) Synthesis of Intermediate (M)

Intermediate (G) (5.0 g, 8.43 mmol), diphenyliodonium triflate (5.44 g, 12.65 mmol) and copper(II) acetate (0.15 g, 0.84 mmol) were mixed with 40 ml of DMF, and then, the mixture was stirred at a temperature of 100° C. for 12 hours. After the reaction was terminated, the mixture was cooled to room temperature, and an organic layer extracted by using saturated ammonium chloride (NH$_4$Cl) and DCM. The organic layer was dried using anhydrous magnesium sulfate (MgSO$_4$), followed by filtering, and condensing under reduced pressure. Silica gel column chromatography was performed on the crude product to produce Intermediate (M) (5.52 g, 6.74 mmol, yield=80%).

(2) Synthesis of Compound 9

Compound 9 (2.61 g, 3.03 mmol, yield=45%) was obtained in the same manner as used to synthesize Compound 2 of Synthesis Example 1, except that Intermediate (M) (5.52 g, 6.74 mmol) was used instead of Intermediate (E).

LC-Mass (calculated: 861.30 g/mol, found: M$^{+1}$=862 g/mol).

Synthesis Example 6 (Compound 14)

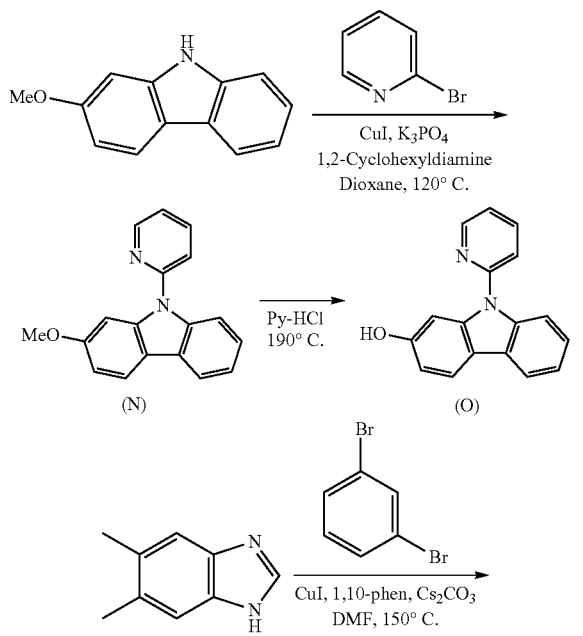

-continued

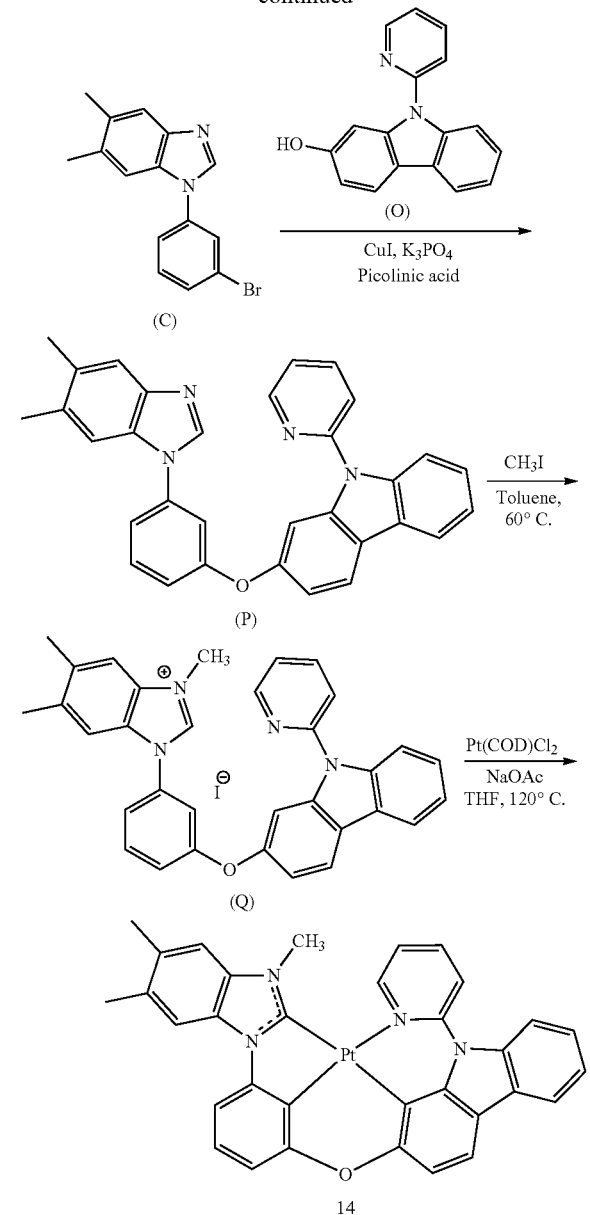

14

(1) Synthesis of Intermediate (N)

Intermediate (N) (13.50 g, 49.20 mmol, yield=82%) was obtained in the same manner as used to synthesize Intermediate (A) of Synthesis Example 1, except that 2-bromopyridine (11.38 g, 72 mmol) was used instead of 2-bromo-4-(tert-butyl)pyridine.

LC-Mass (calculated: 274.11 g/mol, found: M$^{+1}$=275 g/mol).

(2) Synthesis of Intermediate (O)

Intermediate (O) (10.62 g, 40.84 mmol, yield=83%) was obtained in the same manner as used to synthesize Intermediate (B) of Synthesis Example 1, except that Intermediate (N) (13.50 g, 49.20 mmol) was used instead of Intermediate (A).

LC-Mass (calculated: 260.10 g/mol, found: M$^{+1}$=261 g/mol).

(3) Synthesis of Intermediate (P)

Intermediate (P) (12.36 g, 25.73 mmol, yield=63%) was obtained in the same manner as used to synthesize Intermediate (D) of Synthesis Example 1, except that Intermediate (O) (10.62 g, 40.84 mmol) was used instead of Intermediate (B).

LC-Mass (calculated: 480.20 g/mol, found: M+1=481 g/mol).

(4) Synthesis of Intermediate (Q)

Intermediate (Q) (5.44 g, 8.74 mmol, yield=84%) was obtained in the same manner as used to synthesize Intermediate (E) of Synthesis Example 1, except that Intermediate (P) (5.0 g, 10.40 mmol) was used instead of Intermediate (D).

(5) Synthesis of Compound 14

Compound 14 (2.40 g, 3.50 mmol, yield=40%) was obtained in the same manner as used to synthesize Compound 2 of Synthesis Example 1, except that Intermediate (Q) (5.44 g, 8.74 mmol) was used instead of Intermediate (E).

LC-Mass (calculated: 687.16 g/mol, found: M+1=688 g/mol).

Synthesis Example 7 (Compound 12)

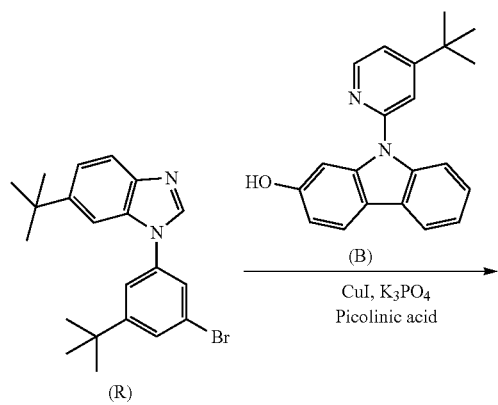

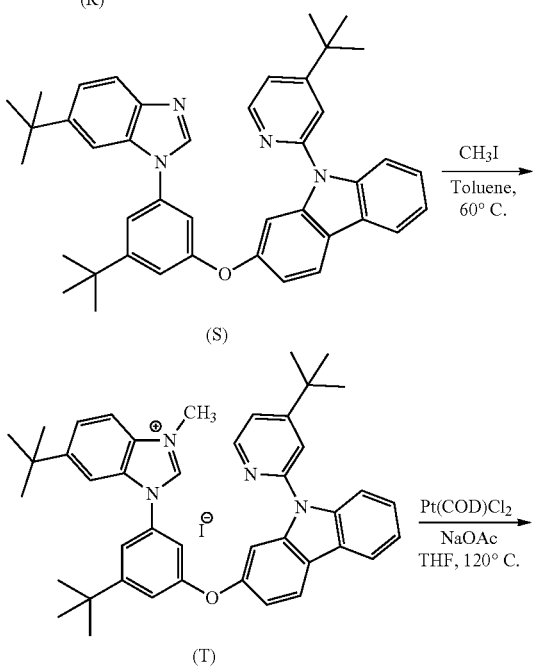

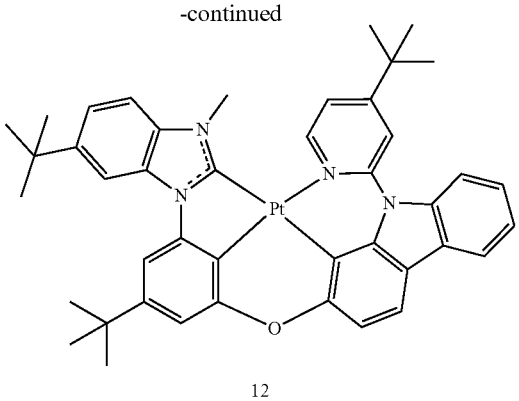

12

(1) Synthesis of Intermediate (S)

Intermediate (S) (5.87 g, 9.45 mmol, yield=63%) was obtained in the same manner as used to synthesize Intermediate (D) of Synthesis Example 1, except that Intermediate (R) (5.78 g, 15.00 mmol) was used instead of Intermediate (C).

LC-Mass (calculated: 620.35 g/mol, found: M+1=621 g/mol).

(2) Synthesis of Intermediate (T)

Intermediate (T) (5.91 g, 7.75 mmol, yield=82%) was obtained in the same manner as used to synthesize Intermediate (E) of Synthesis Example 1, except that Intermediate (S) (5.87 g, 9.45 mmol) was used instead of Intermediate (D).

(3) Synthesis of Compound 12

Compound 12 (2.69 g, 3.26 mmol, yield=42%) was obtained in the same manner as used to synthesize Compound 2 of Synthesis Example 1, except that Intermediate (T) (5.91 g, 7.75 mmol) was used instead of Intermediate (E).

LC-Mass (calculated: 827.32 g/mol, found: M+1=828 g/mol).

Synthesis Example 8 (Compound 21)

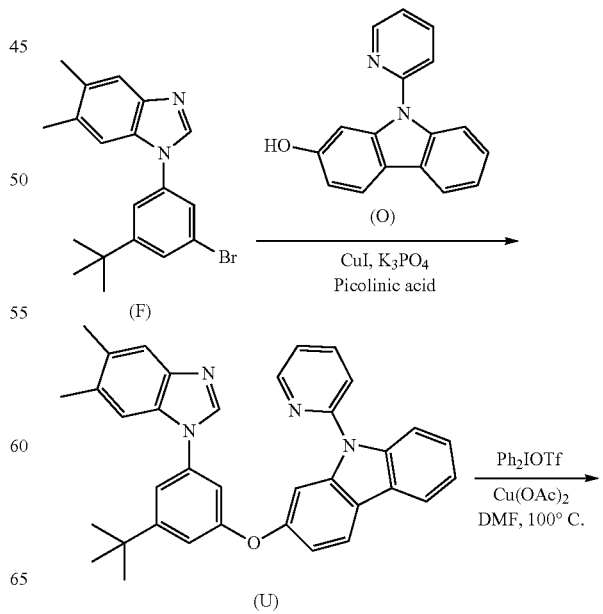

-continued

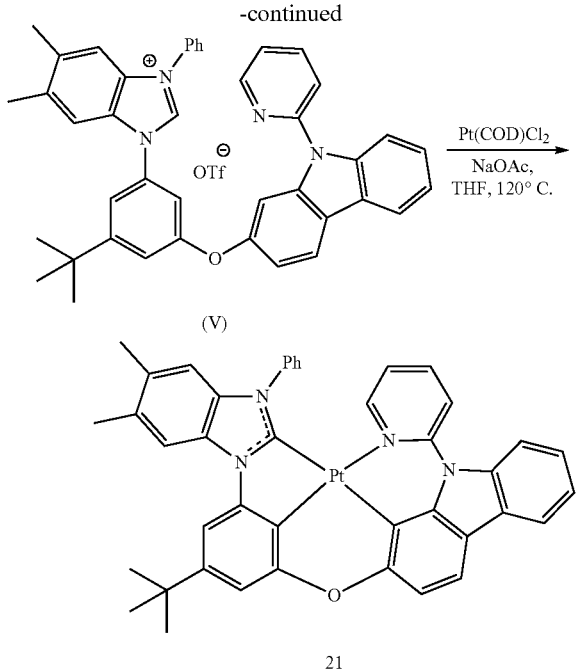

(1) Synthesis of Intermediate (U)

Intermediate (U) (4.99 g, 9.30 mmol, yield=62%) was obtained in the same manner as used to synthesize Intermediate (P) of Synthesis Example 6, except that Intermediate (F) (5.36 g, 15.00 mmol) was used instead of Intermediate (C).

LC-Mass (calculated: 536.26 g/mol, found: $M^{+1}$=537 g/mol).

(2) Synthesis of Intermediate (V)

Intermediate (V) (5.72 g, 7.72 mmol, yield=83%) was obtained in the same manner as used to synthesize Intermediate (M) of Synthesis Example 5, except that Intermediate (U) (4.99 g, 9.30 mmol) was used instead of Intermediate (G).

(3) Synthesis of Compound 21

Compound 21 (2.55 g, 3.17 mmol, yield=41%) was obtained in the same manner as used to synthesize Compound 2 of Synthesis Example 1, except that Intermediate (V) (5.72 g, 7.72 mmol) was used instead of Intermediate (E).

LC-Mass (calculated: 805.24 g/mol, found: $M^{+1}$=806 g/mol).

Evaluation Example 1: Evaluation of PL Spectrum

After Compound 2 was diluted to 10 mM in toluene, a PL spectrum was measured at room temperature using an ISC PC1 spectrofluorometer equipped with a Xenon lamp. The same experiment was performed on Compounds 3, 4, and 5. Results are shown in Table 2.

TABLE 2

| Compound No. | Maximum emission wavelength (nm) | FWHM (nm) |
|---|---|---|
| 2 | 457 | 21 |
| 3 | 461 | 24 |
| 4 | 461 | 24 |
| 5 | 461 | 24 |

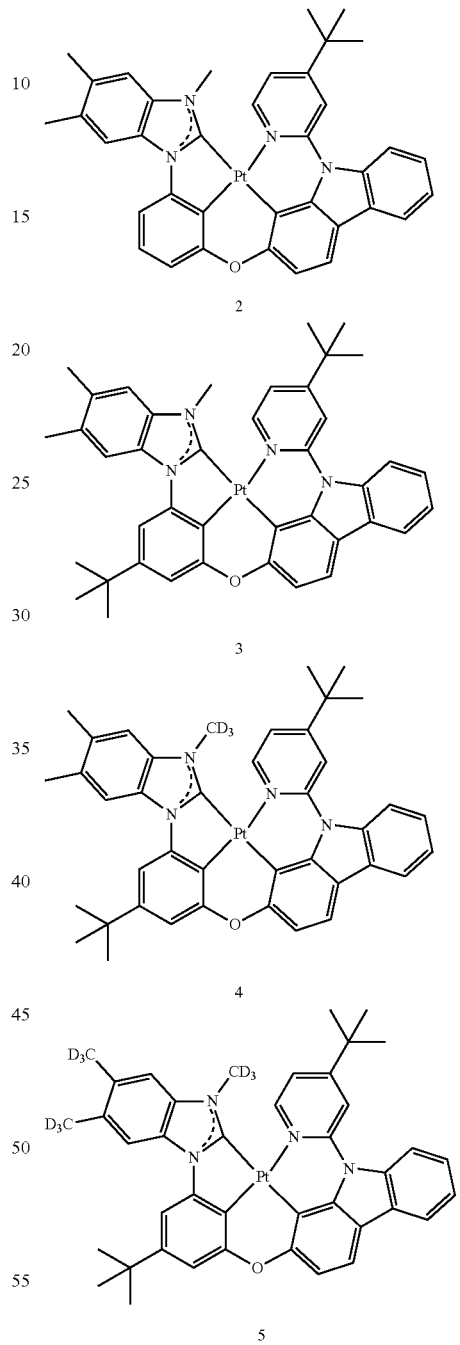

From Table 2, it can be seen that Compounds 2, 3, 4, and 5 emit blue light having a narrow FWHM.

Example 1

A glass substrate, on which a 1500 Å-thick ITO (indium tin oxide) electrode (first electrode, anode) was formed, was cleaned by distilled water ultrasonication. After the distilled water ultrasonication, ultrasonic cleaning was performed with isopropyl alcohol, acetone, and methanol, sequentially in this stated order, and the glass substrate was dried and transferred to a plasma cleaner. The glass substrate was cleaned by using oxygen plasma for 5 minutes, and then transferred to a vacuum laminator.

Compound HT3 was vacuum-deposited on the ITO electrode of the glass substrate to form a first hole injection layer having a thickness of 3500 Å, Compound HT-D1 was vacuum-deposited on the first hole injection layer to form a second hole injection layer having a thickness of 300 Å, and TAPC was vacuum-deposited on the second hole injection layer to form an electron blocking layer having a thickness of 100 Å, thereby forming a hole transport region.

Compound H52 and Compound 2 (dopant, 10 wt %) were co-deposited on the hole transport region to form an emission layer having a thickness of 300 Å.

Compound ET3 was vacuum deposited on the emission layer to form an electron transport layer having a thickness of 250 Å, ET-D1 (Liq) was deposited on the electron transport layer to form an electron injection layer having a thickness of 5 Å, and an Al second electrode (cathode) having a thickness of 1000 Å was formed on the electron injection layer, thereby completing the manufacture of an organic light-emitting device.

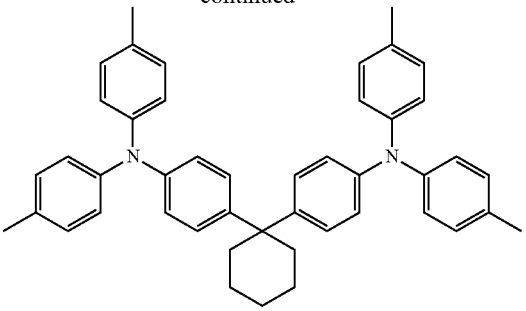

TAPC

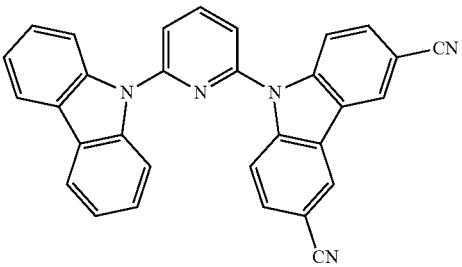

H52

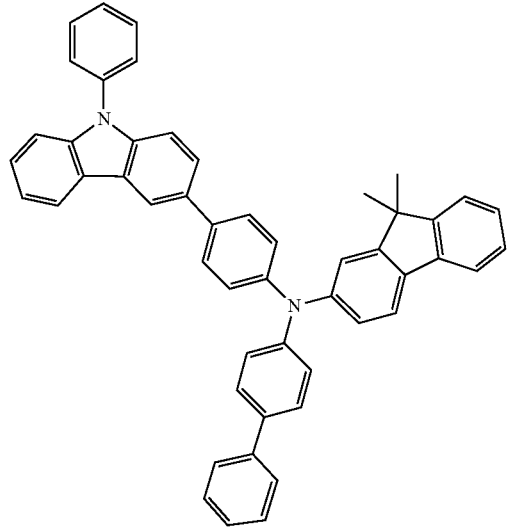

HT3

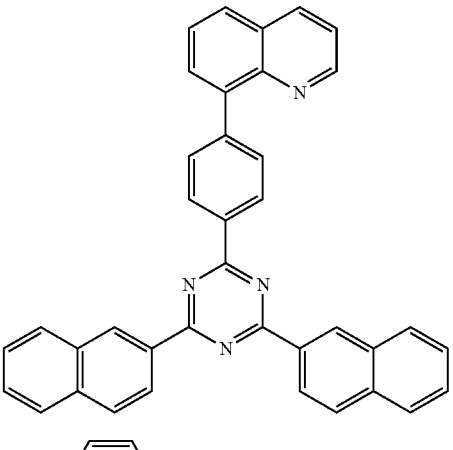

ET3

ET-D1

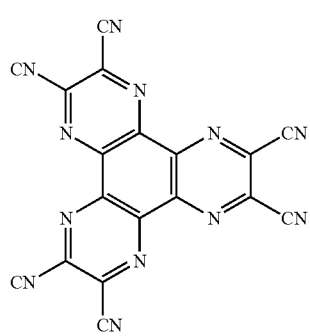

HT-D1

Examples 2 to 6 and Comparative Examples (A) to (C)

Organic light-emitting devices were manufactured in the same manner as in Example 1, except that in forming an emission layer, for use as a dopant, corresponding compounds shown in Table 3 were used instead of Compound 2.

Evaluation Example 2: Evaluation on Characteristics of Organic Light-Emitting Device Regarding the organic light-emitting devices manufactured according to Examples 1 to 6 and Comparative Examples (A) to (C), the maximum emission wavelength (nm) and FWHM of the EL spectrum, driving voltage (V), and external quantum efficiency (%) were evaluated. Results thereof are shown in Table 3. For each organic light-emitting device, the maximum emission wavelength and FWHM of the EL spectrum was evaluated from an EL spectrum (at 500 cd/m$^2$) measured using a luminance meter (Minolta Cs-1000A). The driving voltage and the external quantum efficiency were evaluated by using a current-voltage meter (Keithley 2400) and a luminance meter (Minolta Cs-1000A), respectively. The driving voltage and external quantum efficiency of each of the organic light-emitting devices of Examples 1 to 6 and Comparative Examples (B) and (C) were expressed as relative values (%) with respect to the driving voltage and external quantum efficiency of the organic light-emitting device of Comparative Example (A).

TABLE 3

| | Dopant compound No. | Maximum emission wavelength (nm) | FWHM (nm) | Driving voltage (V) (Relative value, %) | External quantum Efficiency (EQE) (at 1000 cd/m$^2$) (Relative value, %) |
| --- | --- | --- | --- | --- | --- |
| Example 1 | 2 | 457 | 21 | 67 | 482 |
| Example 2 | 3 | 461 | 24 | 69 | 550 |
| Example 3 | 4 | 461 | 24 | 69 | 553 |
| Example 4 | 5 | 461 | 24 | 69 | 556 |
| Example 5 | 9 | 465 | 26 | 71 | 465 |
| Example 6 | 12 | 461 | 24 | 70 | 523 |
| Comparative Example (A) | (A) | 488 | 78 | 100 | 100 |
| Comparative Example (B) | (B) | 457 | 23 | 79 | 447 |
| Comparative Example (C) | (C) | 454 | 43 | 85 | 243 |

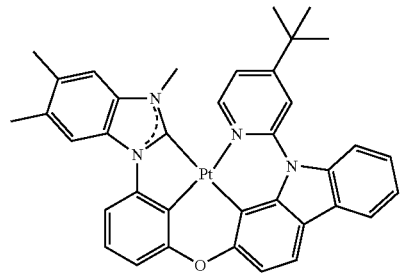

2

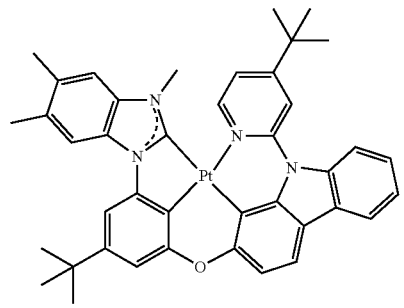

3

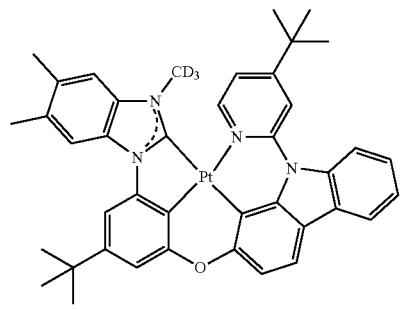

4

TABLE 3-continued
| Dopant compound No. | Maximum emission wavelength (nm) | FWHM (nm) | Driving voltage (V) (Relative value, %) | External quantum Efficiency (EQE) (at 1000 cd/m$^2$) (Relative value, %) |
| --- | --- | --- | --- | --- |
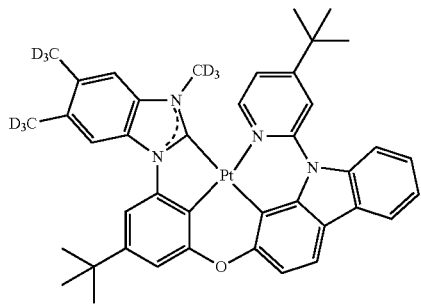
5
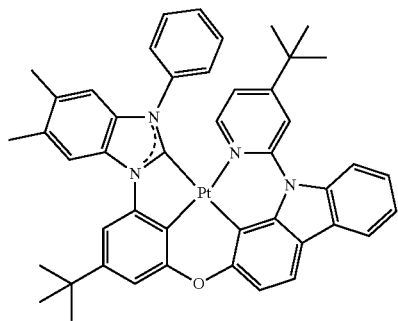
9
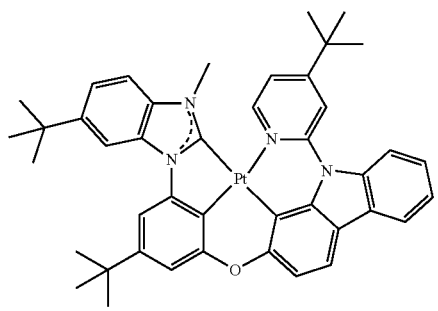
12
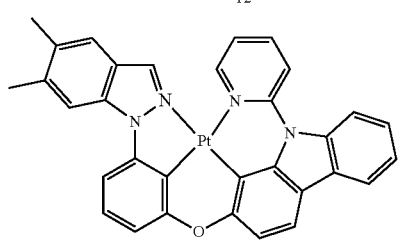
(A)

TABLE 3-continued

| Dopant compound No. | Maximum emission wavelength (nm) | FWHM (nm) | Driving voltage (V) (Relative value, %) | External quantum Efficiency (EQE) (at 1000 cd/m$^2$) (Relative value, %) |
| --- | --- | --- | --- | --- |

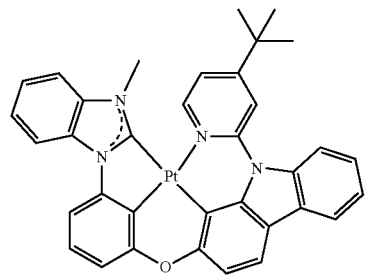

(B)

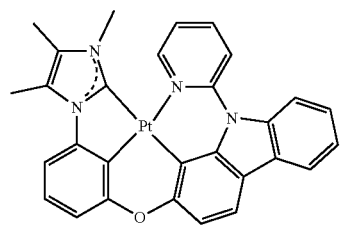

(C)

From Table 3, it can be seen that the organic light-emitting devices of Example 1 to 6 emit blue light having a relatively small FWHM and have improved driving voltage and improved external quantum efficiency, at the same time, compared to the organic light-emitting device of Comparative Examples (A) to (C).

The organometallic compound according to embodiments has excellent electric characteristics and thermal stability. Accordingly, an organic light-emitting device including the organometallic compound may have better characteristics in terms of a driving voltage and external quantum efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details is made therein without departing from the spirit and scope of the disclosure as defined by the following claims.

What is claimed is:

1. An organometallic compound represented by Formula 1:

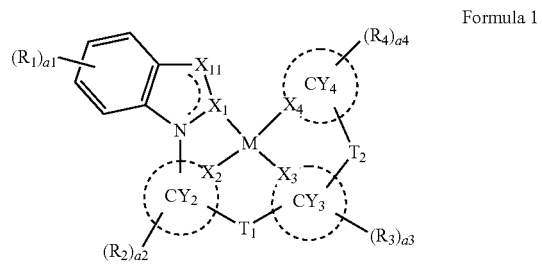

Formula 1 wherein, in Formula 1,

M is a transition metal, $X_1$ is C, and $X_2$ to $X_4$ are each independently C or N, a bond between $X_1$ and M is a coordinate bond, one of a bond between $X_2$ and M, a bond between $X_3$ and M, and a bond between $X_4$ and M is a coordinate bond, and the other two bonds are covalent bonds, $X_{11}$ is O, S, or N($R_{1a}$), a group represented by

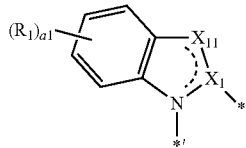

is a group represented by one of Formulae CY1-5 to CY1-15,

CY1-5
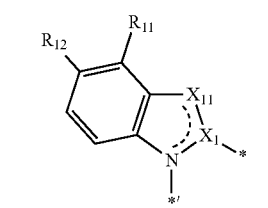

CY1-6
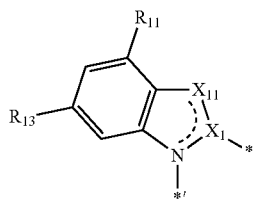

CY1-7
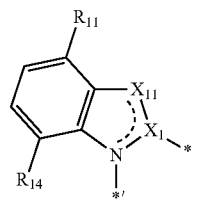

CY1-8
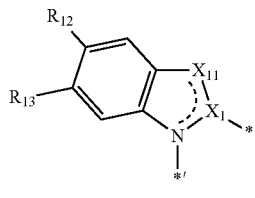

CY1-9
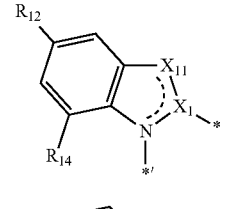

CY1-10
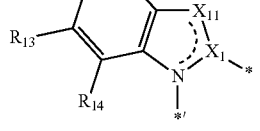

CY1-11
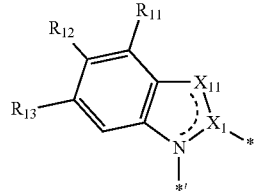

CY1-12
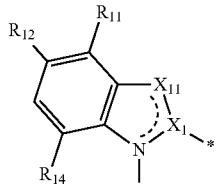

CY1-13
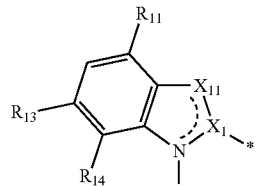

CY1-14
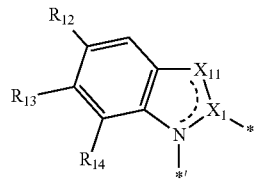

CY1-15
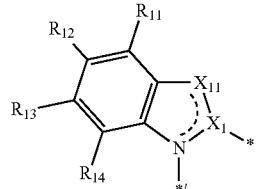

wherein, in Formulae CY1-5 to CY1-15, $R_{11}$ to $R_{14}$ are each independently an unsubstituted or substituted $C_1$-$C_{60}$ alkyl group or an unsubstituted or substituted $C_3$-$C_{10}$ cycloalkyl group,

* indicates a binding site to M in Formula 1, and *' indicates a binding site to ring $CY_2$ in Formula 1, ring $CY_2$ to ring $CY_4$ are each independently a $C_5$-$C_{30}$ carbocyclic group or a $C_1$-$C_{30}$ heterocyclic group, $T_1$ is a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', or *—C≡C—*', $T_2$ is a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=*', *=C($R_7$)—*', *—C($R_7$)=C($R_8$)—*', *—C(=S)—*', or *C≡C—*', $R_{1a}$, $R_1$ to $R_8$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a1 is an integer from 1 to 4, a2 to a4 are each independently an integer from 0 to 20, at least one of $R_1$ in the number of a1 is each independently an unsubstituted or substituted $C_1$-$C_{60}$ alkyl group or an unsubstituted or substituted $C_3$-$C_{10}$ cycloalkyl group, two or more of a plurality of $R_1$(s) are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $R_2$(s) are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $R_3$(s) are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $R_4$(s) are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{1a}$ and $R_1$ to $R_8$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in connection with $R_2$,

* and *' each indicate a binding site to a neighboring atom, a substituent of the substituted $C_1$-$C_{60}$ alkyl group, the substituted $C_2$-Coo alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted with $C_3$-$C_{10}$ cycloalkyl group, the substituted $C_2$-$C_{10}$ heterocycloalkenyl group, the substituted $C_6$-$C_{60}$ aryl group, the substituted, a $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group is:

deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$ and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group that is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group that is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein M is Pt, Pd, or Au.

3. The organometallic compound of claim 1, wherein
$X_2$ and $X_3$ are each C,
$X_4$ is N,
a bond between $X_2$ and M and a bond between $X_3$ and M are each a covalent bond, and
a bond between $X_4$ and M is a coordinate bond.

4. The organometallic compound of claim 1, wherein
ring $CY_2$ to ring $CY_4$ are each independently i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other,
the first ring is a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and
the second ring is an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

5. The organometallic compound of claim 1, wherein
$T_1$ is *—N($R_5$)—*', *—C($R_5$)($R_6$)—*', *—S—*, *—O—*', or *—S(=O)$_2$—*', and
$T_2$ is a single bond, *—N($R_7$)—*', *—C($R_7$)($R_8$)—*', *—S—*', or *—O—*'.

6. The organometallic compound of claim 1, wherein
$R_{1a}$, $R_1$, $R_3$ and $R_5$ to $R_8$ are each independently:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, a $C_2$-$C_{20}$ alkenyl group, a $C_1$-$C_{20}$ alkoxy group, or a $C_1$-$C_{20}$ alkylthio group;
a $C_1$-$C_{20}$ alkyl group, a $C_2$-$C_{20}$ alkenyl group, a $C_1$-$C_{20}$ alkoxy group, or a $C_1$-$C_{20}$ alkylthio group, each unsubstituted or substituted with deuterium, —F, —Cl, —Br, —I, -CD$_3$, —CD$_2$H, -CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, -CD$_3$, -CD$_2$H, -CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)

cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), R$_2$ and R$_4$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, C$_1$-C$_{20}$ alkyl group, a C$_2$-C$_{20}$ alkenyl group, a C$_1$-C$_{20}$ alkoxy group, or a C$_1$-C$_{20}$ alkylthio group;

a C$_1$-C$_{20}$ alkyl group, a C$_2$-C$_{20}$ alkenyl group, a C$_1$-C$_{20}$ alkoxy group, or a C$_1$-C$_{20}$ alkylthio group, each unsubstituted or substituted with deuterium, —F, —Cl, —Br, —I, -CD$_3$, -CD$_2$H, -CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, each unsubstituted or substituted with deuterium, —F, —Cl, —Br, —I, -CD$_3$, -CD$_2$H, -CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, deuterated C$_2$-C$_{20}$ alkyl group, a C$_1$-C$_{20}$ alkoxy group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), and Q$_1$ to Q$_9$ are each independently:

deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, —F, a C$_1$-C$_{10}$ alkyl group, a phenyl group, or any combination thereof.

7. The organometallic compound of claim 1, wherein a1 is 1 or 2.

8. The organometallic compound of claim 1, wherein at least one of R$_1$(s) in the number of a1 is each independently a C$_1$-C$_{20}$ alkyl group or a C$_3$-C$_{10}$ cycloalkyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, or any combination thereof.

9. The organometallic compound of claim 1, wherein at least one of $R_2$(s) in the number of a2, at least one of $R_4$(s) in the number of a4, or any combination thereof is each independently an unsubstituted or substituted $C_1$-$C_{60}$ alkyl group or an unsubstituted or substituted $C_3$-$C_{10}$ cycloalkyl group.

10. The organometallic compound of claim 1, wherein a group represented by

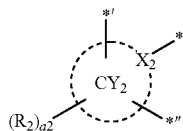

is represented by one of Formulae A2-1(1) to A2-1(17):

A2-1(1)
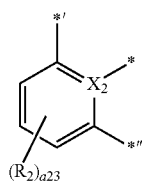

A2-1(2)
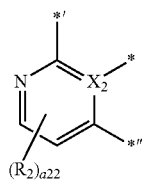

A2-1(3)
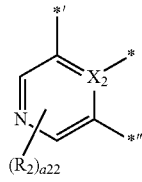

A2-1(4)
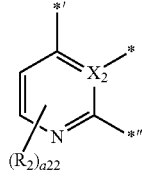

A2-1(5)
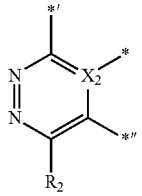

A2-1(6)
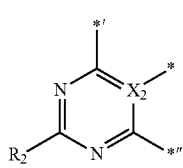

-continued

A2-1(7)
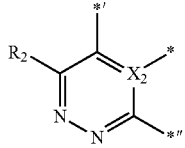

A2-1(8)
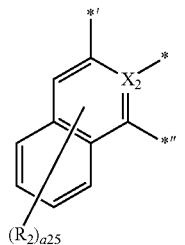

A2-1(9)
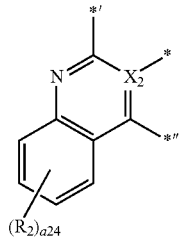

A2-1(10)
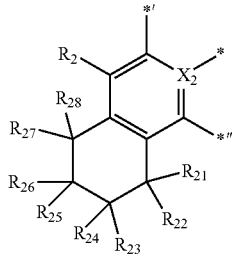

A2-1(11)
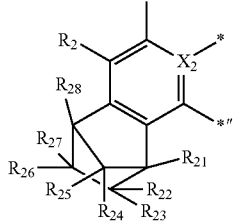

A2-1(12)
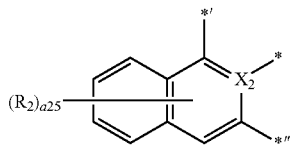

A2-1(13)
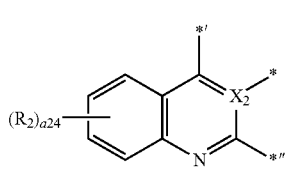

-continued

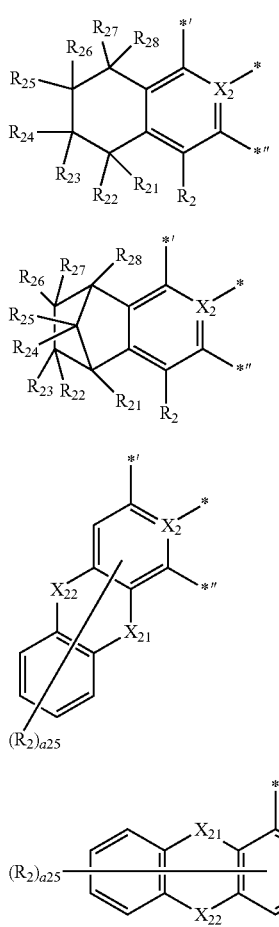

wherein, in Formulae A2-1(1) to A2-1(17),
$X_2$ and $R_2$ are respectively the same as described in claim 1,
$X_{21}$ is a single bond, O, S, $N(R_{21})$, $C(R_{21})(R_{22})$, or $Si(R_{21})(R_{22})$, and $X_{22}$ is a single bond, O, S, $N(R_{23})$, $C(R_{23})(R_{24})$, or $Si(R_{23})(R_{24})$, wherein at least one of $X_{21}$ and $X_{22}$ is not a single bond,
$R_{21}$ to $R_{28}$ are the same as described in connection with $R_2$ in claim 1,
a25 is an integer from 0 to 5,
a24 is an integer from 0 to 4,
a23 is an integer from 0 to 3,
a22 is an integer from 0 to 2,
* indicates a binding site to M in Formula 1,
*' indicates a binding site to a neighboring nitrogen atom in Formula 1, and
*'' indicates a binding site to $T_1$ in Formula 1.

11. The organometallic compound of claim 1, wherein a group represented by

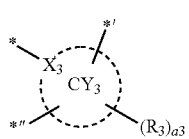

is a group represented by one of Formulae A3-1(1) to A3-1(17) and A3-2(1) to A3-2(7):

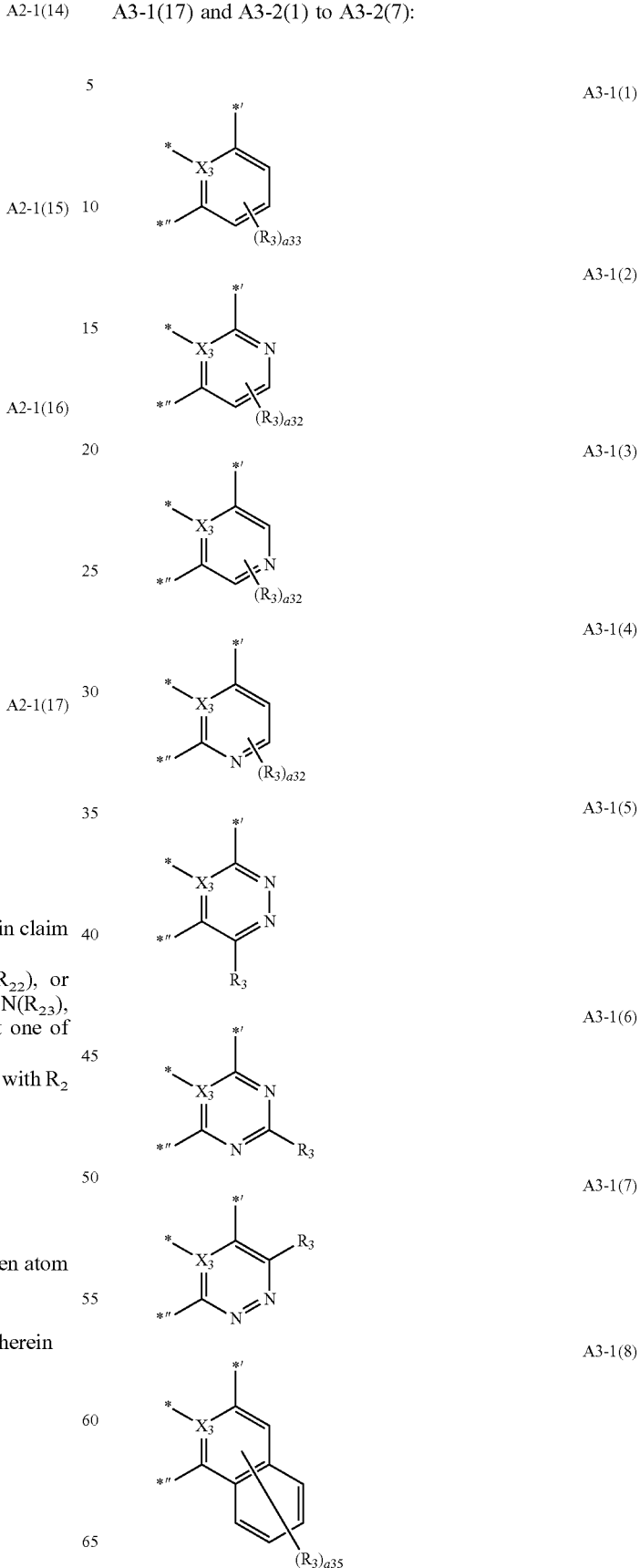

205
-continued
A3-1(9)
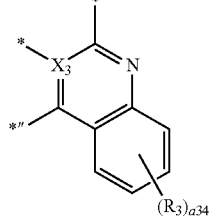
A3-1(10)
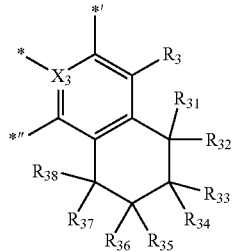
A3-1(11)
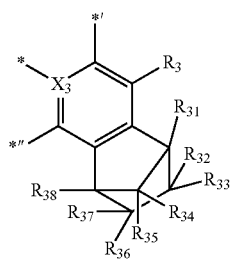
A3-1(12)
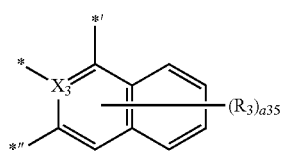
A3-1(13)
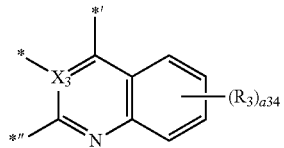
A3-1(14)
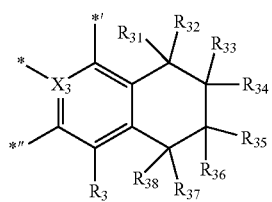
A3-1(15)
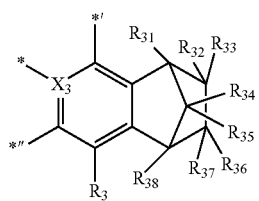
206
-continued
A3-1(16)
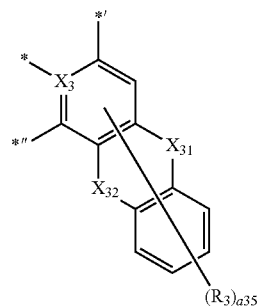
A3-1(17)
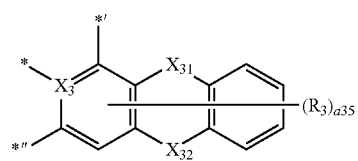
A3-2(1)
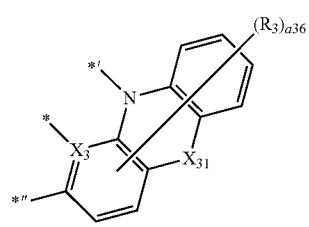
A3-2(2)
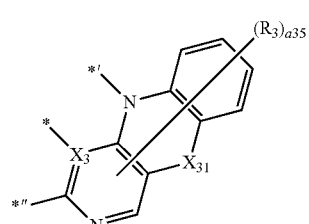
A3-2(3)
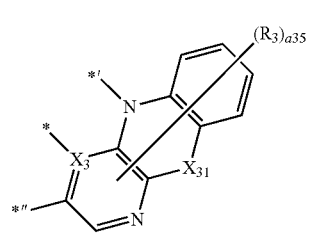
A3-2(4)
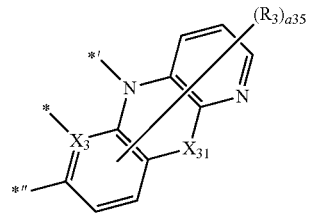
A3-2(5)
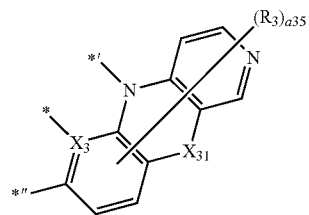

A3-2(6)

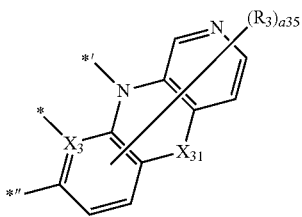

A3-2(7)

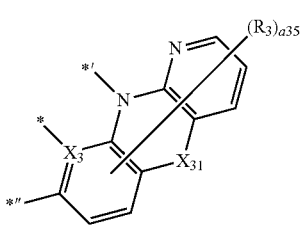

wherein, in Formulae A3-1(1) to A3-1(17) and A3-2(1) to A3-2(7), $X_3$ and $R_3$ are the same as described in claim 1, $X_{31}$ is a single bond, O, S, $N(R_{31})$, $C(R_{31})(R_{32})$, or $Si(R_{31})(R_{32})$, $X_{32}$ is a single bond, O, S, $N(R_{33})$, $C(R_{33})(R_{34})$, or $Si(R_{33})(R_{34})$, and at least one of $X_{31}$ and $X_{32}$ of Formulae A3-1(16) and A3-1(17) is not a single bond, $R_{31}$ to $R_{38}$ are the same as described in connection with $R_3$ in claim 1, a36 is an integer from 0 to 6,
a35 is an integer from 0 to 5,
a34 is an integer from 0 to 4,
a33 is an integer from 0 to 3,
a32 is an integer from 0 to 2,

* indicates a binding site to M in Formula 1,
*' indicates a binding site to $T_2$ in Formula 1, and
*'' indicates a binding site to $T_1$ in Formula 1.

12. The organometallic compound of claim 1, wherein a group represented by

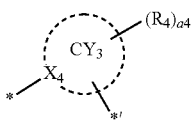

is a group represented by one of Formulae A4-1(1) to A4-1(26) and A4-2(1) to A4-2(8):

A4-1(1)

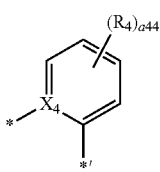

A4-1(2)

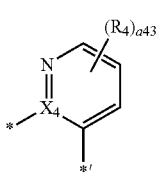

A4-1(3)

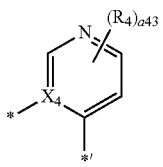

A4-1(4)

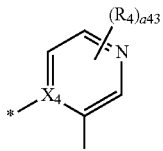

A4-1(5)

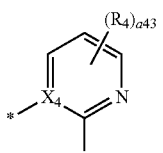

A4-1(6)

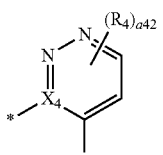

A4-1(7)

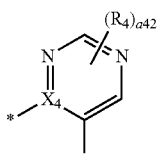

A4-1(8)

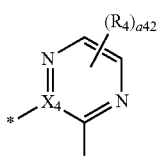

A4-1(9)

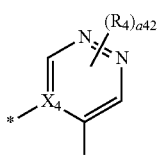

A4-1(10)

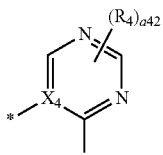

A4-1(11)

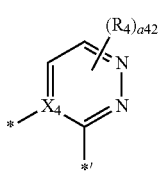

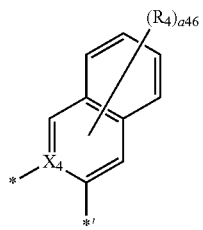 A4-1(12)
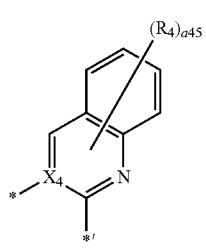 A4-1(13)
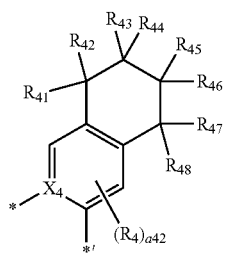 A4-1(14)
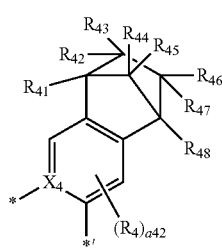 A4-1(15)
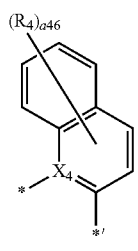 A4-1(16)
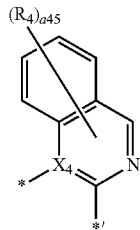 A4-1(17)
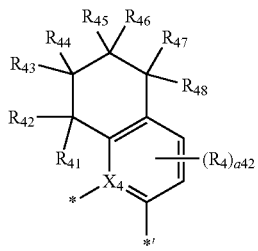 A4-1(18)
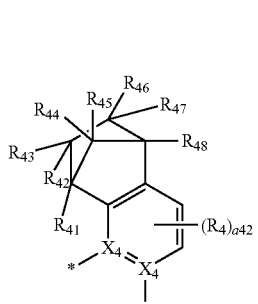 A4-1(19)
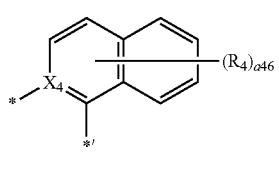 A4-1(20)
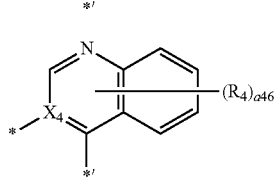 A4-1(21)
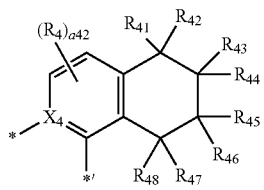 A4-1(22)
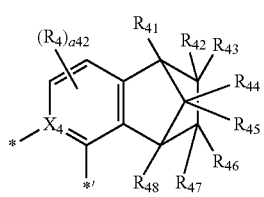 A4-1(23)
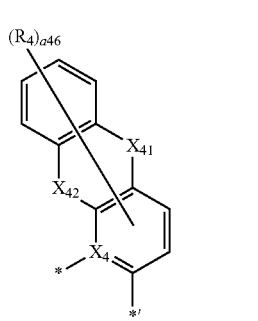 A4-1(24)

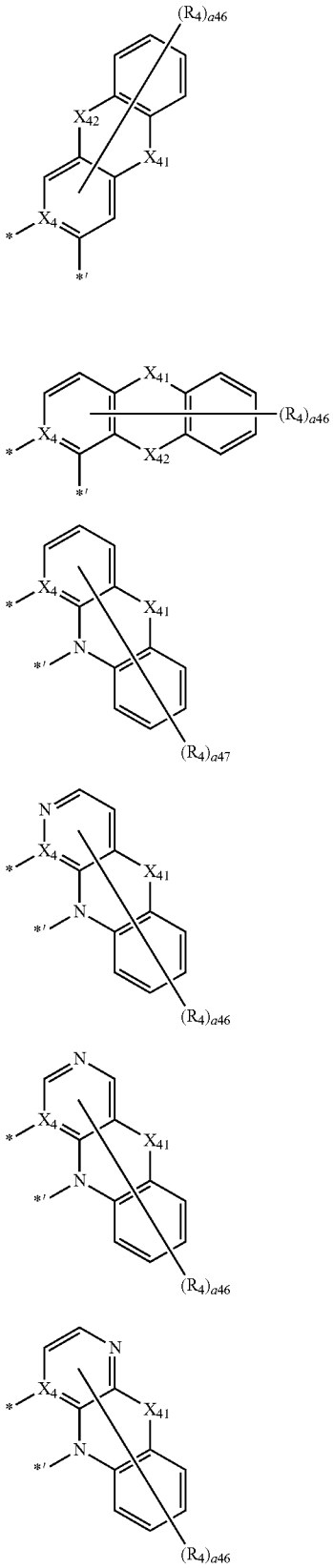
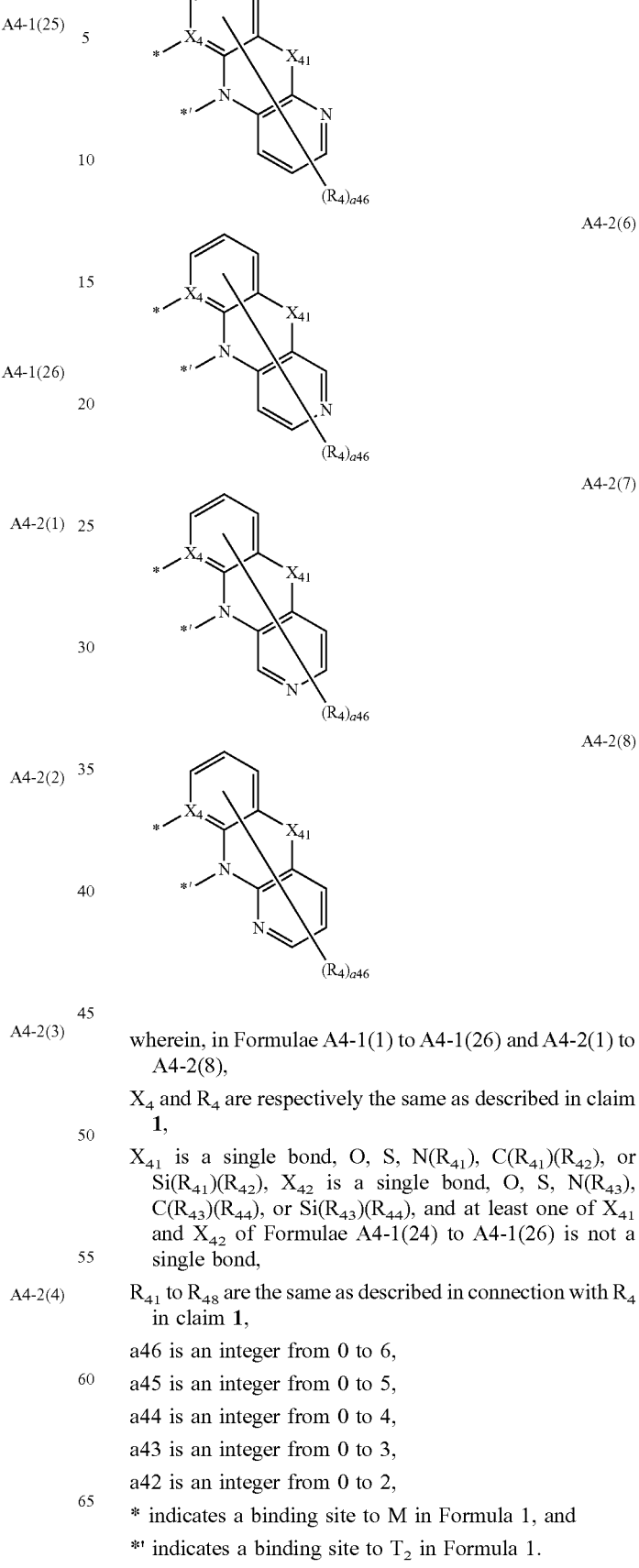

wherein, in Formulae A4-1(1) to A4-1(26) and A4-2(1) to A4-2(8), $X_4$ and $R_4$ are respectively the same as described in claim 1, $X_{41}$ is a single bond, O, S, $N(R_{41})$, $C(R_{41})(R_{42})$, or $Si(R_{41})(R_{42})$, $X_{42}$ is a single bond, O, S, $N(R_{43})$, $C(R_{43})(R_{44})$, or $Si(R_{43})(R_{44})$, and at least one of $X_{41}$ and $X_{42}$ of Formulae A4-1(24) to A4-1(26) is not a single bond, $R_{41}$ to $R_{48}$ are the same as described in connection with $R_4$ in claim 1, a46 is an integer from 0 to 6, a45 is an integer from 0 to 5, a44 is an integer from 0 to 4, a43 is an integer from 0 to 3, a42 is an integer from 0 to 2, \* indicates a binding site to M in Formula 1, and \*' indicates a binding site to $T_2$ in Formula 1.

13. The organometallic compound of claim 1, wherein
a group represented by
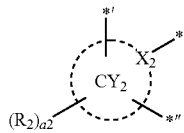
is a group represented by one of Formulae CY2-1 to CY2-8,
a group represented by
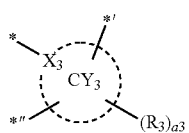
is a group represented by one of Formulae CY3-1 to CY3-16,
a group represented by
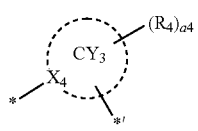
is a group represented by one of Formulae CY4-1 to CY4-24:
CY1-1
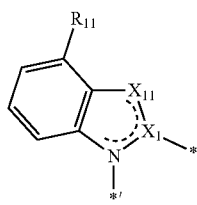
CY1-2
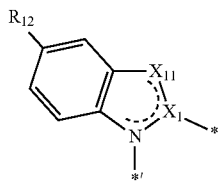
CY1-3
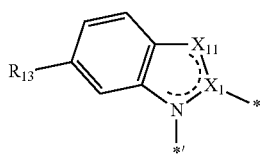
CY1-4
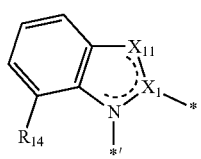
CY1-9
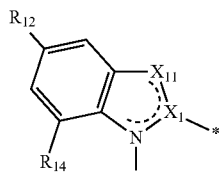
CY1-10
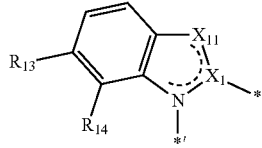
CY1-11
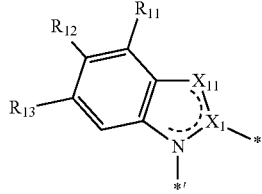
CY1-12
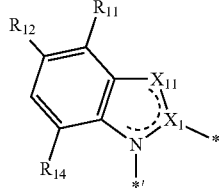
CY2-1
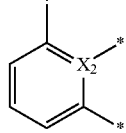
CY2-2
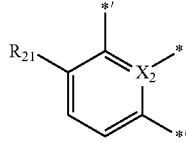
CY2-3
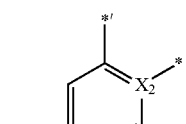
CY2-4
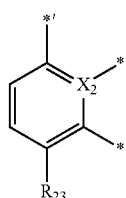
CY2-5
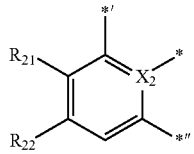

-continued
CY2-6
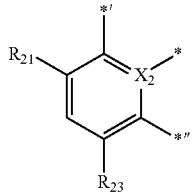
CY2-7
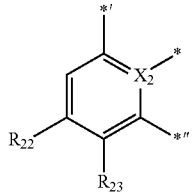
CY2-8
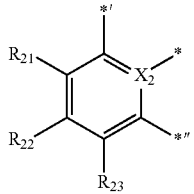
CY3-1
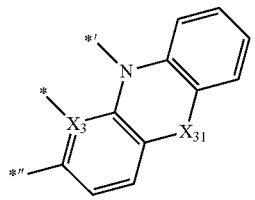
CY3-2
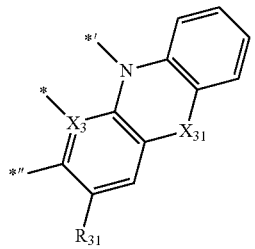
CY3-3
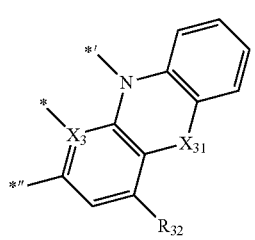
CY3-4
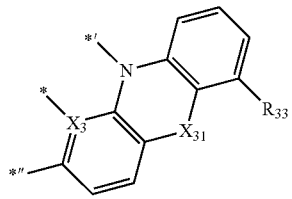
-continued
CY3-5
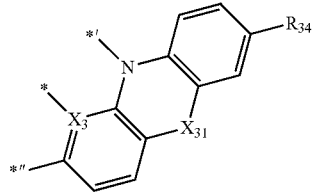
CY3-6
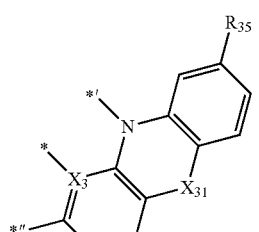
CY3-7
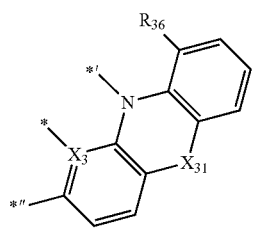
CY3-8
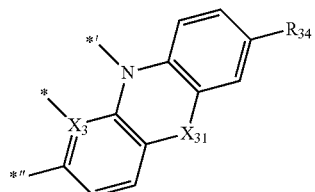
CY3-9
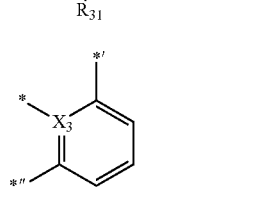
CY3-10
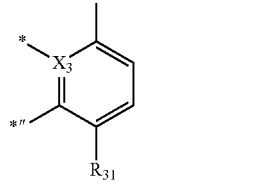
CY3-11
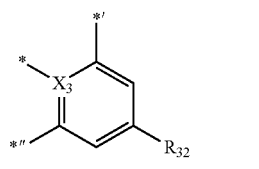
CY3-12
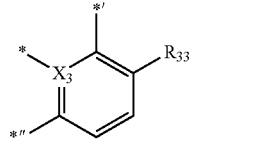

-continued
CY3-13
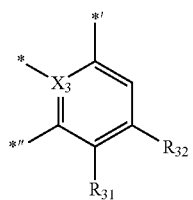
CY3-14
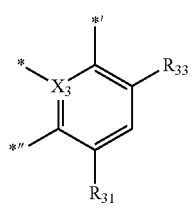
CY3-15
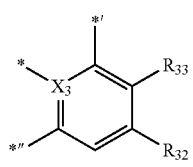
CY3-16
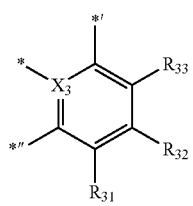
CY4-1
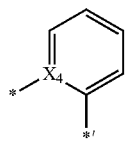
CY4-2
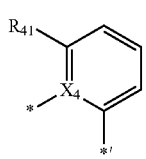
CY4-3
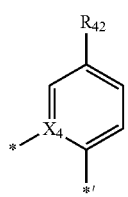
CY4-4
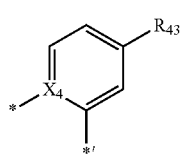
CY4-5
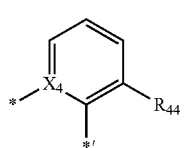
-continued
CY4-6
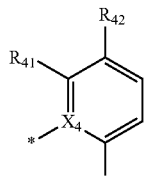
CY4-7
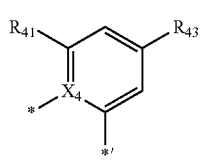
CY4-8
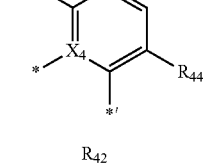
CY4-9
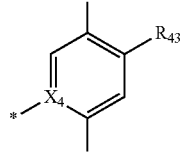
CY4-10
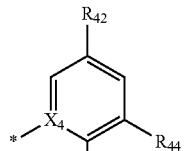
CY4-11
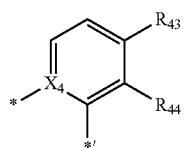
CY4-12
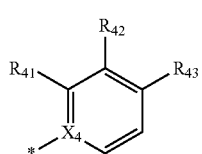
CY4-13
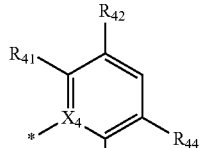
CY4-14
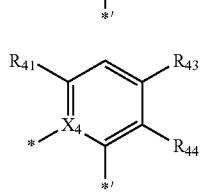

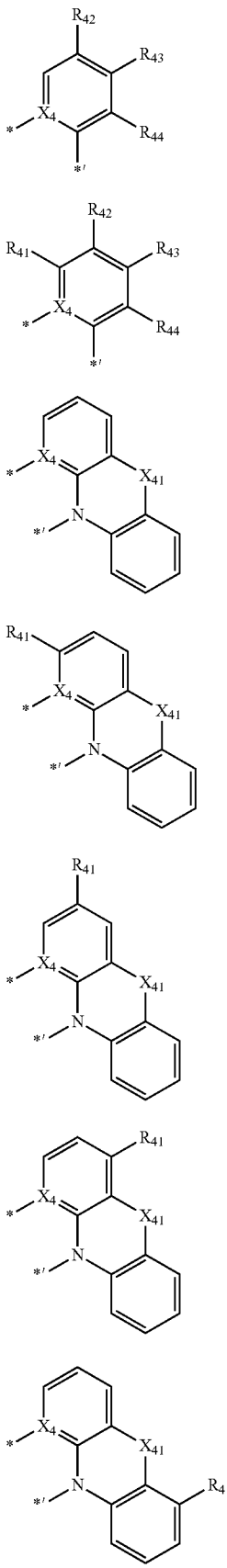
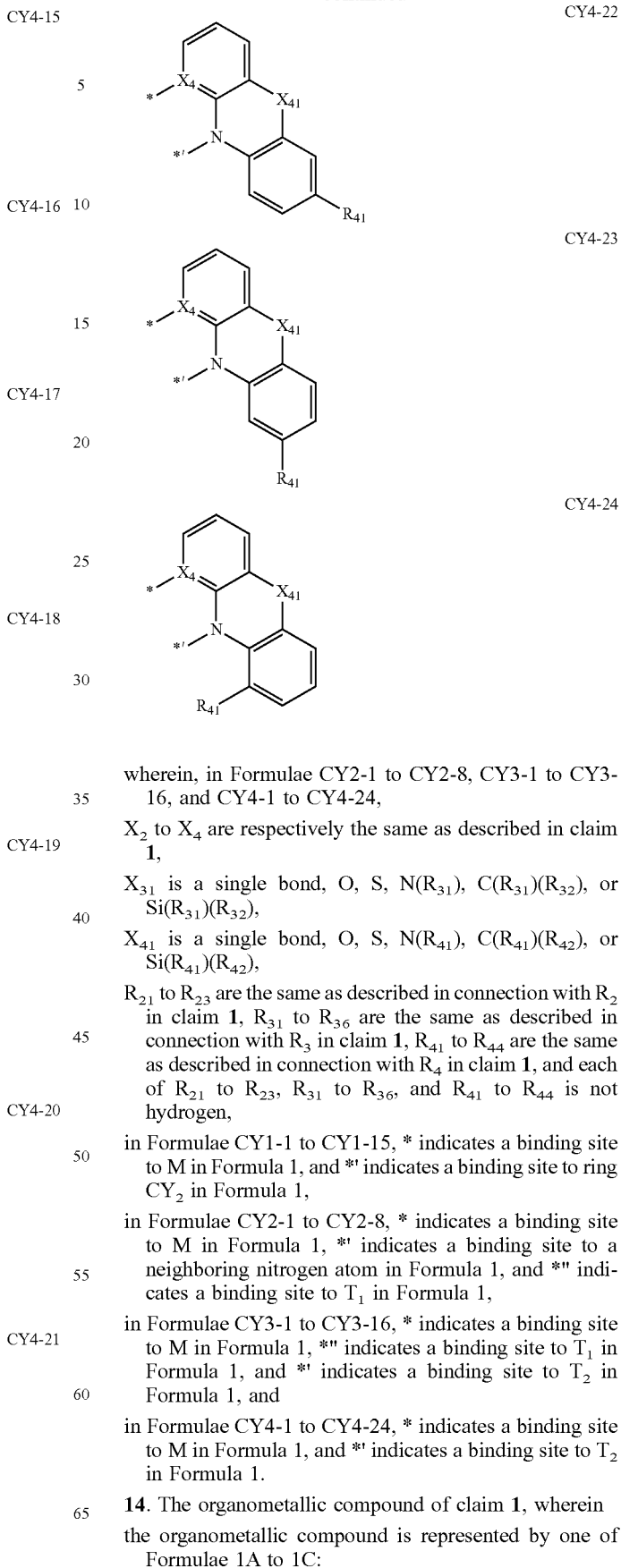

wherein, in Formulae CY2-1 to CY2-8, CY3-1 to CY3-16, and CY4-1 to CY4-24, $X_2$ to $X_4$ are respectively the same as described in claim 1, $X_{31}$ is a single bond, O, S, $N(R_{31})$, $C(R_{31})(R_{32})$, or $Si(R_{31})(R_{32})$, $X_{41}$ is a single bond, O, S, $N(R_{41})$, $C(R_{41})(R_{42})$, or $Si(R_{41})(R_{42})$, $R_{21}$ to $R_{23}$ are the same as described in connection with $R_2$ in claim 1, $R_{31}$ to $R_{36}$ are the same as described in connection with $R_3$ in claim 1, $R_{41}$ to $R_{44}$ are the same as described in connection with $R_4$ in claim 1, and each of $R_{21}$ to $R_{23}$, $R_{31}$ to $R_{36}$, and $R_{41}$ to $R_{44}$ is not hydrogen, in Formulae CY1-1 to CY1-15, * indicates a binding site to M in Formula 1, and *' indicates a binding site to ring $CY_2$ in Formula 1, in Formulae CY2-1 to CY2-8, * indicates a binding site to M in Formula 1, *' indicates a binding site to a neighboring nitrogen atom in Formula 1, and *''' indicates a binding site to $T_1$ in Formula 1, in Formulae CY3-1 to CY3-16, * indicates a binding site to M in Formula 1, *''' indicates a binding site to $T_1$ in Formula 1, and *' indicates a binding site to $T_2$ in Formula 1, and in Formulae CY4-1 to CY4-24, * indicates a binding site to M in Formula 1, and *' indicates a binding site to $T_2$ in Formula 1.

14. The organometallic compound of claim 1, wherein the organometallic compound is represented by one of Formulae 1A to 1C:

Formula 1A

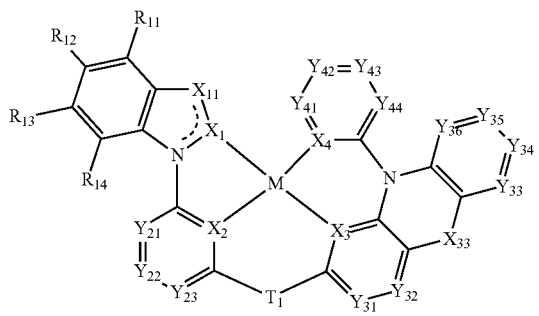

Formula 1B

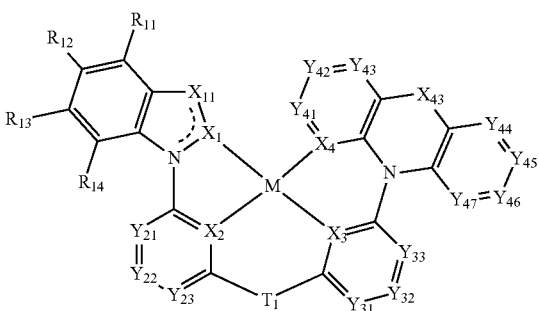

Formula 1C

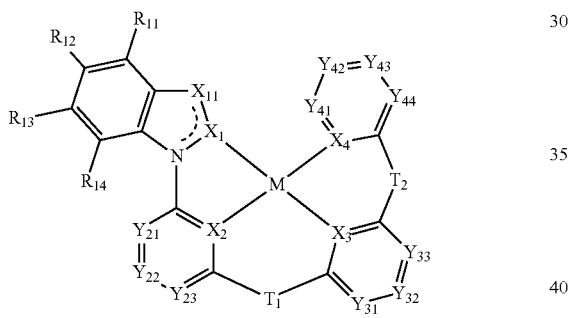

wherein, in Formulae 1A to 1C,

M, $X_1$ to $X_4$, $X_{11}$, $T_1$, and $T_2$ are the same as described in claim 1, and $T_2$ in Formula 1C is not a single bond, $Y_{21}$ is $C(R_{21})$ or N, $Y_{22}$ is $C(R_{22})$ or N, $Y_{23}$ is $C(R_{23})$ or N, $Y_{31}$ is $C(R_{31})$ or N, $Y_{32}$ is $C(R_{32})$ or N, $Y_{33}$ is $C(R_{33})$ or N, $Y_{34}$ is $C(R_{34})$ or N, $Y_{35}$ is $C(R_{35})$ or N, $Y_{36}$ is $C(R_{36})$ or N, $Y_{41}$ is $C(R_{41})$ or N, $Y_{42}$ is $C(R_{42})$ or N, $Y_{43}$ is $C(R_{43})$ or N, $Y_{44}$ is $C(R_{44})$ or N, $Y_{45}$ is $C(R_{45})$ or N, $Y_{46}$ is $C(R_{46})$ or N, $Y_{47}$ is $C(R_{47})$ or N, $X_{33}$ is a single bond, O, S, $N(R_{3a})$, $C(R_{3a})(R_{3b})$, or $Si(R_{3a})(R_{3b})$, $X_{43}$ is a single bond, O, S, $N(R_{4a})$, $C(R_{4a})(R_{4b})$, or $Si(R_{4a})(R_{4b})$, $R_{11}$ to $R_{14}$ are the same as described in claim 1, $R_{21}$ to $R_{23}$ are the same as described in connection with $R_2$ in claim 1, and two or more of $R_{21}$ to $R_{23}$ are optionally linked to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{31}$ to $R_{36}$, $R_{3a}$, and $R_{3b}$ are the same as described in connection with $R_3$ in claim 1, and two or more of $R_{31}$ to $R_{36}$ are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{41}$ to $R_{47}$, $R_{4a}$, and $R_{4b}$ are the same as described in connection with $R_4$ in claim 1, and two or more of $R_{41}$ to $R_{47}$ are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and $R_{10a}$ is the same as described in connection with $R_2$ in claim 1.

15. The organometallic compound of claim 1, wherein the organometallic compound emits blue light.

16. The organometallic compound of claim 1, wherein the organometallic compound is one of Compounds 2 to 5, 9 to 10, 14 to 17, 21 to 22, 26 to 29, 33 to 34, 38 to 41, 45 to 46, 50 to 53, 57 to 58, 62 to 65, 69 to 70, 74 to 77, 81 to 82, 86 to 89, 93 to 94, 98 to 101, 105 to 106, 110 to 113, and 117 to 118:

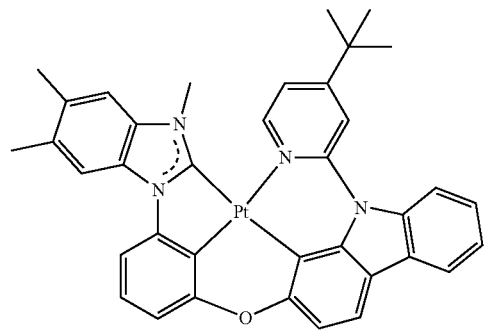

2

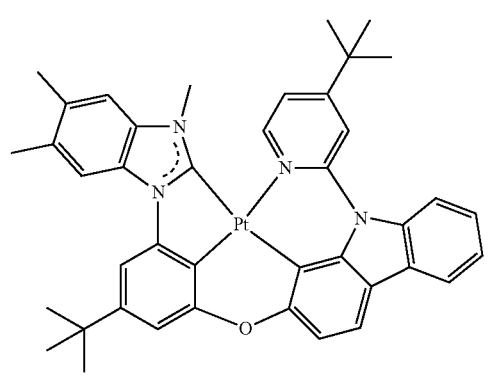

3

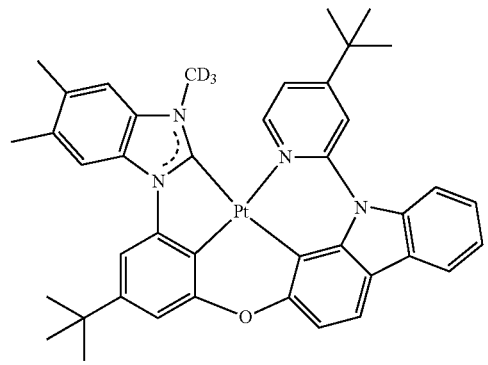

4

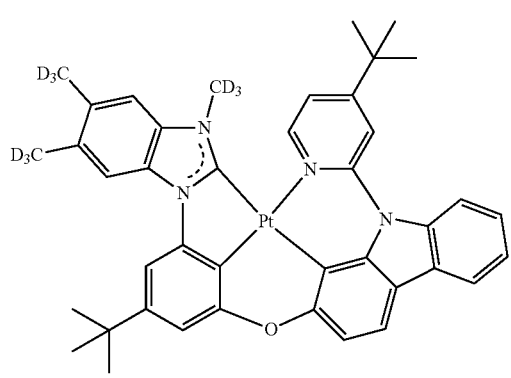
5
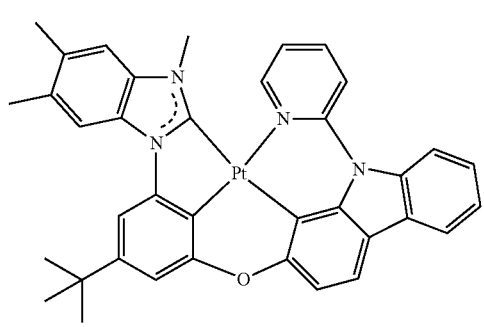
15
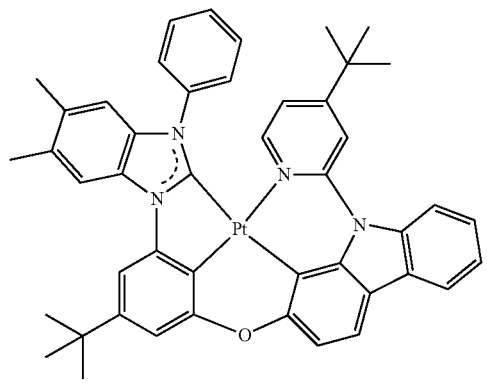
9
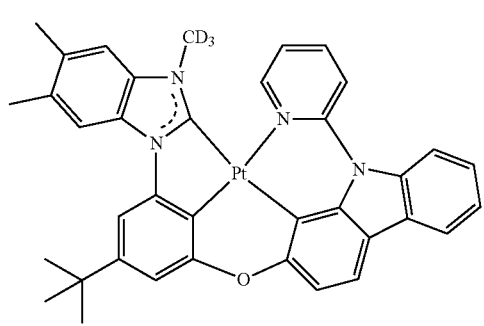
16
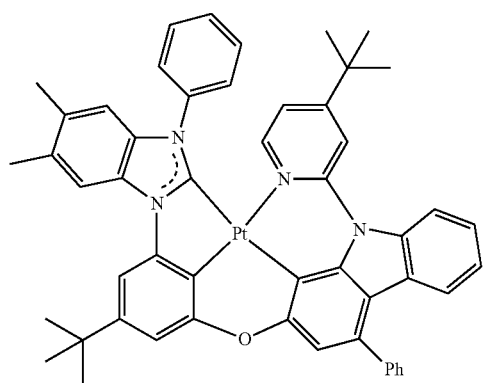
10
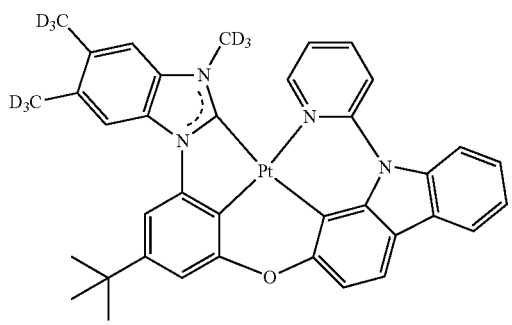
17
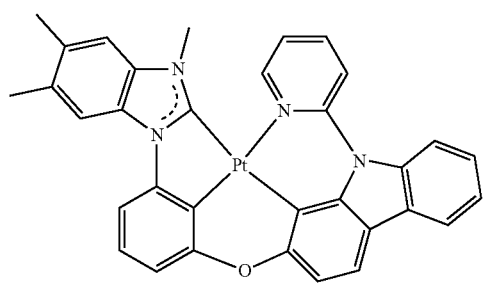
14
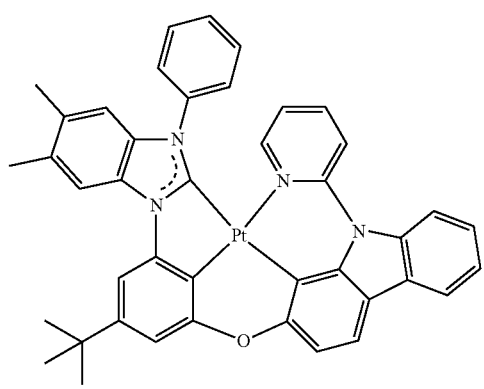
21

22
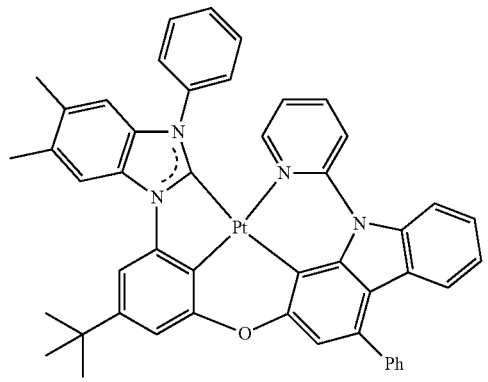
26
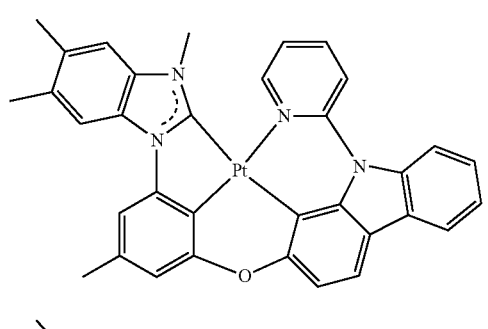
27
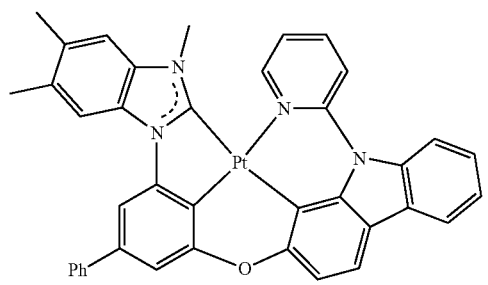
28
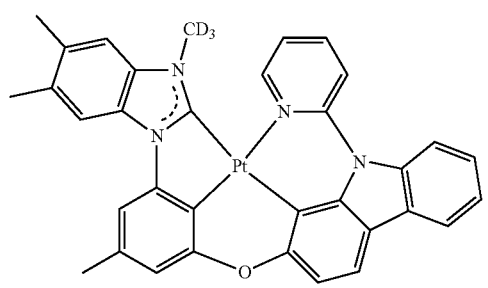
29
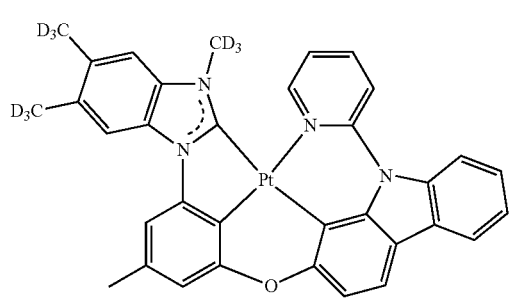
33
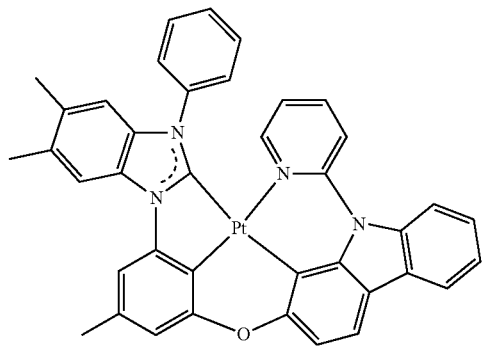
34
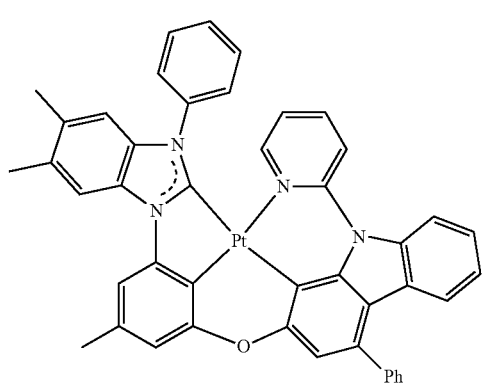
38
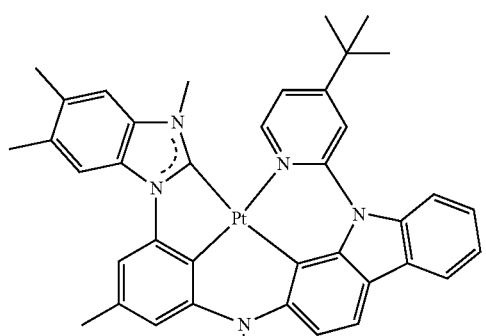
39
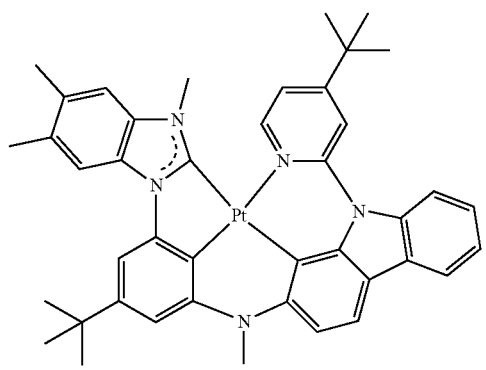

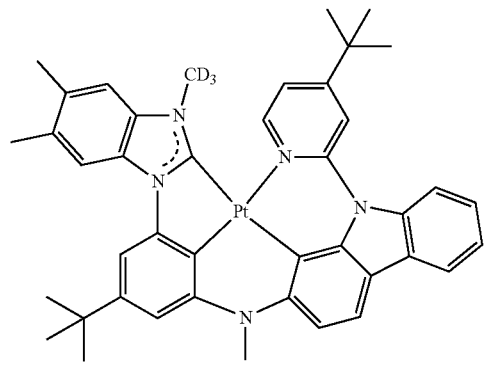
40
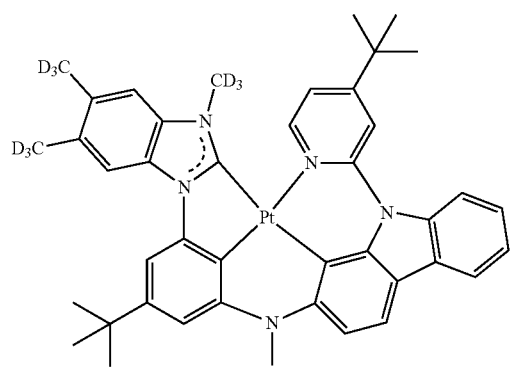
41
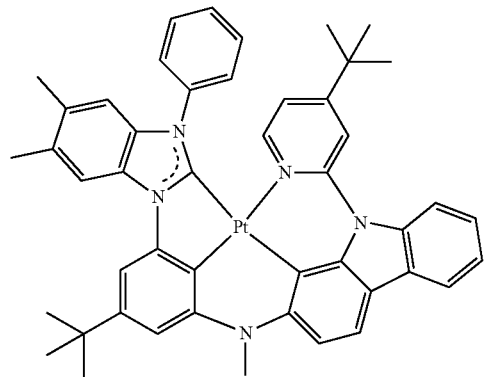
45
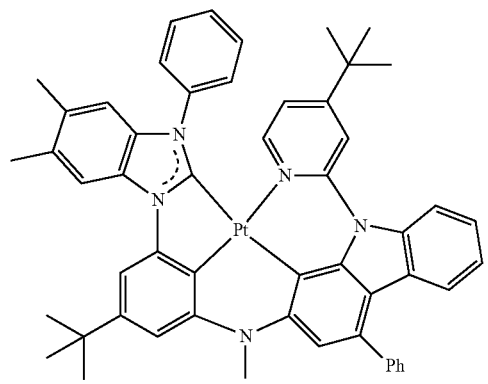
46
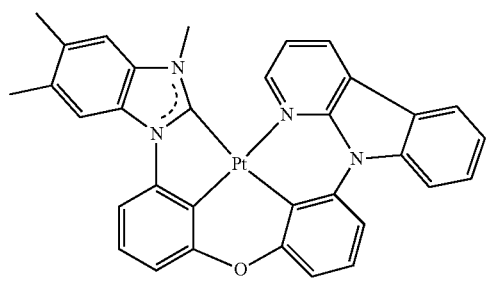
74
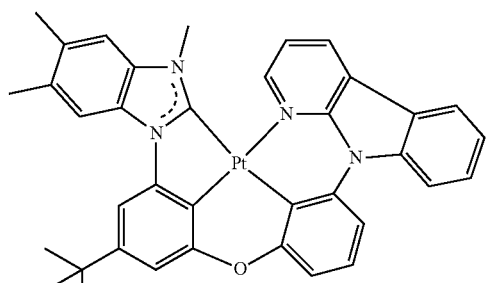
75
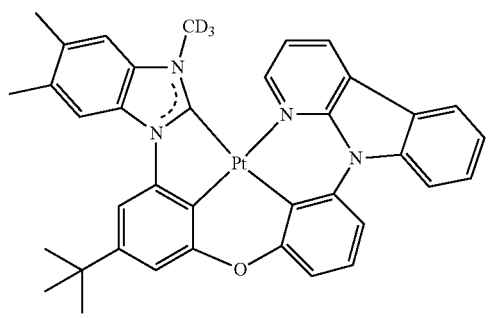
76
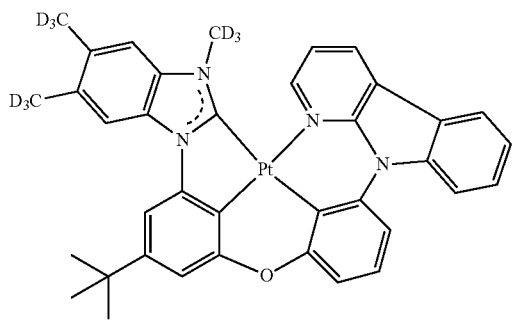
77
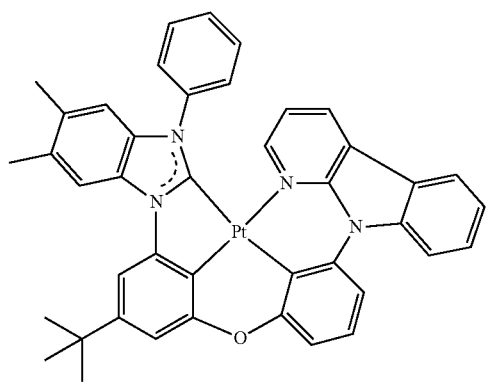
81

82
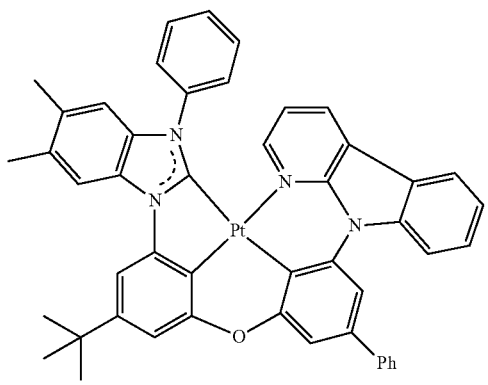
86
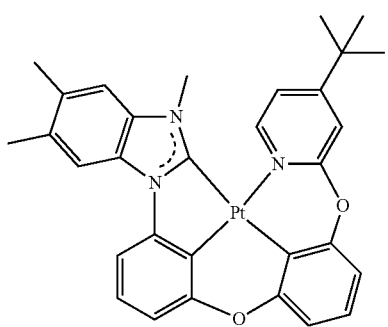
87
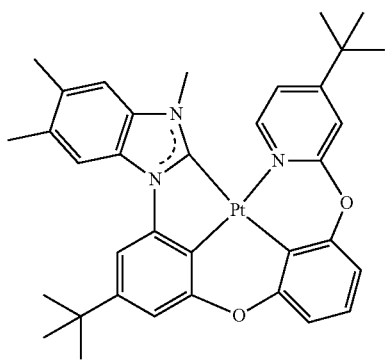
88
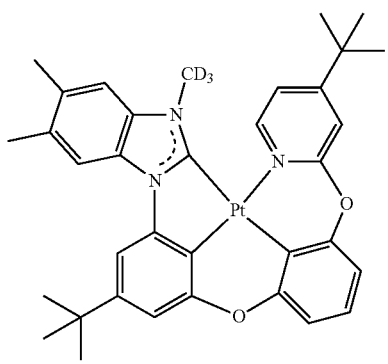
89
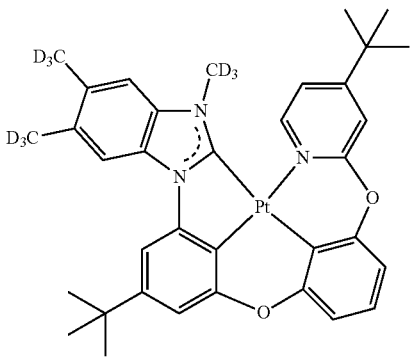
93
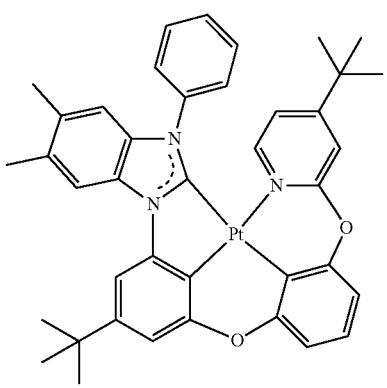
94
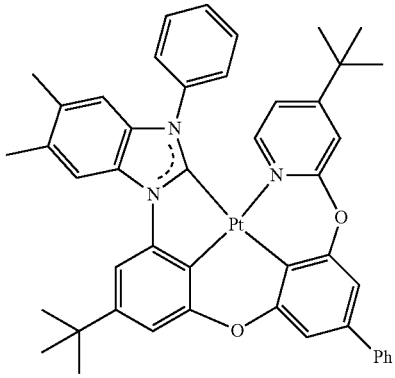
50
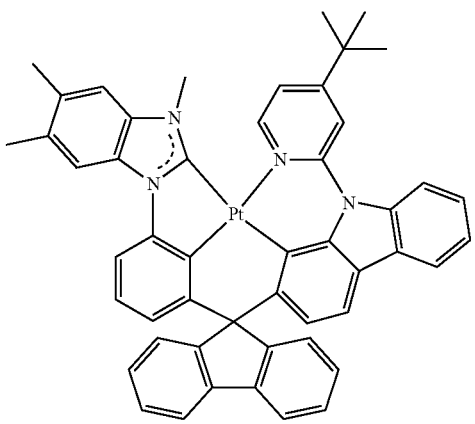

51
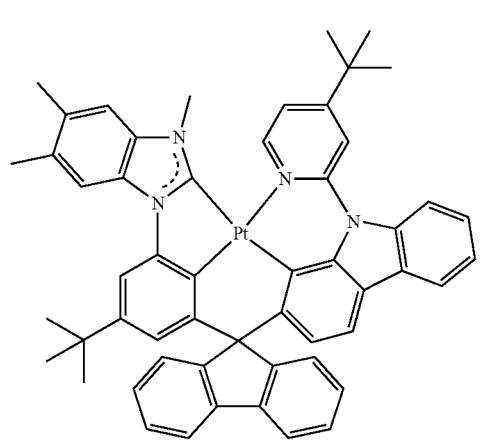
52
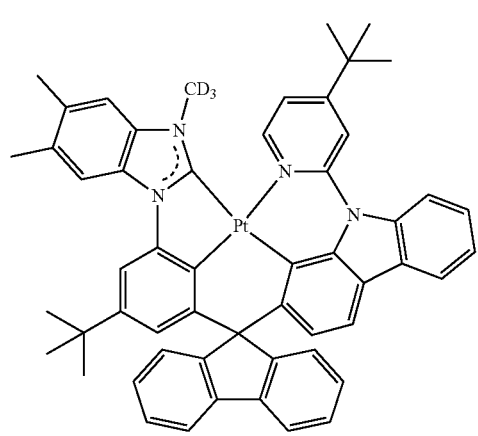
53
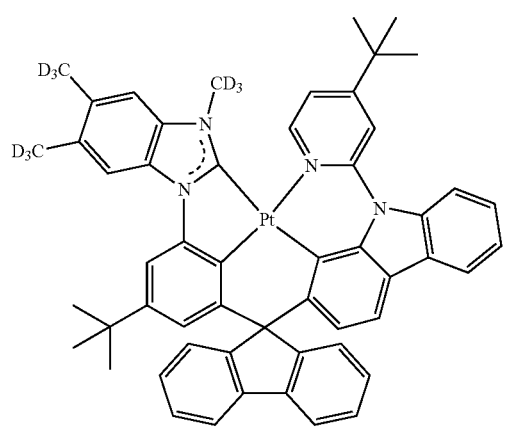
57
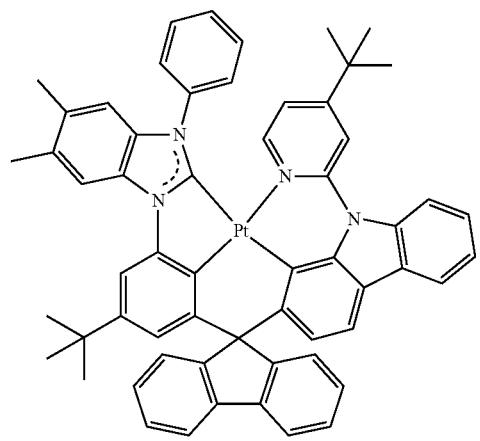
58
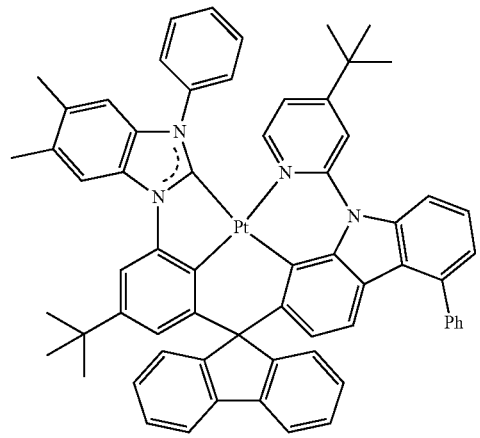
62
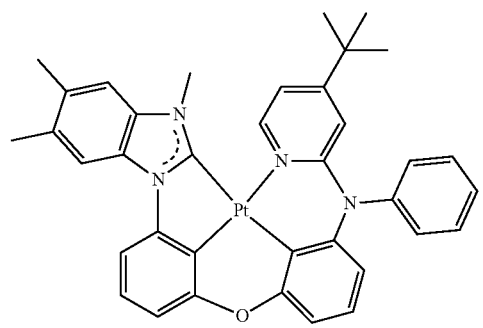
63
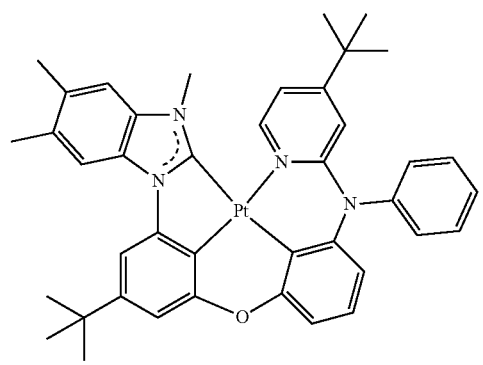

233
-continued
64
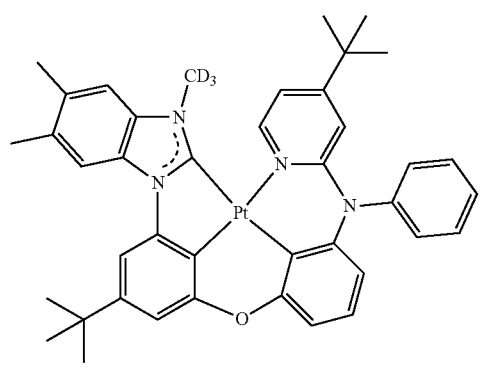
65
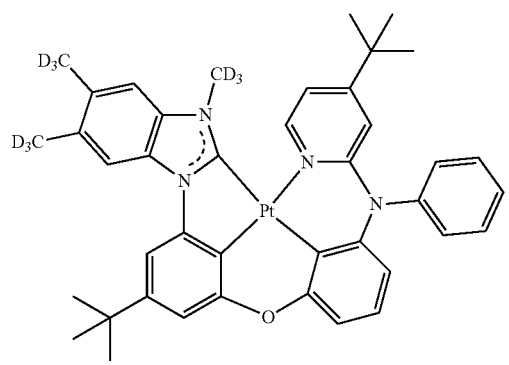
69
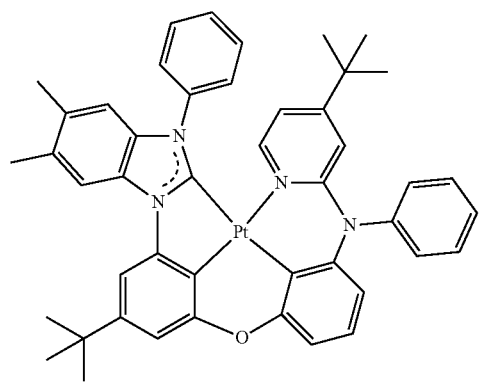
70
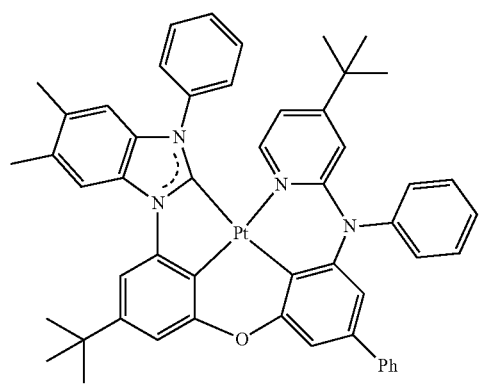
234
-continued
98
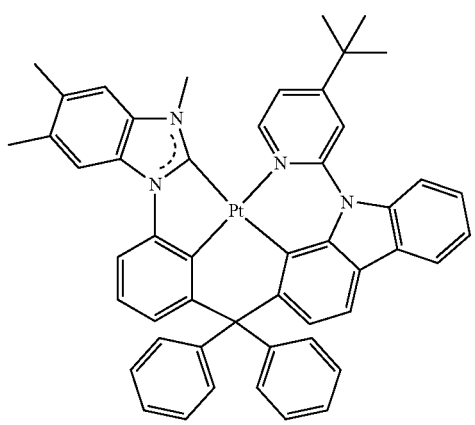
99
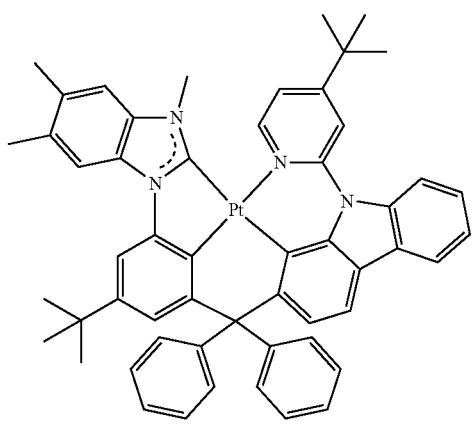
100
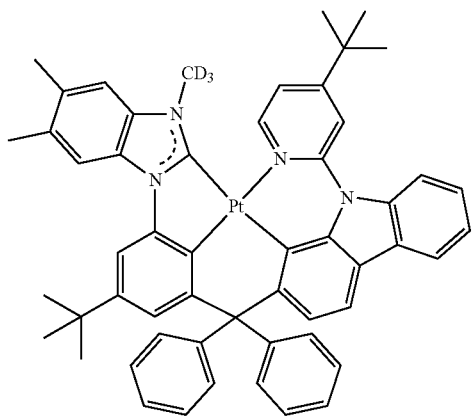

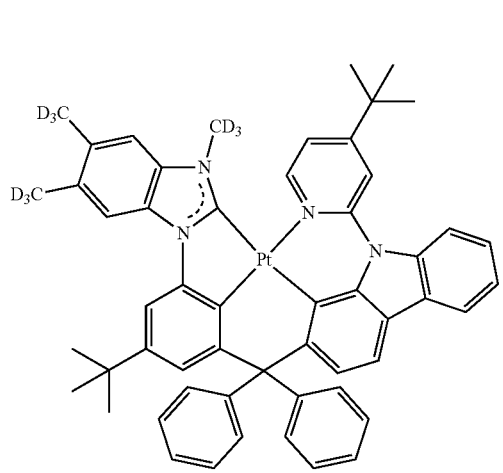
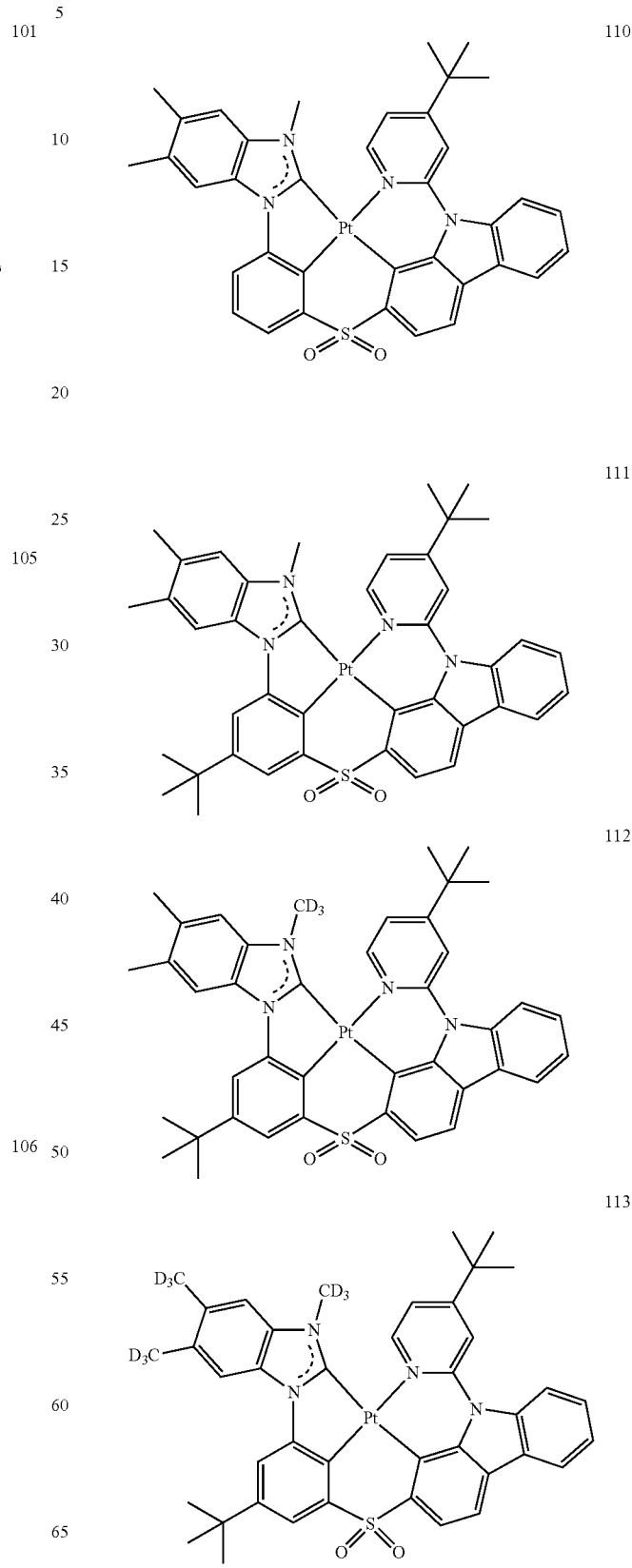

-continued

117
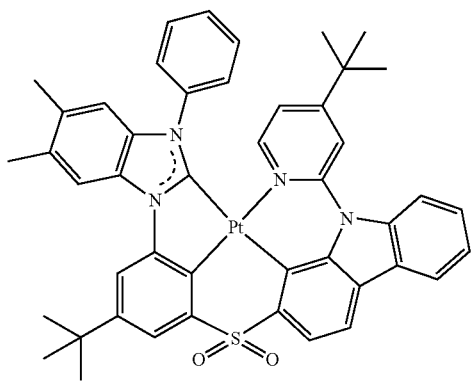

118
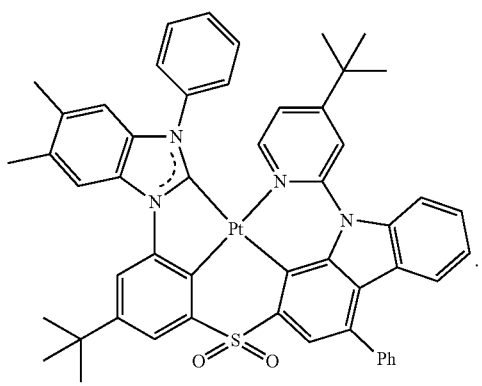

17. An organic light-emitting device comprising:
a first electrode;
a second electrode; and
an organic layer disposed between the first electrode and the second electrode,
wherein the organic layer comprises at least one organometallic compound of claim 1.

18. The organic light-emitting device of claim 17, wherein
the first electrode is an anode,
the second electrode is a cathode,
the organic layer comprises a hole transport region disposed between the first electrode and the emission layer and an electron transport region disposed between the emission layer and the second electrode,
the hole transport region comprises a hole injection layer, a hole transport layer, an electron blocking layer, or any combination thereof, and
the electron transport region comprises a hole blocking layer, an electron transport layer, an electron injection layer, or any combination thereof.

19. The organic light-emitting device of claim 17, wherein the organometallic compound is included in the emission layer.

20. The organic light-emitting device of claim 19, wherein the emission layer emits blue light.

* * * * *